(12) United States Patent
Matsumoto et al.

(10) Patent No.: US 8,115,154 B2
(45) Date of Patent: Feb. 14, 2012

(54) SOLID-STATE IMAGING DEVICE, METHOD OF PRODUCING THE SAME, AND IMAGING DEVICE

(75) Inventors: Takuji Matsumoto, Kanagawa (JP); Tetsuji Yamaguchi, Kanagawa (JP); Keiji Tatani, Kanagawa (JP); Yutaka Nishimura, Kanagawa (JP); Kazuichiro Itonaga, Tokyo (JP); Hiroyuki Mori, Kanagawa (JP); Norihiro Kubo, Kanagawa (JP); Fumihiko Koga, Kanagawa (JP); Shinichiro Izawa, Kanagawa (JP); Susumu Ooki, Kanagawa (JP)

(73) Assignee: Sony Corporation, Tokyo (JP)

( * ) Notice: Subject to any disclaimer, the term of this patent is extended or adjusted under 35 U.S.C. 154(b) by 375 days.

(21) Appl. No.: 12/509,990

(22) Filed: Jul. 27, 2009

(65) Prior Publication Data
US 2010/0025569 A1 Feb. 4, 2010

(30) Foreign Application Priority Data

Aug. 1, 2008 (JP) ............................ P2008-199518
Aug. 1, 2008 (JP) ............................ P2008-199519
Feb. 20, 2009 (JP) ............................ P2009-037557

(51) Int. Cl.
*H01L 27/00* (2006.01)
*H01L 31/112* (2006.01)
*H01L 21/28* (2006.01)

(52) U.S. Cl. .................... 250/208.1; 257/291; 257/355

(58) Field of Classification Search ............ 250/208.1; 257/291, 355, E21.158, E31.073; 438/73; 361/56
See application file for complete search history.

(56) References Cited

U.S. PATENT DOCUMENTS

| 7,154,150 B2* | 12/2006 | Hu et al. ................ 257/355 |
| 7,233,467 B2* | 6/2007 | Mergens et al. ........... 361/56 |
| 7,511,345 B2* | 3/2009 | Van Camp et al. ........ 257/355 |
| 7,532,446 B2* | 5/2009 | Cheng et al. ............. 361/56 |

FOREIGN PATENT DOCUMENTS

JP 2008-086104 4/2008
WO 03/096421 11/2003

OTHER PUBLICATIONS

K. Ota et al.; Novel Locally Strained Channel Technique for High Performance 55nm CMOS; IEDM Tech Dig.; pp. 27-30; 2002.

* cited by examiner

*Primary Examiner* — Seung C Sohn
(74) *Attorney, Agent, or Firm* — SNR Denton US LLP

(57) ABSTRACT

A solid-state imaging device includes a semiconductor substrate including a pixel portion having a photoelectric conversion portion and a peripheral circuit portion; a first sidewall composed of a sidewall film and disposed on each sidewall of gate electrodes of MOS transistors in the pixel portion; a second sidewall composed of the sidewall film and disposed on each sidewall of gate electrodes of MOS transistors in the peripheral circuit portion; a first silicide blocking film composed of the sidewall film and disposed on the photoelectric conversion portion and a part of the MOS transistors in the pixel portion; and a second silicide blocking film disposed on the MOS transistors in the pixel portion so as to overlap with a part of the first silicide blocking film, wherein the MOS transistors in the pixel portion are covered with the first and second silicide blocking films.

13 Claims, 96 Drawing Sheets

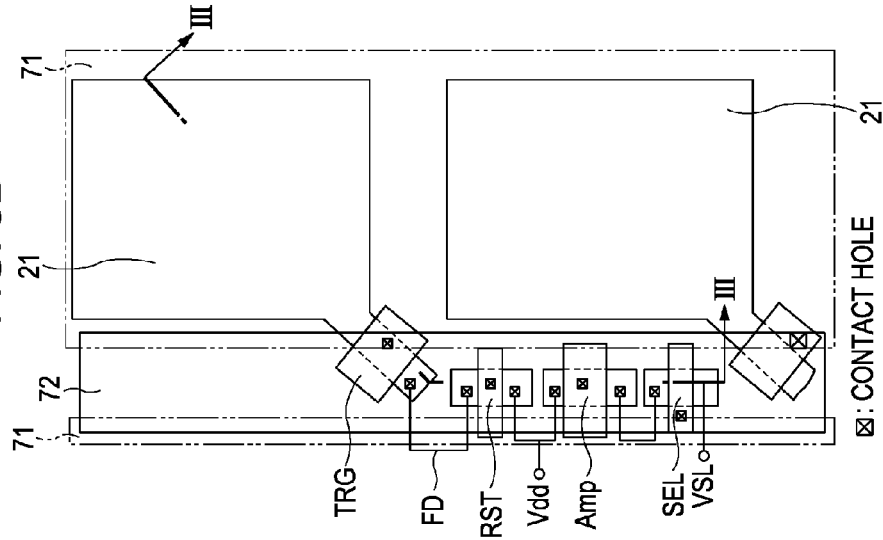
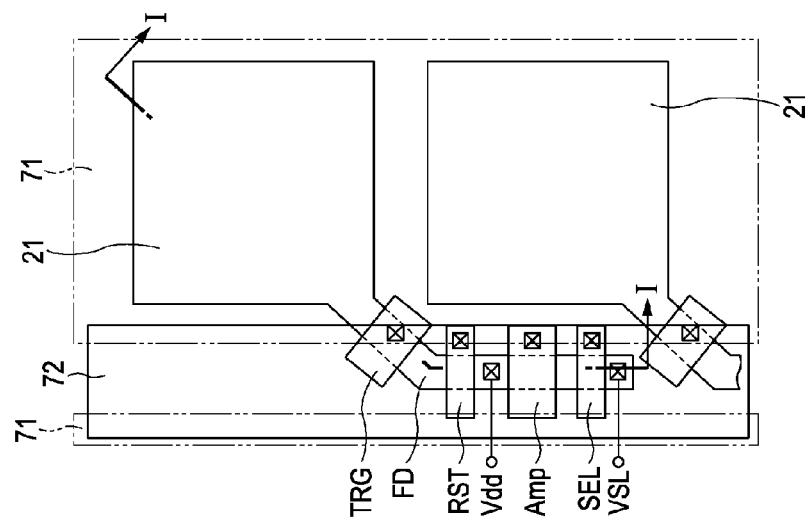

FIG. 22
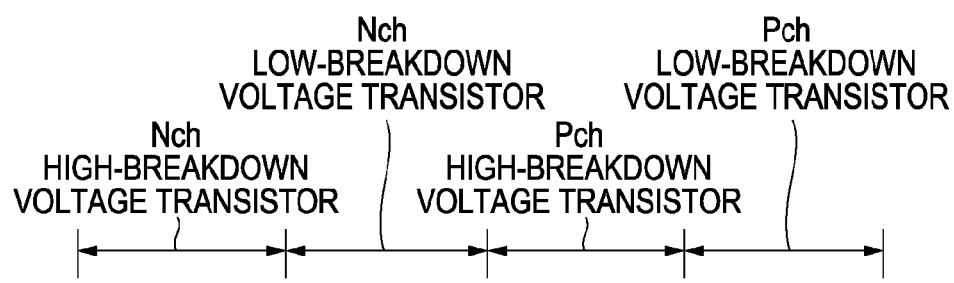
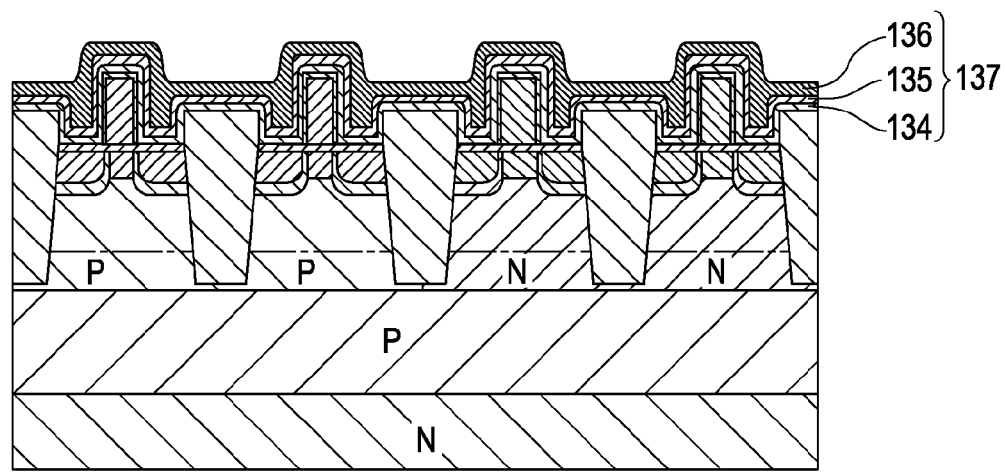

FIG. 30
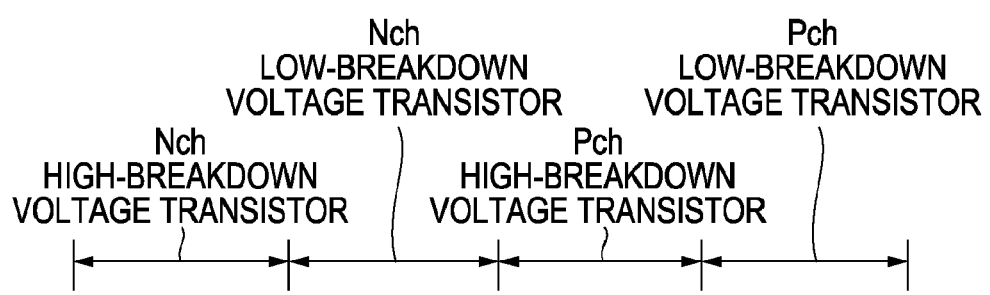
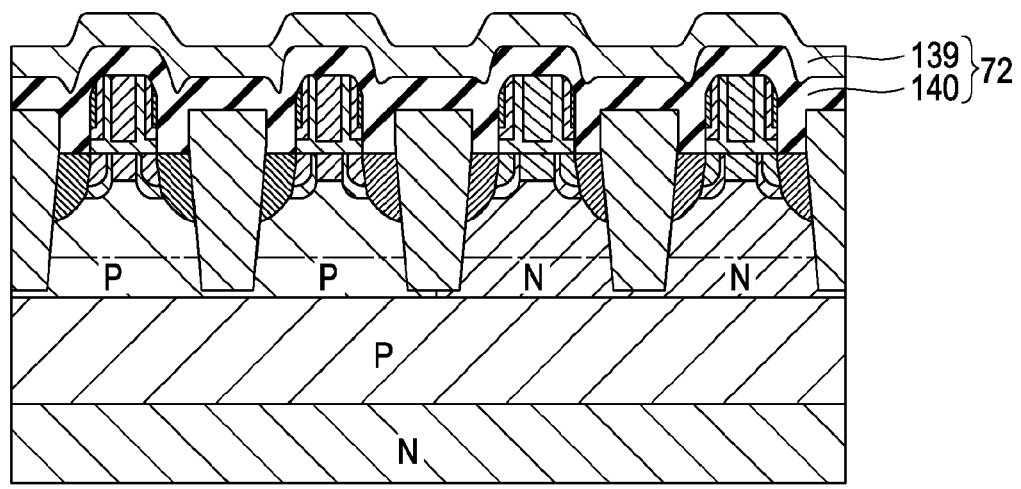

FIG. 36
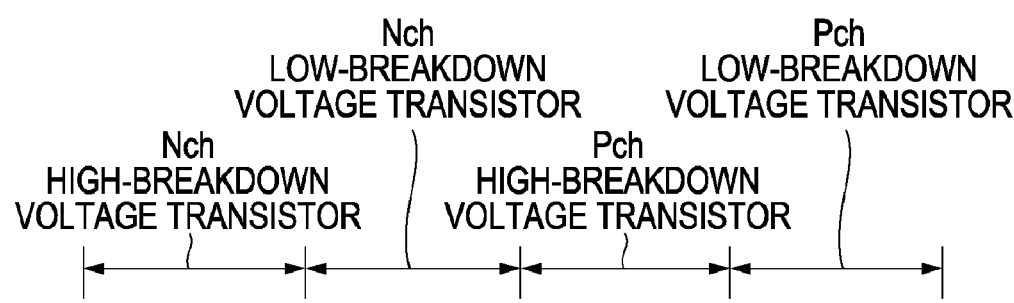
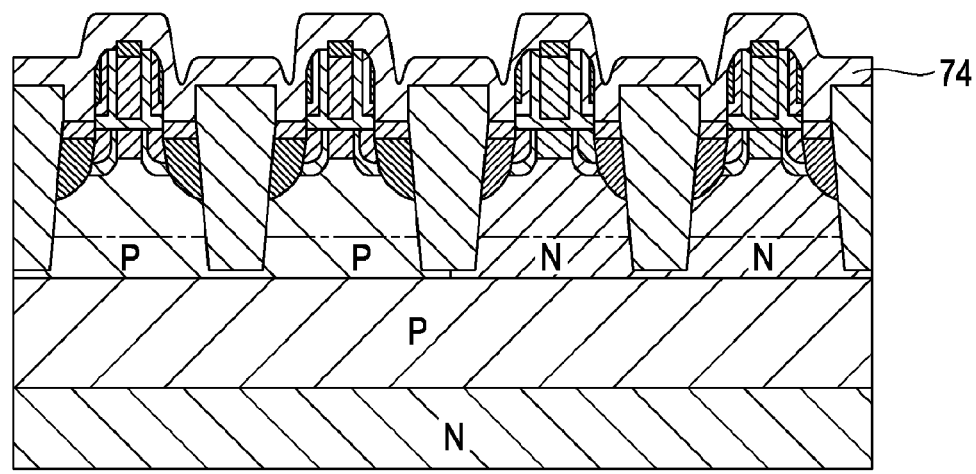

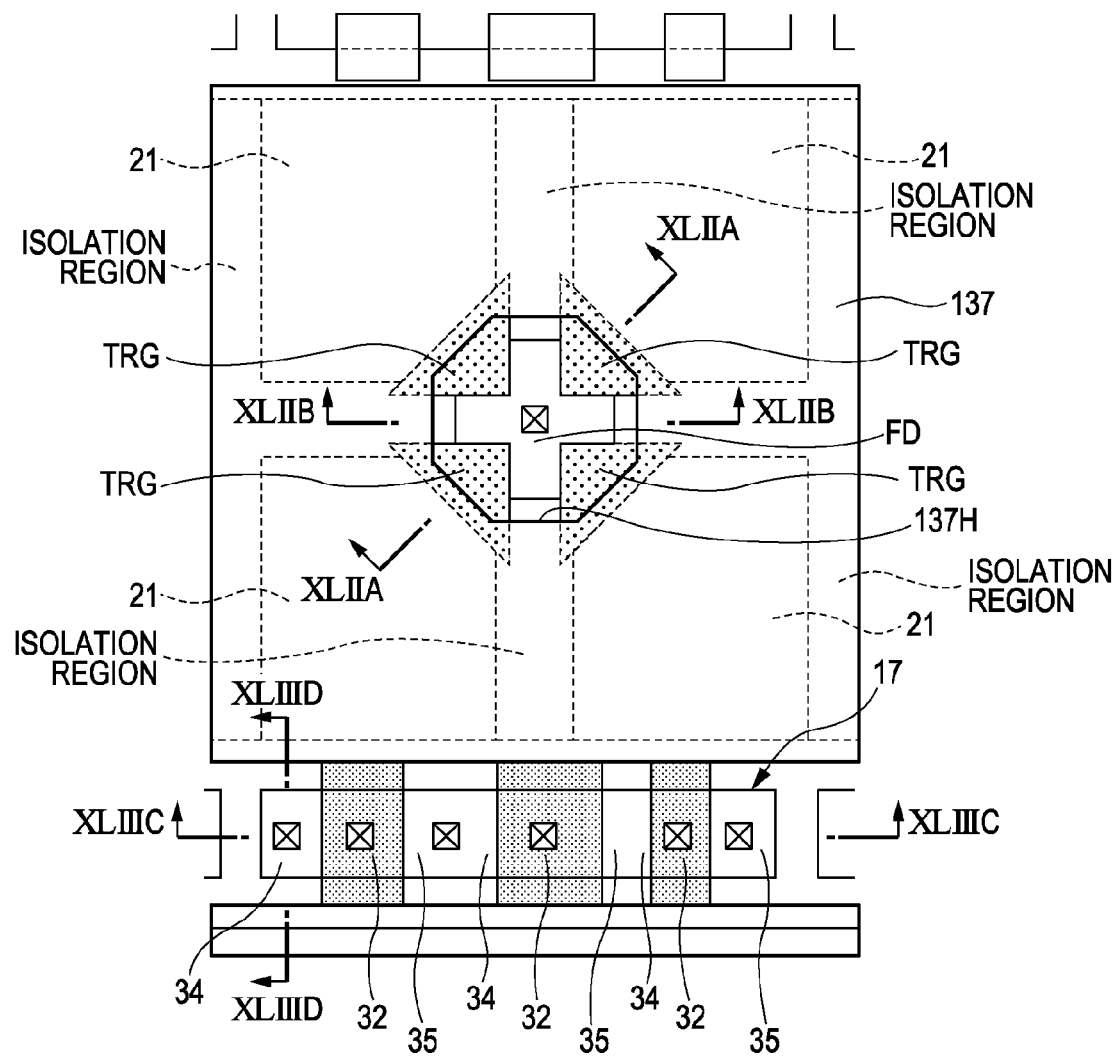

⊠ : CONTACT PORTION

⊠ : CONTACT PORTION

FIG. 72A
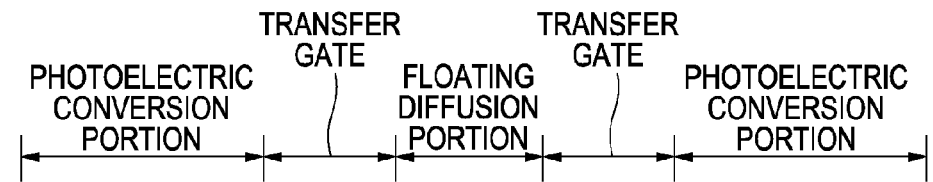
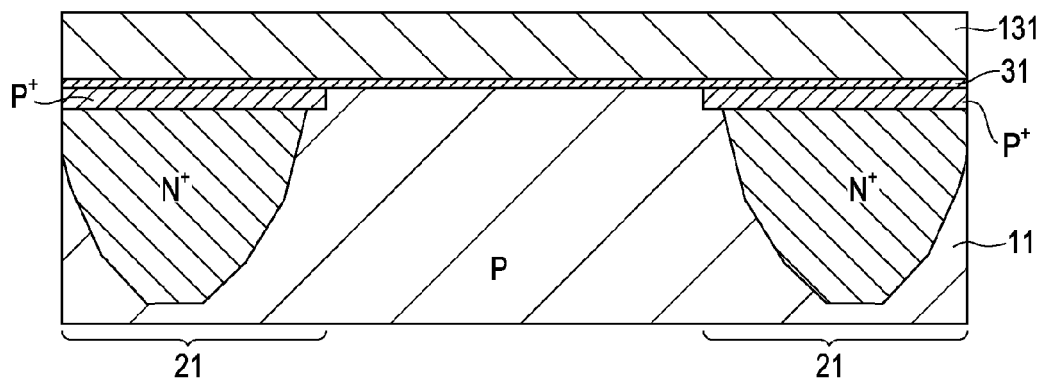
FIG. 72B
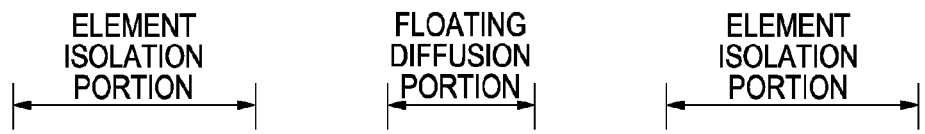
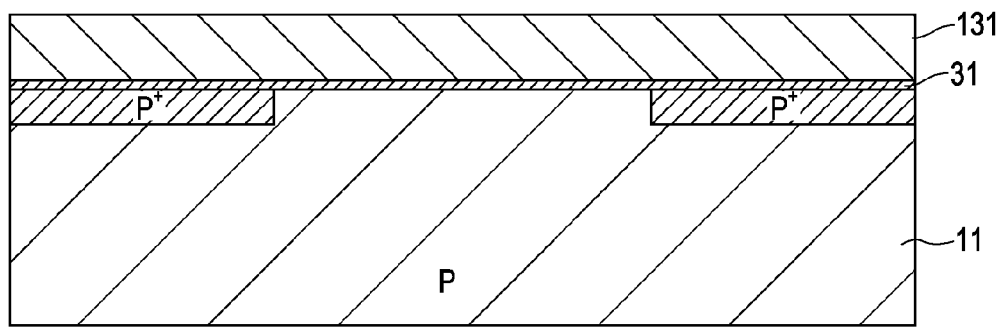

FIG. 77C
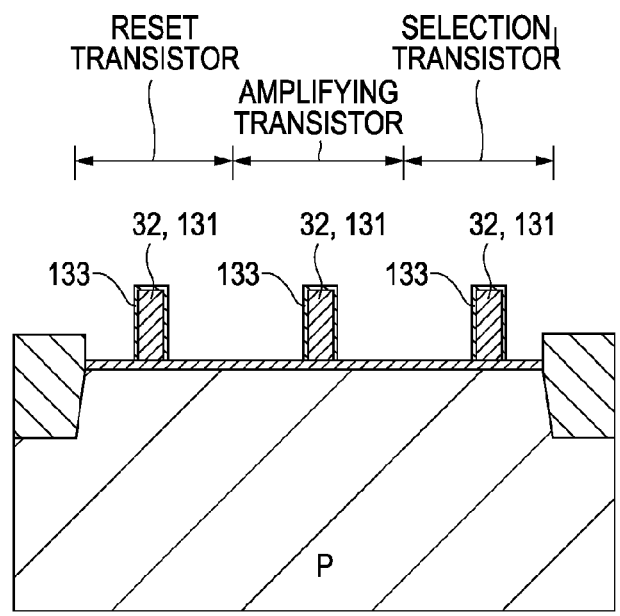
FIG. 77D
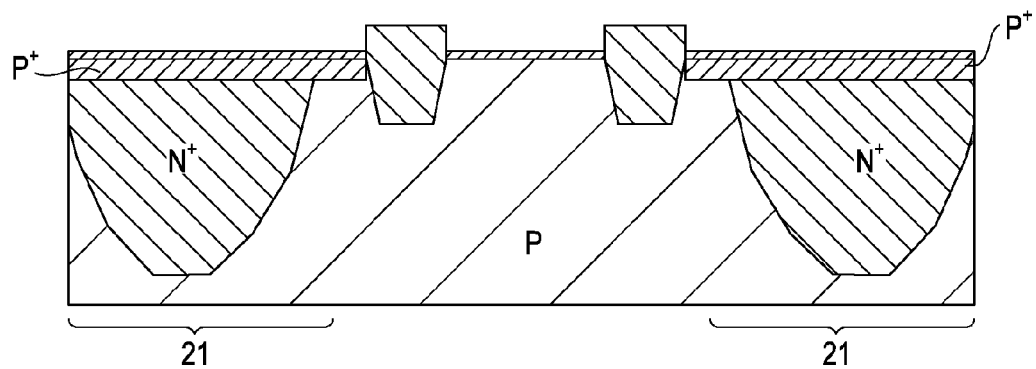

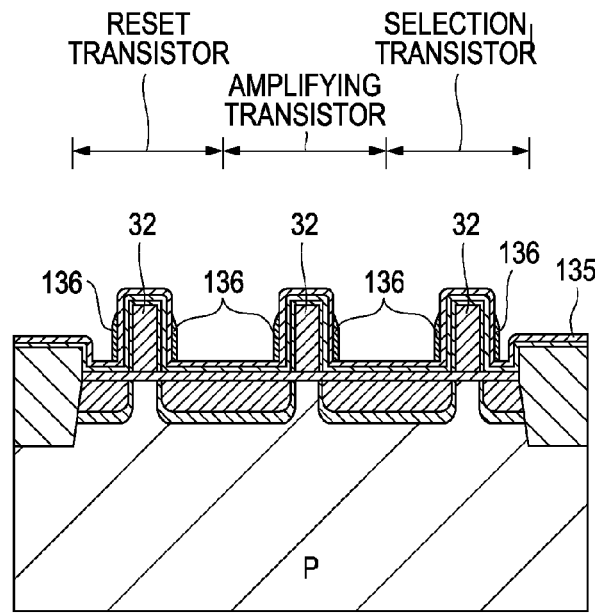
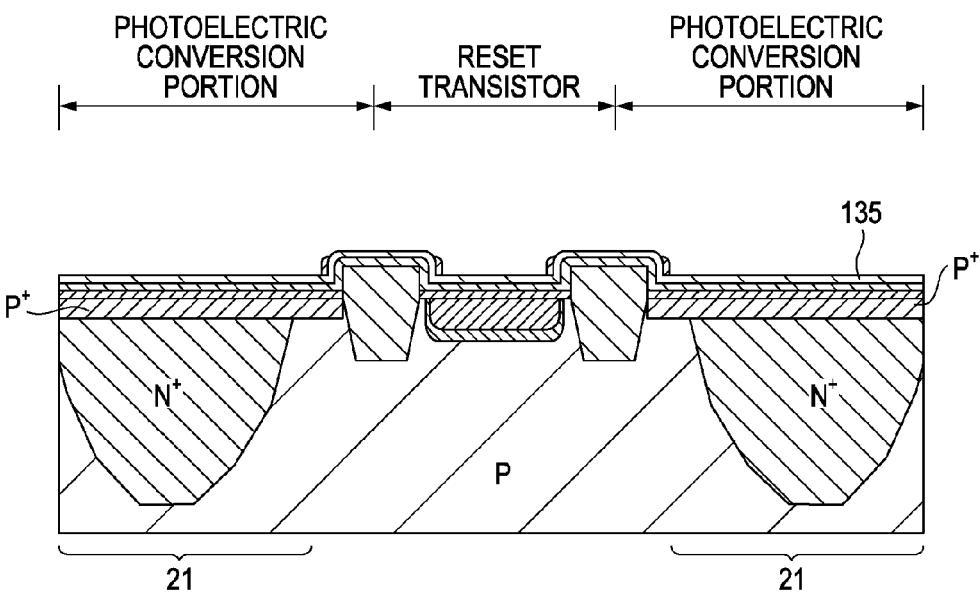

⊠ : CONTACT HOLE

SOLID-STATE IMAGING DEVICE, METHOD OF PRODUCING THE SAME, AND IMAGING DEVICE

BACKGROUND OF THE INVENTION

1. Field of the Invention

The present invention relates to a solid-state imaging device, a method of producing the same, and an imaging device.

2. Description of the Related Art

A method of producing a solid-state imaging device has been disclosed in which a sidewall having a three-layer structure is formed on gate electrodes of MOS transistors of the solid-state imaging device, a film (hereinafter referred to as "sidewall film") which is the same film as the sidewall having the three-layer structure is formed on a sensor portion of the solid-state imaging device to use the sidewall film as a silicide block for preventing a silicide from forming on the sensor portion (refer to, for example, domestic re-publication of PCT international publication for patent application No. WO2003/096421 (document '421) (in particular, FIG. 64 and a description related thereto)).

However, according to the method described in document '421, in order to form source-drain regions of the MOS transistors, ion implantation for forming the source-drain regions is performed through the sidewall film having the three-layer structure. Therefore, it has been difficult to improve a short-channel effect while suppressing parasitic resistance. Furthermore, the source-drain regions are annealed in a state in which the source-drain regions are completely covered with the sidewall film having the three-layer structure, and thus stress due to the sidewall film increases (stress memorization technique (SMT), refer to, for example, K. Ota, et al., "Novel Locally Strained Channel Technique for High Performance 55 nm CMOS" IEDM Tech. Dig., pp. 27-30, 2002). Furthermore, it is assumed that it is necessary to vary the conditions for ion implantation for forming source-drain regions of MOS transistors in a logic portion from the conditions for ion implantation for forming source-drain regions of MOS transistors in a pixel portion. The reason for this is that the ion implantation for the MOS transistors in the pixel portion is performed through the sidewall film, whereas the ion implantation for the MOS transistors in the logic portion is performed without such a film. Consequently, the depth of an impurity diffusion layer of each of the MOS transistors in the logic portion differs from the depth of an impurity diffusion layer of each the MOS transistors in the pixel portion. The gate length of the MOS transistors in the logic portion is shorter than that of the MOS transistors in the pixel portion. Accordingly, it is difficult to improve the short-channel effect while suppressing junction leakage, and to suppress an increase in parasitic resistance at the same time. It is a matter of course that the ion implantation for forming the source-drain regions of the MOS transistors in the logic portion and the ion implantation for forming the source-drain regions of the MOS transistors in the pixel portion are separately performed, though this is not described in document '421.

Furthermore, when source-drain regions are annealed in a state in which a cover film that completely covers gate electrodes is provided, a tensile stress is applied to the cover film (SMT). This film stress may generate crystal defects in a silicon layer of a sensor portion, which may result in an increase in random noise and an increase in the number of white flaws and dark current.

As described above, the ion implantation for forming the source-drain regions is performed through the sidewall film. Accordingly, it is difficult to set the depth of an impurity diffusion layer to a desired value while maintaining a high ion concentration at the surface of silicon (Si). Consequently, the parasitic resistance of the source-drain regions increases, thereby decreasing a driving force of a pixel transistor.

A production method in which the above sidewall film is not used as a silicide blocking film and another film for silicide blocking is separately provided has also been disclosed (refer to, for example, Japanese Unexamined Patent Application Publication No. 2008-85104). In this production method, a silicon substrate is readily damaged by etching-back of a sidewall film for forming a sidewall on each sidewall of gate electrodes. This results in a problem of an increase in dark current. Furthermore, in this method, an oxide film disposed on a photodiode is removed before ion implantation for forming source-drain regions is performed. Accordingly, a resist mask is formed directly on the photodiode. Consequently, the photodiode is contaminated by the resist, thus increasing dark current. Furthermore, a P-type impurity in a surface area is lost due to wet etching performed on the photodiode. As a result, dark current is increased. During the wet etching for removing the oxide film on the photodiode, the amount of an upper portion of an isolation region (shallow trench isolation (STI)) in a logic portion removed by the etching is increased. Accordingly, when a silicide is formed on the source-drain regions at an edge of the isolation region in the logic portion, junction leakage due to the silicide is increased. When the oxide film on the photodiode is removed, a problem of lift-off of a part of the sidewall film becomes severe. As a result, the yield is decreased.

In a MOS transistor of a solid-state imaging device, when a sidewall having a two-layer structure is formed on each sidewall of a gate electrode, the gate electrode is formed on a silicon substrate with a gate insulating film therebetween. Subsequently, a silicon oxide film covering the gate electrode is formed on the silicon substrate. Furthermore, a silicon nitride film is formed on the silicon oxide film. Next, etching-back of the entire surface of the silicon nitride film is performed so that the silicon nitride film remains on the sidewalls of the gate electrode with the silicon oxide film therebetween. In this etching-back, the silicon oxide film functions as an etching stopper. Next, the silicon oxide film is etched. As a result, the upper surface of the gate electrode is exposed, and the silicon substrate is also exposed. In this step, the silicon oxide film formed on a photodiode of the solid-state imaging device is also removed.

In the above method, as the pixel size and the transistor size are decreased, the film thickness of the silicon oxide layer is also deceased. Therefore, in the etching-back of the silicon nitride film, it is difficult to stop the etching while the silicon substrate serving as an underlying layer is not damaged. In general, when a silicon oxide film is used as an etching stopper in etching of a silicon nitride film, it is difficult to ensure a sufficient etching selection ratio.

In addition, during the removal of the silicon oxide film, a part of the silicon oxide film located under the sidewall composed of the silicon nitride film is also removed by the wet etching. Consequently, the sidewall is in a state of lift-off by a stress due to a subsequent heat treatment or the like. The sidewall in this state may become a cause of contamination, which may result in a decrease in the yield.

When the silicon oxide film is etched, the silicon oxide film located on a photodiode of the solid-state imaging device is also removed. Subsequently, ion implantation for forming sources and drains of an nFET and a pFET is performed. In this case, a resist mask used in this ion implantation is formed directly on the photodiode. Therefore, the photodiode may be contaminated with sodium (Na) and the like contained in the resist. These contaminations may cause a problem of an increase in the number of white flaws.

FIG. 95 is a layout view of a CMOS sensor. As shown in FIG. 95, a photodiode PD and an active region 15 connected to the photodiode PD are provided on a silicon substrate. A transfer gate TRG, a reset transistor RST, an amplifying transistor Amp, and a selection transistor SEL are sequentially arranged on the active region 15. A floating diffusion portion FD is provided between the transfer gate TRG and the reset transistor RST. FIG. 96 shows an equivalent circuit of the planar layout described above. In the layout shown in FIG. 96, a pixel includes a single photodiode PD, a floating diffusion portion FD, and four transistors, namely, a transfer gate TRG, a reset transistor RST, an amplifying transistor Amp, and a selection transistor SEL. This layout shows a structure in which a plurality of photodiodes PD are shared. Alternatively, photodiodes PD may be shared, or a pixel may include three transistors instead of the four transistors.

SUMMARY OF THE INVENTION

It is desirable to reduce random noise, the number of white flaws, and dark current.

According to an embodiment of the present invention, two different silicide blocking films are formed so as to partly overlap with each other on a MOS transistor in a pixel portion, thereby reducing random noise, the number of white flaws, and dark current.

A solid-state imaging device according to an embodiment of the present invention includes a semiconductor substrate including a pixel portion having a photoelectric conversion portion configured to photoelectrically convert incident light to obtain an electrical signal and a peripheral circuit portion disposed at the periphery of the pixel portion; a first sidewall composed of a sidewall film and disposed on each sidewall of gate electrodes of MOS transistors in the pixel portion; a second sidewall composed of the same film as the sidewall film and disposed on each sidewall of gate electrodes of MOS transistors in the peripheral circuit portion; a first silicide blocking film composed of the same film as the sidewall film and disposed on the photoelectric conversion portion and a part of the MOS transistors in the pixel portion; and a second silicide blocking film disposed on the MOS transistors in the pixel portion so as to overlap with a part of the first silicide blocking film, wherein the MOS transistors in the pixel portion are covered with the first silicide blocking film and the second silicide blocking film.

In the solid-state imaging device according to an embodiment of the present invention, the MOS transistors in the pixel portion are covered with two films, namely, the first silicide blocking film composed of the same film as the sidewall film and the second silicide blocking film composed of a film different from the first silicide blocking film. Thus, the MOS transistors in the pixel portion are not completely covered with a single silicide blocking film. Consequently, random noise can be reduced, and the number of white flaws and dark current can be reduced.

According to a method of producing a solid-state imaging device according to an embodiment of the present invention, in forming on a semiconductor substrate a pixel portion having a photoelectric conversion portion configured to photoelectrically convert incident light to obtain an electrical signal and a peripheral circuit portion formed at the periphery of the pixel portion, the method includes the steps of forming a sidewall film covering the pixel portion and the peripheral circuit portion; forming a first sidewall composed of the sidewall film on each sidewall of gate electrodes of MOS transistors in the pixel portion, a second sidewall composed of the sidewall film on each sidewall of gate electrodes of MOS transistors in the peripheral circuit portion, and a first silicide blocking film composed of the sidewall film on the photoelectric conversion portion and a part of the MOS transistors in the pixel portion; and forming a second silicide blocking film on the MOS transistors in the pixel portion so as to overlap with a part of the first silicide blocking film, wherein the MOS transistors in the pixel portion are covered with the first silicide blocking film and the second silicide blocking film.

In the method of producing a solid-state imaging device according to an embodiment of the present invention, the MOS transistors in the pixel portion are covered with two films, namely, the first silicide blocking film composed of the same film as the sidewall film and the second silicide blocking film composed of a film different from the first silicide blocking film. Thus, the MOS transistors in the pixel portion are not completely covered with a single silicide blocking film. Consequently, random noise can be reduced, and the number of white flaws and dark current can be reduced.

An imaging device according to an embodiment of the present invention includes a light-focusing optical unit configured to focus incident light; a solid-state imaging device configured to receive light focused in the light-focusing optical unit and to photoelectrically convert the light; and a signal processing unit configured to process a signal obtained as a result of photoelectric conversion. In this imaging device, the solid-state imaging device includes a semiconductor substrate including a pixel portion having a photoelectric conversion portion configured to photoelectrically convert incident light to obtain an electrical signal and a peripheral circuit portion disposed at the periphery of the pixel portion, a first sidewall composed of a sidewall film and disposed on each sidewall of gate electrodes of MOS transistors in the pixel portion, a second sidewall composed of the same film as the sidewall film and disposed on each sidewall of gate electrodes of MOS transistors in the peripheral circuit portion, a first silicide blocking film composed of the same film as the sidewall film and disposed on the photoelectric conversion portion and a part of the MOS transistors in the pixel portion, and a second silicide blocking film disposed on the MOS transistors in the pixel portion so as to overlap with a part of the first silicide blocking film, wherein the MOS transistors in the pixel portion are covered with the first silicide blocking film and the second silicide blocking film.

The imaging device according to an embodiment of the present invention includes the solid-state imaging device according to an embodiment of the present invention. Accordingly, random noise can be reduced, and the number of white flaws and dark current can be reduced.

The solid-state imaging device according to an embodiment of the present invention is advantageous in that random noise can be reduced and that the number of white flaws and dark current can be reduced.

The method of producing a solid-state imaging device according to an embodiment of the present invention is advantageous in that random noise can be reduced and that the number of white flaws and dark current can be reduced.

Since the imaging device according to an embodiment of the present invention includes the solid-state imaging device according to an embodiment of the present invention, random noise of each pixel can be reduced, and the number of white flaws and dark current can be reduced. Consequently, the image quality can be improved.

BRIEF DESCRIPTION OF THE DRAWINGS

FIG. 5A is a planar layout view showing the first example of the solid-state imaging device according to an embodiment of the present invention;

FIG. 5B is a planar layout view showing the second example of the solid-state imaging device according to an embodiment of the present invention;

FIG. 22 is a cross-sectional view showing the first example of the method of producing a solid-state imaging device according to an embodiment of the present invention;

FIG. 30 is a cross-sectional view showing the first example of the method of producing a solid-state imaging device according to an embodiment of the present invention;

FIG. 36 is a cross-sectional view showing the first example of the method of producing a solid-state imaging device according to an embodiment of the present invention;

FIG. 41 is a planar layout view showing a second example of a method of producing a solid-state imaging device according to an embodiment of the present invention;

FIGS. 72A and 72B are cross-sectional views showing the detailed example of the method of producing a solid-state imaging device having the four-pixel sharing structure;

FIGS. 77C and 77D are cross-sectional views showing the detailed example of the method of producing a solid-state imaging device having the four-pixel sharing structure;

FIGS. 83C and 83D are cross-sectional views showing the detailed example of the method of producing a solid-state imaging device having the four-pixel sharing structure;

DESCRIPTION OF THE PREFERRED EMBODIMENTS

Modes for carrying out the invention (hereinafter referred to as "embodiments") will now described below.

1. First Embodiment

Figure 1:
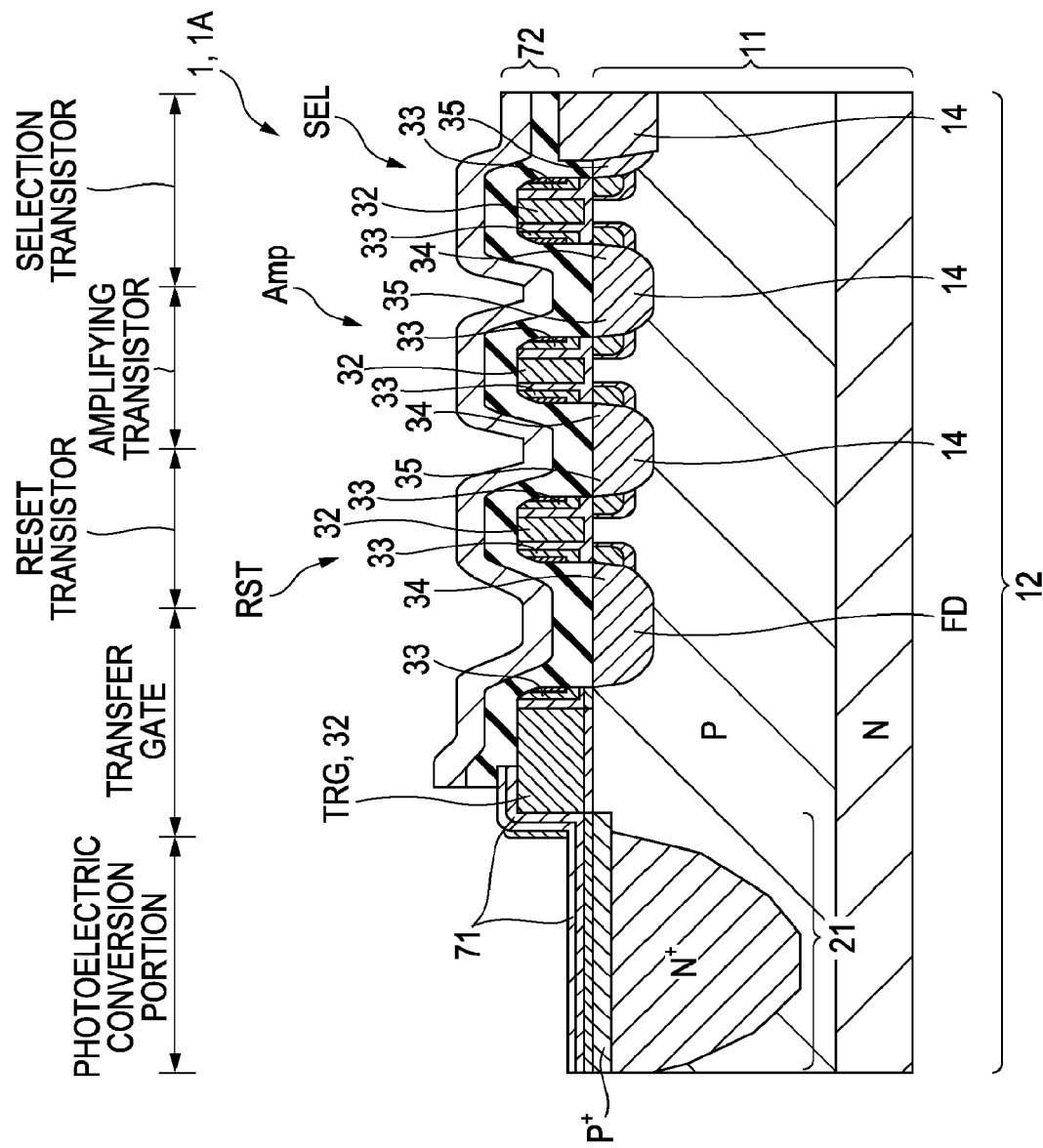
FIG. 1 is a schematic structural cross-sectional view showing a first example of the structure of a solid-state imaging device according to an embodiment of the present invention.
Figure 2:
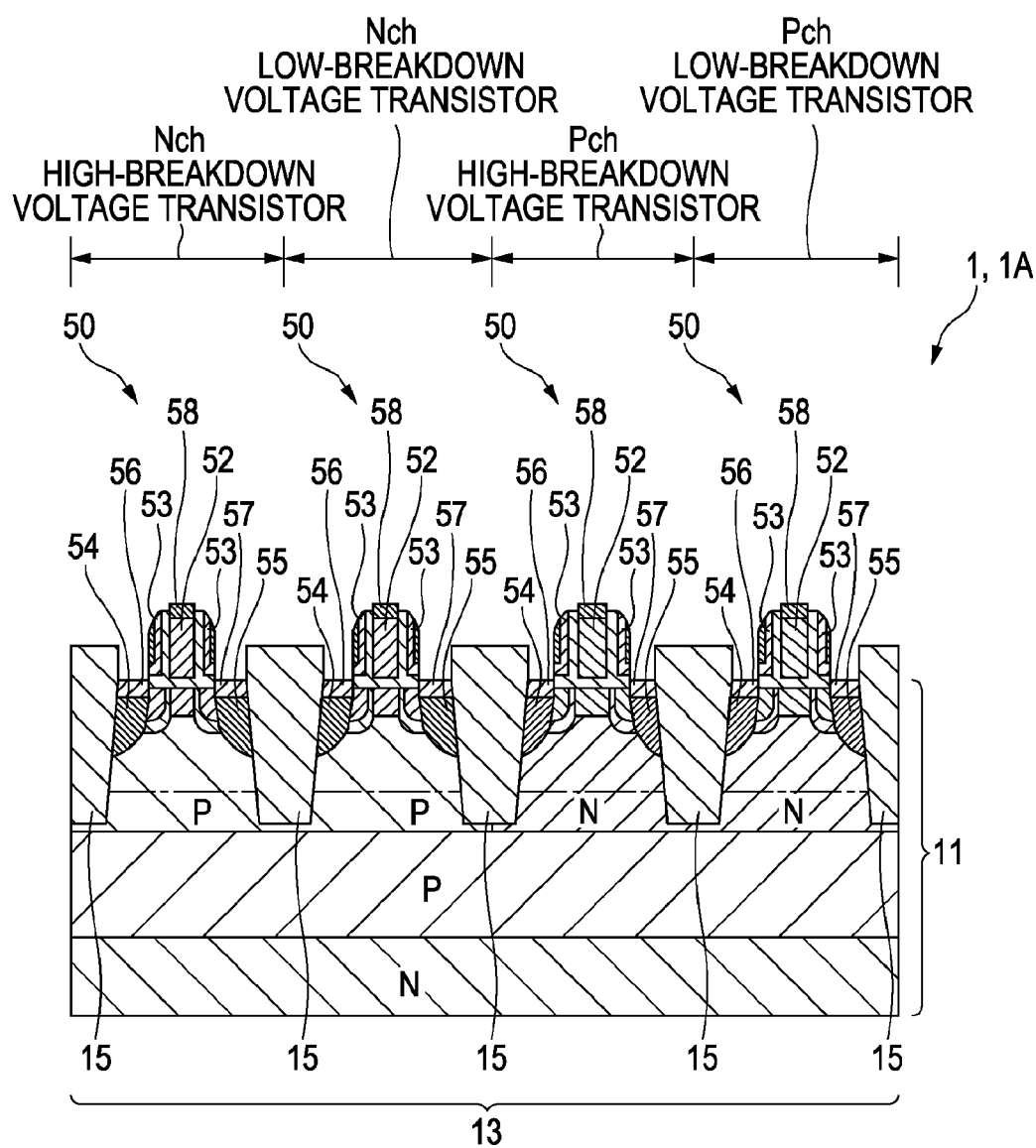
FIG. 2 is a schematic structural cross-sectional view showing the first example of the structure of the solid-state imaging device according to an embodiment of the present invention.
Figure 3:
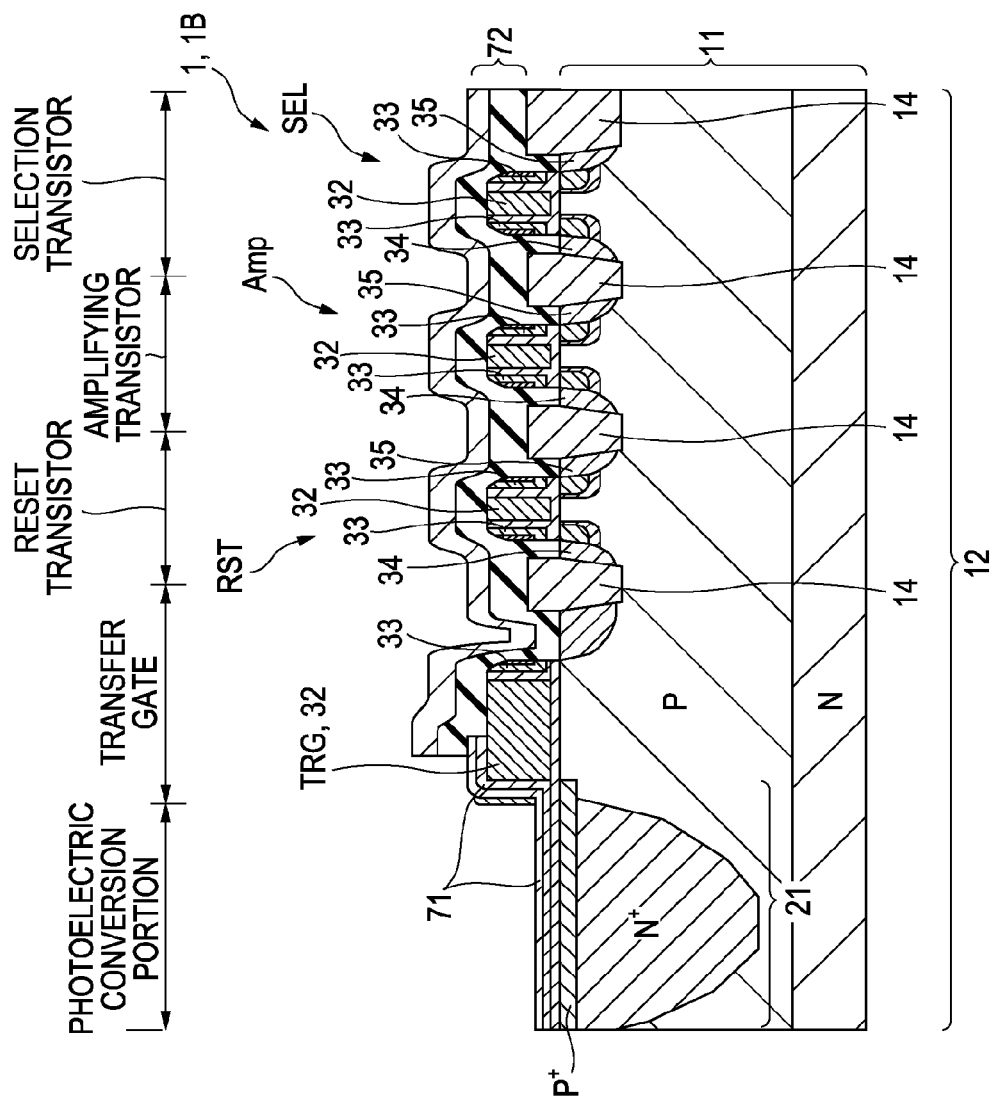
FIG. 3 is a schematic structural cross-sectional view showing a second example of the structure of a solid-state imaging device according to an embodiment of the present invention.
Figure 4:
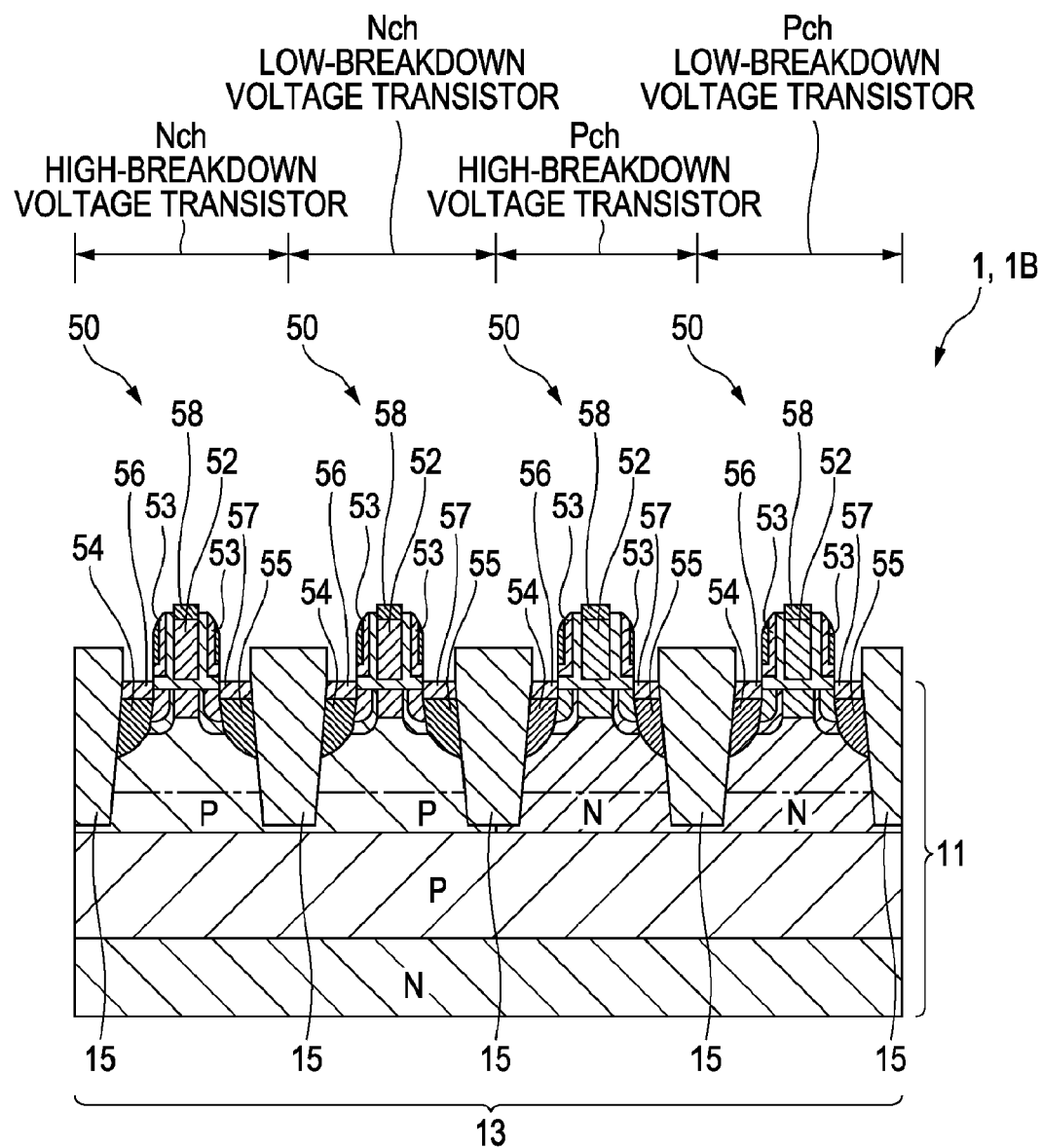
FIG. 4 is a schematic structural cross-sectional view showing the second example of the structure of the solid-state imaging device according to an embodiment of the present invention.

A first example of the structure of a solid-state imaging device according to a first embodiment of the present invention will be described with reference to a schematic structural cross-sectional view of a pixel portion of FIG. 1, a schematic structural cross-sectional view of a peripheral circuit portion of FIG. 2, and a planar layout view of the pixel portion of FIG. 5A. FIG. 5A shows a case where a transfer gate TRIG, a reset transistor RST, an amplifying transistor Amp, and a selection transistor SEL are connected to each other in an active region. Note that the pixel portion shown in FIG. 1 and the peripheral circuit portion shown in FIG. 2 are formed on the same semiconductor substrate. FIG. 1 shows a cross section taken along line I-I in FIG. 5A. Furthermore, a second example of the structure of a solid-state imaging device according to the first embodiment will be described with reference to a schematic structural cross-sectional view of a pixel portion of FIG. 3, a schematic structural cross-sectional view of a peripheral circuit portion of FIG. 4, and a planar layout view of the pixel portion of FIG. 5B. FIG. 5B shows a case where an active region of a transfer gate TRIG, a reset transistor RST, an amplifying transistor Amp, and a selection transistor SEL is separated by shallow trench isolation (STI). Note that the pixel portion shown in FIG. 3 and the peripheral circuit portion shown in FIG. 4 are formed on the same semiconductor substrate. FIG. 3 shows a cross section taken along line III-III in FIG. 5B. In order to reduce the pixel size in the same amount of saturated electric charge Qs, the layout shown in FIG. 5A is preferable.

[First Example of Structure of Solid-state Imaging Device]

As shown in FIGS. 1, 2, and 5A, a solid-state imaging device 1(A) includes a semiconductor substrate 11 including a pixel portion 12 having a photoelectric conversion portion 21 that photoelectrically converts incident light to obtain an electrical signal and a peripheral circuit portion 13 disposed at the periphery of the pixel portion 12. In the pixel portion 12 of the semiconductor substrate 11, the photoelectric conversion portion 21 is provided, and a transfer gate TRG, a reset transistor RST, an amplifying transistor Amp, and a selection transistor SEL are sequentially provided in series so as to be connected to the photoelectric conversion portion 21. The photoelectric conversion portion 21 is constituted by, for example, a photodiode.

A first sidewall 33 composed of a sidewall film is provided on sidewalls of each gate electrode 32 of MOS transistors 30 (the transfer gate TRG, the reset transistor RST, the amplifying transistor Amp, and the selection transistor SEL) in the pixel portion 12. In addition, a second sidewall 53 composed of the same film as the sidewall film is provided on sidewalls of each gate electrode 52 of MOS transistors 50 in the peripheral circuit portion 13. Furthermore, a first silicide blocking film 71 composed of the same film as the sidewall film is provided on the photoelectric conversion portion 21. Furthermore, a second silicide blocking film 72 that overlaps with a part of the first silicide blocking film 71 is provided on each of the MOS transistors 30 in the pixel portion 12. The first silicide blocking film 71 has a stacked structure including, for example, a silicon oxide film and a silicon nitride film. The second silicide blocking film 72 has a stacked structure including, for example, a silicon oxide film and a silicon nitride film. Thus, the pixel portion 12 is covered with the first silicide blocking film 71 and the second silicide blocking film 72. The part where the second silicide blocking film 72 overlaps with the first silicide blocking film 71 is formed in the pixel portion 12.

For each of the MOS transistors 50 in the peripheral circuit portion 13, for example, a silicide layer 58 is provided on the gate electrode 52, and silicide layers 56 and 57 are provided on source-drain regions 54 and 55, respectively. In this manner, in order to reduce parasitic resistance to achieve a high-speed operation, each of the MOS transistors 50 in the peripheral circuit portion 13 is silicided.

First isolation regions 14 that separate the pixel portion 12 are provided in the semiconductor substrate 11. Second isolation regions 15 that separate a region where the MOS transistors in the peripheral circuit portion 13 are formed are provided in the semiconductor substrate 11. Each of the first isolation regions 14 and the second isolation regions 15 has an STI structure. The first isolation regions 14 are formed so as to be shallower than the second isolation regions 15. In addition, the first isolation regions 14 are formed so that a height of a part of each first isolation region 14 projecting from the semiconductor substrate 11 is low.

As described above, the solid-state imaging device 1(A) includes a region where the first silicide blocking film 71 is formed using the sidewall film, a region where the second silicide blocking film 72, which is formed by separately forming an insulating film for silicide blocking, is formed, and regions where the silicide layer 56 or 57 is formed as in the MOS transistors 50 in the peripheral circuit portion 13. In addition, the first silicide blocking film 71 composed of the sidewall film is formed on the photoelectric conversion portion 21.

[Second Example of Structure of Solid-state Imaging Device]

As shown in FIGS. 3, 4, and 5B, a solid-state imaging device 1(B) includes a semiconductor substrate 11 including a pixel portion 12 having a photoelectric conversion portion 21 that photoelectrically converts incident light to obtain an electrical signal and a peripheral circuit portion 13 disposed at the periphery of the pixel portion 12. In the pixel portion 12 of the semiconductor substrate 11, the photoelectric conversion portion 21 is provided, and a transfer gate TRG, a reset transistor RST, an amplifying transistor Amp, and a selection transistor SEL are sequentially provided in series so as to be connected to the photoelectric conversion portion 21. The photoelectric conversion portion 21 is constituted by, for example, a photodiode.

A first sidewall 33 composed of a sidewall film is provided on sidewalls of each gate electrode 32 of MOS transistors 30 (the transfer gate TRG, the reset transistor RST, the amplifying transistor Amp, and the selection transistor SEL) in the pixel portion 12. In addition, a second sidewall 53 composed of the same film as the sidewall film is provided on sidewalls of each gate electrode 52 of MOS transistors 50 in the peripheral circuit portion 13. Furthermore, a first silicide blocking film 71 composed of the same film as the sidewall film is provided on the photoelectric conversion portion 21. Furthermore, a second silicide blocking film 72 that overlaps with a part of the first silicide blocking film 71 is provided on each of the MOS transistors 30 in the pixel portion 12. The first silicide blocking film 71 has a stacked structure including, for example, a silicon oxide film and a silicon nitride film. The second silicide blocking film 72 has a stacked structure including, for example, a silicon oxide film and a silicon nitride film. Thus, the pixel portion 12 is covered with the first silicide blocking film 71 and the second silicide blocking film 72. The part where the second silicide blocking film 72 overlaps with the first silicide blocking film 71 is formed in the pixel portion 12.

For each of the MOS transistors 50 in the peripheral circuit portion 13, for example, a silicide layer 58 is provided on the gate electrode 52, and silicide layers 56 and 57 are provided on source-drain regions 54 and 55, respectively. In this manner, in order to reduce parasitic resistance to achieve a high-speed operation, each of the MOS transistors 50 in the peripheral circuit portion 13 is silicided.

First isolation regions 14 that separate a region where the MOS transistors in the pixel portion 12 are formed are provided in the semiconductor substrate 11. Second isolation regions 15 that separate a region where the MOS transistors in the peripheral circuit portion 13 are formed are provided in the semiconductor substrate 11. Each of the first isolation regions 14 and the second isolation regions 15 has an STI structure. The first isolation regions 14 are formed so as to be shallower than the second isolation regions 15. In addition, the first isolation regions 14 are formed so that a height of a part of each first isolation region 14 projecting from the semiconductor substrate 11 is low.

As described above, the solid-state imaging device 1(B) includes a region where the first silicide blocking film 71 is formed using the sidewall film, a region where the second silicide blocking film 72, which is formed by separately forming an insulating film for silicide blocking, is formed, and regions where the silicide layer 56 or 57 is formed as in the MOS transistors 50 in the peripheral circuit portion 13. In addition, the first silicide blocking film 71 composed of the sidewall film is formed on the photoelectric conversion portion 21.

In each of the solid-state imaging devices 1 (1A and 1B), in order to prevent impurity contamination and generation of defects due to a silicide, the pixel portion 12 is preferably completely covered with the first silicide blocking film 71 and the second silicide blocking film 72. The first silicide blocking film 71 and the second silicide blocking film 72 may not be provided on the first and second isolation regions 14 and 15. However, it is necessary to maximize the light-receiving area of the photoelectric conversion portion 21 in the same pixel size to increase the saturated electric charge (Qs), thereby reducing the effect of noise. Accordingly, in order that overlapping margins on the isolation regions need not be considered, the upper surfaces of the isolation regions are also preferably covered with the first silicide blocking film 71 and the second silicide blocking film 72. This structure can reduce the area of the isolation regions to increase the light-receiving area of the photoelectric conversion portion 21.

Consequently, in the above layout of the solid-state imaging device 1, in order to decrease a separation width of the isolation regions to increase the proportion of the area of the photodiode, the part where the second silicide blocking film 72 overlaps with the first silicide blocking film 71 is provided. As a result, the difference in the level on each of the gate electrodes 32 in the pixel portion 12 increases, and it becomes difficult to ensure the flatness of an interlayer insulating film. For example, in the separation technique described in Japanese Unexamined Patent Application Publication No. 2005-347325, the height of an oxide film isolation portion in a pixel projecting from the surface of a silicon (Si) substrate increases, and thus it becomes more difficult to ensure the flatness. In this embodiment of the present invention, the first isolation region 14 having the shallow trench isolation (STI) structure is used so that the height of a part of the first isolation region 14 projecting from the semiconductor substrate 11 is low. However, if the depth of the STI of the first isolation region 14 is the same as the depth of the STI of the second isolation region 15 in the peripheral circuit portion 13, stress and etching damage on the photodiode constituting the photoelectric conversion portion 21 increase, resulting in an increase in the number of white flaws. Therefore, the first isolation regions 14 are formed so as to be shallower than the second isolation regions 15 in the peripheral circuit portion 13. In order to realize a high-speed operation, the STI of the second isolation region 15 in the peripheral circuit portion 13 has a large depth to reduce parasitic resistance between wiring and the substrate.

In the solid-state imaging device 1 (1A) according to an embodiment of the present invention, the pixel portion 12 is covered with two layers, namely, the first silicide blocking film 71 composed of the same film as a sidewall film and the second silicide blocking film 72 composed of a film different from the first silicide blocking film 71. Accordingly, the MOS transistors 30 in the pixel portion 12 are not completely covered with a single silicide blocking film. This structure is advantageous in that random noise can be reduced, and the number of white flaws and dark current can be reduced.

2. Second Embodiment

[First Example of Method of Producing Solid-State Imaging Device]

A first example of a method of producing a solid-state imaging device according to an embodiment of the present invention will now be described with reference to FIGS. 6 to 39, which are cross-sectional views showing production steps.

Figure 6:
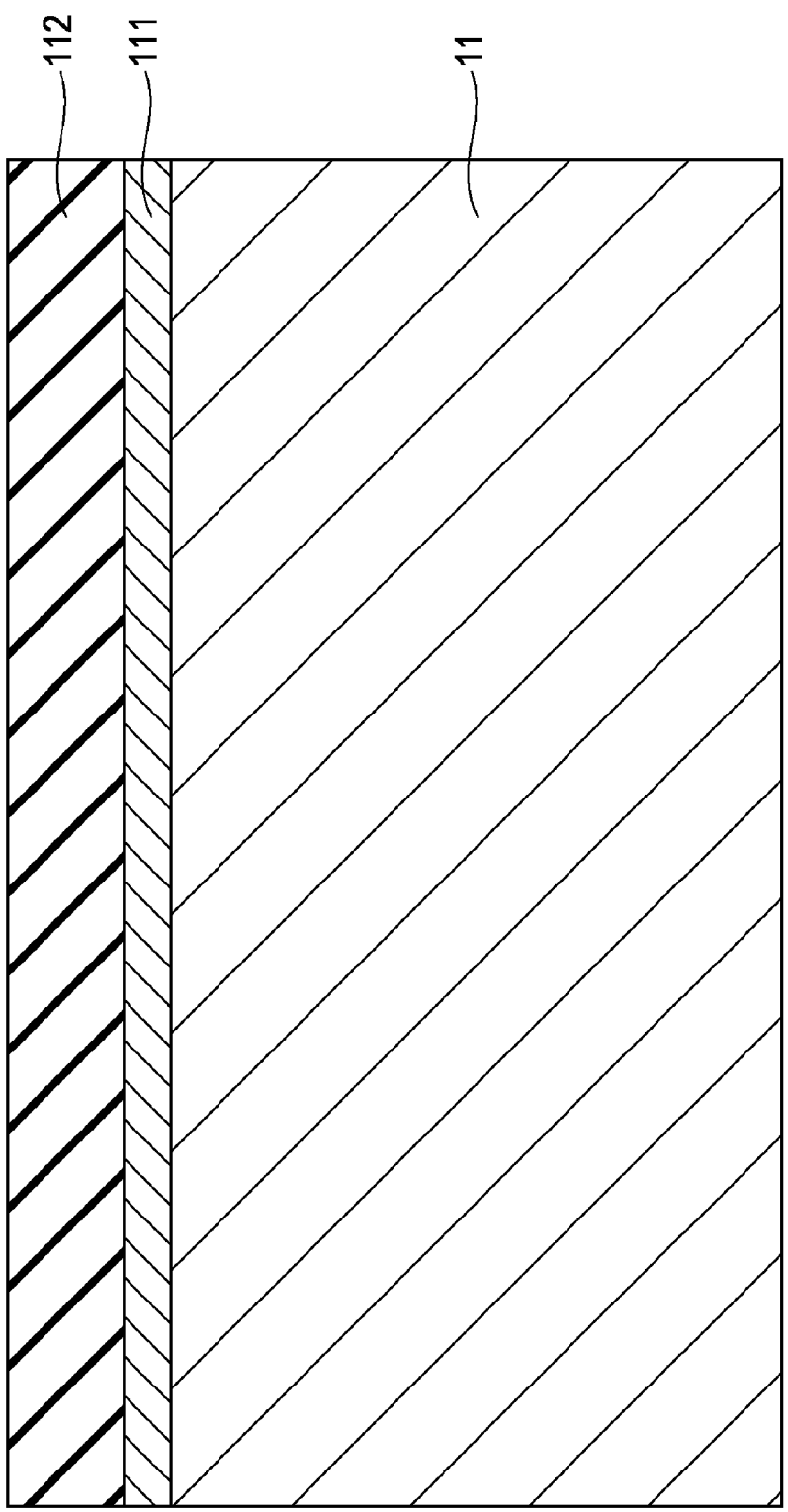
FIG. 6 is a cross-sectional view showing a first example of a method of producing a solid-state imaging device according to an embodiment of the present invention.

As shown in FIG. 6, for example, a silicon substrate is used as a semiconductor substrate 11. A pad oxide film 111 and a silicon nitride film 112 are formed on the semiconductor substrate 11. The pad oxide film 111 is formed by oxidizing a surface of the semiconductor substrate 11 by, for example, a thermal oxidization method. This pad oxide film 111 is formed so as to have a thickness of, for example, 15 nm. Next, the silicon nitride film 112 is formed on the pad oxide film 111 by, for example, a low-pressure chemical vapor deposition (LP-CVD) method. This silicon nitride film 112 is formed so as to have a thickness of, for example, 160 nm. The above-described device has a structure of silicon nitride film/pad oxide film. Alternatively, the device may have a structure of silicon nitride film/polysilicon film or a structure of amorphous silicon film/pad oxide film.

Figure 7:
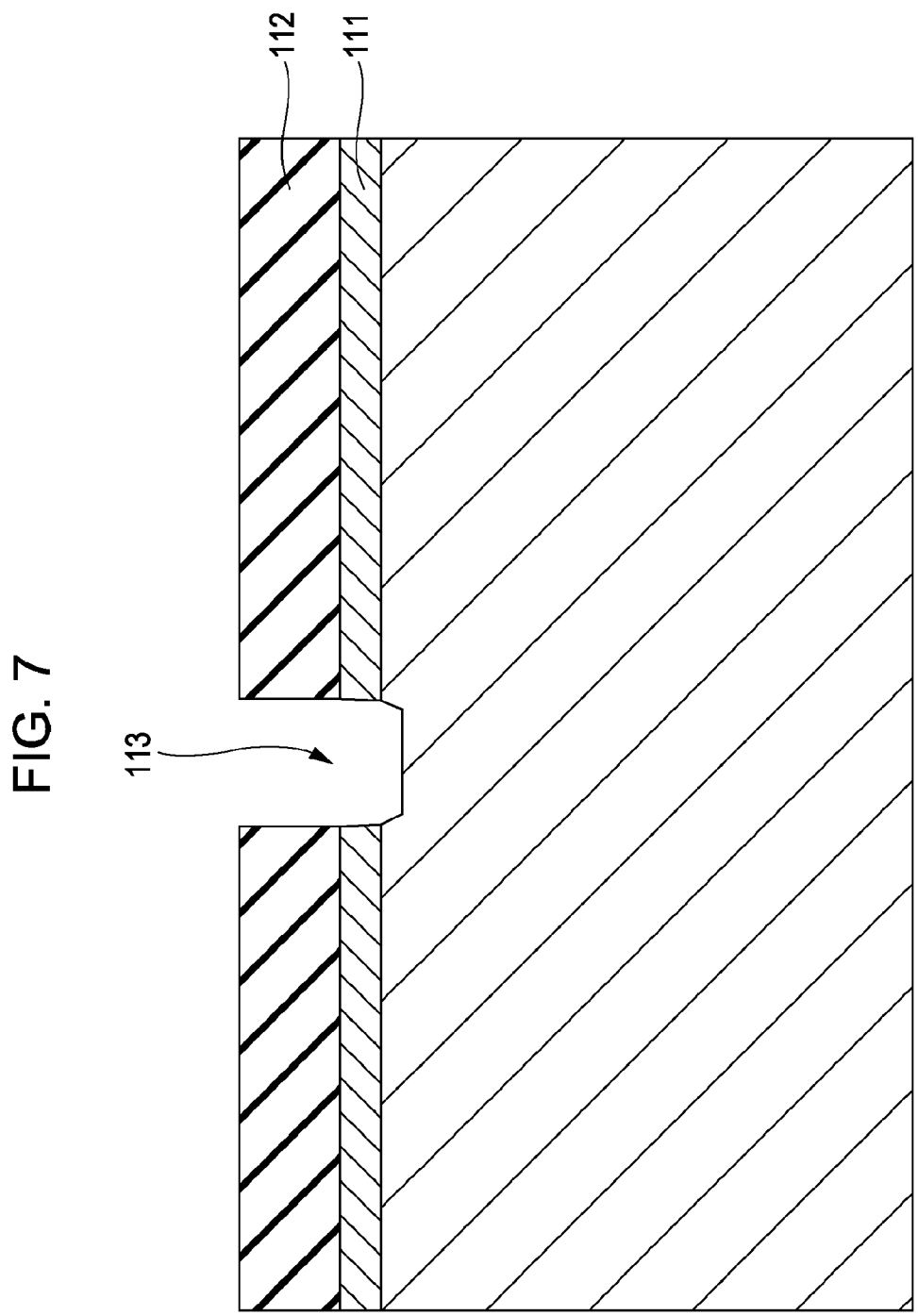
FIG. 7 is a cross-sectional view showing the first example of the method of producing a solid-state imaging device according to an embodiment of the present invention.

Next, as shown in FIG. 7, a resist mask (not shown) having an opening on an area where an isolation region is to be formed is formed on the silicon nitride film 112. An opening 113 is then formed in the silicon nitride film 112 and the pad oxide film 111 by etching. For example, a reactive ion etching (RIE) apparatus or an electron cyclotron resonance (ECR) etching apparatus can be used for this etching. After the etching process, the resist mask is removed with an ashing apparatus or the like.

Figure 8:
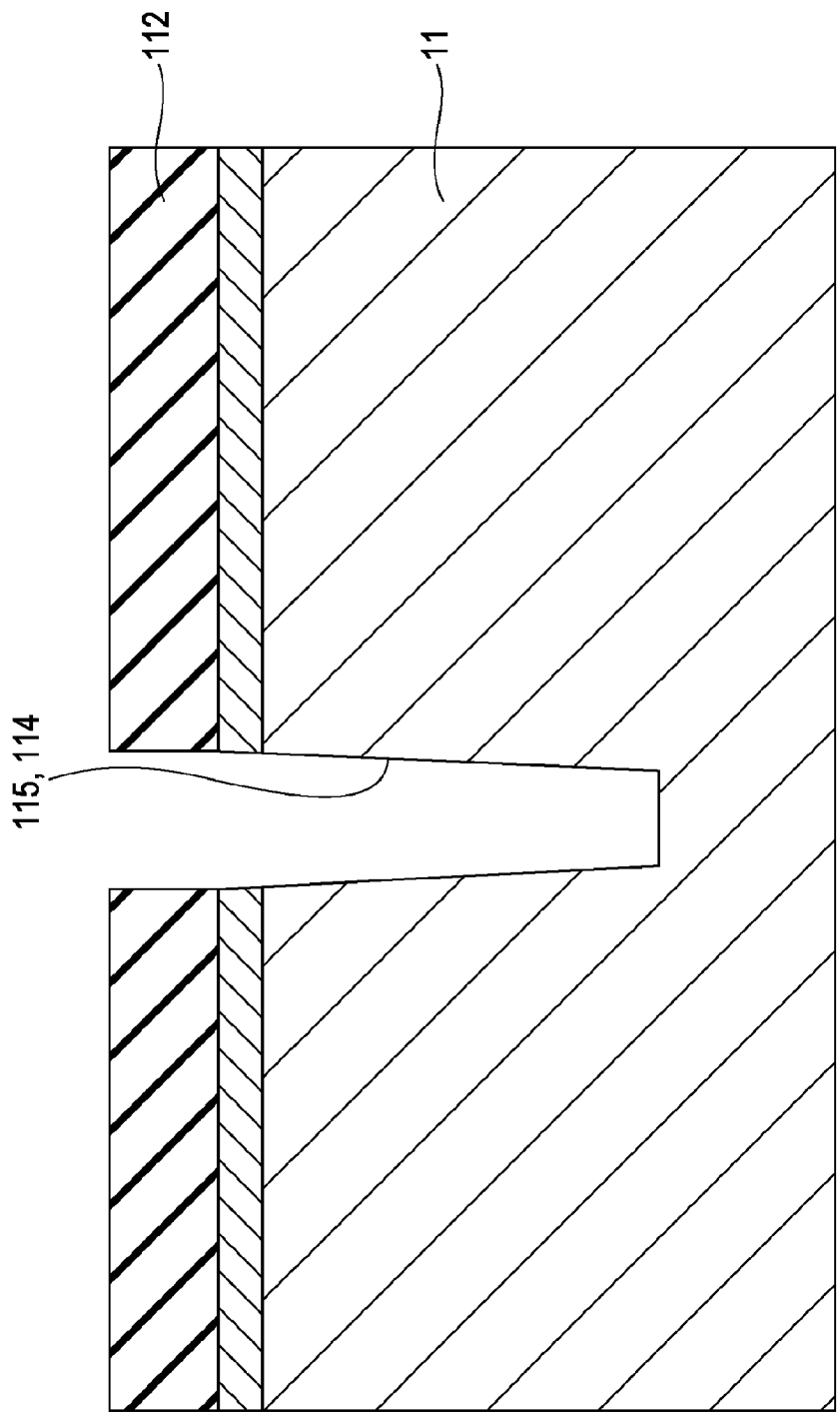
FIG. 8 is a cross-sectional view showing the first example of the method of producing a solid-state imaging device according to an embodiment of the present invention.

Next, as shown in FIG. 8, a first element isolation trench 114 is formed in the semiconductor substrate 11 using the silicon nitride film 112 as an etching mask. For example, an RIE apparatus or an ECR etching apparatus is used for this etching. First, a first etching of a second element isolation trench 115 (and the first element isolation trench 114) of a peripheral circuit portion 13 (and a pixel portion 12) is performed. In this case, the depth of the first element isolation trench 114 (and the second element isolation trench 115) of the pixel portion 12 (and the peripheral circuit portion 13) is in the range of 50 to 160 nm. Subsequently, although not shown in the figure, a resist mask is formed on the pixel portion 12, and a second etching for extending only the second element isolation trench 115 in the peripheral circuit portion 13 is then performed. Thus, only the second element isolation trench 115 in the peripheral circuit portion 13 has a depth of, for example, 0.3 μm. The resist mask is then removed.

By forming such a shallow first element isolation trench 114 in the pixel portion 12, an effect of reducing the number of white flaws due to etching damage can be achieved. By decreasing the depth of the first element isolation trench 114, the area of an effective photoelectric conversion portion increases. This is advantageous in that the saturated electric charge (Qs) can be increased.

Next, although not shown in the figure, a liner film is formed. This liner film is formed by, for example, thermal oxidation at a temperature in the range of about 800° C. to 900° C. The liner film may be a silicon oxide film, a nitrogen-containing silicon oxide film, or a CVD silicon nitride film. The thickness of the liner film is in the range of about 4 to 10 nm. Although not shown in the figure, ion implantation of boron (B) for suppressing dark current is performed in the pixel portion 12 using a resist mask. As for an example of the conditions for the ion implantation, the implantation energy is set to be about 10 keV, and the dosage is set to be in the range of $1\times10^{12}$ to $1\times10^{14}$ cm$^{-2}$. In an area around the first element isolation trench 114 where an isolation region in the pixel portion 12 is to be formed, as the boron concentration increases, dark current can be more effectively suppressed to suppress a parasitic transistor operation. However, if the boron concentration is too high, the area of the photodiode constituting the photoelectric conversion portion is decreased, thereby decreasing the saturated electric charge (Qs). For these reasons, the dosage is specified as described above.

Figure 9:
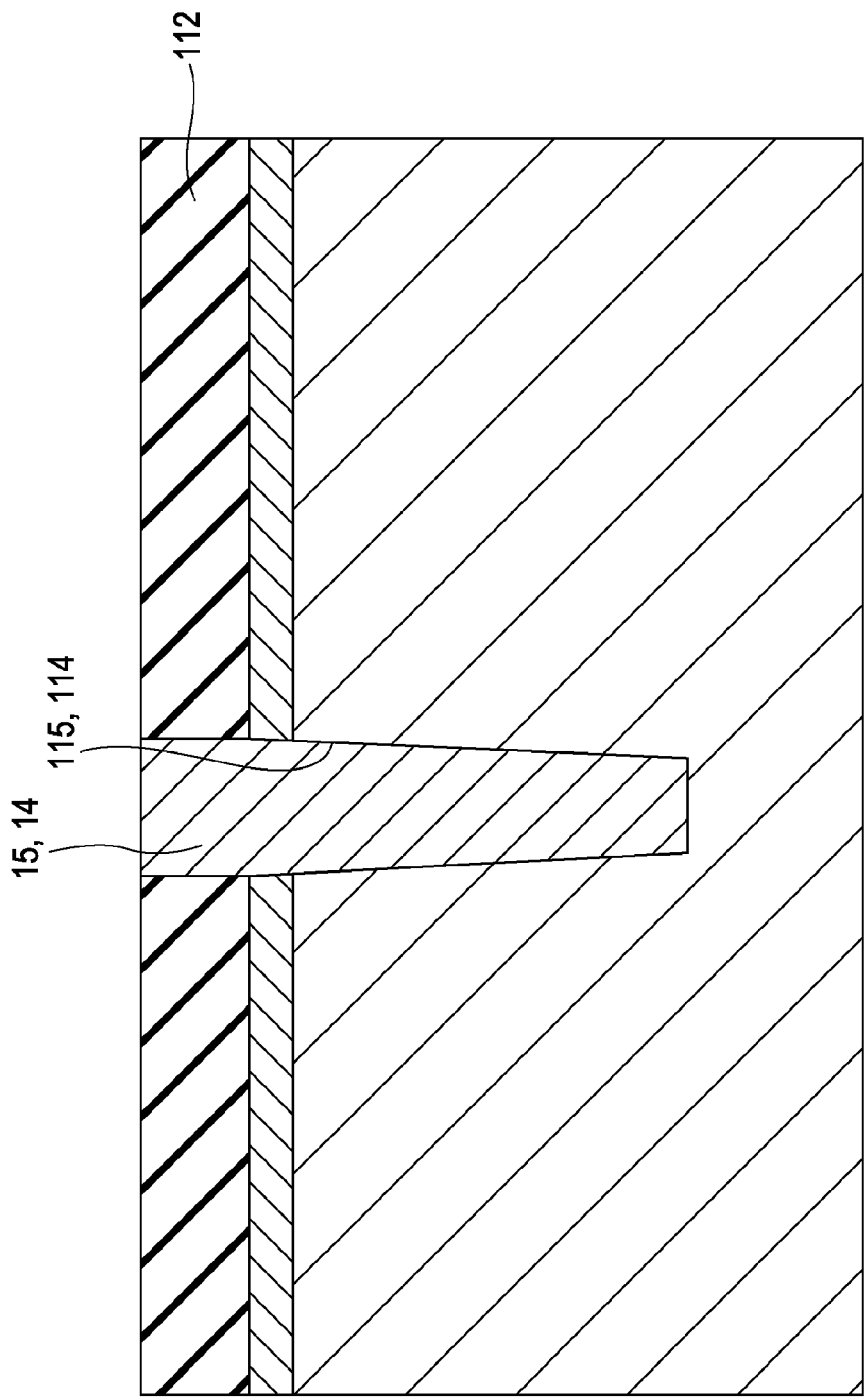
FIG. 9 is a cross-sectional view showing the first example of the method of producing a solid-state imaging device according to an embodiment of the present invention.

Next, as shown in FIG. 9, an insulating film is formed on the silicon nitride film 112 so as to fill the inside of the second element isolation trench 115 (and the first element isolation trench 114). This insulating film is formed by depositing silicon oxide by, for example, a high-density plasma CVD method. Subsequently, an excess portion of the insulating film formed on the silicon nitride film 112 is removed by, for example, chemical mechanical polishing (CMP). Consequently, the insulating film remains inside the second element isolation trench 115 (first element isolation trench 114) to form the second isolation region 15 (first isolation region 14) composed of the insulating film. In the CMP, the silicon nitride film 112 functions as a stopper to stop the CMP. The first isolation region 14 is formed so as to be shallower than the second isolation region 15 in the peripheral circuit portion 13. However, the silicon nitride film 112 is commonly used as the stopper, and thus the amount of projection of the first isolation region 14 is set to be the same as the amount of projection of the second isolation region 15. Herein, in the phrase "a projection height of the first isolation region 14 is the same as a projection height of the second isolation region 15", the projection heights are defined as being the same as long as a difference in projection height is within a range of process variations due to a processing accuracy in production. Specifically, when a silicon nitride film 112 used as a mask in a trench process has a thickness of about 160 nm, the thickness of the silicon nitride film 112 formed on a wafer generally varies by about ±10% in a plane. The variation in thickness due to chemical mechanical polishing (CMP) is about ±20 to ±30 nm. Accordingly, even when the first isolation region 14 and the second isolation region 15 are formed so that the amount of projection in the pixel portion 12 is the same as that in the peripheral circuit portion 13, the amount of projection may vary in the range of about 20 to 30 nm. Suppose that a chip surface is closely observed and a pixel portion 12 is compared with a peripheral circuit portion 13 at certain positions on the surface. In this case, even if the projection heights are not completely the same values, the heights may be included in the category of "the same height" in this embodiment of the present invention as long as the difference in projection height between the pixel portion 12 and the peripheral circuit portion 13 is within 30 nm. Ultimately, a center condition for the projection heights of the first isolation region 14 and the second isolation region 15 is set to be low; for example, in the range of about 0 to 20 nm from the silicon surface.

Figure 10:
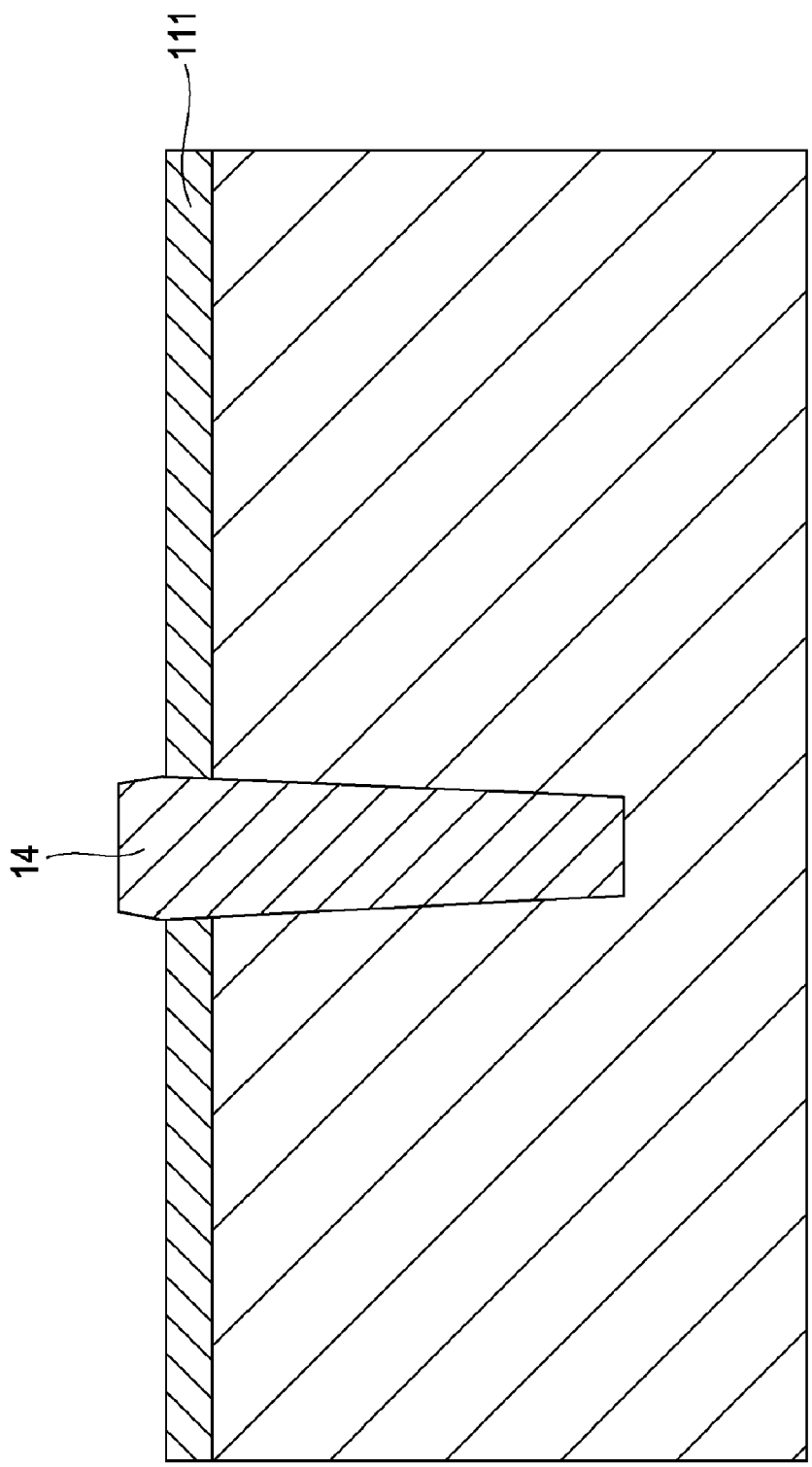
FIG. 10 is a cross-sectional view showing the first example of the method of producing a solid-state imaging device according to an embodiment of the present invention.

Next, as shown in FIG. 10, it order to adjust the height of a part of the first isolation region 14 projecting from the surface of the semiconductor substrate 11, wet etching of the oxide film is performed. The amount of etching of the oxide film is, for example, in the range of 40 to 100 nm. In this embodiment of the present invention, the first isolation region 14 having the shallow trench isolation (STI) structure is used so that the height of the part of the first isolation region 14 projecting from the semiconductor substrate 11 is low. However, if the depth of the STI of the first isolation region 14 is the same as the depth of the STI of the second isolation region 15 in the peripheral circuit portion 13, stress and etching damage on the photodiode constituting the photoelectric conversion portion 21 increase, resulting in an increase in the number of white flaws. Therefore, the first isolation region 14 is formed so as to be shallower than the second isolation region 15 in the peripheral circuit portion 13. In order to realize a high-speed operation, the depth of the STI of the second isolation region 15 in the peripheral circuit portion 13 is increased to reduce parasitic resistance between wiring and the substrate. Subsequently, the silicon nitride film 112 (see FIG. 9) is removed to expose the pad oxide film 111. The silicon nitride film 112 is removed by, for example, wet etching using hot phosphoric acid.

Figure 11:
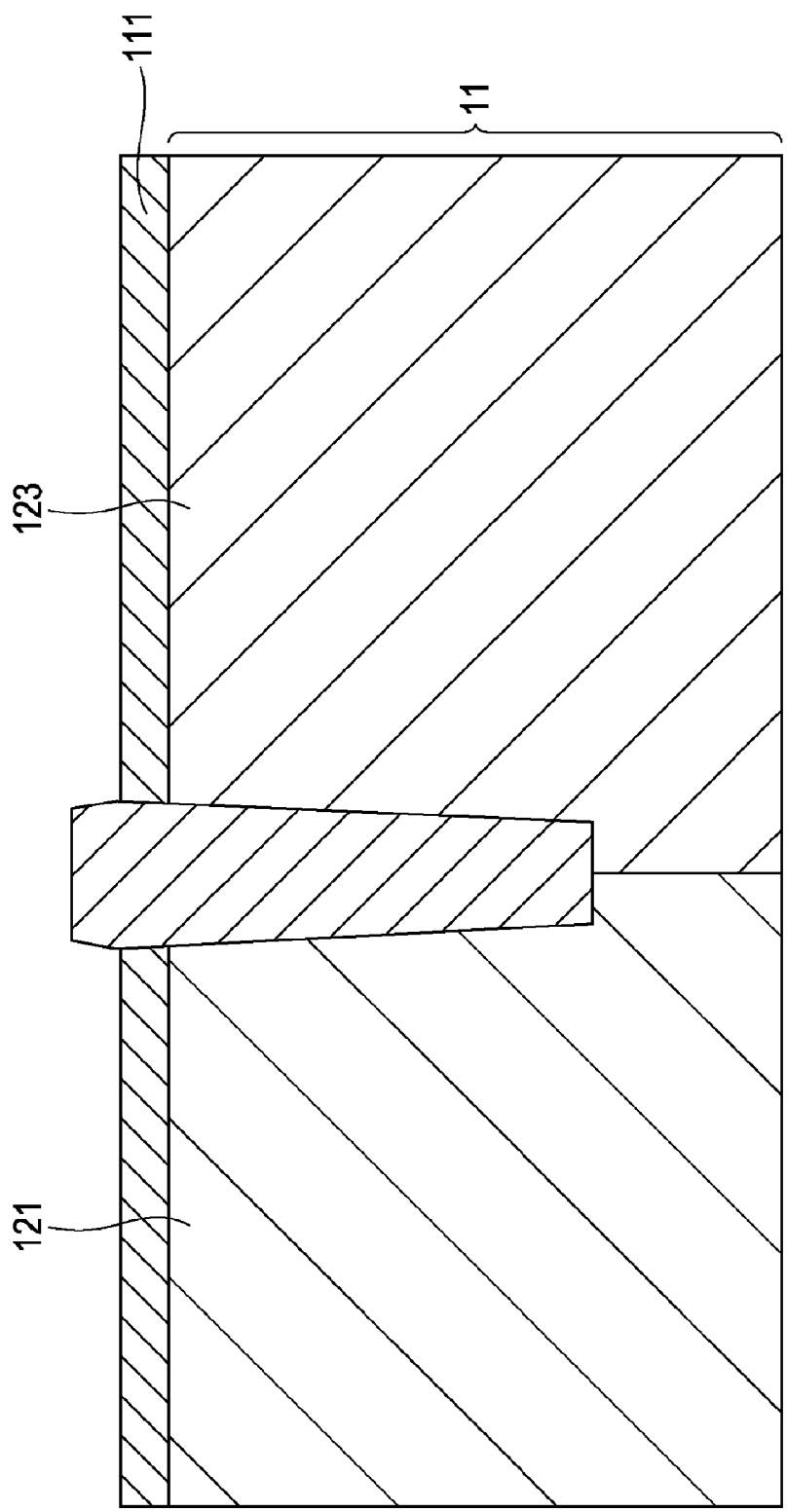
FIG. 11 is a cross-sectional view showing the first example of the method of producing a solid-state imaging device according to an embodiment of the present invention.

Next, as shown in FIG. 11, in a state in which the pad oxide film 111 is provided, a p-well 121 is formed on the semiconductor substrate 11 by ion implantation using a resist mask (not shown) having an opening on an area where the p-well 121 is to be formed. Channel ion implantation is further performed. The resist mask is then removed. In addition, in a state in which the pad oxide film 111 is provided, an n-well 123 is formed on the semiconductor substrate 11 by ion implantation using a resist mask (not shown) having an opening on an area where the n-well 123 is to be formed. Channel ion implantation is further performed. The resist mask is then removed. The ion implantation for the p-well 121 is performed using boron (B) as an ion implantation species. In this ion implantation, the implantation energy is set to be, for example, about 200 keV and the dosage is set to be, for example, $1 \times 10^{13}$ cm$^{-2}$. The channel ion implantation for the p-well 121 is performed using boron (B) as an ion implantation species. In this channel ion implantation, the implantation energy is set to be in the range of, for example, about 10 to 20 keV and the dosage is set to be in the range of, for example, $1 \times 10^{11}$ to $1 \times 10^{13}$ cm$^{-2}$. The ion implantation for the n-well 123 is performed using, for example, phosphorus (P) as an ion implantation species. In this ion implantation, the implantation energy is set to be in the range of, for example, about 200 keV and the dosage is set to be, for example, $1 \times 10^{13}$ cm$^{-2}$. The channel ion implantation for the n-well 123 is performed using, for example, arsenic (As) as an ion implantation species. In this channel ion implantation, implantation energy is set to be, for example, about 100 keV and the dosage is set to be in the range of, for example, $1 \times 10^{11}$ to $1 \times 10^{13}$ cm$^{-2}$. Furthermore, although not shown in the figure, ion implantation for forming a photodiode in the photoelectric conversion portion is performed to form a p-type region. For example, ion implantation of boron (B) is performed on a surface of the semiconductor substrate in which the photoelectric conversion portion is to be formed. Ion implantation is further performed in a deep region using arsenic (As) or phosphorus (P) to form an n-type region that forms a junction with a lower portion of the p-type region. Thus, the photoelectric conversion portion having a p-n junction is formed.

Figure 12:
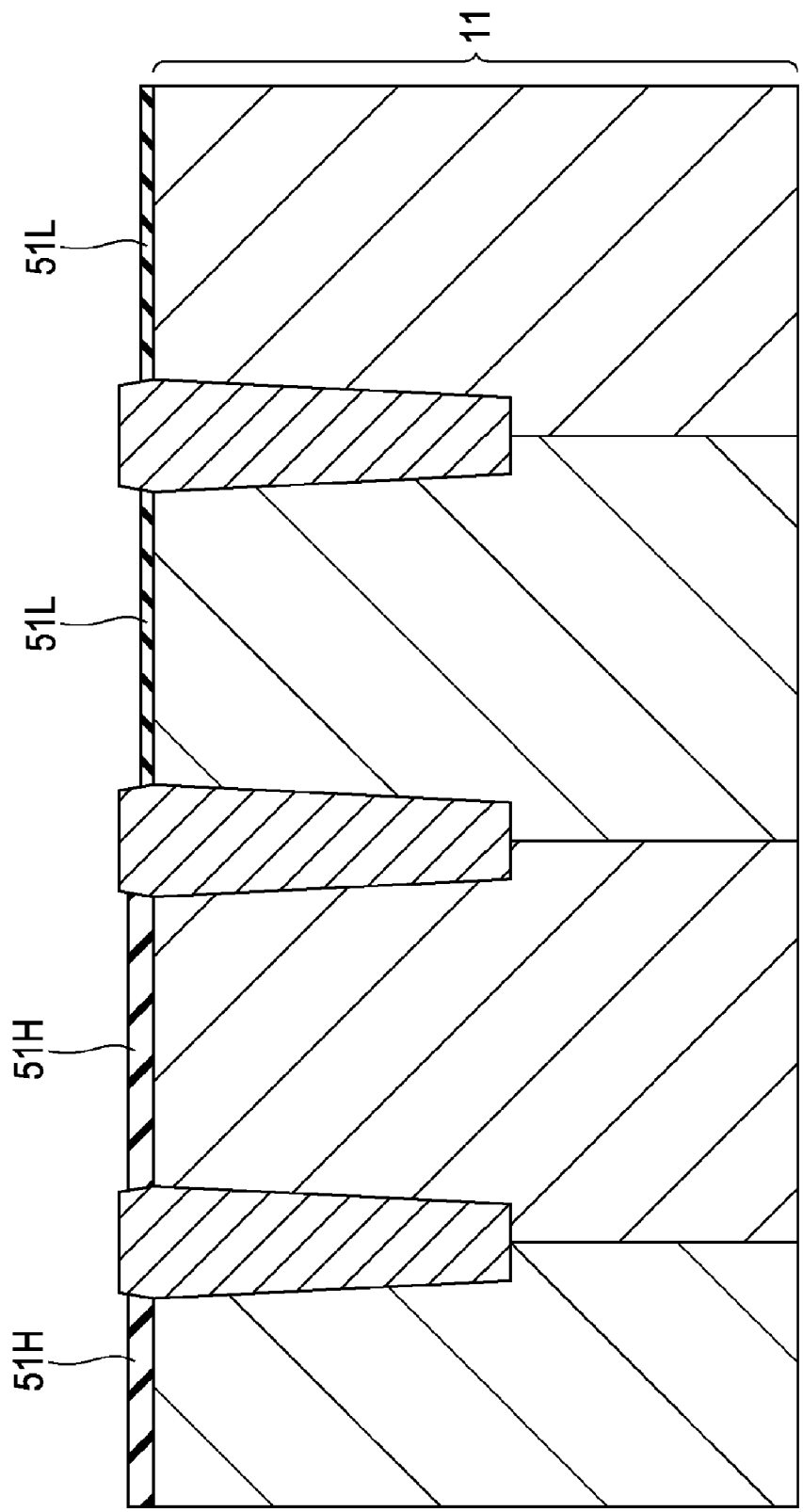
FIG. 12 is a cross-sectional view showing the first example of the method of producing a solid-state imaging device according to an embodiment of the present invention.

Next, as shown in FIG. 12, the pad oxide film 111 (see FIG. 11) is removed by, for example, wet etching. Next, a gate insulating film 51H with a large thickness for a high voltage is formed on the semiconductor substrate 11. The thickness of the gate insulating film 51H is about 7.5 nm in a transistor for a power supply voltage of 3.3 V, and about 5.5 nm in a transistor for a power supply voltage of 2.5 V. Subsequently, a resist mask (not shown) is formed on the gate insulating film 51H with a large thickness for a high voltage, and the gate insulating film 51H with a large thickness formed on a transistor region for a low voltage is removed. After the resist mask is removed, a gate insulating film 51L with a small thickness is formed in the transistor region for a low voltage on the semiconductor substrate 11. The thickness of the gate insulating film 51L is in the range of about 1.2 to 1.8 nm in a transistor for a power supply voltage of 1.0 V. A gate insulating film 31 (not shown) with a small thickness is formed at the same time in the transistor-forming region in the pixel portion. Each of the gate insulating films 51H, 51L, and 31 is composed of, for example, a thermally oxidized silicon film. Alternatively, each of the gate insulating films 51H, 51L, and 31 may be composed of a silicon oxynitride film grown by rapid thermal oxidation (RTO). Alternatively, in order to further decrease a gate leakage, a high dielectric film such as an oxide film or an oxynitride film of hafnium (Hf), zirconium (Zr), or the like may be used. In the subsequent figures, for the sake of convenience, the gate insulating film 51H with a large thickness and the gate insulating film 51L with a small thickness are shown as films having the same thickness.

Figure 13:
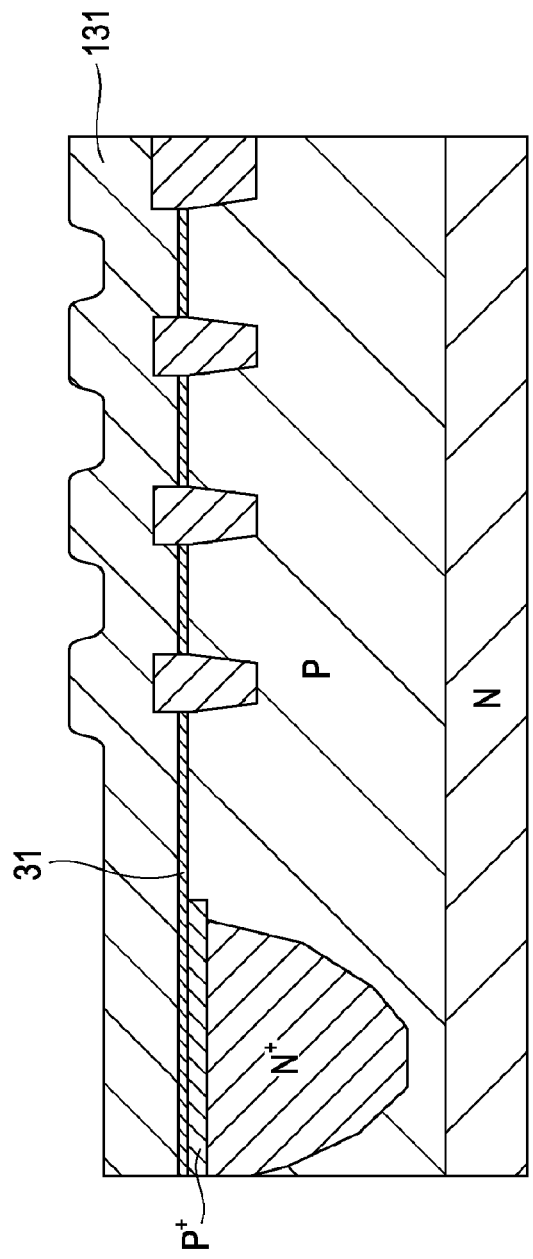
FIG. 13 is a cross-sectional view showing the first example of the method of producing a solid-state imaging device according to an embodiment of the present invention.
Figure 14:
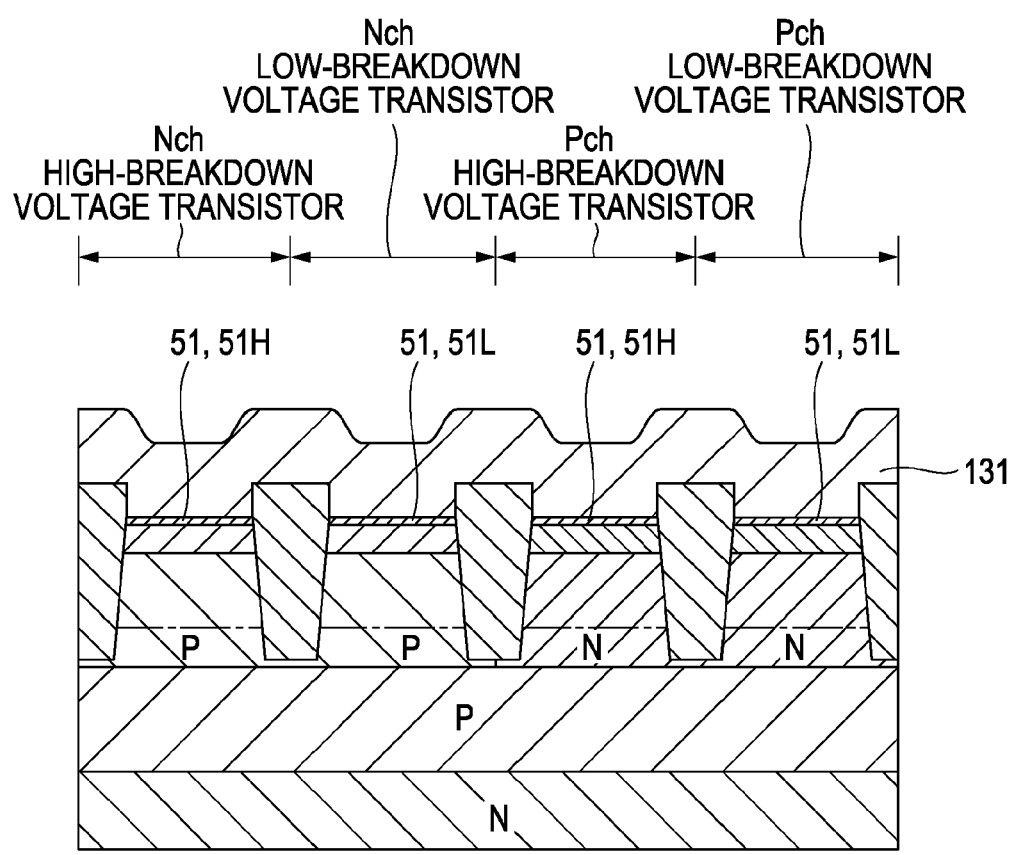
FIG. 14 is a cross-sectional view showing the first example of the method of producing a solid-state imaging device according to an embodiment of the present invention.

Next, as shown in the cross-sectional view of the pixel portion of FIG. 13 and the cross-sectional view of the peripheral circuit portion of FIG. 14, a gate electrode-forming film 131 is formed on the gate insulating film 51 (51H and 51L) and the gate insulating film 31. The gate electrode-forming film 131 is formed by depositing polysilicon by, for example, an LP-CVD method. The deposited film thickness depends on the technical node, but is in the range of 150 to 200 nm in a 90-nm node. The film thickness tends to decrease for every node because a gate aspect ratio is not generally increased from the standpoint of the controllability of the process. As a measure to counter gate depletion, silicon germanium (SiGe) may be used instead of polysilicon. The gate depletion refers to the following problem: As the thickness of a gate oxide film decreases, not only an effect of the physical thickness of the gate oxide film but also an effect of the thickness of a depletion layer in a gate polysilicon is not negligible, and thus an effective thickness of the gate oxide film is not decreased, thereby degrading the transistor performance.

Figure 15:
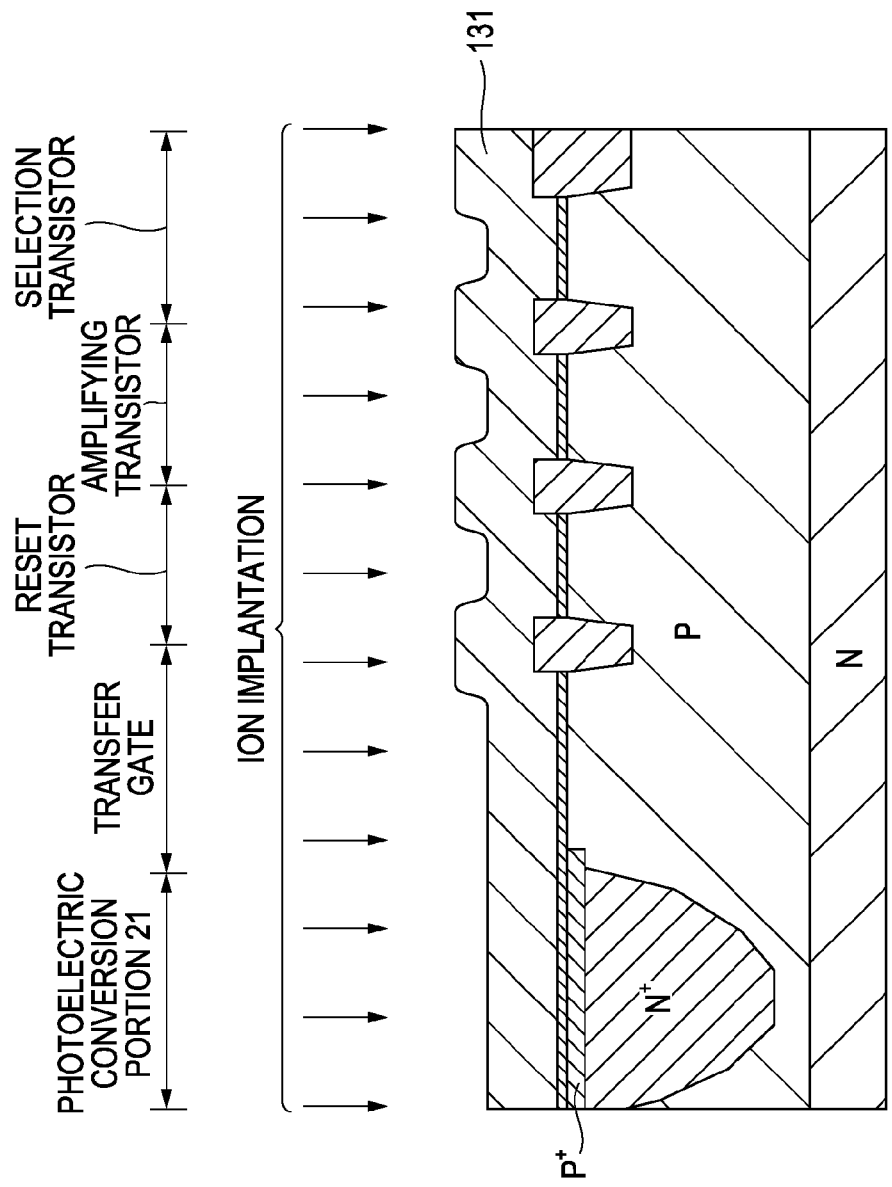
FIG. 15 is a cross-sectional view showing the first example of the method of producing a solid-state imaging device according to an embodiment of the present invention.
Figure 16:
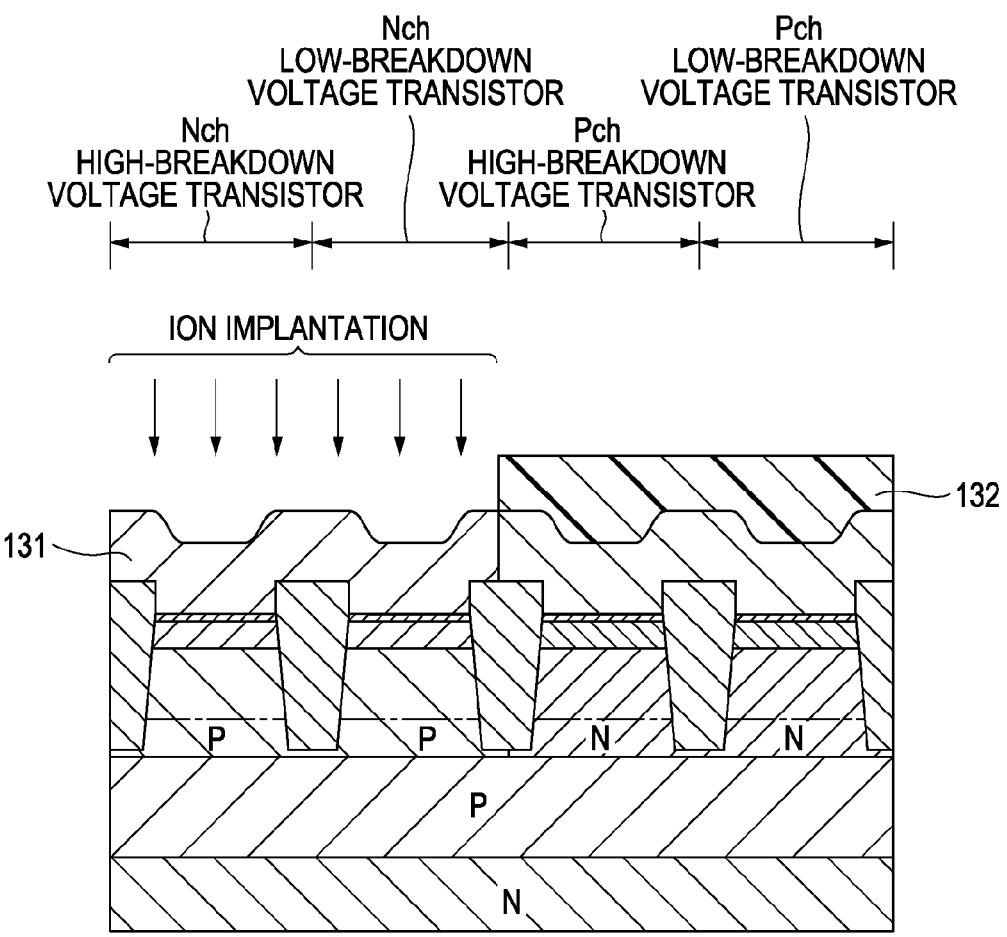
FIG. 16 is a cross-sectional view showing the first example of the method of producing a solid-state imaging device according to an embodiment of the present invention.

Next, as shown in the cross-sectional view of the pixel portion of FIG. 15 and the cross-sectional view of the peripheral circuit portion of FIG. 16, a measure to counter the gate depletion is taken. First, a resist mask 132 is formed on a p-MOS transistor-forming region, and an n-type impurity is then doped into the gate electrode-forming film 131 in an n-MOS transistor-forming region. This doping is conducted by ion implantation of, for example, phosphorus (P) or arsenic (As). The amount of ions implanted is in the range of about $1 \times 10^{15}$ to $1 \times 10^{16}$ cm$^{-2}$. The resist mask 132 is then removed. Next, although not shown in the figure, a resist mask (not shown) is formed on the n-MOS transistor-forming region, and a p-type impurity is doped into the gate electrode-forming film 131 in the p-MOS transistor-forming region. This doping is performed by ion implantation of, for example, boron (B), boron difluoride (BF$_2$), or indium (In). The amount of ions implanted is in the range of about $1 \times 10^{15}$ to $1 \times 10^{16}$ cm$^{-2}$. The resist mask is then removed. Either the former implantation or the latter implantation may be performed first. In each of the above ion implantations, in order to prevent impurities introduced by the ion implantation from reaching right under the gate insulating film, ion implantation of nitrogen (N$_2$) may be combined.

Figure 17:
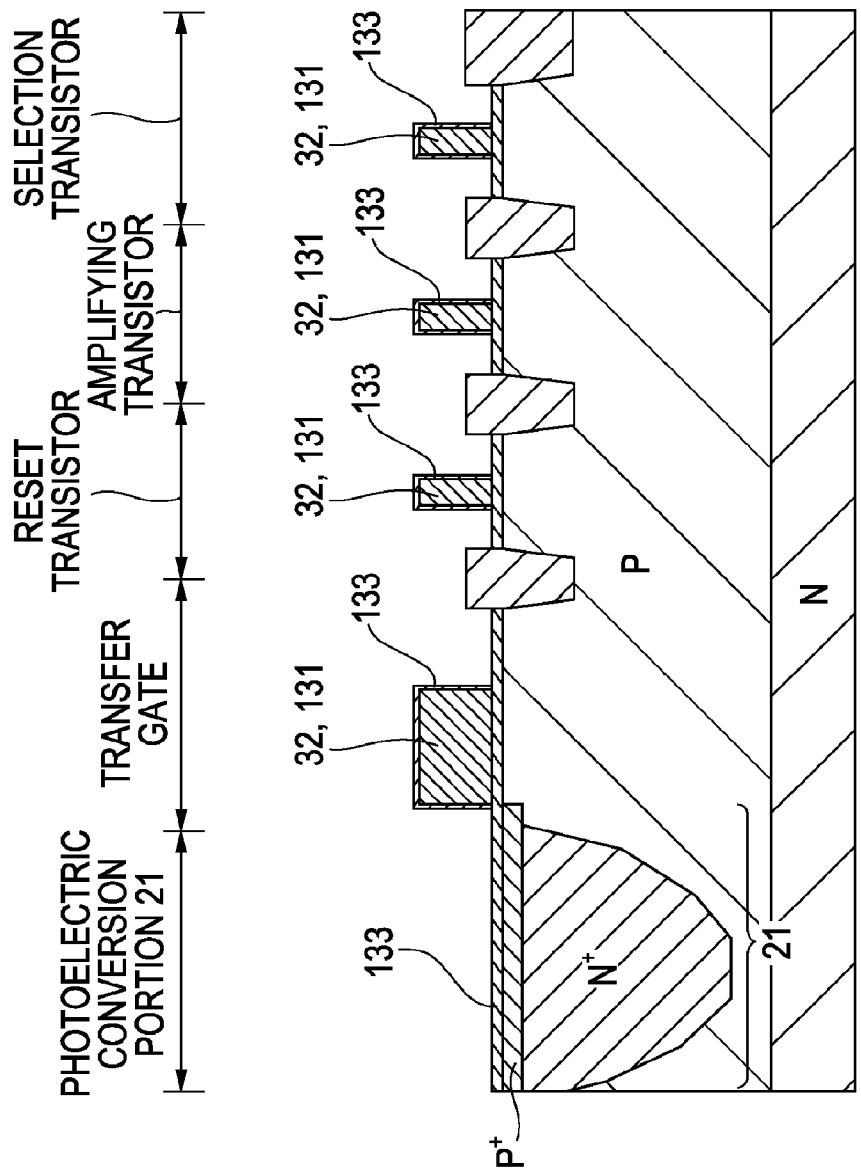
FIG. 17 is a cross-sectional view showing the first example of the method of producing a solid-state imaging device according to an embodiment of the present invention.
Figure 18:
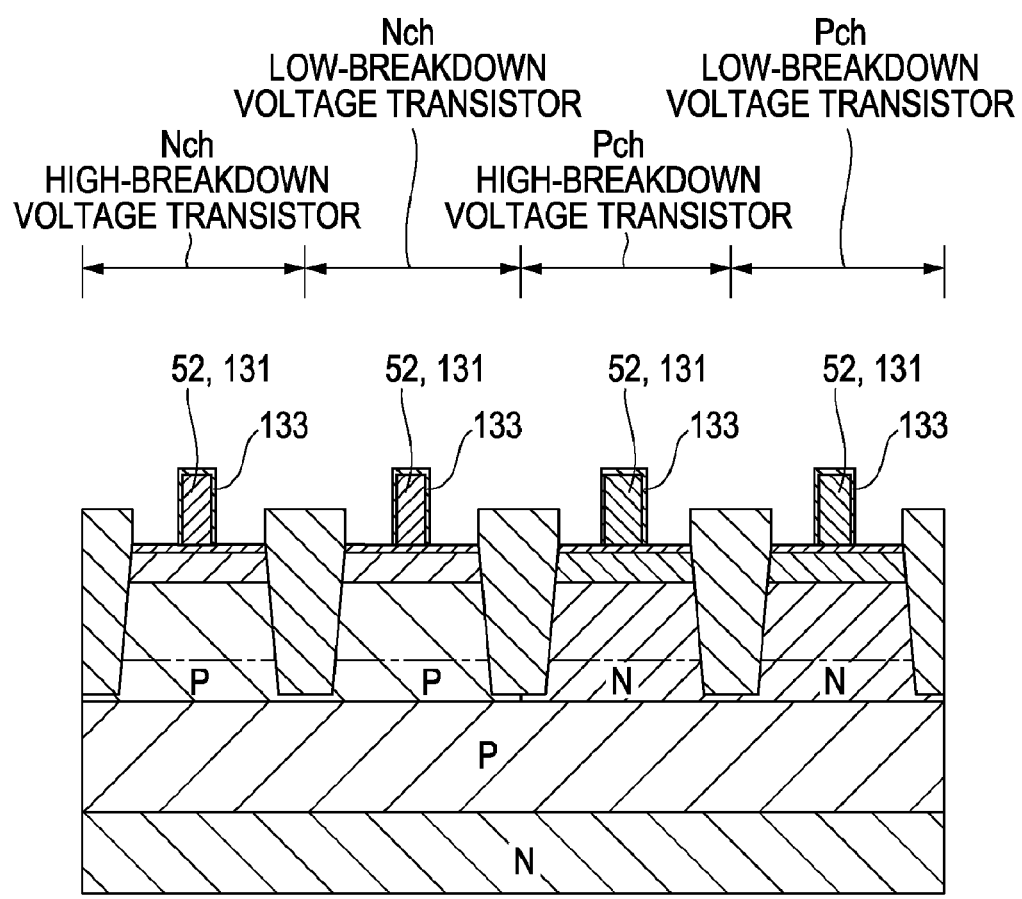
FIG. 18 is a cross-sectional view showing the first example of the method of producing a solid-state imaging device according to an embodiment of the present invention.

Next, as shown in the cross-sectional view of the pixel portion of FIG. 17 and the cross-sectional view of the peripheral circuit portion of FIG. 18, a resist mask (not shown) for forming gate electrodes is formed on the gate electrode-forming film 131. The gate electrode-forming film 131 is etching-processed by reactive ion etching using this resist mask as an etching mask to form gate electrodes 32 of MOS transistors in the pixel portion 12 and gate electrodes 52 of MOS transistors in the peripheral circuit portion 13. Subsequently, the surfaces of the gate electrodes 32 and 52 are oxidized to form an oxide film 133. The thickness of the oxide film 133 is, for example, in the range of 1 to 10 nm. The oxide film 133 is formed not only on the sidewalls but also on the top surface of each of the gate electrodes 32 and 52. Furthermore, rounding edge portions of the gate electrodes 32 and 52 in the above oxidization step has an effect of improving the breakdown voltage of the oxide film. In addition, etching damage can be decreased by performing the heat treatment. Furthermore, in the above processing of the gate electrodes, even if the gate insulating film formed on the photoelectric conversion portion 21 is removed, the oxide film 133 is formed also on the photoelectric conversion portion 21. Therefore, when a resist film is formed on the photoelectric conversion portion 21 in the subsequent step of lithography, the resist film is formed not directly on a surface of silicon, and thus contamination due to this resist can be prevented. Accordingly, for the photoelectric conversion portion 21 in the pixel portion 12, this structure serves as a measure to counter white flaws.

Figure 19:
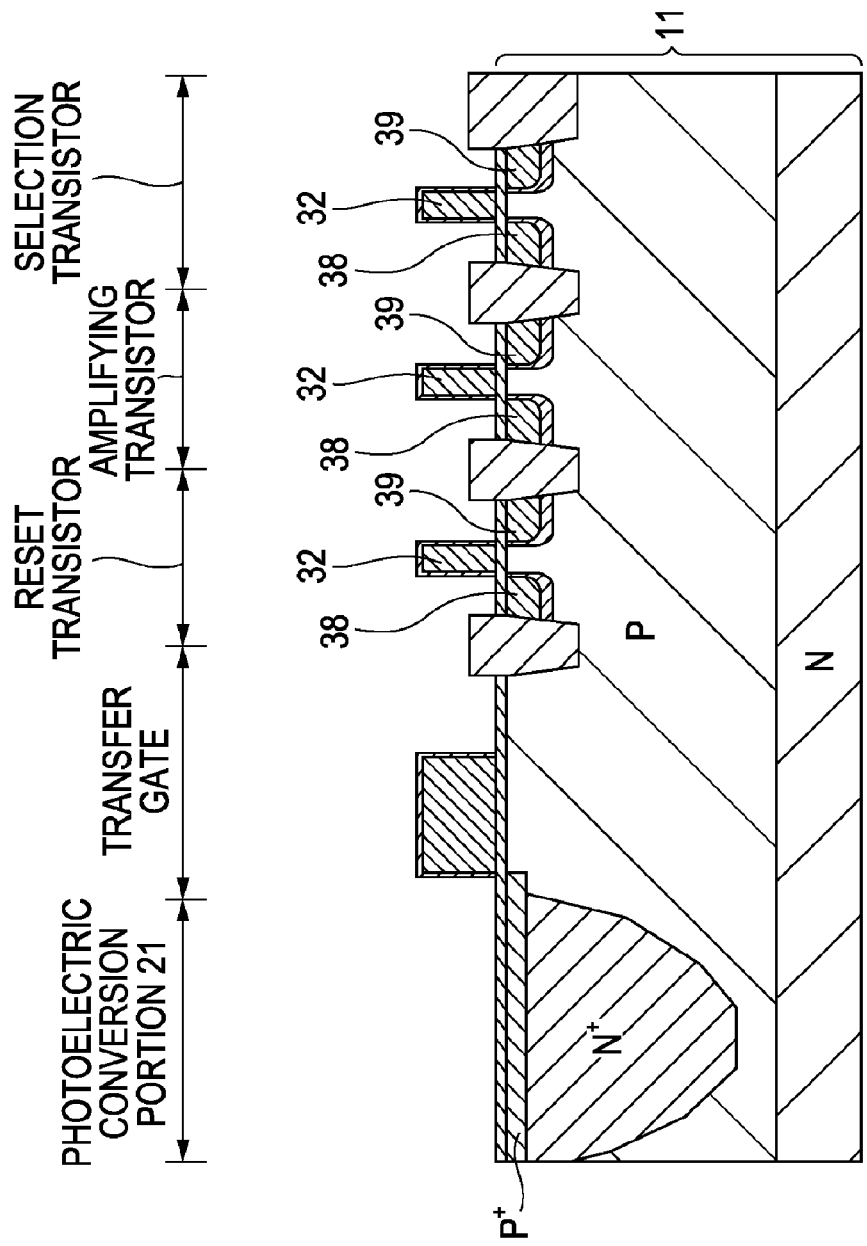
FIG. 19 is a cross-sectional view showing the first example of the method of producing a solid-state imaging device according to an embodiment of the present invention.
Figure 20:
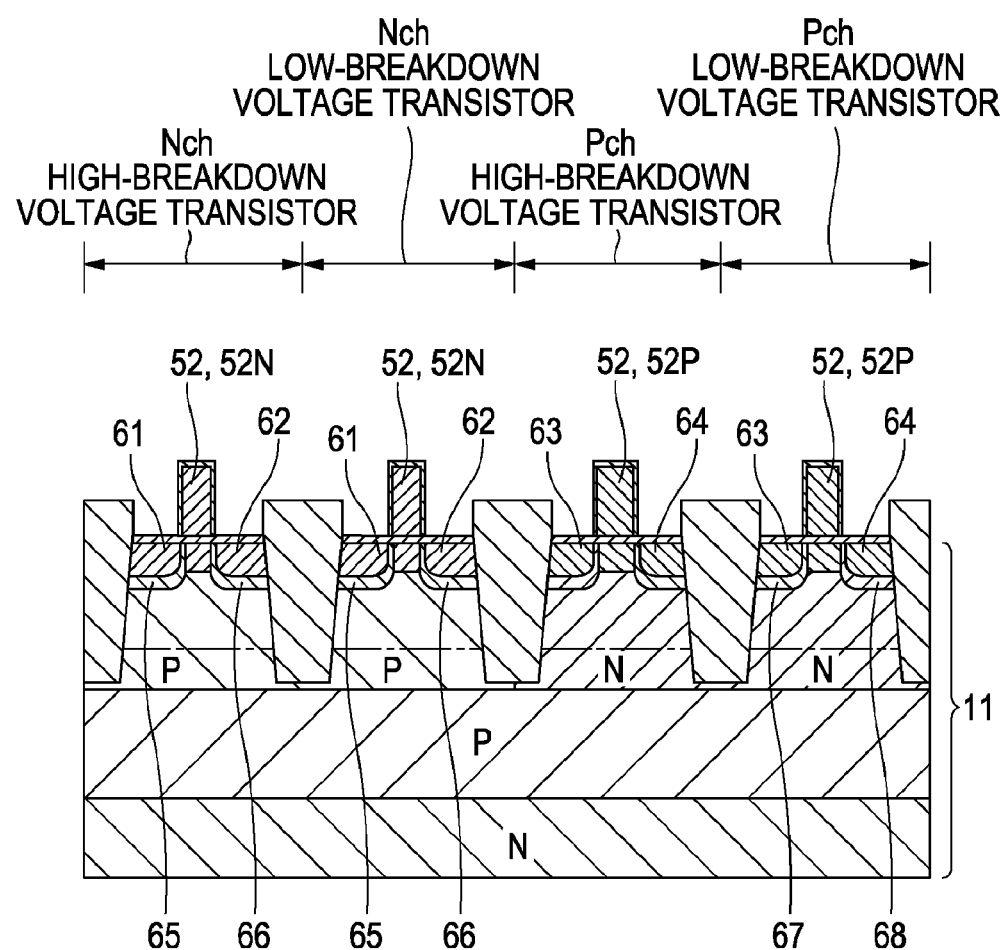
FIG. 20 is a cross-sectional view showing the first example of the method of producing a solid-state imaging device according to an embodiment of the present invention.

Next, as shown in the cross-sectional view of the pixel portion of FIG. 19 and the cross-sectional view of the peripheral circuit portion of FIG. 20, LDD regions 38, 39, etc. of the MOS transistors in the pixel portion 12 and LDD regions 61, 62, 63, 64, etc. of the MOS transistors in the peripheral circuit portion 13 are formed.

First, as for NMOS transistors formed in the peripheral circuit portion 13, pocket diffusion layers 65 and 66 are formed at both sides of each of the gate electrodes 52 (52N) in the semiconductor substrate 11. These pocket diffusion layers 65 and 66 are formed by ion implantation using, for example, boron difluoride ($BF_2$), boron (B), or indium (In) as an ion implantation species, and the dosage thereof is set to be, for example, in the range of $1 \times 10^{12}$ to $1 \times 10^{14}$ cm$^{-2}$. Furthermore, the LDD regions 61 and 62 are formed at both sides of each of the gate electrodes 52 (52N) in the semiconductor substrate 11. The LDD regions 61 and 62 are formed by ion implantation using, for example, arsenic (As) or phosphorus (P) as an ion implantation species, and the dosage thereof is set to be, for example, in the range of $1 \times 10^{13}$ to $1 \times 10^{15}$ cm$^{-2}$.

As for MOS transistors formed in the pixel portion 12, the LDD regions 38 and 39 are formed at both sides of each of the gate electrodes 32 in the semiconductor substrate 11. The LDD regions 38 and 39 are formed by ion implantation using, for example, arsenic (As) or phosphorus (P) as an ion implantation species, and the dosage thereof is set to be, for example, in the range of $1 \times 10^{13}$ to $1 \times 10^{15}$ cm$^{-2}$. In addition, pocket diffusion layers may be formed. As for the MOS transistors formed in the pixel portion 12, the LDD regions may not be formed from the standpoint of reducing the number of steps. Alternatively, the ion implantation for forming the LDD regions for the MOS transistors formed in the pixel portion 12 may also function as the LDD ion implantation for the MOS transistors formed in the peripheral circuit portion 13.

As for PMOS transistors formed in the peripheral circuit portion 13, pocket diffusion layers 67 and 68 are formed at both sides of each of the gate electrodes 52 (52P) in the semiconductor substrate 11. These pocket diffusion layers 67 and 68 are formed by ion implantation using, for example, arsenic (As) or phosphorus (P) as an ion implantation species, and the dosage thereof is set to be, for example, in the range of $1 \times 10^{12}$ to $1 \times 10^{14}$ cm$^{-2}$. Furthermore, the LDD regions 63 and 64 are formed at both sides of each of the gate electrodes 52 (52P) in the semiconductor substrate 11. The LDD regions 63 and 64 are formed by ion implantation using, for example, boron difluoride ($BF_2$), boron (B), or indium (In) as an ion implantation species, and the dosage thereof is set to be, for example, in the range of $1 \times 10^{13}$ to $1 \times 10^{15}$ cm$^{-2}$.

Before the pocket ion implantations of the NMOS transistors and PMOS transistors in the peripheral circuit portion, pre-amorphization may be performed by conducting ion implantation of germanium (Ge) as a technique for suppressing channeling in implantation. Furthermore, in order to reduce the number of implantation defects that may cause transient enhanced diffusion (TED) or the like, rapid thermal annealing (RTA) at a temperature in the range of about 800° C. to 900° C. may be added after the formation of the LDD regions.

Figure 21:
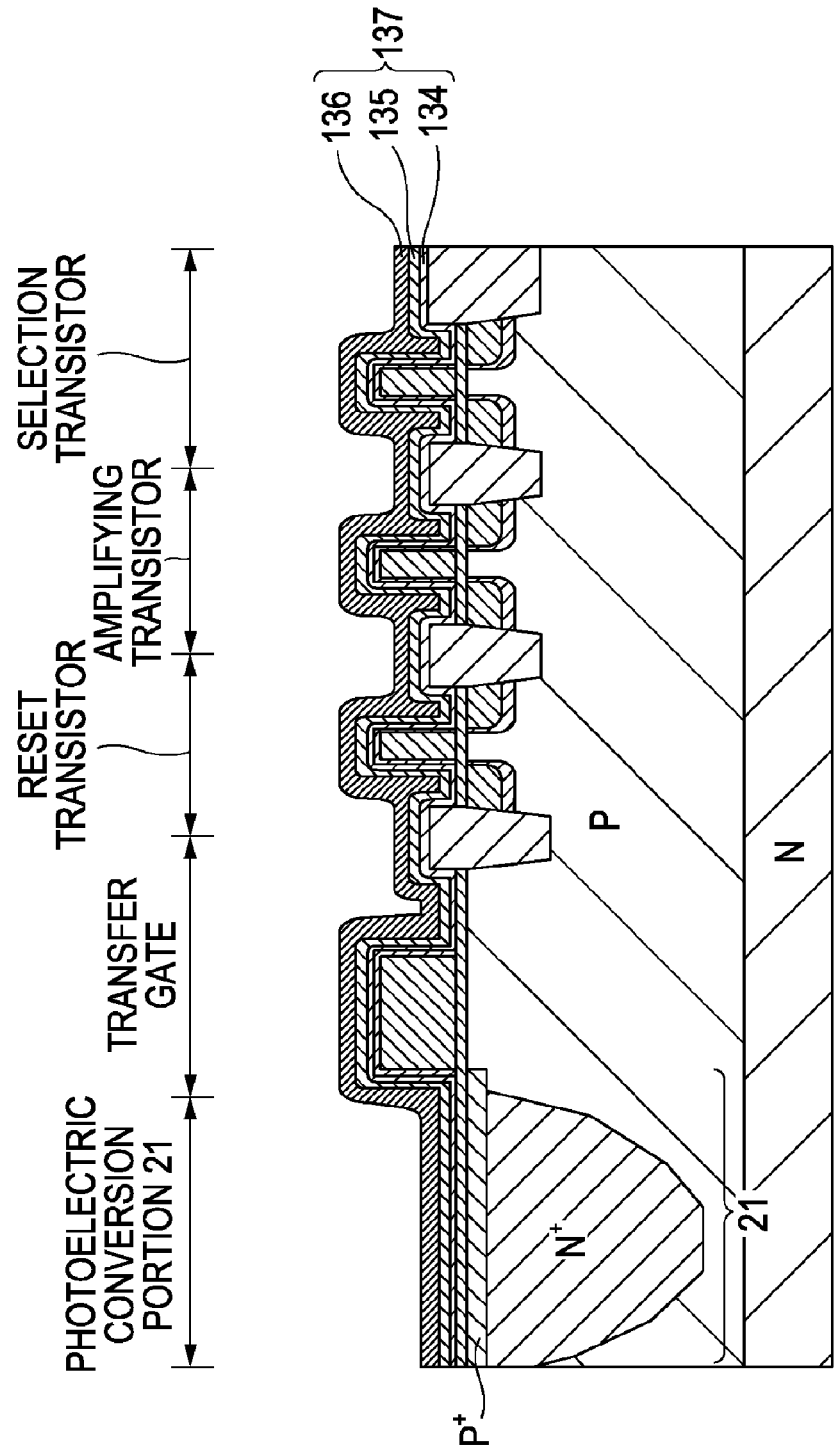
FIG. 21 is a cross-sectional view showing the first example of the method of producing a solid-state imaging device according to an embodiment of the present invention.

Next, as shown in the cross-sectional view of the pixel portion of FIG. 21 and the cross-sectional view of the peripheral circuit portion of FIG. 22, a silicon oxide ($SiO_2$) film 134 is formed on the entire surface of the pixel portion 12 and the peripheral circuit portion 13. This silicon oxide film 134 is formed by depositing a non-doped silicate glass (NSG) film, a low-pressure tetraethyl orthosilicate (LP-TEOS) film, a high-temperature oxide (HTO) film, or the like. The silicon oxide film 134 is formed so as to have a thickness in the range of, for example, 5 to 20 nm. Next, a silicon nitride film 135 is formed on the silicon oxide film 134. This silicon nitride film 135 is composed of, for example, a silicon nitride film formed by low-pressure chemical vapor deposition (LPCVD). The thickness thereof is in the range of, for example, 10 to 100 nm. The silicon nitride film 135 may be an ALD silicon nitride film formed by an atomic layer deposition method by which the film can be formed at a low temperature. On the photoelectric conversion portion 21 in the pixel portion 12, as the thickness of the silicon oxide film 134 disposed right under the silicon nitride film 135 decreases, light reflection is prevented, and thus the sensitivity of the photoelectric conversion portion 21 becomes high. Next, a silicon oxide ($SiO_2$) film 136, which is a third layer, is optionally deposited on the silicon nitride film 135. This silicon oxide film 136 is formed by depositing an NSG film, an LP-TEOS film, an HTO film, or the like. The silicon oxide film 136 is formed so as to have a thickness in the range of, for example, 10 to 100 nm.

Accordingly, a sidewall film 137 is formed as a three-layered film having a structure of silicon oxide film 136/silicon nitride film 135/silicon oxide film 134. Alternatively, the sidewall film 137 may be a two-layered film having a structure of silicon nitride film/silicon oxide film. A case of the sidewall film 137 having the three-layer structure will be described below.

Figure 23:
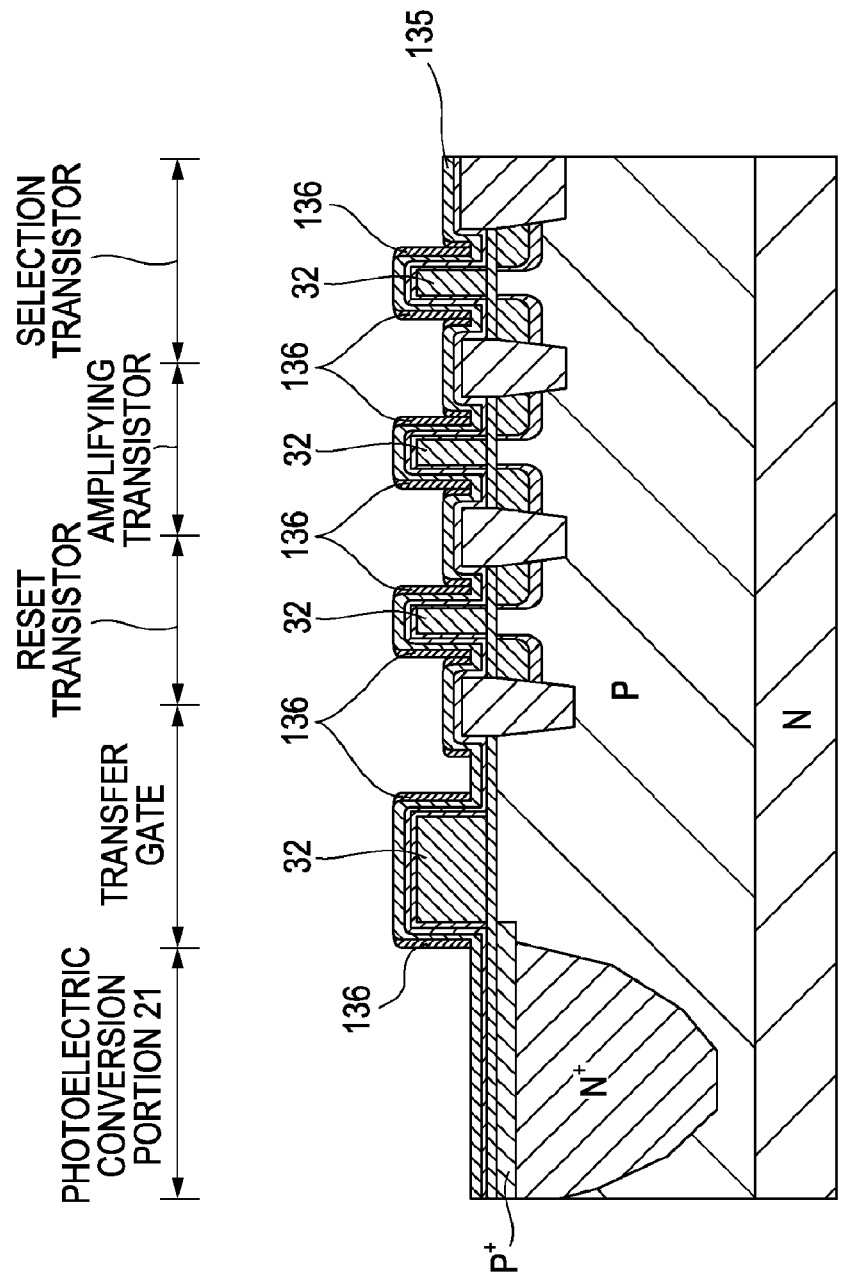
FIG. 23 is a cross-sectional view showing the first example of the method of producing a solid-state imaging device according to an embodiment of the present invention.
Figure 24:
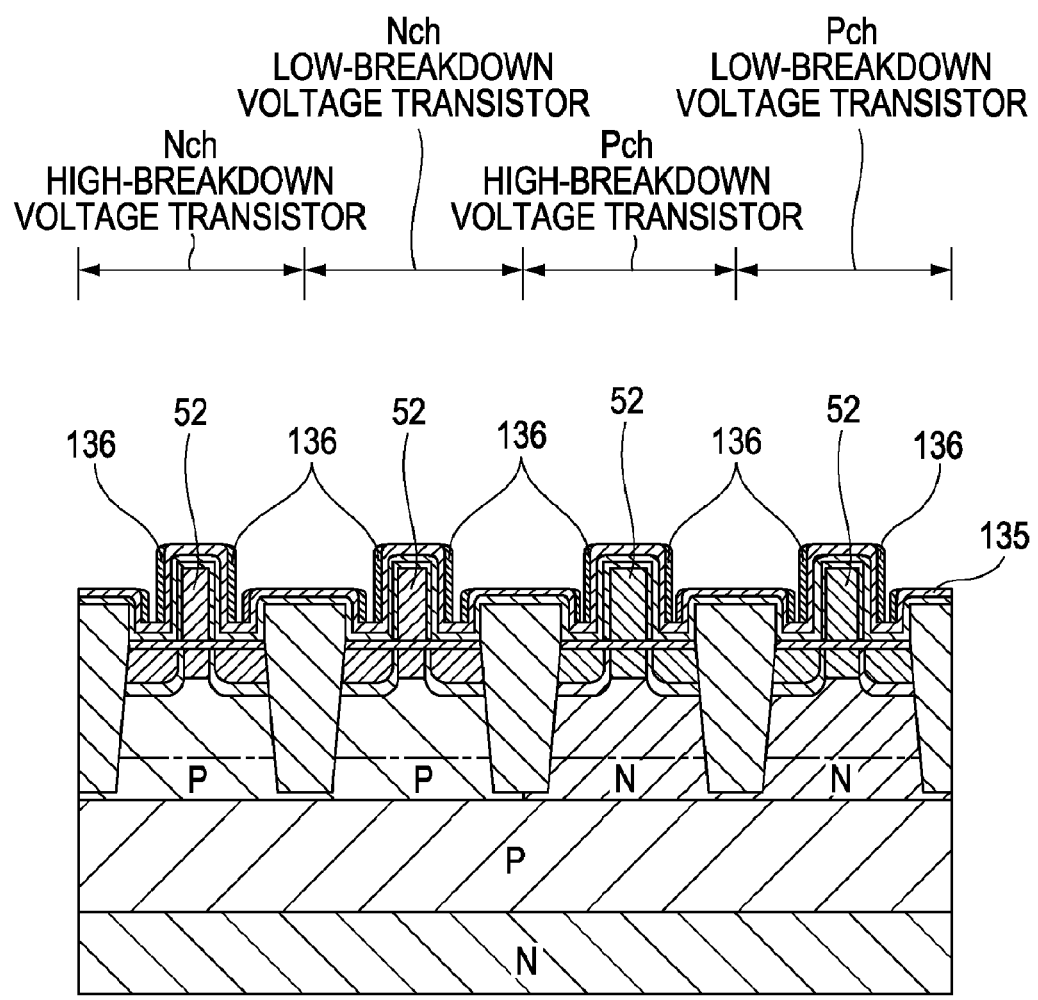
FIG. 24 is a cross-sectional view showing the first example of the method of producing a solid-state imaging device according to an embodiment of the present invention.

Next, as shown in the cross-sectional view of the pixel portion of FIG. 23 and the cross-sectional view of the peripheral circuit portion of FIG. 24, etching-back of the silicon oxide film 136, which is provided as the top layer, is performed so that the silicon oxide film 136 is left only on the side portions of each of the gate electrodes 32 and 52, and the like. The etching-back is performed by, for example, reactive ion etching (RIE). In this etching-back, etching is stopped using the silicon nitride film 135. Since the etching is stopped by the silicon nitride film 135 in this manner, etching damage on the photoelectric conversion portion 21 in the pixel portion 12 can be reduced, and thus the number of white flaws can be decreased.

Figure 25:
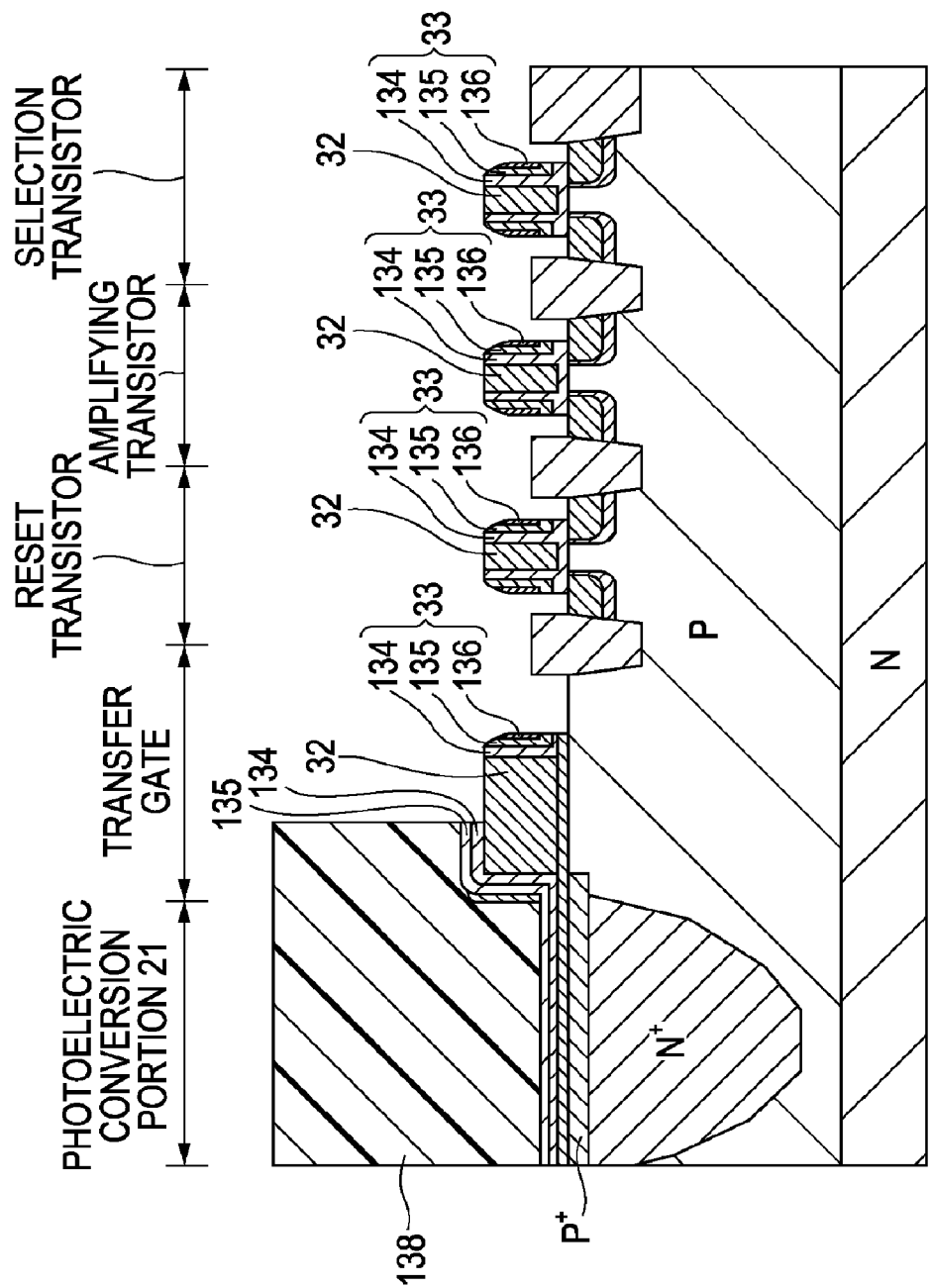
FIG. 25 is a cross-sectional view showing the first example of the method of producing a solid-state imaging device according to an embodiment of the present invention.
Figure 26:
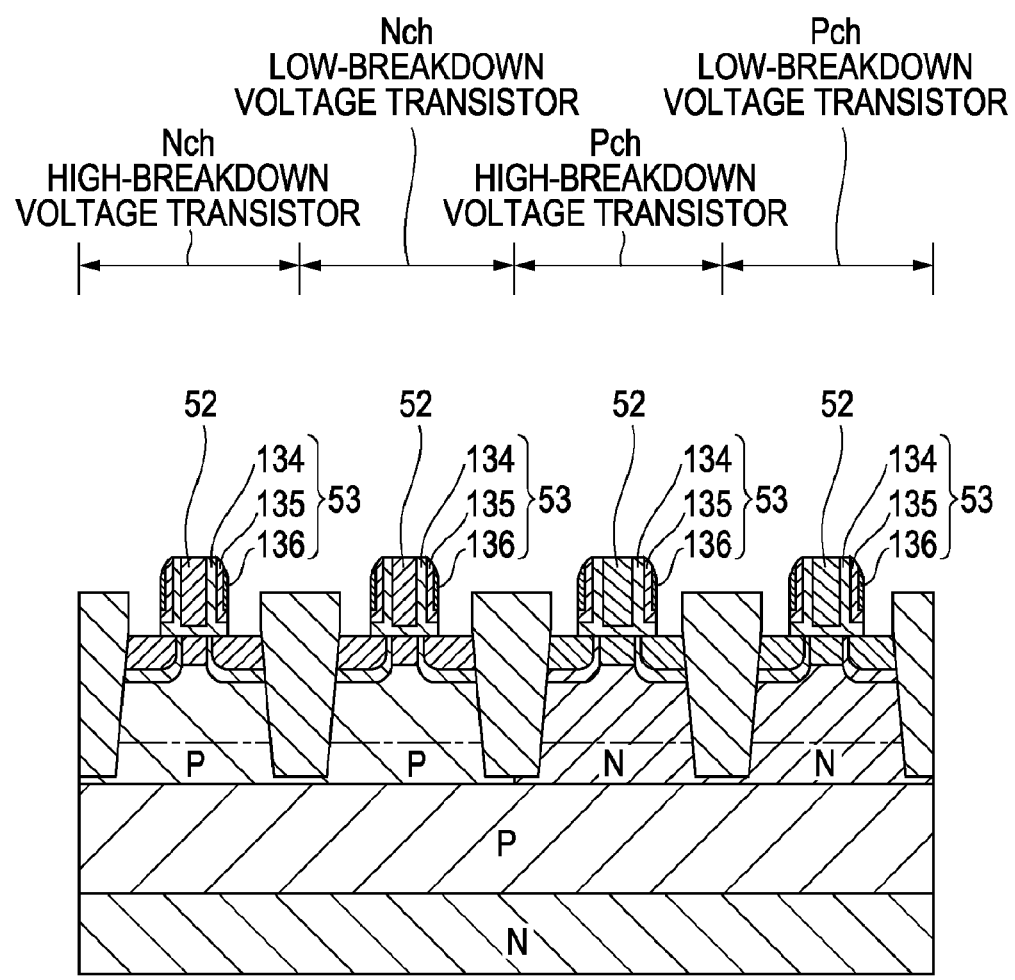
FIG. 26 is a cross-sectional view showing the first example of the method of producing a solid-state imaging device according to an embodiment of the present invention.

Next, as shown in the cross-sectional view of the pixel portion of FIG. 25 and the cross-sectional view of the peripheral circuit portion of FIG. 26, a resist mask 138 is formed on the entire surface of the photoelectric conversion portion 21 in the pixel portion 12 and on a part of the transfer gate TRG. Next, etching-back of the silicon nitride film 135 and the silicon oxide film 134 are performed to form a first sidewall 33 on the sidewalls of each of the gate electrodes 32 and a second sidewall 53 on the sidewalls of each of the gate electrodes 52, the first sidewall 33 and the second sidewall 53 being composed of the silicon oxide film 134, the silicon nitride film 135, and the silicon oxide film 136. In this step, the silicon nitride film 135 and silicon oxide film 134 located on the photoelectric conversion portion 21 are not etched because they are covered with the resist mask 138.

Figure 27:
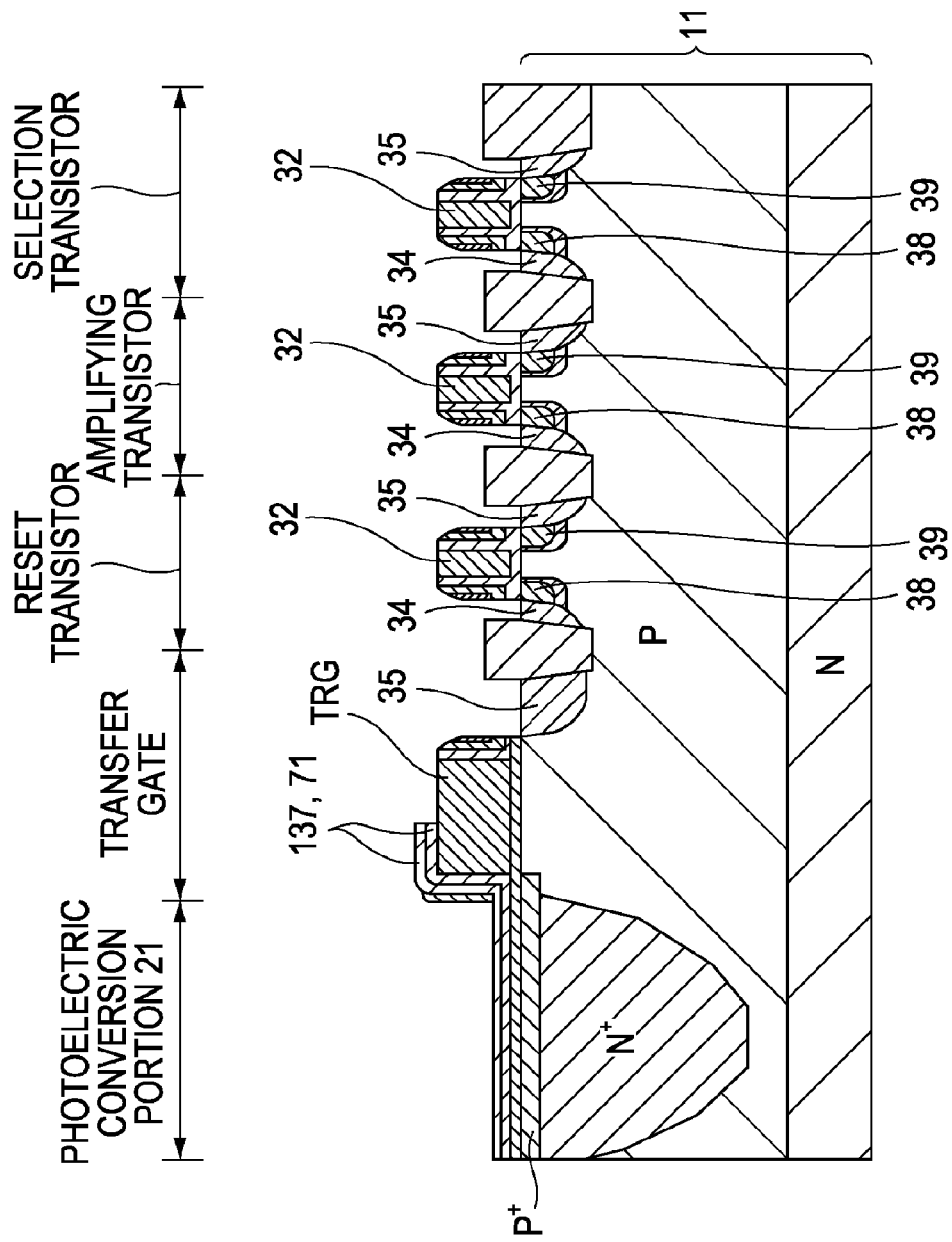
FIG. 27 is a cross-sectional view showing the first example of the method of producing a solid-state imaging device according to an embodiment of the present invention.
Figure 28:
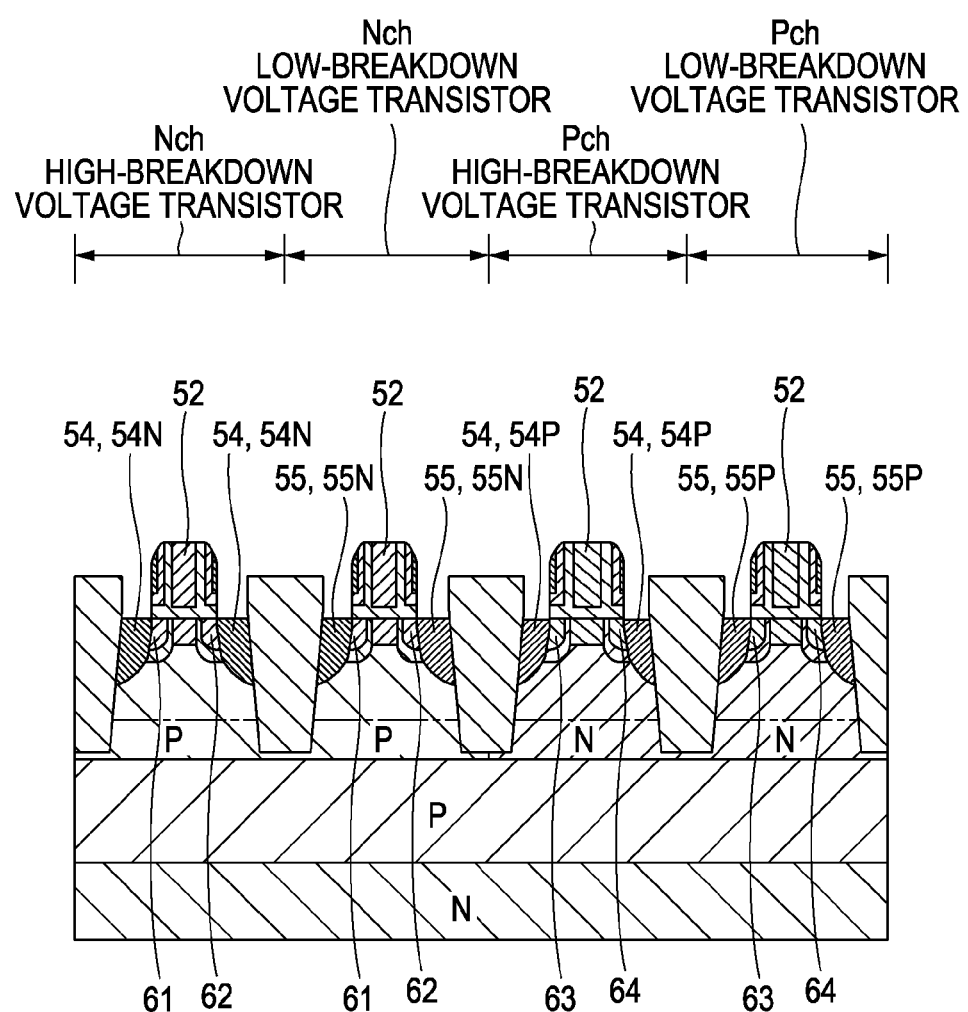
FIG. 28 is a cross-sectional view showing the first example of the method of producing a solid-state imaging device according to an embodiment of the present invention.

Next, as shown in the cross-sectional view of the pixel portion of FIG. 27 and the cross-sectional view of the peripheral circuit portion of FIG. 28, a resist mask (not shown) having openings is formed, the openings being disposed in regions where the NMOS transistors in the peripheral circuit portion 13 are to be formed. Deep source-drain regions 54 (54N) and 55 (55N) are formed in the regions where the NMOS transistors in the peripheral circuit portion 13 are to be formed by ion implantation using the resist mask. Specifically, the source-drain regions 54N and 55N are formed at both sides of each of the gate electrodes 52 in the semiconductor substrate 11, with the LDD regions 61, 62, etc. therebetween. The source-drain regions 54N and 55N are formed by ion implantation using, for example, arsenic (As) or phosphorus (P) as an ion implantation species, and the dosage thereof is set to be, for example, in the range of $1 \times 10^{15}$ to $1 \times 10^{16}$ cm$^{-2}$. The resist mask is then removed.

Next, a resist mask (not shown) having openings is formed, the openings being disposed in regions where the NMOS transistors in the pixel portion 12 are to be formed. Deep source-drain regions 34 and 35 are formed in the regions where the NMOS transistors in the pixel portion 12 are to be formed by ion implantation using the resist mask. Specifically, the source-drain regions 34 and 35 are formed at both sides of each of the gate electrodes 32 in the semiconductor substrate 11, with the LDD regions 38, 39, etc. therebetween. Here, the source-drain region 35 adjacent to the transfer gate TRG functions as a floating diffusion. The source-drain regions 34 and 35 are formed by ion implantation using, for example, arsenic (As) or phosphorus (P) as an ion implantation species, and the dosage thereof is set to be, for example, in the range of $1 \times 10^{15}$ to $1 \times 10^{16}$ cm$^{-2}$. The resist mask is then removed. This ion implantation may also function as the ion implantation for forming the source-drain regions 54N and 55N of the NMOS transistors in the peripheral circuit portion 13. In the formation of the source-drain regions described in document '421 described in the related art, one ion implantation is performed through three layers, whereas the other ion implantation is directly performed without such layers. Accordingly, it is difficult to perform these ion implantations at the same time.

Next, a resist mask (not shown) having openings is formed, the openings being disposed in regions where the PMOS transistors in the peripheral circuit portion 13 are to be formed. Deep source-drain regions 54 (54P) and 55 (55P) are formed in the regions where the PMOS transistors in the peripheral circuit portion 13 are to be formed by ion implantation using the resist mask. Specifically, the source-drain regions 54P and 55P are formed at both sides of each of the gate electrodes 52 in the semiconductor substrate 11, with the LDD regions 63, 64, etc. therebetween. The source-drain regions 54P and 55P are formed by ion implantation using, for example, boron (B) or boron difluoride (BF$_2$) as an ion implantation species, and the dosage thereof is set to be, for example, in the range of $1 \times 10^{15}$ to $1 \times 10^{16}$ cm$^{-2}$. The resist mask is then removed. Next, activation annealing of the source-drain regions is performed. This activation annealing is performed at a temperature in the range of, for example, about 800° C. to 1,100° C. For this activation annealing, a rapid thermal annealing (RTA) apparatus, a spike RTA apparatus, or the like can be used.

Before the activation annealing of the source-drain regions, the sidewall film 137 covering the photoelectric conversion portion 21 is separated from the sidewall 33 composed of the sidewall film 137 on the gate electrodes 32 of the MOS transistors in the pixel portion 12. This structure prevents degradation by a stress due to stress memorization technique (SMT) described in the related art. Accordingly, white flaws, random noise, and the like can be suppressed. Furthermore, the photoelectric conversion portion 21 is covered with the sidewall film 137, and the resist mask used in the ion implantation for forming the source-drain regions is formed on the photoelectric conversion portion 21, with the sidewall film 137 therebetween. That is, the resist mask is formed not directly on the surface of the photoelectric conversion portion 21. Therefore, the photoelectric conversion portion 21 is not contaminated by contaminants in the resist, thus suppressing an increase in the number of white flaws, dark current, and the like. In addition, the ion implantation for forming the source-drain regions is not an ion implantation through a film, and thus the depth of the source-drain regions can be set while ensuring a high concentration at the surface. Therefore, an increase in the series resistance of the source-drain regions can be suppressed. Furthermore, the sidewall film 137 covering the photoelectric conversion portion 21 is used as a first silicide blocking film 71 in the subsequent steps.

Figure 29:
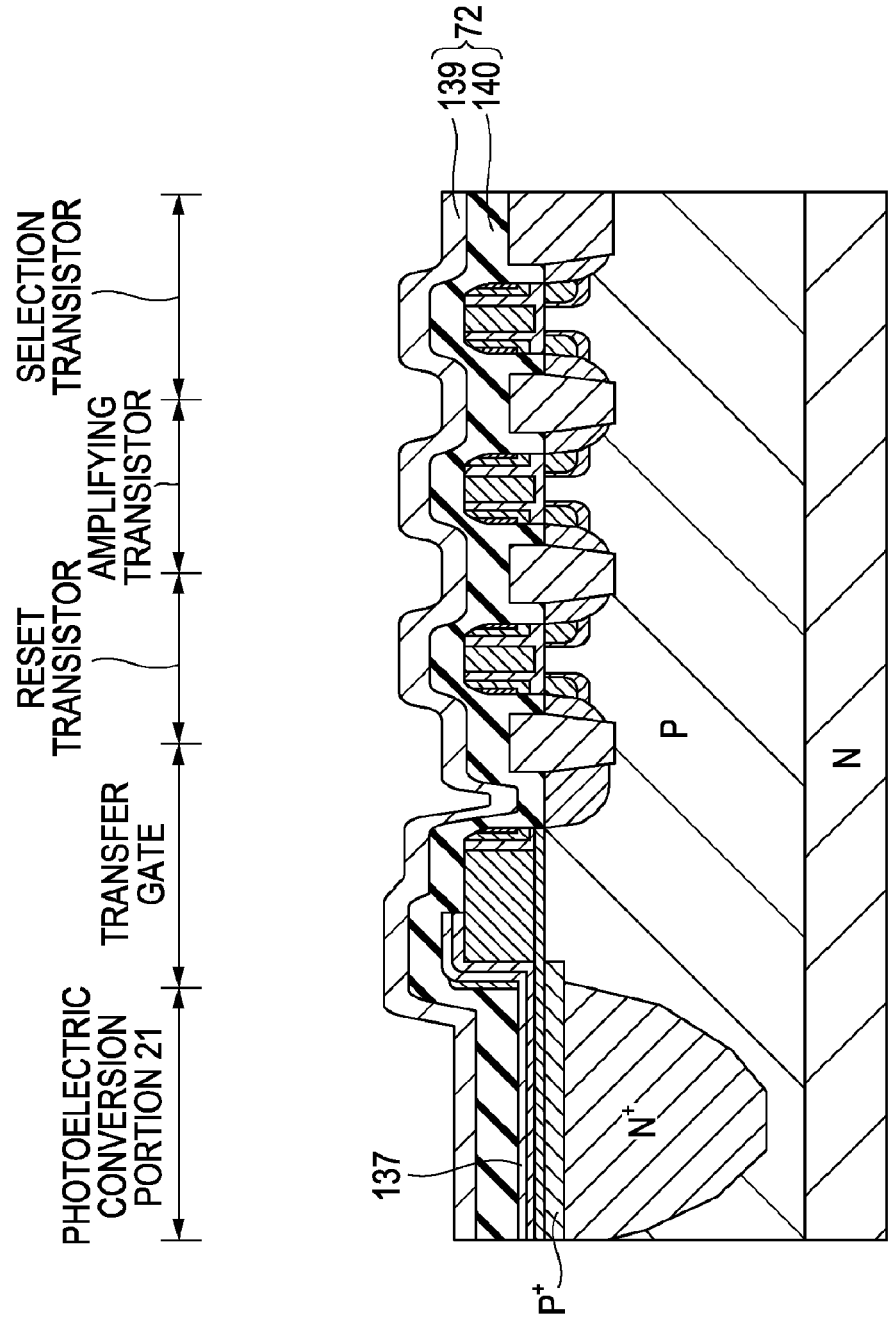
FIG. 29 is a cross-sectional view showing the first example of the method of producing a solid-state imaging device according to an embodiment of the present invention.

Next, as shown in the cross-sectional view of the pixel portion of FIG. 29 and the cross-sectional view of the peripheral circuit portion of FIG. 30, a second silicide blocking film 72 is formed on the entire surface of the pixel portion 12 and the peripheral circuit portion 13. The second silicide blocking film 72 is composed of a stacked film including a silicon oxide (SiO$_2$) film 140 and a silicon nitride film 139. For example, the silicon oxide film 140 is formed so as to have a thickness in the range of, for example, 5 to 40 nm, and the silicon nitride film 139 is formed so as to have a thickness in the range of, for example, 5 to 60 nm. The silicon oxide film 140 is composed of an NSG film, an LP-TEOS film, an HTO film, or the like. The silicon nitride film 139 is composed of an ALD-SiN film, a plasma nitride film, an LP-SiN film, or the like. If the deposition temperature of these two films is high, deactivation of boron occurs in gate electrodes of PMOSFETs. Consequently, a current driving capability of the PMOSFETs is decreased by gate depletion. Accordingly, the deposition temperature of the silicon oxide film 140 and the silicon nitride film 139 is preferably lower than the deposition temperature of the sidewall film 137. The deposition temperature is preferably, for example, at 700° C. or lower.

Figure 31:
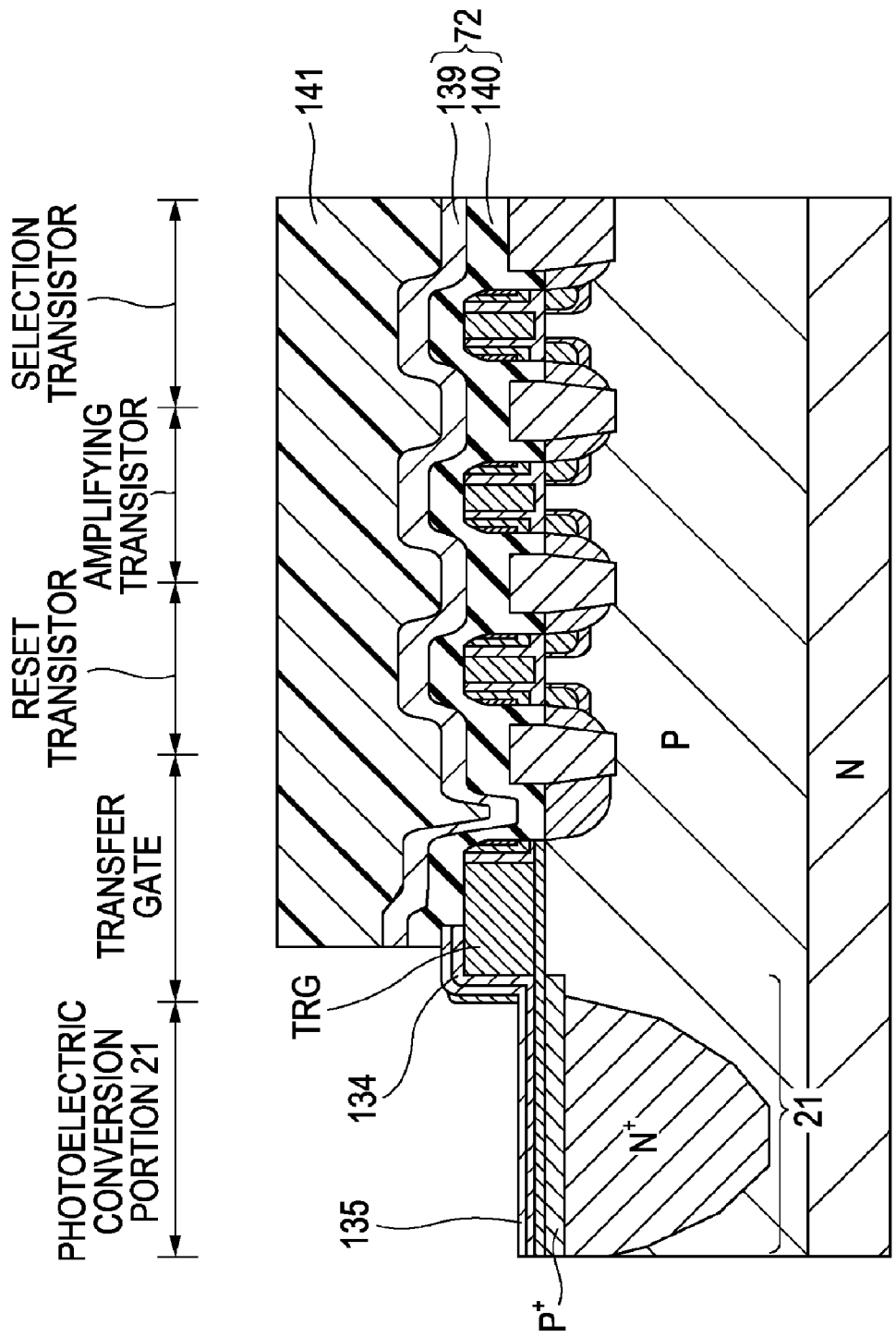
FIG. 31 is a cross-sectional view showing the first example of the method of producing a solid-state imaging device according to an embodiment of the present invention.
Figure 32:
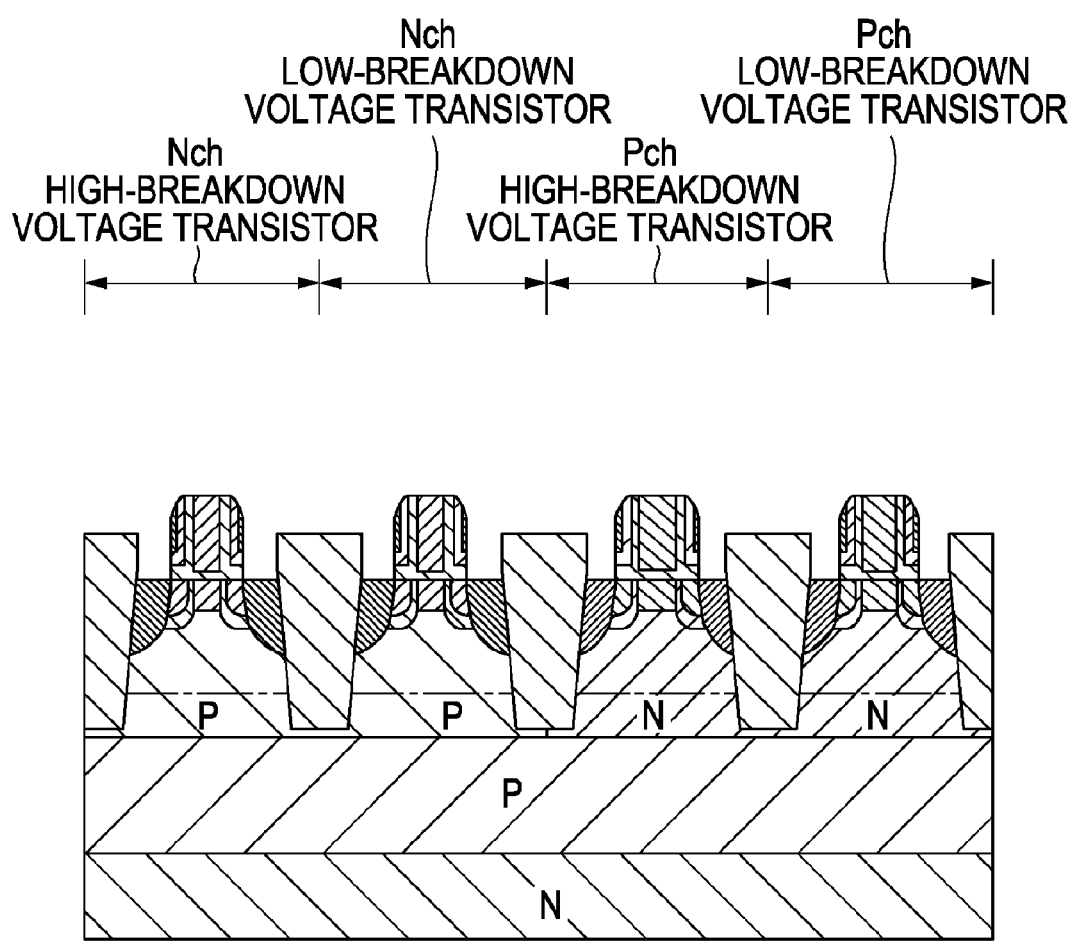
FIG. 32 is a cross-sectional view showing the first example of the method of producing a solid-state imaging device according to an embodiment of the present invention.

Next, as shown in the cross-sectional view of the pixel portion of FIG. 31 and the cross-sectional view of the peripheral circuit portion of FIG. 32, a resist mask 141 is formed so as to substantially cover the region where the MOS transistors in the pixel portion 12 are formed. The second silicide blocking film 72 located on the photoelectric conversion portion 21 (and on a part of the transfer gate TRG) in the pixel portion 12 and on the peripheral circuit portion 13 is removed by etching using this resist mask 141 as an etching mask. As a result, from the top layer, the silicon nitride film 135 and the silicon oxide film 134 are disposed on the photoelectric conversion portion 21 in that order, and thus spectral ripple can be prevented. In contrast, if the above etching is not performed, from the top layer, the silicon nitride film 139, the silicon oxide film 140, the silicon nitride film 135, and the silicon oxide film 134 are disposed on the photoelectric conversion portion 21 in that order. In this case, incident light is subjected to multiple reflections, thereby degrading spectral ripple characteristics. Since the ripple characteristics are degraded, chip-to-chip spectral variations increase. To solve this problem, in this embodiment, the second silicide blocking film 72 on the photoelectric conversion portion 21 is intentionally removed.

Figure 33:
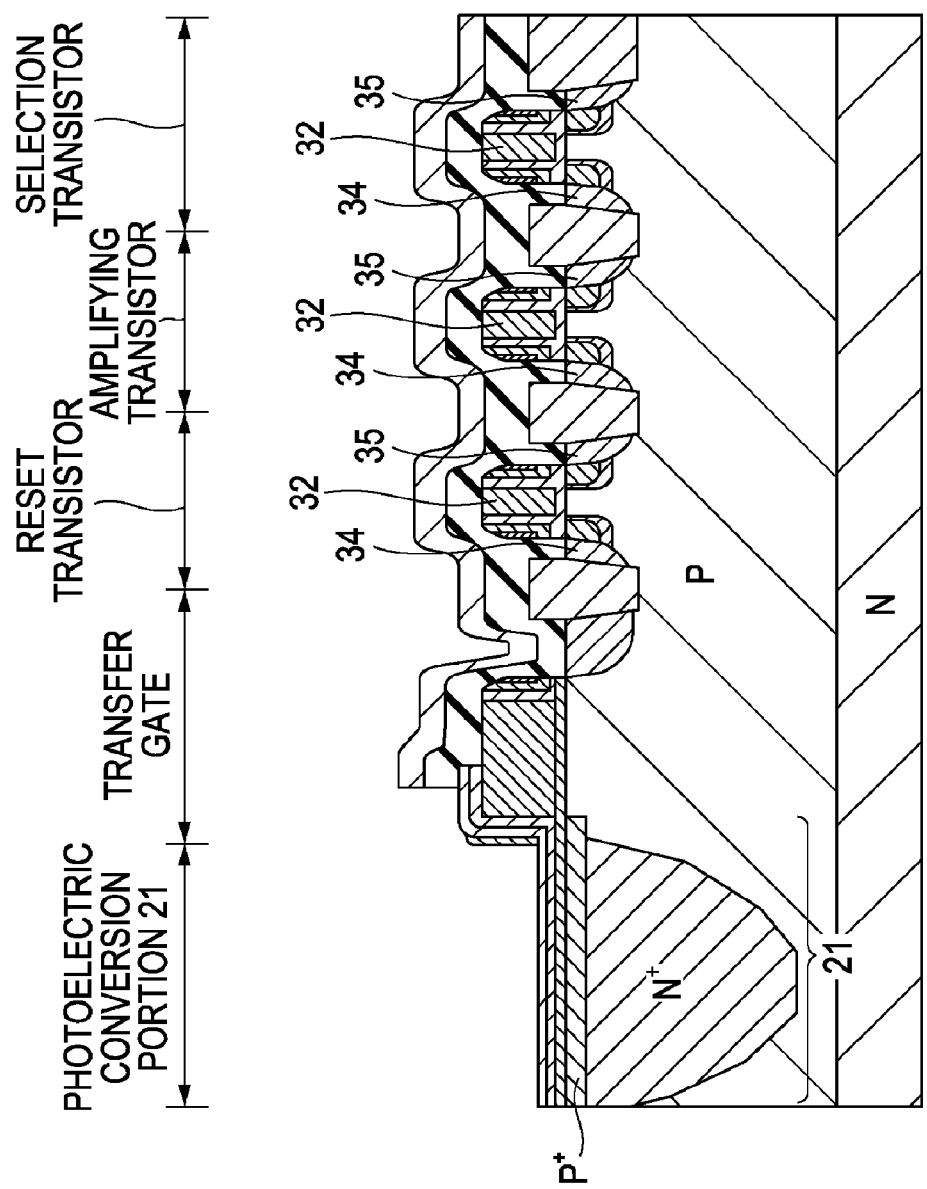
FIG. 33 is a cross-sectional view showing the first example of the method of producing a solid-state imaging device according to an embodiment of the present invention.
Figure 34:
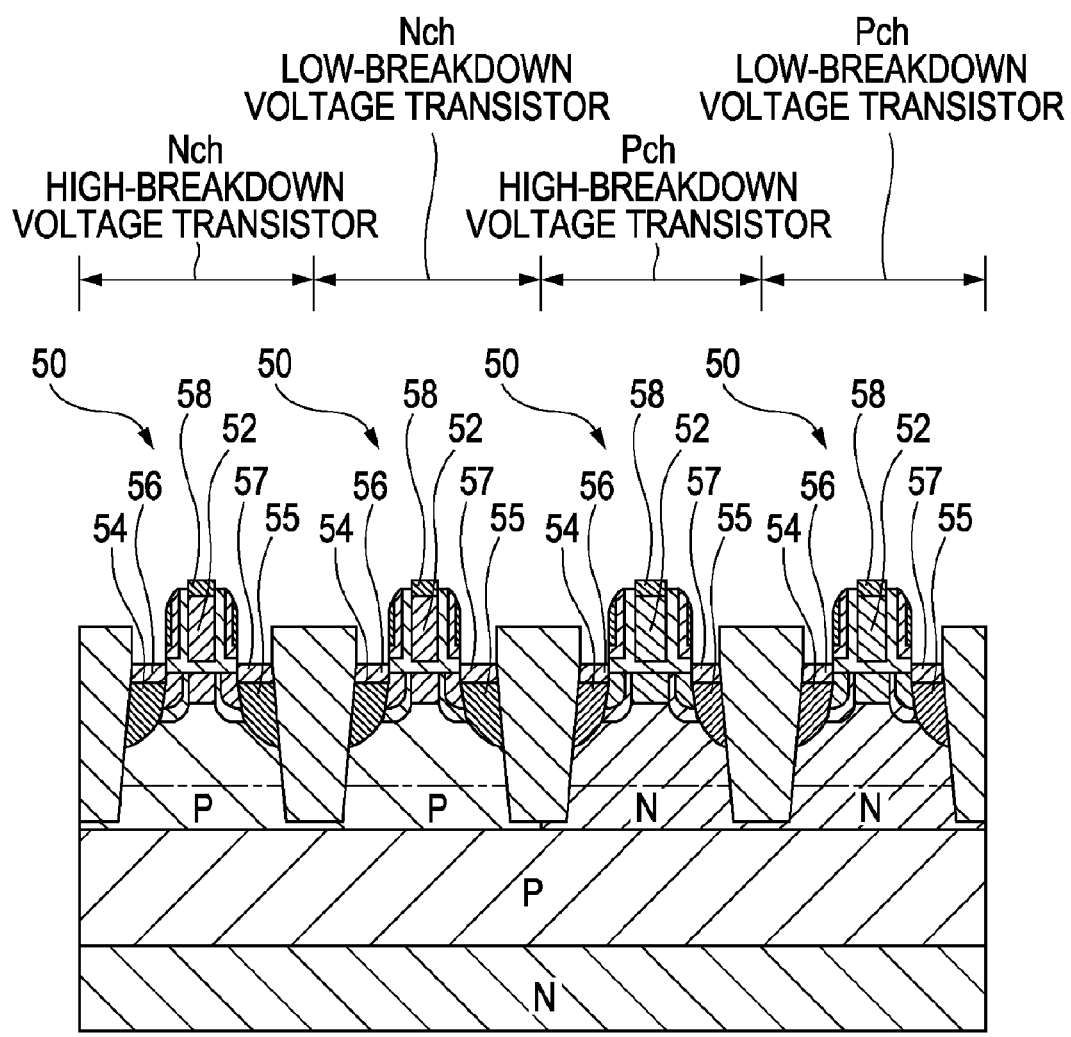
FIG. 34 is a cross-sectional view showing the first example of the method of producing a solid-state imaging device according to an embodiment of the present invention.

Next, as shown in the cross-sectional view of the pixel portion of FIG. 33 and the cross-sectional view of the peripheral circuit portion of FIG. 34, silicide layers 56, 57, and 58 are formed on the source-drain regions 54 and 55, and the gate electrode 52, respectively, of each of the MOS transistors 50 in the peripheral circuit portion 13. The silicide layers 56, 57, and 58 are composed of cobalt silicide ($CoSi_2$), nickel silicide (NiSi), titanium silicide ($TiSi_2$), platinum silicide (PtSi), tungsten silicide ($WSi_2$), or the like. An example of the formation of nickel silicide will be described as an example of the formation of the silicide layers 56, 57, and 58. First, a nickel (Ni) film is formed on the entire surface. This nickel film is formed using a sputtering apparatus or the like so as to have a thickness of, for example, 10 nm. Subsequently, an annealing treatment is performed at a temperature in the range of about 300° C. to 400° C. to react the nickel film with silicon which is the underlying layer, thus forming a nickel silicide layer. Unreacted nickel is then removed by wet etching. By this wet etching, the silicide layers 56, 57, and 58 are formed only on the surfaces of silicon or polysilicon other than the insulating films in a self-alignment manner. Subsequently, an annealing treatment is again performed at a temperature in the range of about 500° C. to 600° C. to stabilize the nickel silicide layer. In the above silicidation step, the silicide layer is not formed on the source-drain regions 34 and 35 and the gate electrode 32 of the MOS transistors in the pixel portion 12. This structure is used in order to prevent an increase in the number of white flaws and dark current caused by diffusion of the metal constituting the silicide on the photoelectric conversion portion 21. Accordingly, unless the surfaces of the source-drain regions 34 and 35 of the MOS transistors in the pixel portion 12 have a high impurity concentration, the contact resistance significantly increases. This embodiment is advantageous in that an increase in the contact resistance can be relatively suppressed because the surfaces of the source-drain regions 34 and 35 can have a high impurity concentration.

Figure 35:
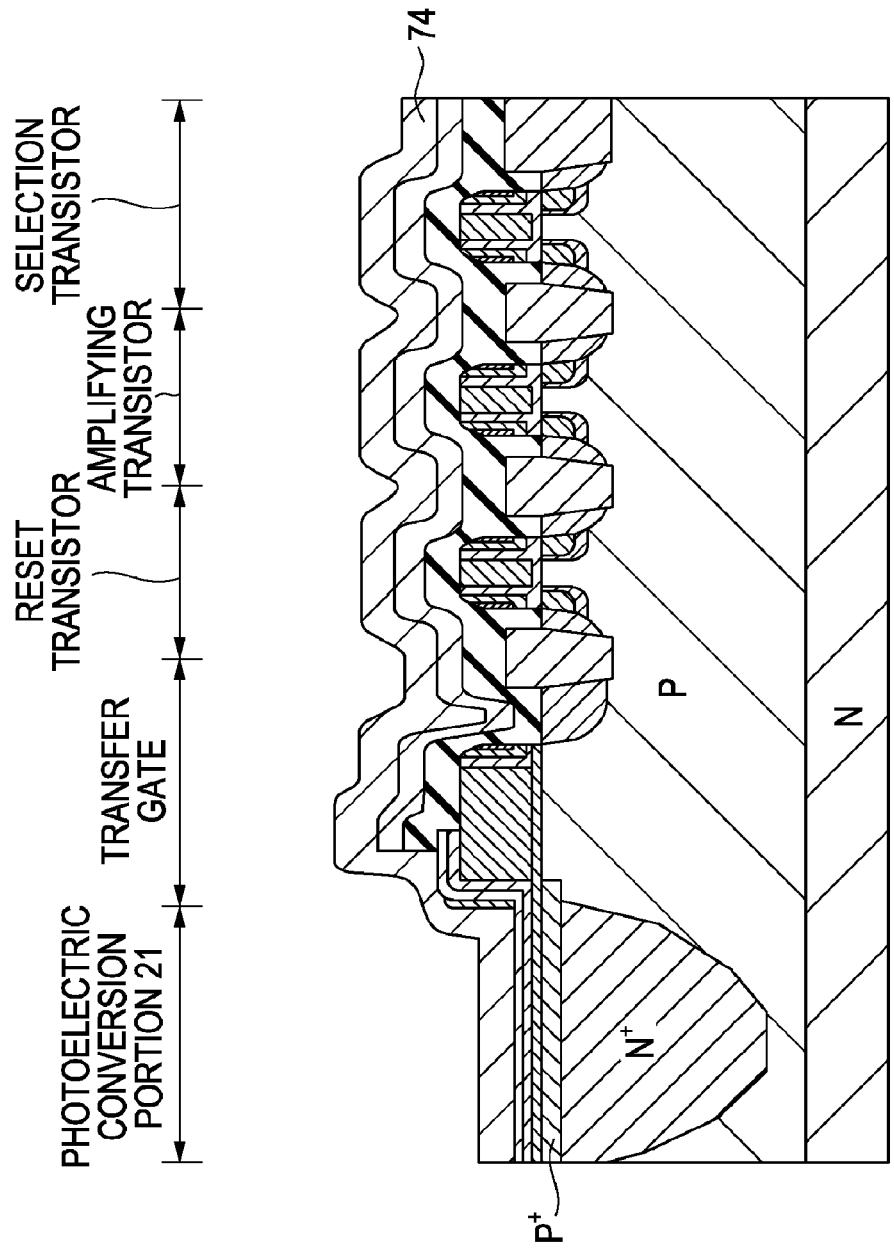
FIG. 35 is a cross-sectional view showing the first example of the method of producing a solid-state imaging device according to an embodiment of the present invention.

Next, as shown in the cross-sectional view of the pixel portion of FIG. 35 and the cross-sectional view of the peripheral circuit portion of FIG. 36, an etching stopper film 74 is formed on the entire surface of the pixel portion 12 and the peripheral circuit portion 13. The etching stopper film 74 is composed of, for example, a silicon nitride film. For example, a silicon nitride film deposited by a reduced pressure CVD method or a silicon nitride film deposited by a plasma CVD method is used as this silicon nitride film. The thickness of the silicon nitride film is, for example, in the range of 10 to 100 nm. This silicon nitride film has an effect of minimizing overetching during etching for forming contact holes. Furthermore, this silicon nitride film has an effect of suppressing an increase in junction leakage due to etching damage.

Figure 37:
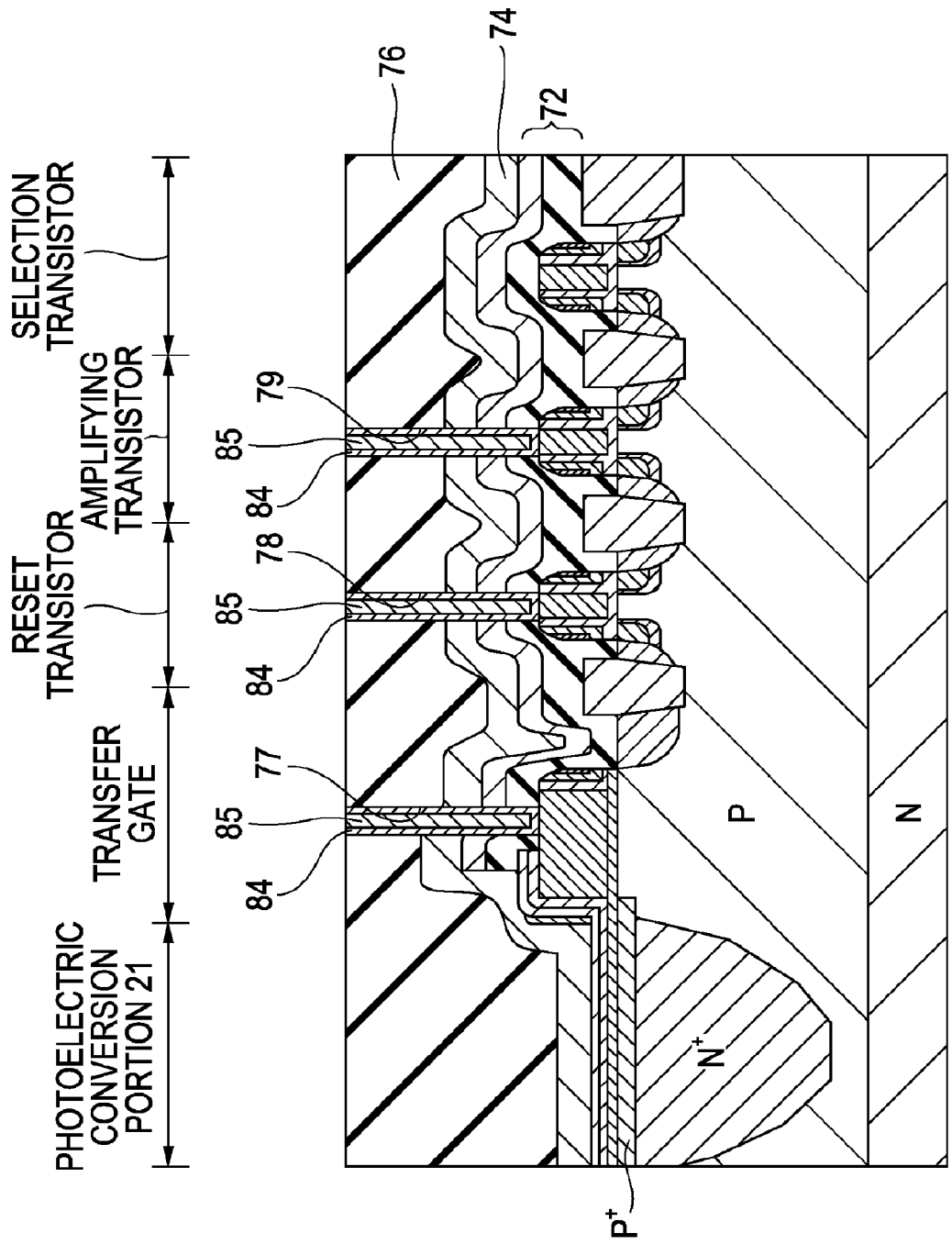
FIG. 37 is a cross-sectional view showing the first example of the method of producing a solid-state imaging device according to an embodiment of the present invention.
Figure 38:
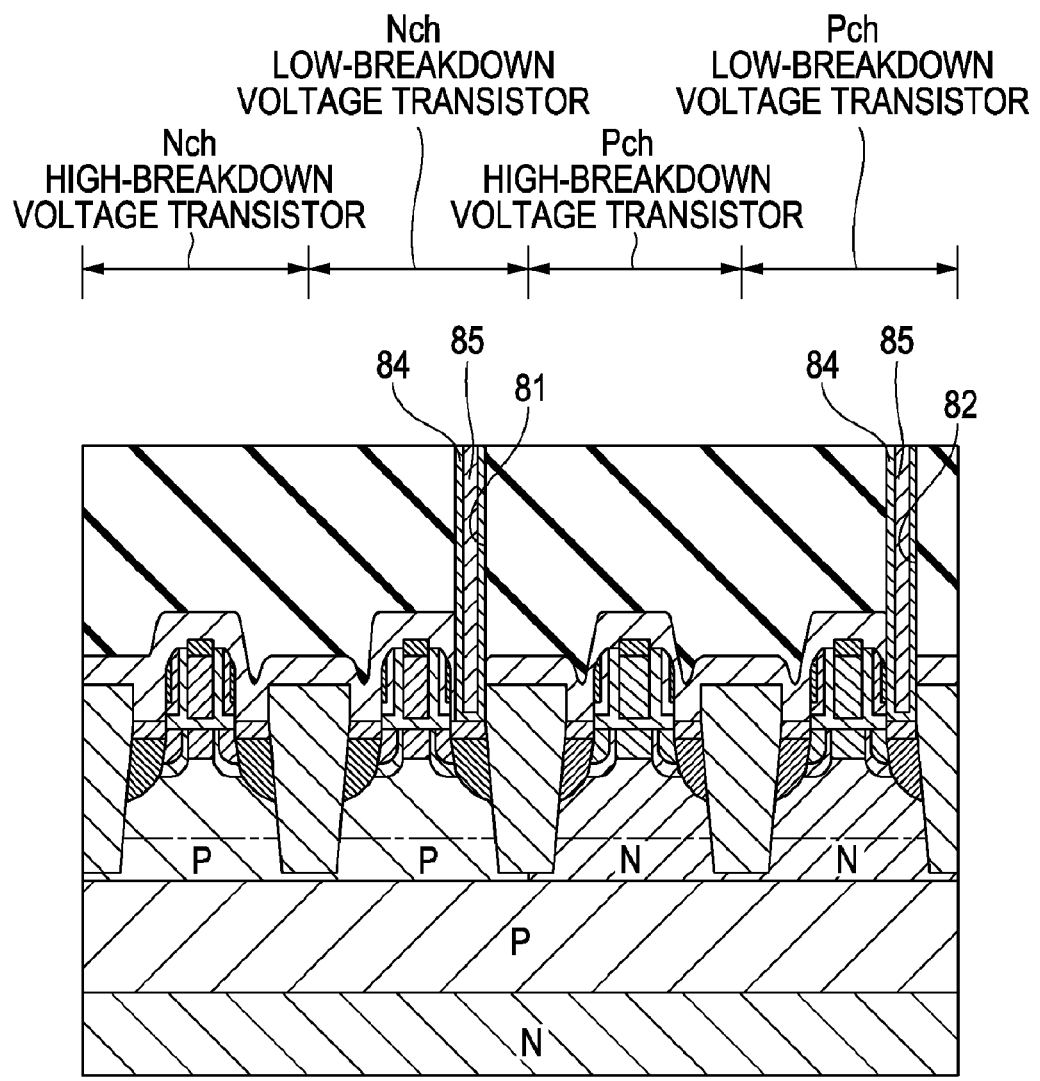
FIG. 38 is a cross-sectional view showing the first example of the method of producing a solid-state imaging device according to an embodiment of the present invention.

Next, as shown in the cross-sectional view of the pixel portion of FIG. 37 and the cross-sectional view of the peripheral circuit portion of FIG. 38, an interlayer insulating film 76 is formed on the etching stopper film 74. The interlayer insulating film 76 is composed of, for example, a silicon oxide film and has a thickness, for example, in the range of 100 to 1,000 nm. The silicon oxide film is formed by, for example, a CVD method. A tetraethyl orthosilicate (TEOS) film, a phosphosilicate glass (PSG) film, a borophosphosilicate (BPSG) film, or the like is used as this silicon oxide film. Alternatively, a silicon nitride film or the like may also be used. Next, the surface of the interlayer insulating film 76 is planarized. This planarization is performed by, for example, chemical mechanical polishing (CMP). Next, a resist mask (not shown) for forming contact holes is formed. Subsequently, contact holes 77, 78, and 79 are formed by, for example, etching the interlayer insulating film 76, the etching stopper film 74, and the second silicide blocking film 72 in the pixel portion 12. Similarly, contact holes 81 and 82 are formed in the peripheral circuit portion 13. In the pixel portion 12, as an example, the contact holes 77, 78, and 79 reaching the transfer gate TRG, the gate electrode 32 of the reset transistor RST, and the gate electrode 32 of the amplifying transistor Amp, respectively, are shown in FIG. 37. In the peripheral circuit portion 13, as an example, the contact holes 81 and 82 reaching the source-drain region 55 of an N channel (Nch) low-breakdown voltage transistor and the source-drain region 55 of a P channel (Pch) low-breakdown voltage transistor, respectively, are shown in FIG. 38. However, contact holes reaching gate electrodes and source-drain regions of other transistors are also formed at the same time, though they are not shown in the figures. In forming the contact holes 77 to 79, 81, and 82, in a first step, the interlayer insulating film 76 is etched. The etching is temporarily stopped on the etching stopper film 74. Thereby, variations in the thickness of the interlayer insulating film 76, variations in the etching, and the like can be absorbed. In a second step, the etching stopper film 74 composed of silicon nitride is etched, and etching is further continued to complete the contact holes 77 to 79, 81, and 82. For example, a reactive ion etching apparatus is used in the etching of the contact holes.

Next, a plug 85 is formed inside each of the contact holes 77 to 79, 81, and 82, with an adhesion layer (not shown) and a barrier metal layer 84 therebetween. As the adhesion layer, for example, a titanium (Ti) film or a tantalum (Ta) film is used. As the barrier metal layer 84, for example, a titanium nitride film or a tantalum nitride film is used. These films are formed by, for example, a sputtering method or a CVD method. The plug 85 is composed of tungsten (W). For example, a tungsten film is formed on the interlayer insulating film 76 so that the contact holes 77 to 79, 81, and 82 are filled with the tungsten film. The tungsten film disposed on the interlayer insulating film 76 is then removed. Thus, the plug 85 composed of the tungsten film is formed in each of the contact holes 77 to 79, 81, and 82. Instead of tungsten, the plug 85 may be composed of, for example, aluminum (Al) or copper (Cu), which has a resistance lower than that of tungsten. For example, when copper (Cu) is used as the plug 85, for example, a tantalum film is used as the adhesion layer and a tantalum nitride film is used as the barrier metal layer 84. Subsequently, although not shown in the figures, multilayer wiring is formed. If necessary, the number of wiring layers may be increased to two layers, three layers, four layers, and the like.

Figure 39:
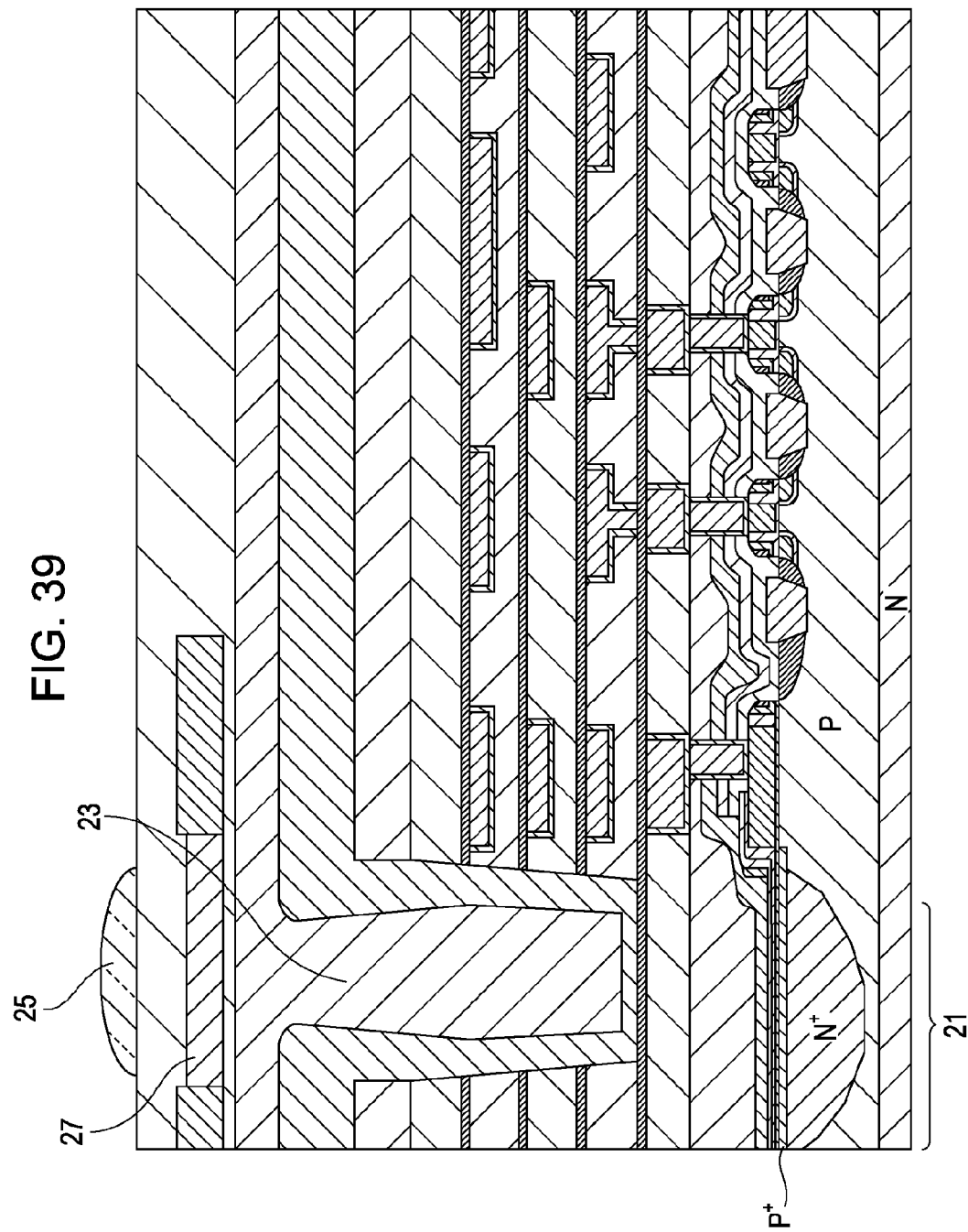
FIG. 39 is a cross-sectional view showing the first example of the method of producing a solid-state imaging device according to an embodiment of the present invention.

Next, as shown in the cross-sectional view of the pixel portion of FIG. 39, a waveguide 23 may be formed on the photoelectric conversion portion 21. In addition, in order to focus incident light to the photoelectric conversion portion 21, a focusing lens 25 may be formed. A color filter 27 for spectral separation of light may be formed between the waveguide 23 and the focusing lens 25.

In the above-described method (first example) of producing a solid-state imaging device, the pixel portion 12 is covered with two layers, namely, the first silicide blocking film composed of the same film as the sidewall film and the second silicide blocking film composed of a film different from the first silicide blocking film. Accordingly, MOS transistors in the pixel portion 12 are not completely covered with a single silicide blocking film. Consequently, random noise can be reduced and the number of white flaws and dark current can also be reduced.

In the above production method, the solid-state imaging device 1 (1B) described with reference to FIGS. 3, 4, and 5B is formed. In the production method, when the isolation regions 14 between the transfer gate TRG, the reset transistor RST, the amplifying transistor Amp, and the selection transistor SEL in the pixel portion 12 are not formed, the solid-state imaging device 1 (1A) described above is formed. In this case, the floating diffusion portion FD is common to the source-drain region 34 which is one of the impurity diffusion layers of the reset transistor RST.

In the above description of the solid-state imaging device and the method of producing the solid-state imaging device, a structure in which a single pixel transistor portion (including, for example, a reset transistor, an amplifying transistor, and a selection transistor) is formed per pixel has been described. The embodiment of the present invention can be applied not only to a solid-state imaging device having such a structure of one pixel-one pixel transistor portion but also similarly to a solid-state imaging device having a structure in which two pixels are shared by a single pixel transistor portion, a solid-state imaging device having a structure in which four pixels are shared by a single pixel transistor portion, and methods of producing these solid-state imaging devices.

[Second Example of Method of Producing Solid-state Imaging Device]

A description will be made of main points of a production method in the case where, for example, one pixel transistor portion shares four pixels. First, an example of the structure in which one pixel transistor portion shares four pixels will be described with reference to a planar layout view of FIG. 40.

Figure 40:
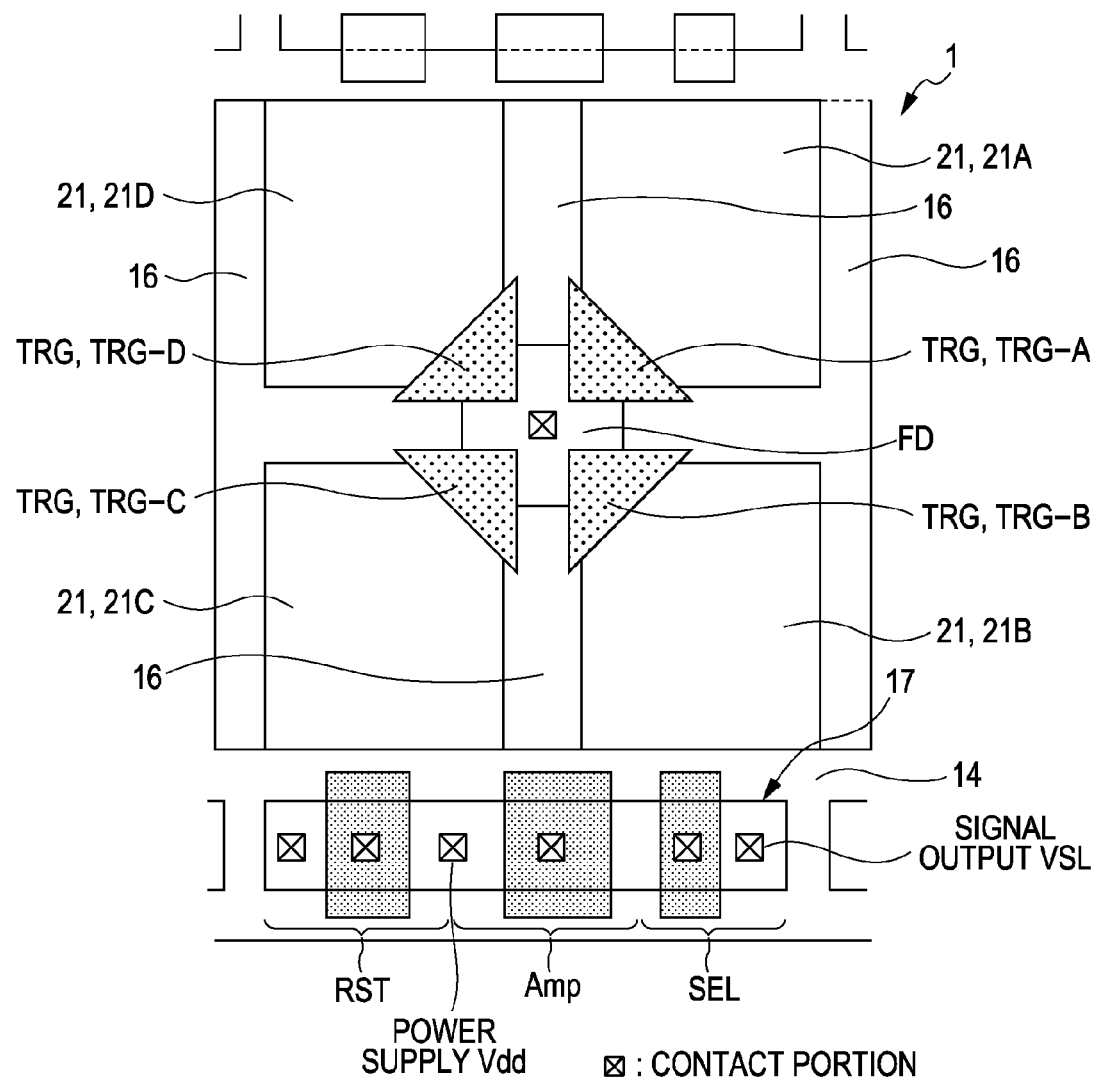
FIG. 40 is a planar layout view showing an example of the structure in which one pixel transistor portion shares four pixels.

As shown in FIG. 40, photoelectric conversion portions 21 (21A, 21B, 21C, and 21D) of four pixels are arranged in two rows and two columns. At the center of the arrangement of the photoelectric conversion portions 21, a floating diffusion portion FD is provided in an active region continuous to each of the photoelectric conversion portions 21. Furthermore, transfer gates TRG (TRG-A, TRG-B, TRG-C, and TRG-D) are provided at the boundaries between each of the photoelectric conversion portions 21 and the floating diffusion portion FD, with a gate insulating film (not shown) therebetween. The peripheries of the photoelectric conversion portions 21 are electrically separated by isolation regions 16 composed of an impurity diffusion layer, except for regions located under the transfer gates TRG. In addition, a pixel transistor portion 17 is provided in a region adjacent to the photoelectric conversion portions 21, with an isolation region 14 therebetween. The pixel transistor portion 17 is configured so that, for example, a reset transistor RST, an amplifying transistor Amp, and a selection transistor SEL are arranged in series.

A description will be made of main points in the case where the first example of the above-described method of producing a solid-state imaging device is applied to a method of producing a solid-state imaging device in which a single pixel transistor portion 17 is shared by four pixels. In the case where the pixel transistor portion is shared by four pixels, the structure of this solid-state imaging device differs from the solid-state imaging device produced by the above first example of the production method in that the floating diffusion portion FD is formed at the center of the arrangement of the photoelectric conversion portions 21 and the transfer gate TRG is formed between each of the photoelectric conversion portions 21 and the floating diffusion portion FD. However, operations of the production method of this solid-state imaging device are the same as those of the first example except that the arrangement of the photoelectric conversion portions 21, the floating diffusion portion FD, and the transfer gates TRG are different from that in the first example. Accordingly, the method of producing the peripheral circuit portion is the same as the first example. A part of the method will be described below.

Figure 42A:
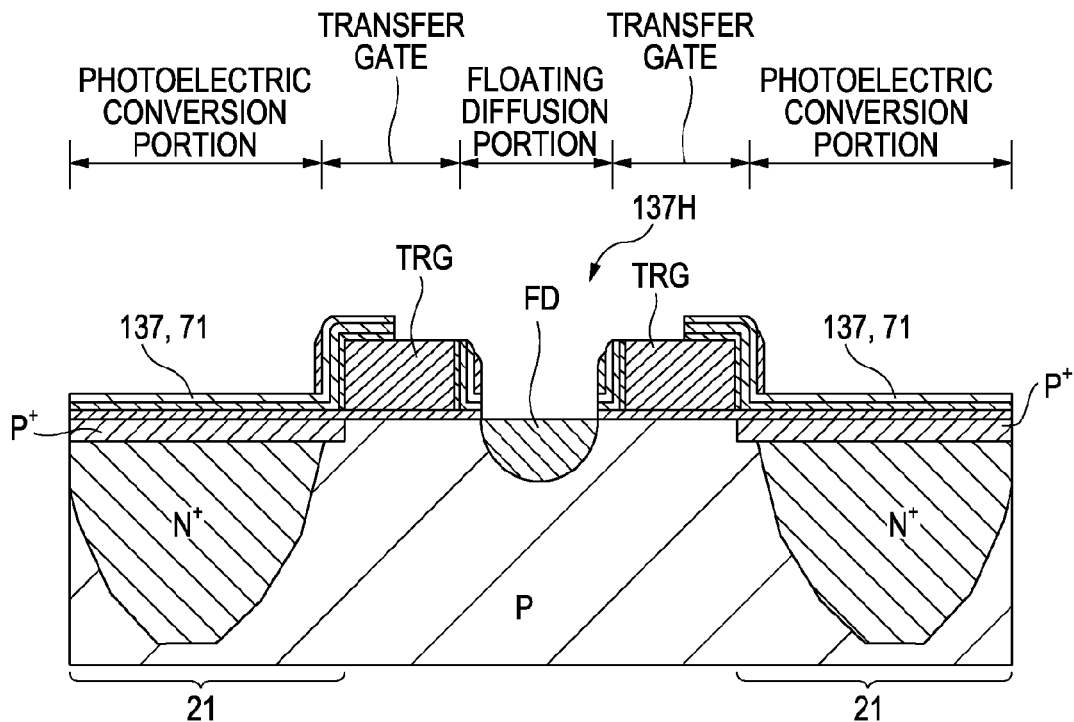
FIGS. 42A and 42B are partial cross-sectional views showing the second example of the method of producing a solid-state imaging device according to an embodiment of the present invention.
Figure 42B:
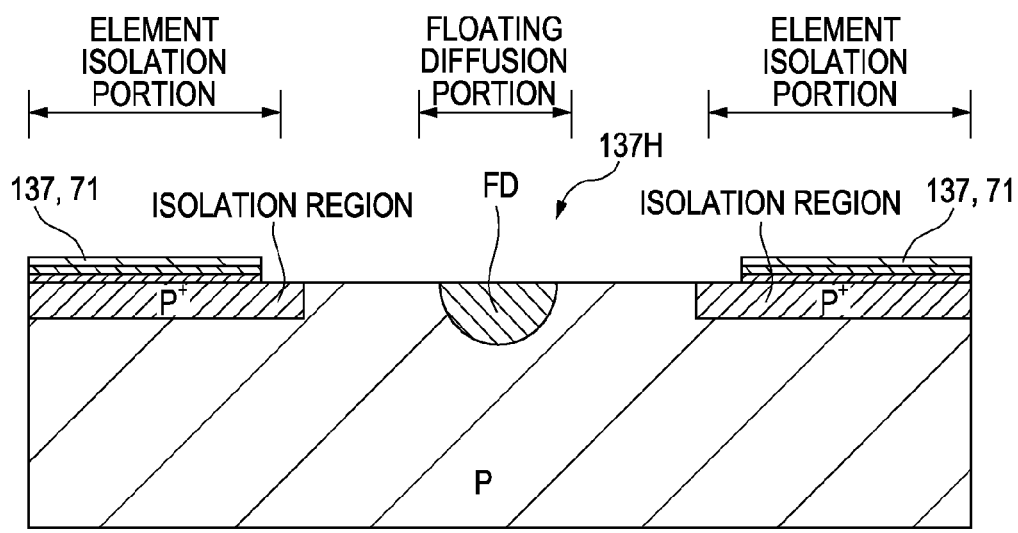
Figure 43C:
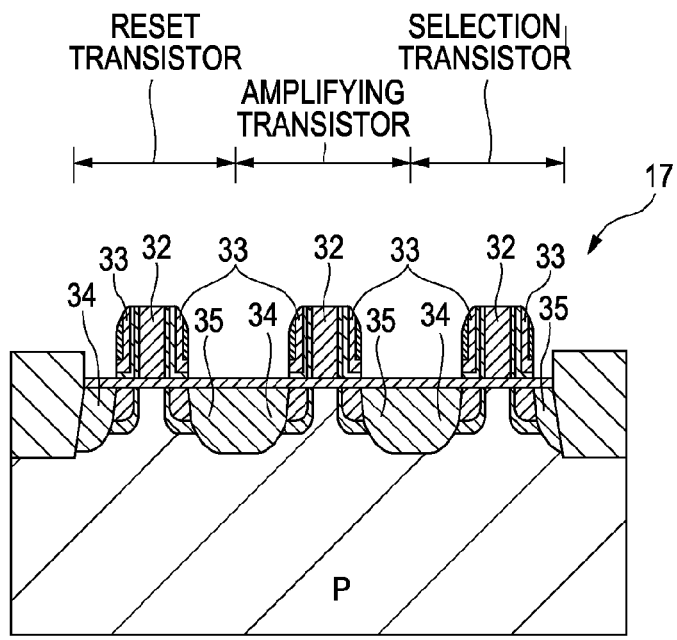
FIGS. 43C and 43D are partial cross-sectional views showing the second example of the method of producing a solid-state imaging device according to an embodiment of the present invention.
Figure 43D:
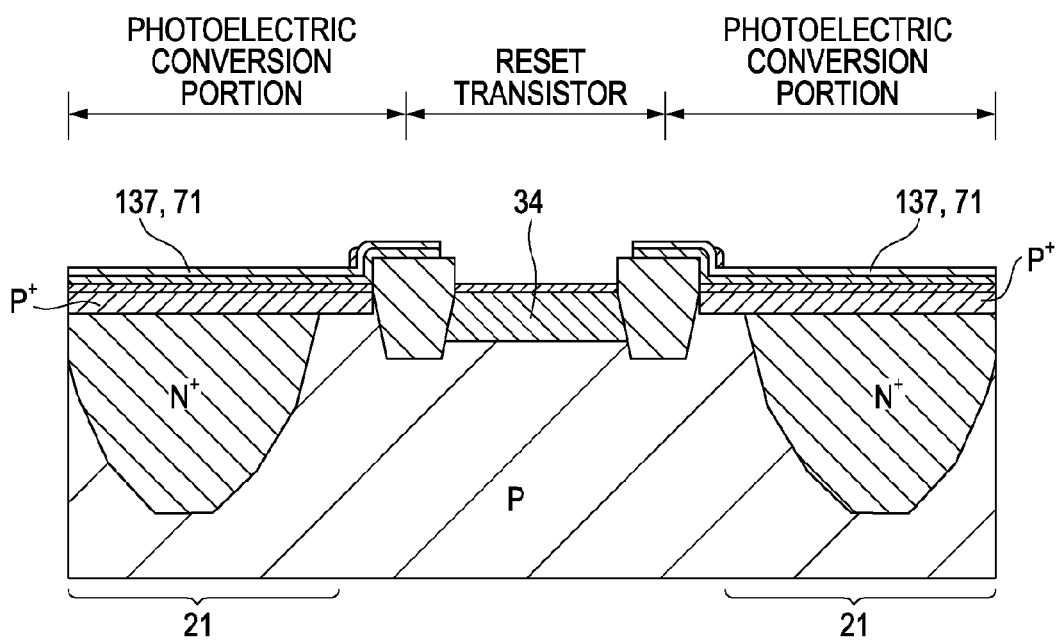

First, a step of forming a sidewall will be described with reference to FIGS. 41, 42A, 42B, 43C, 43D, etc. FIG. 41 is a planar layout view of a pixel portion, FIG. 42A is a cross-sectional view taken along line XLIIA-XLIIA in FIG. 41, FIG. 42B is a cross-sectional view taken along line XLIIB-XLIIB in FIG. 41, FIG. 43C is a cross-sectional view taken along line XLIIIC-XLIIIC in FIG. 41, and FIG. 43D is a cross-sectional view taken along line XLIIID-XLIIID in FIG. 41. After a sidewall film 137 (first silicide blocking film 71) is formed, etching-back of the sidewall film 137 is performed to form sidewalls (not shown) on sidewalls of each gate electrode 32 of the pixel transistor portion 17 and each gate electrode (not shown) in the peripheral circuit portion. In this case, the sidewall film 137 is left on the photoelectric conversion portions 21. This is because the photoelectric conversion portions 21 are covered with a resist mask (not shown) so that etching damage during the formation of the sidewalls does not enter the photoelectric conversion portions 21. An opening 137H is provided in the sidewall film 137 on a region where the floating diffusion portion FD is formed to expose the region where the floating diffusion portion FD is formed. A part of this opening 137H is disposed on the transfer gates TRG.

Subsequently, source-drain regions 34 and 35 of transistors in the pixel portion and the peripheral circuit portion are formed.

Figure 44:
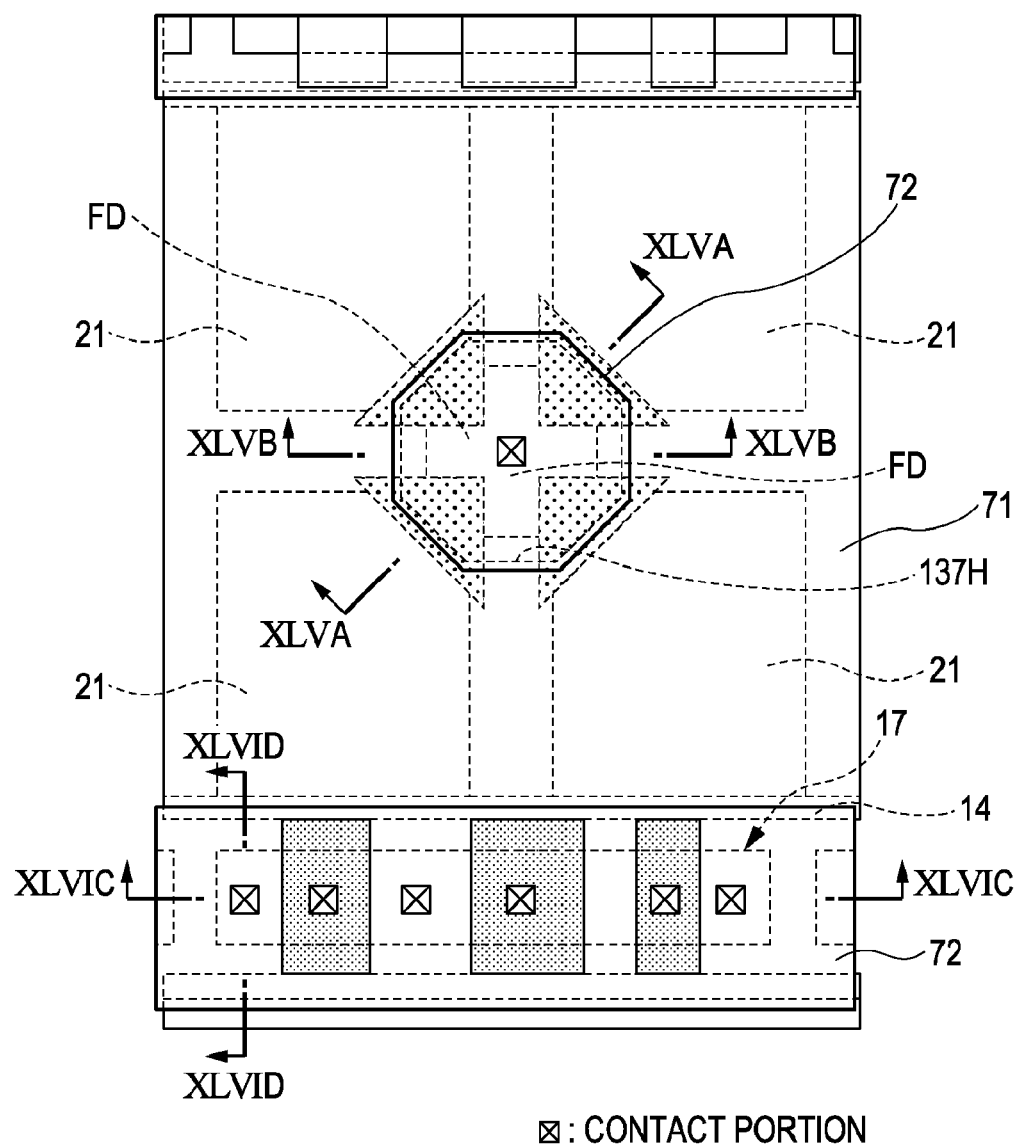
FIG. 44 is a planar layout view showing the second example of the method of producing a solid-state imaging device according to an embodiment of the present invention.
Figure 45A:
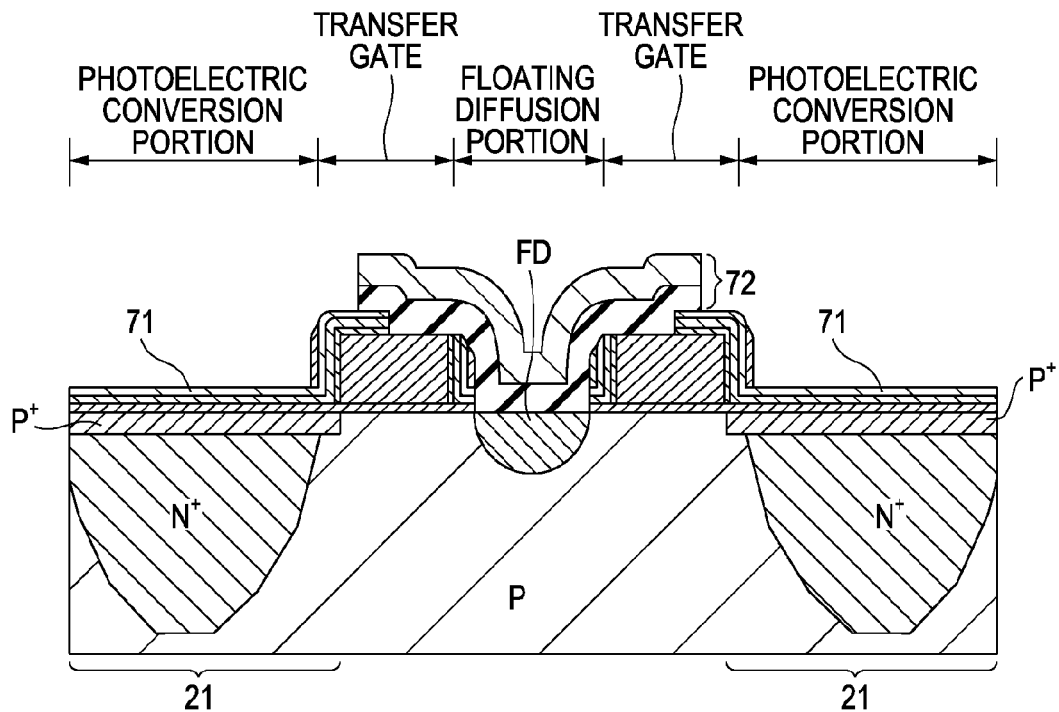
FIGS. 45A and 45B are partial cross-sectional views showing the second example of the method of producing a solid-state imaging device according to an embodiment of the present invention.
Figure 45B:
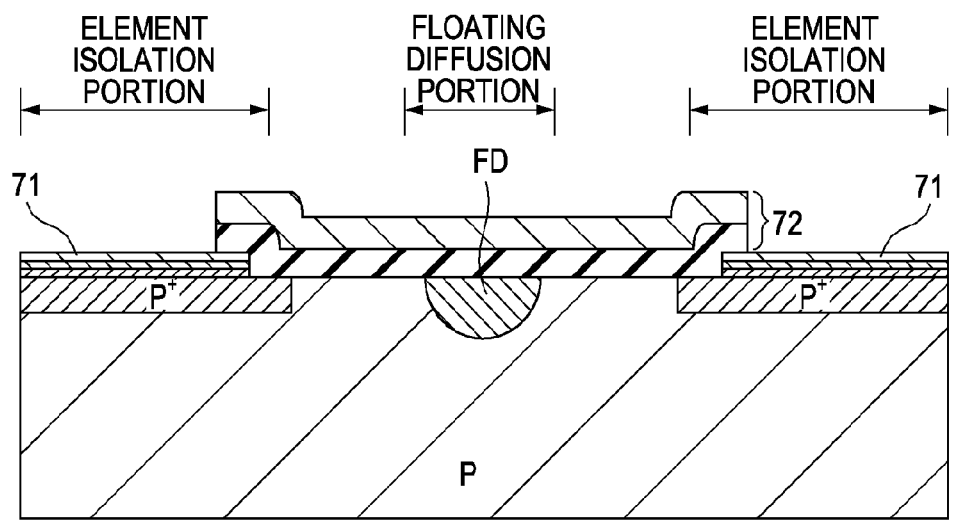
Figure 46C:
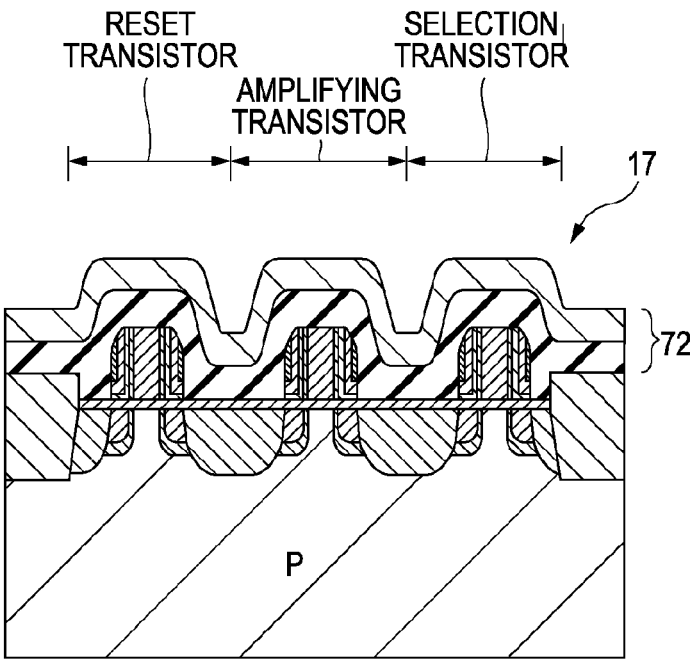
FIGS. 46C and 46D are partial cross-sectional views showing the second example of the method of producing a solid-state imaging device according to an embodiment of the present invention.
Figure 46D:
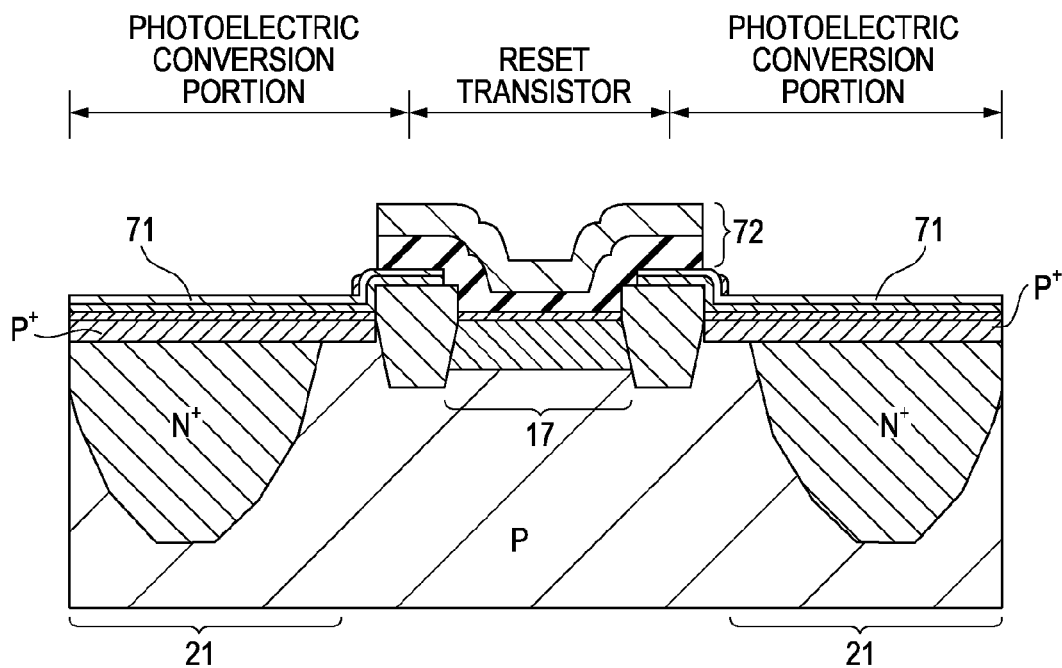

Next, a subsequent step will be described with reference to FIGS. 44, 45A, 45B, 46C, 46D, etc. FIG. 44 is a planar layout view of the pixel portion, FIG. 45A is a cross-sectional view taken along line XLVA-XLVA in FIG. 44, FIG. 45B is a cross-sectional view taken along line XLVB-XLVB in FIG. 44, FIG. 46C is a cross-sectional view taken along line XLVIC-XLVIC in FIG. 44, and FIG. 46D is a cross-sectional view taken along line XLVID-XLVID in FIG. 44. After the source-drain regions of the transistors in the pixel portion and the peripheral circuit portion are formed, a silicide layer is formed on the source-drain regions and the like in the peripheral circuit portion. In this step, it is necessary that the silicide layer be not formed on the pixel transistor portion, the photoelectric conversion portions 21, etc. For this purpose, prior to the formation of the silicide layer, a second silicide blocking film 72 covering the pixel transistor portion 17 is formed. In this step, the second silicide blocking film 72 is formed so as to overlap with the first silicide blocking film 71 on the isolation region 14. In this step, also on the floating diffusion portion FD, the second silicide blocking film 72 is formed so as to overlap with the periphery of the opening 137H of the first silicide blocking film 71. Subsequently, as in the first example, the step of silicidation on the gate electrodes and the source-drain regions of the MOS transistors in the peripheral circuit portion, and the subsequent steps are performed.

In the first example and the second example of the above production methods, when the sidewalls 33 and 53 are formed on the sidewalls of the gate electrodes 32 and 52 in the pixel portion 12 and in the peripheral circuit portion 13, respectively, the sidewall film 137 on the floating diffusion portion FD is not covered with a resist mask. In the case where the sidewalls 33 and 53 are formed by etching on the sidewalls of the gate electrodes 32 and 52, respectively, etching damage may occur in the floating diffusion portion FD.

Figure 47:
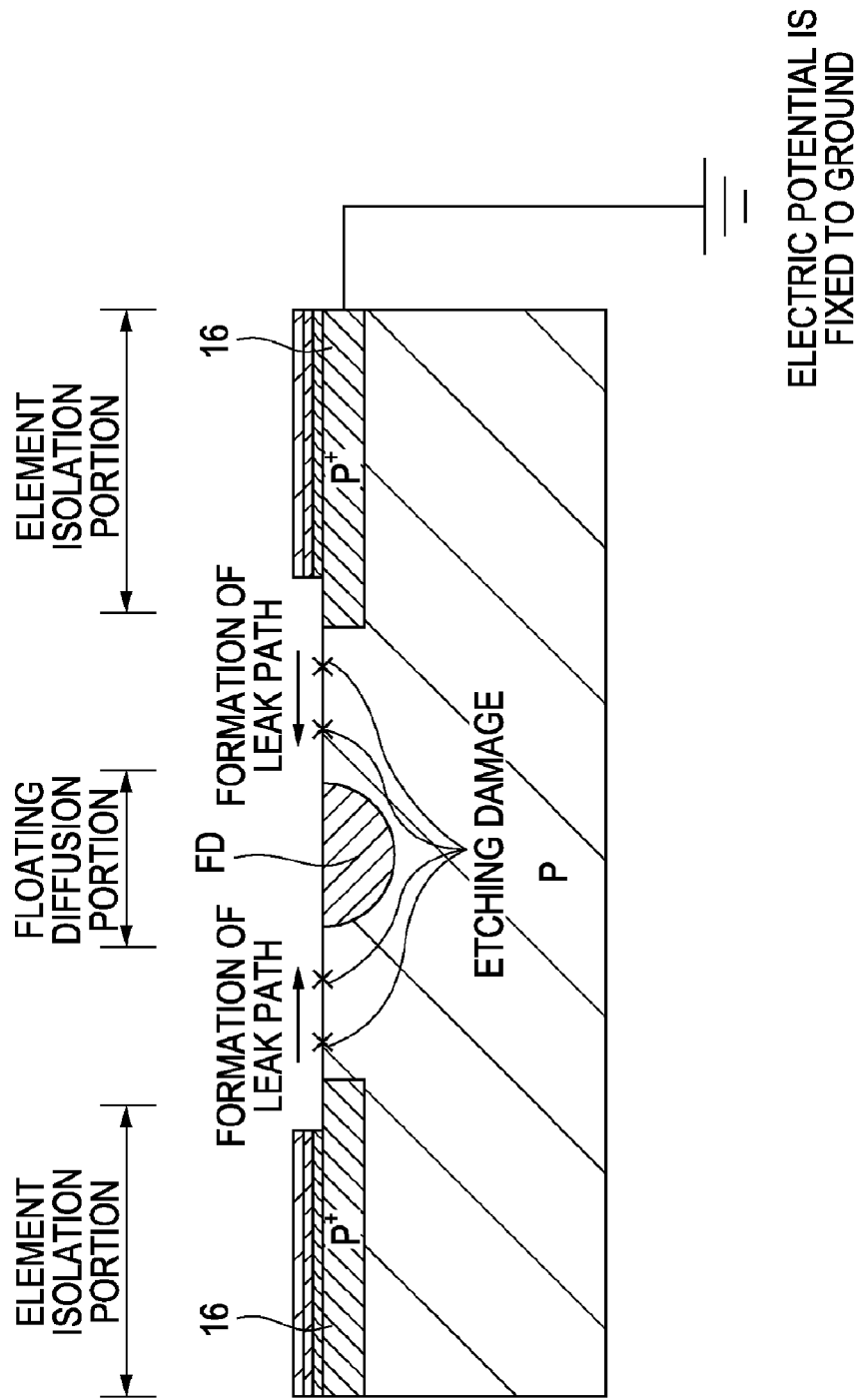
FIG. 47 is a schematic structural cross-sectional view illustrating an effect of etching damage.

The concern about the etching damage will be described below. For example, as shown in FIG. 47, when sidewalls (not shown) are formed on sidewalls of each gate electrode (not shown) by etching, etching damage may occur in the floating diffusion portion FD. If etching damage occurs in the floating diffusion portion FD, a leak path is generated in a p-n junction included in the floating diffusion portion FD, thereby increasing the number of FD white flaws.

The FD white flaws will be described here. Electrons that are photoelectrically converted in the photoelectric conversion portion are transferred to the floating diffusion portion FD and converted to a voltage. In this case, in the case where there is a leak path in the floating diffusion portion FD, even if there is no photoelectrically converted electron in the floating diffusion portion FD, leaked electrons are output and appear as white spots. This is referred to as "FD white flaws".

In some cases, an isolation region 16 composed of a p-type diffusion layer is used for separating photoelectric conversion portions (not shown) and the floating diffusion portion FD. When a p-type diffusion layer is used for separating pixels in such a manner, in particular, the number of FD white flaws is significantly increased. For example, a possible reason for this is an effect of out-diffusion of impurities during a heat treatment at 1,000° C. or higher for activating source-drain regions. For example, impurities scattered by out-diffusion during the heat treatment adhere between the floating diffusion portion FD and the isolation region 16 composed of a p-type diffusion layer. Consequently, a large leak path is formed, resulting in the problem of the generation of FD white flaws. That is, when a leakage current flows to the floating diffusion portion FD, even in a dark state, it appears as if signals are present. Consequently, white flaws are generated. The reason why it appears as if signals are present is as follows. If the above-mentioned leakage occurs during a period from a state in which an electric potential of the floating diffusion portion FD is reset to a detection of a signal electric potential, a voltage fluctuation due to a leakage current is superimposed on the reset electric potential.

In the above example, a description has been made of the structure in which a single pixel transistor portion shares four pixels. Similarly, also in the case where a pixel transistor portion shares two pixels or in the case where a pixel transistor portion is formed so as to correspond to one pixel, etching damage may occur in the floating diffusion portion FD.

3. Third Embodiment

Example of Structure of Solid-state Imaging Device

A structure in which etching damage does not occur in the floating diffusion portion FD will be described on the basis of the solid-state imaging device 1 which has been described with reference to FIGS. 1 and 2 or FIGS. 3 and 4. For example, the first silicide blocking film 71 is formed so as to cover the photoelectric conversion portion 21, the transfer gate TRG, the floating diffusion portion FD, and a part of the gate electrode 32 of the reset transistor RST. In this case, the second silicide blocking film 72 is formed so as to overlap with the first silicide blocking film 71 on the gate electrode 32 of the reset transistor RST.

By forming the first silicide blocking film 71 and the second silicide blocking film 72 so as to have above structure, when the sidewalls 33 and sidewalls (not shown) in the peripheral circuit portion are formed, the floating diffusion portion FD is also covered with the first silicide blocking film 71 which is a sidewall film. Accordingly, etching damage does not occur in the floating diffusion portion FD during the formation of the sidewalls.

[Third Example of Structure of Solid-state Imaging Device]

Figure 48:
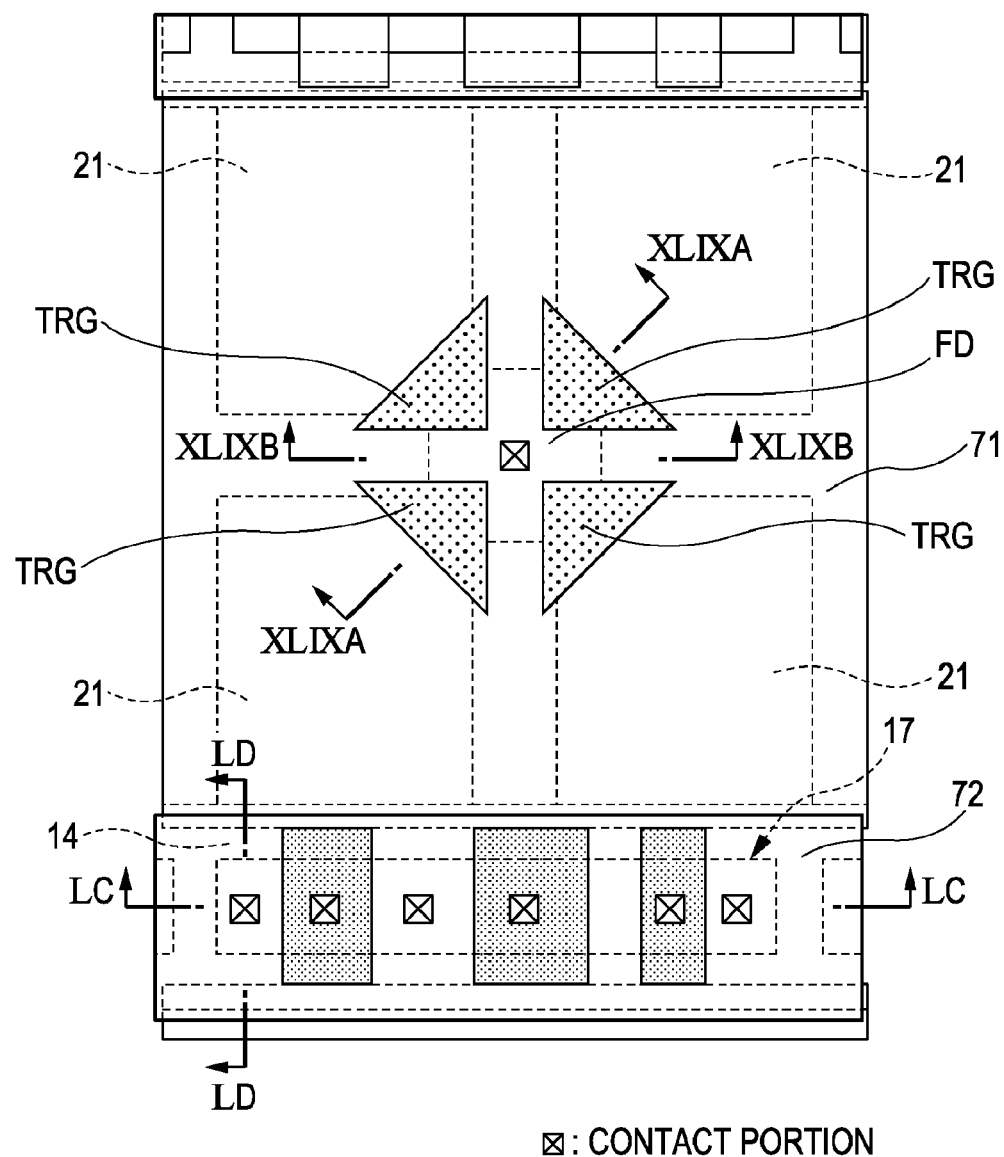
FIG. 48 is a planar layout view showing a third example of a solid-state imaging device according to an embodiment of the present invention.
Figure 49A:
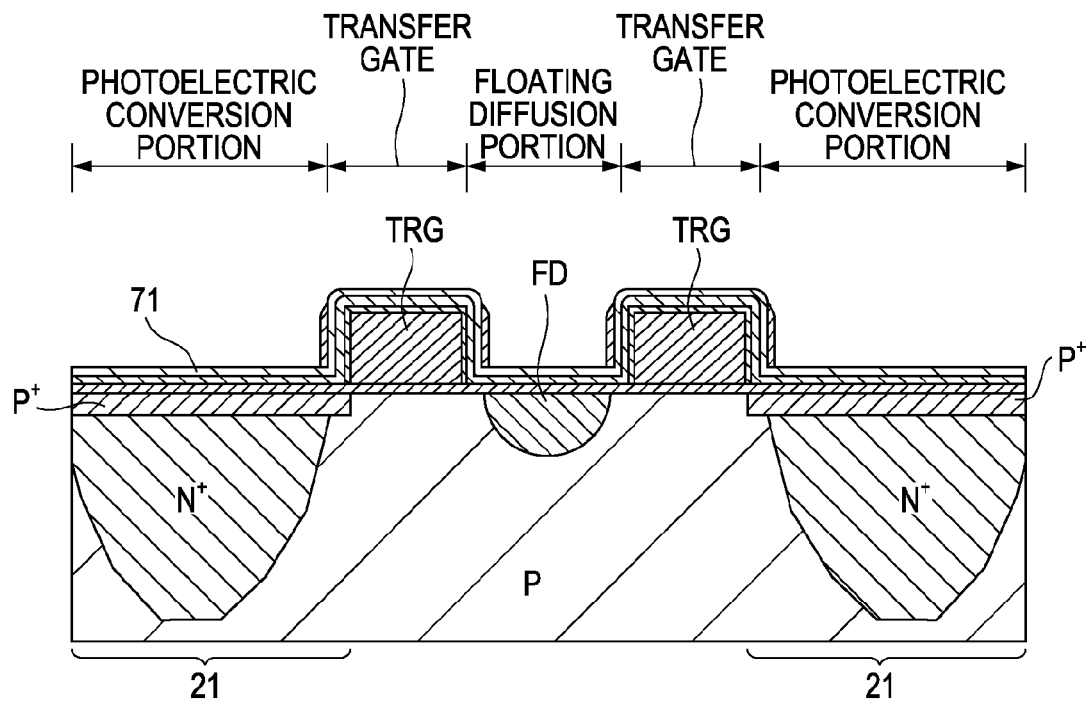
FIGS. 49A and 49B are partial cross-sectional views showing the third example of the solid-state imaging device according to an embodiment of the present invention.
Figure 49B:
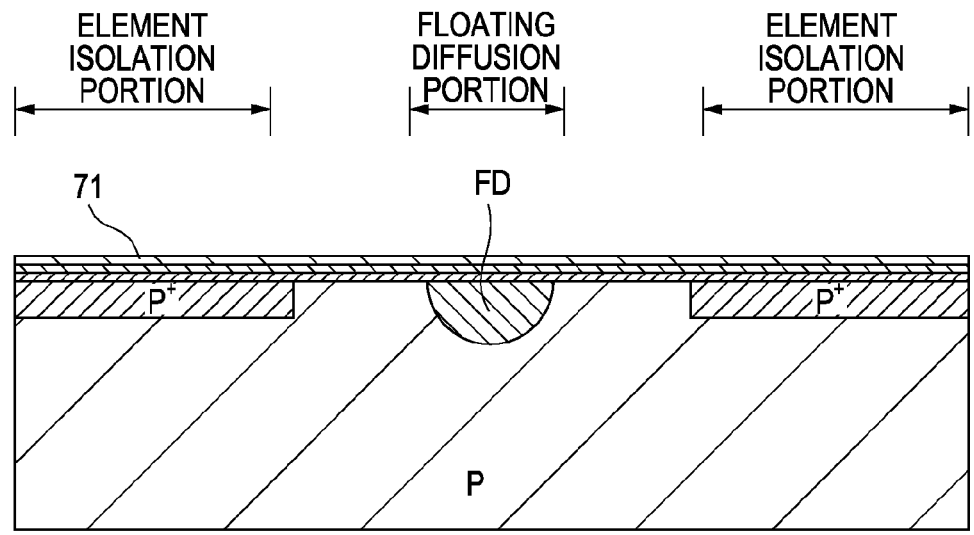
Figure 50C:
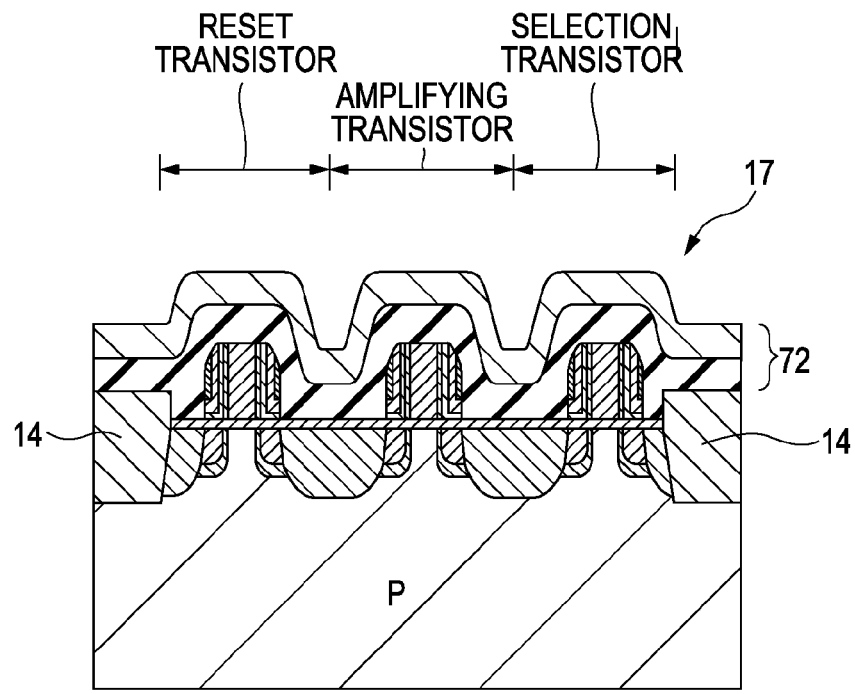
FIGS. 50C and 50D are partial cross-sectional views showing the third example of the solid-state imaging device according to an embodiment of the present invention.
Figure 50D:
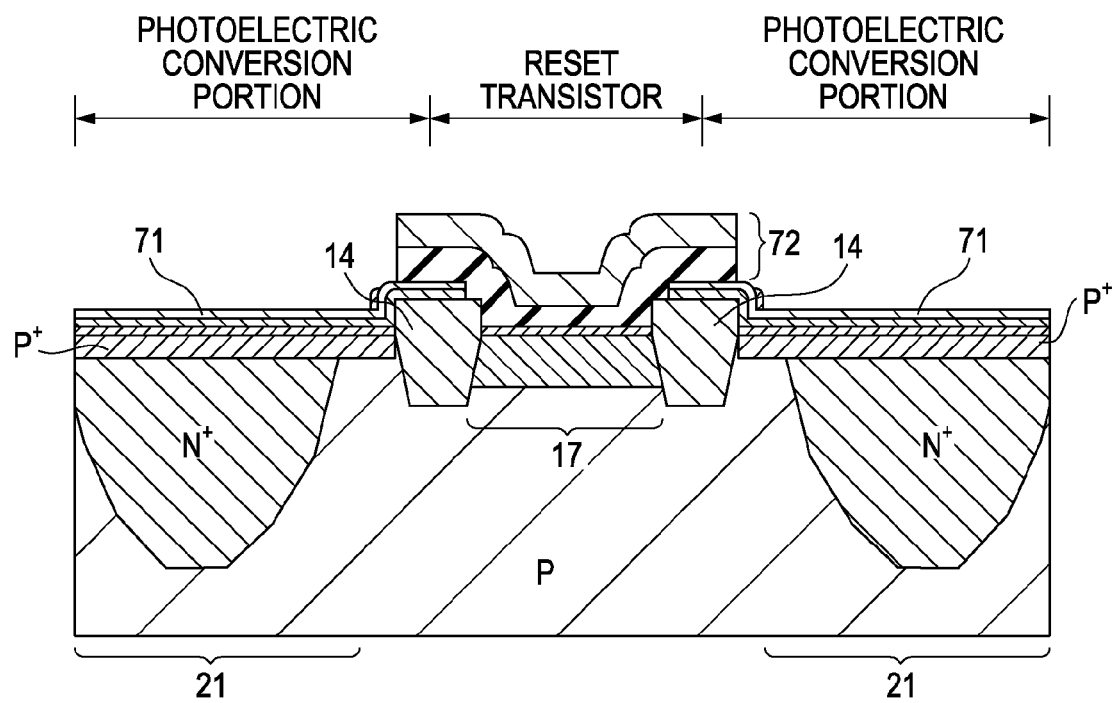

Next, a description will be made of a third example of a solid-state imaging device having the structure in which a single pixel transistor portion shares four pixels, the solid-state imaging device being described with reference to FIG. 40. The solid-state imaging device will be described with reference to FIGS. 48, 49A, 49B, 50C, 50D, etc. FIG. 48 is a planar layout view of a pixel portion, FIG. 49A is a cross-sectional view taken along line XLIXA-XLIXA in FIG. 48, FIG. 49B is a cross-sectional view taken along line XLIXB-XLIXB in FIG. 48, FIG. 50C is a cross-sectional view taken along line LC-LC in FIG. 48, and FIG. 50D is a cross-sectional view taken along line LD-LD in FIG. 48.

A first silicide blocking film 71 is formed so as to cover the photoelectric conversion portions 21, the transfer gates TRG, and the floating diffusion portion FD. In this case, a second silicide blocking film 72 is formed so as to cover the pixel transistor portion 17 on which the first silicide blocking film 71 is not formed in such a manner that the second silicide blocking film 72 overlaps with the first silicide blocking film 71, for example, on the isolation regions 14.

Accordingly, when sidewalls 33 in the pixel transistor portion 17 and sidewalls (not shown) in the peripheral circuit portion are formed, the floating diffusion portion FD is also covered with the first silicide blocking film 71 which is a sidewall film. This structure can prevent the occurrence of etching damage in the floating diffusion portion FD during the formation of the sidewalls. In addition, this structure can prevent the floating diffusion portion FD from receiving an effect of out-diffusion. Accordingly, the generation of a leak path can be suppressed, thereby suppressing the generation of the FD white flaws. Consequently, this structure can realize imaging with high image quality.

[Fourth Example of Structure of Solid-State Imaging Device]

Figure 51:
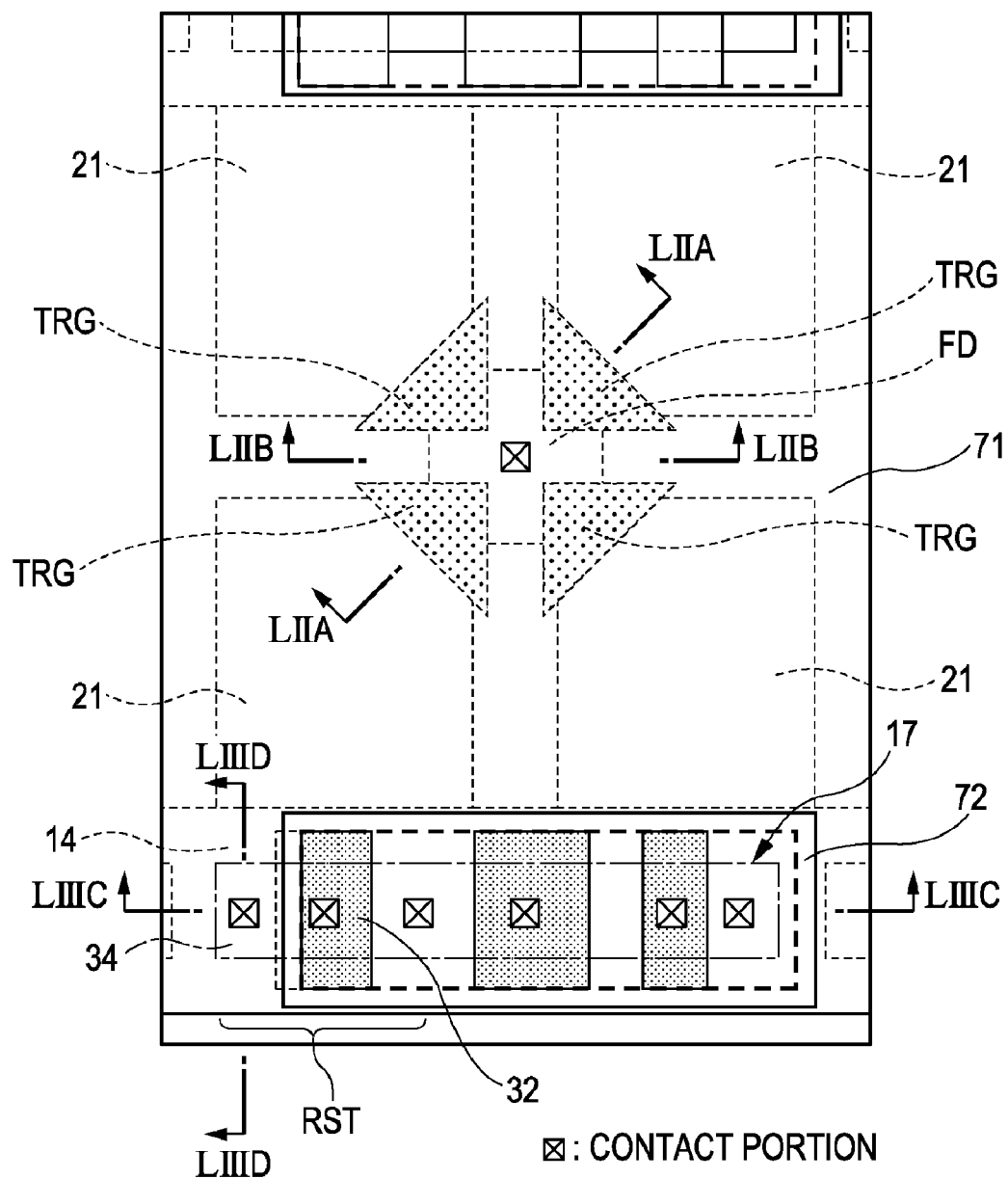
FIG. 51 is a planar layout view showing a fourth example of a solid-state imaging device according to an embodiment of the present invention.
Figure 52A:
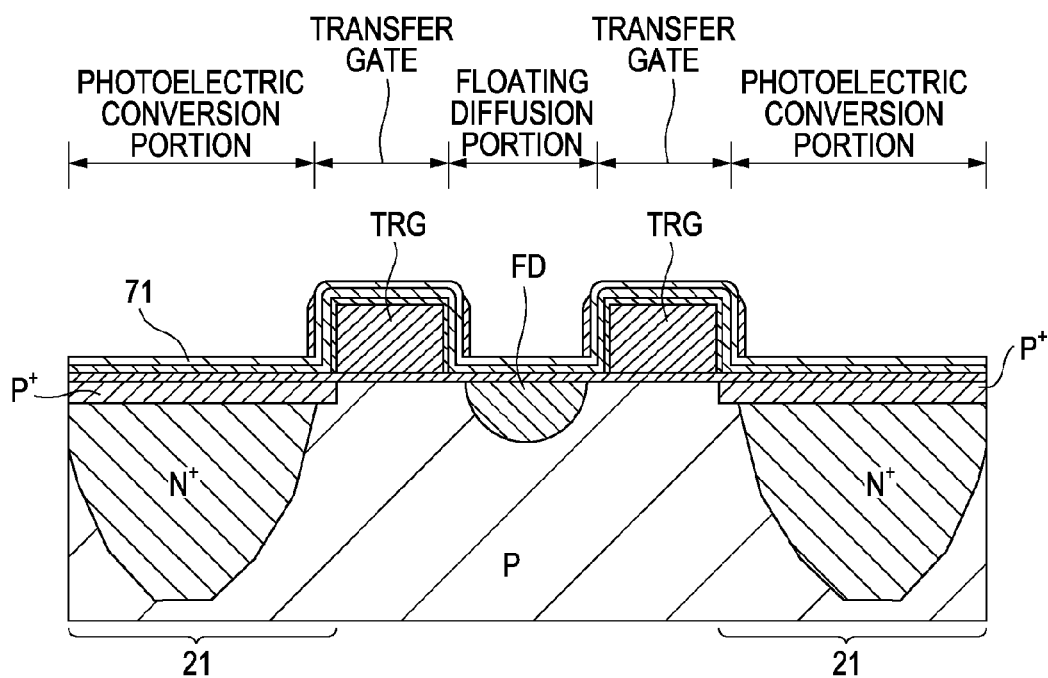
FIGS. 52A and 52B are partial cross-sectional views showing the fourth example of the solid-state imaging device according to an embodiment of the present invention.
Figure 52B:
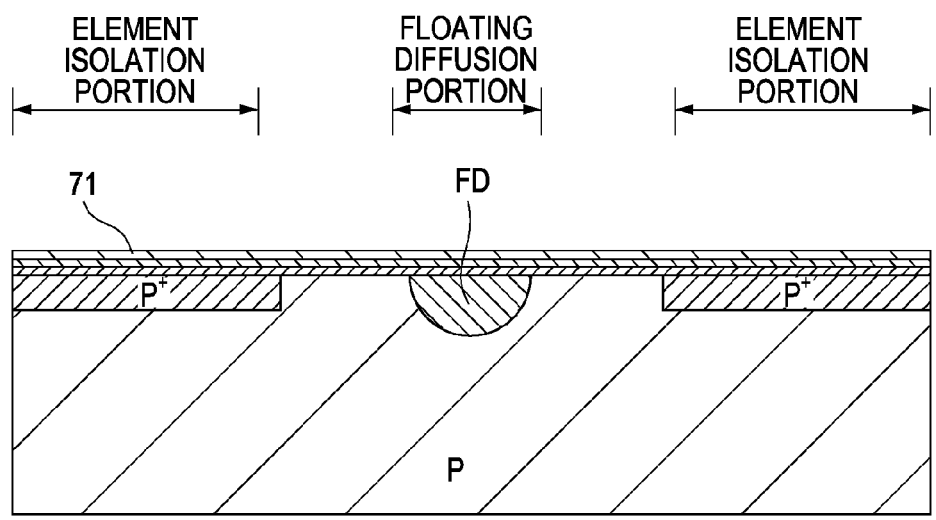
Figure 53C:
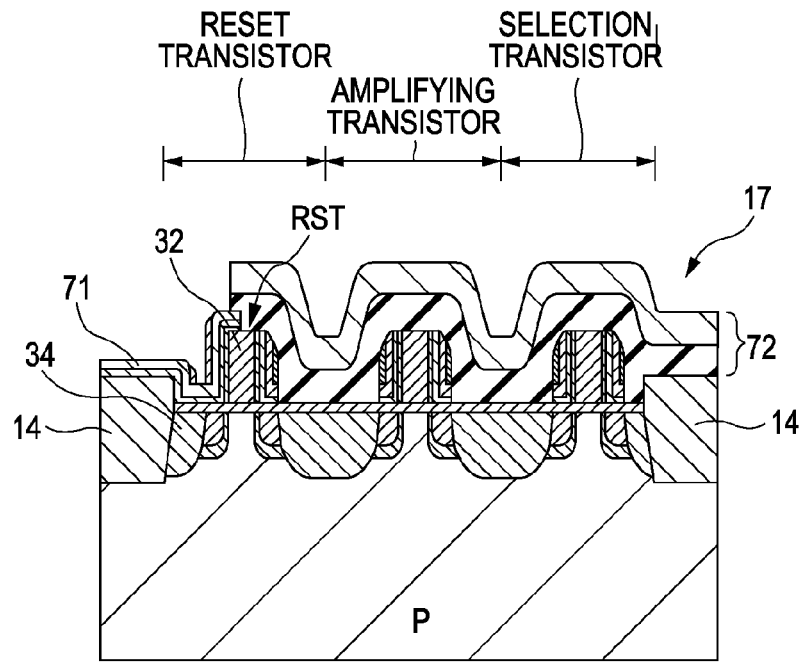
FIGS. 53C and 53D are partial cross-sectional views showing the fourth example of the solid-state imaging device according to an embodiment of the present invention.
Figure 53D:
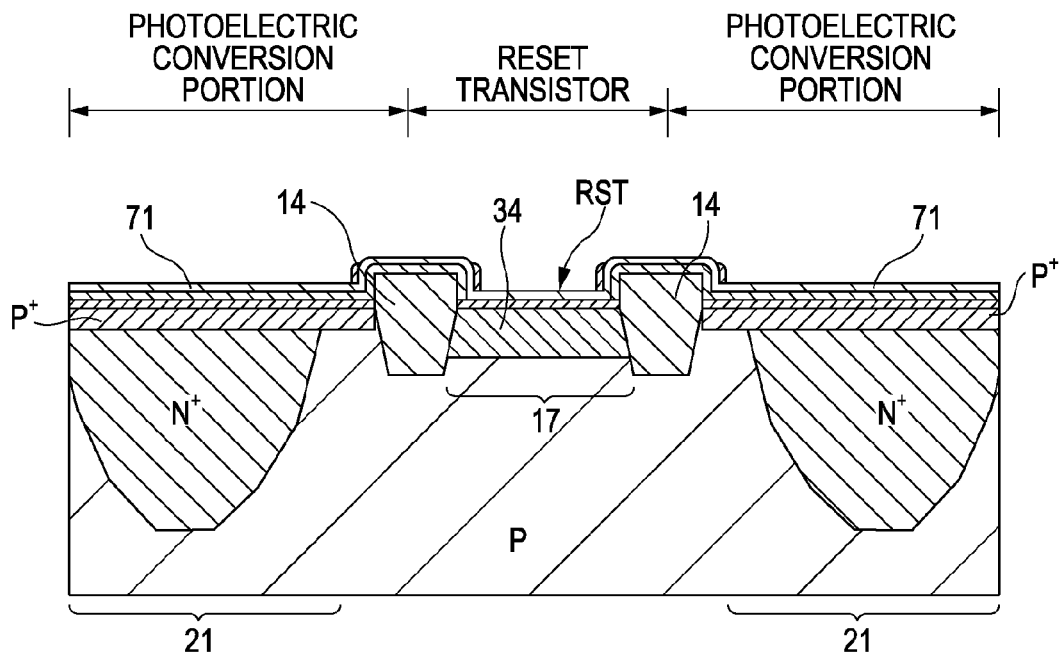

Next, a description will be made of a fourth example of a solid-state imaging device having the structure in which a single pixel transistor portion shares four pixels, the solid-state imaging device being described with reference to FIG. 40. The solid-state imaging device will be described with reference to FIGS. 51, 52A, 52B, 53C, 53D, etc. FIG. 51 is a planar layout view of a pixel portion, FIG. 52A is a cross-sectional view taken along line LIIA-LIIA in FIG. 51, FIG. 52B is a cross-sectional view taken along line LIIB-LIIB in FIG. 51, FIG. 53C is a cross-sectional view taken along line LIIIC-LIIIC in FIG. 51, and FIG. 53D is a cross-sectional view taken along line LIIID-LIIID in FIG. 51.

A first silicide blocking film 71 is formed so as to cover the photoelectric conversion portions 21, the transfer gates TRG, the floating diffusion portion FD, and the source-drain region 34 of the reset transistor RST. In this case, a second silicide blocking film 72 is formed so as to cover a region on which the first silicide blocking film 71 is not formed in such a manner that the second silicide blocking film 72 overlaps with the first silicide blocking film 71, for example, on the isolation regions 14 and the gate electrode 32 of the reset transistor RST.

Accordingly, the floating diffusion portion FD and the source-drain region 34 of the reset transistor RST connected to this floating diffusion portion FD are also covered with the first silicide blocking film 71 which is a sidewall film. Therefore, when sidewalls are formed in the pixel transistor portion and the peripheral circuit portion (not shown), the occurrence of etching damage to the floating diffusion portion FD and the source-drain region 34 of the reset transistor RST can be prevented. Furthermore, this structure can prevent the floating diffusion portion FD and the source-drain region 34 of the reset transistor RST from receiving the effect of out-diffusion. Accordingly, the generation of a leak path can be suppressed, thereby suppressing the generation of the FD white flaws. Consequently, this structure can realize imaging with high image quality.

In each of the third example and the fourth example of the solid-state imaging devices, the structure of the peripheral circuit portion is the same as that shown in FIG. 2 or 4.

4. Fourth Embodiment

[Third Example of Method of Producing Solid-state Imaging Device]

Next, main points of a production method (third example) for preventing etching damage of a floating diffusion portion FD will be described using a method of producing a solid-state imaging device having a structure in which a single pixel transistor portion shares four pixels as an example.

When the pixel transistor portion is shared by four pixels, the structure of this solid-state imaging device differs from the solid-state imaging device produced by the above first example of the production method in that a floating diffusion portion is formed at the center of an arrangement of photoelectric conversion portions and a transfer gate is formed between each of the photoelectric conversion portions and the floating diffusion portion. However, operations of the production process of this solid-state imaging device are the same as those of the first example except that the arrangement of the photoelectric conversion portions, the floating diffusion portion, and the transfer gates are different from that in the first example, and pattern shapes of a sidewall film and a second silicide blocking film are different from those in the first example. A part of the method will be described below.

Figure 54:
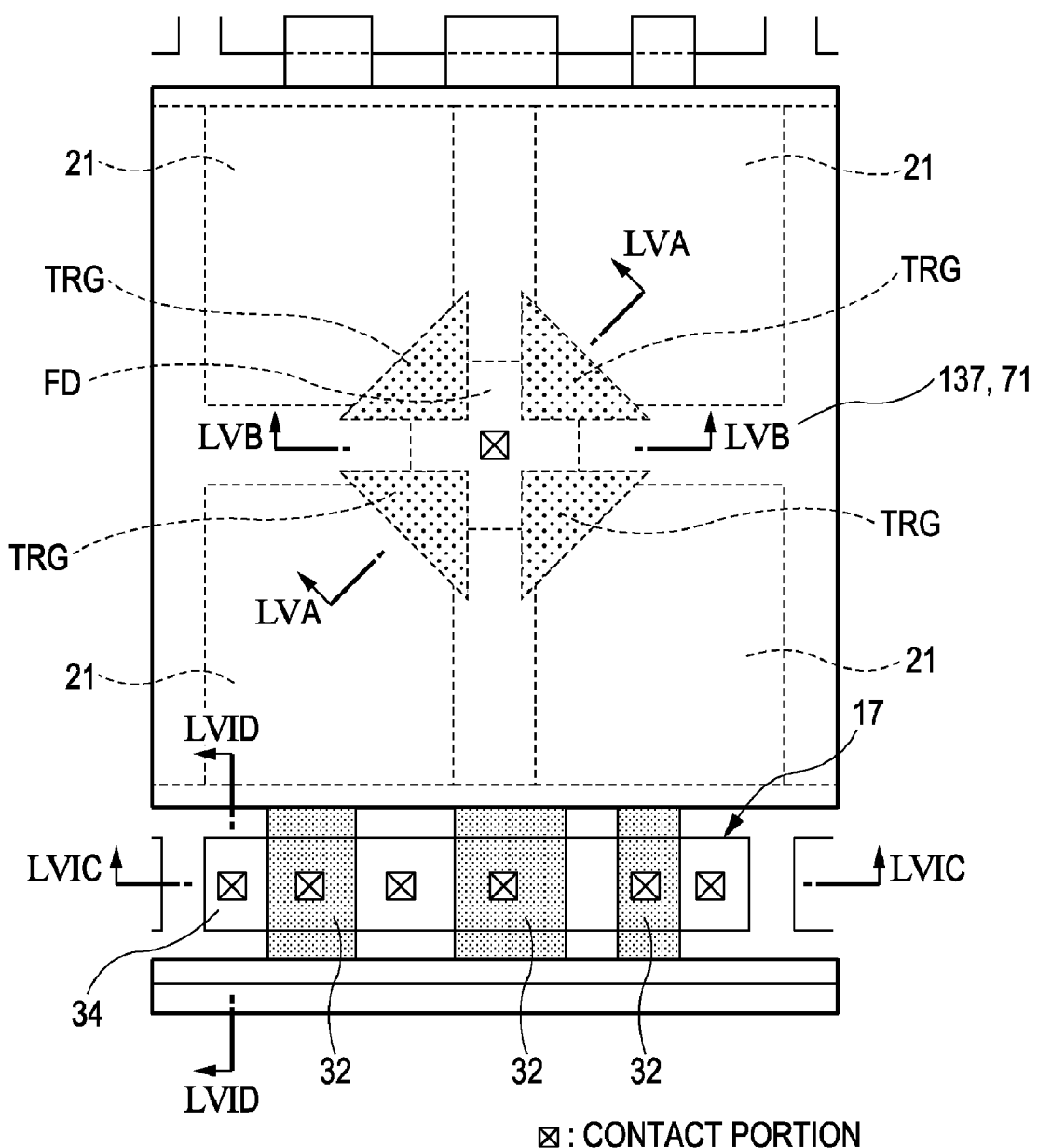
FIG. 54 is a planar layout view showing a third example of a method of producing a solid-state imaging device according to an embodiment of the present invention.
Figure 55A:
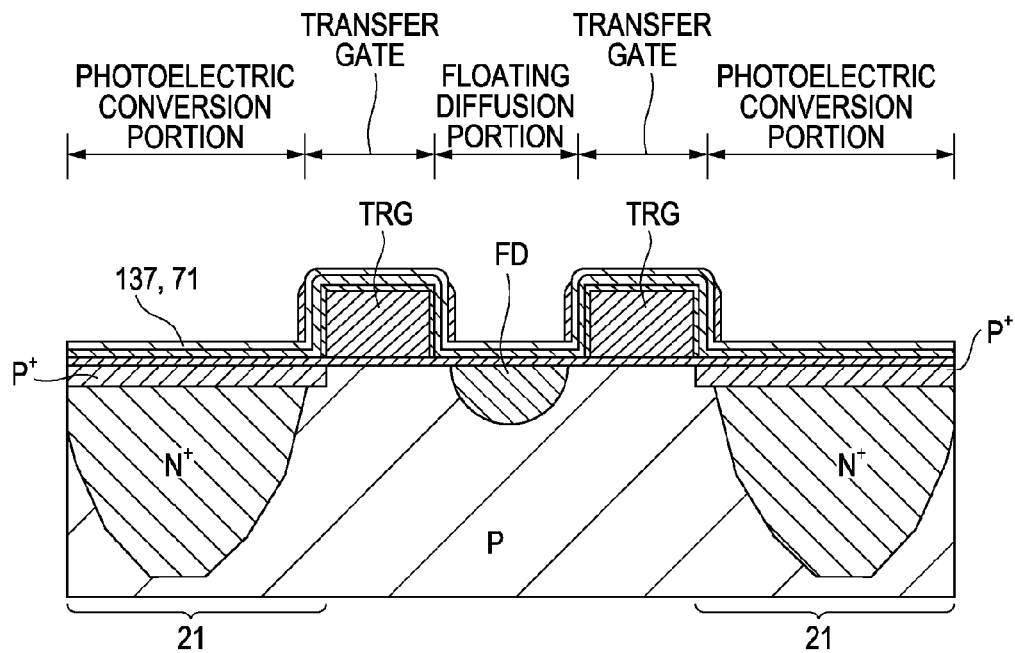
FIGS. 55A and 55B are partial cross-sectional views showing the third example of the method of producing a solid-state imaging device according to an embodiment of the present invention.
Figure 55B:
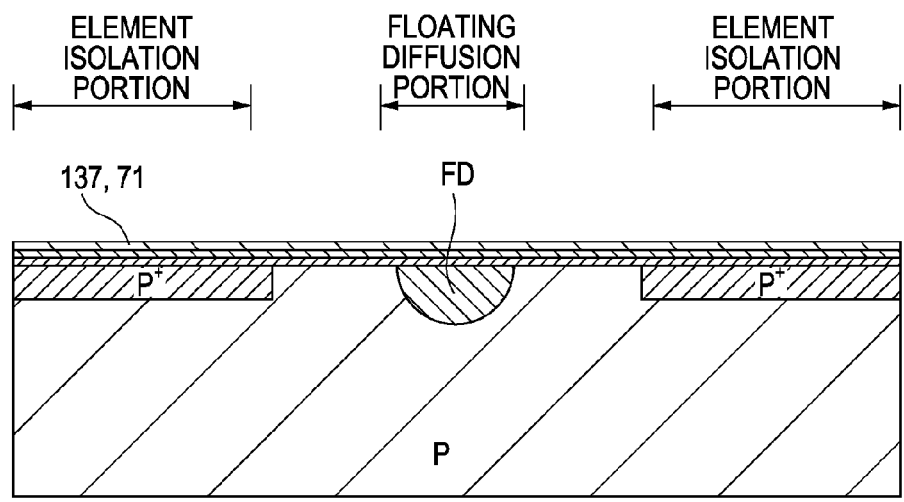
Figure 56C:
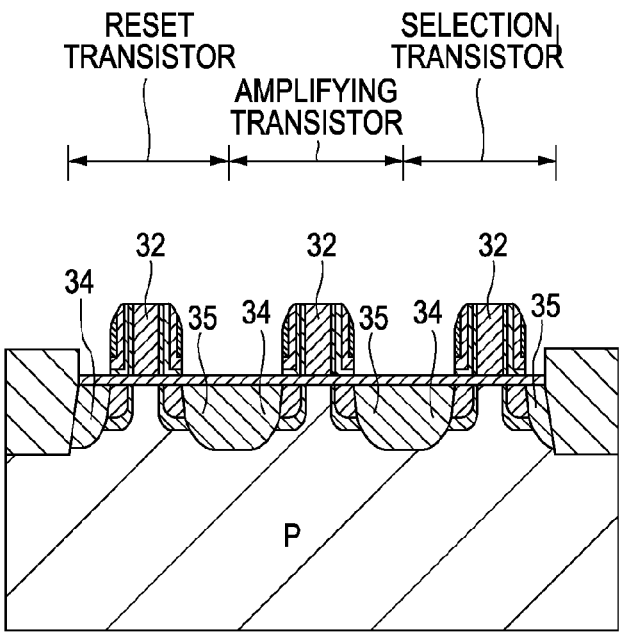
FIGS. 56C and 56D are partial cross-sectional views showing the third example of the method of producing a solid-state imaging device according to an embodiment of the present invention.
Figure 56D:
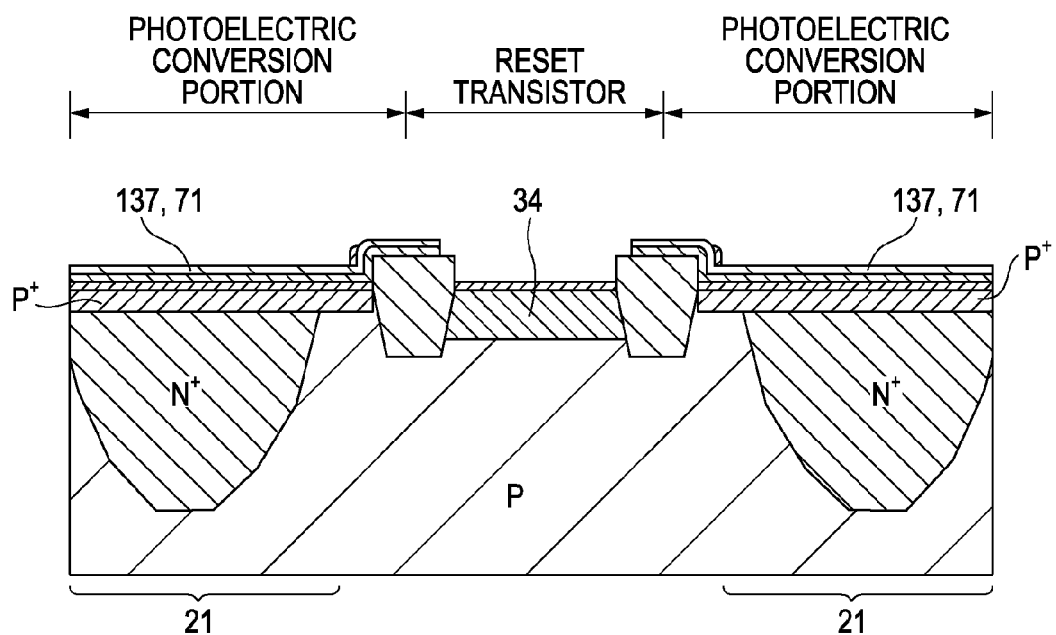

First, a step of forming a sidewall will be described with reference to FIGS. 54, 55A, 55B, 56C, 56D, etc. FIG. 54 is a planar layout view of a pixel portion, FIG. 55A is a cross-sectional view taken along line LVA-LVA in FIG. 54, FIG. 55B is a cross-sectional view taken along line LVB-LVB in FIG. 54, FIG. 56C is a cross-sectional view taken along line LVIC-LVIC in FIG. 54, and FIG. 56D is a cross-sectional view taken along line LVID-LVID in FIG. 54. After a sidewall film 137 (first silicide blocking film 71) is formed, etching-back of the sidewall film 137 is performed to form sidewalls (not shown) on sidewalls of each gate electrode 32 of a pixel transistor portion 17 and each gate electrode (not shown) in a peripheral circuit portion. In this case, the sidewall film 137 is left on photoelectric conversion portions 21 and a floating diffusion portion FD (and transfer gates TRG). This is because the photoelectric conversion portions 21 and the floating diffusion portion FD are covered with a resist mask (not shown) so that etching damage during the formation of the sidewalls does not enter the photoelectric conversion portions 21 and the floating diffusion portion FD. That is, this method differs from the first example of the production method described above only in that the resist mask 138 (see FIG. 25) is formed so as to extend to the floating diffusion portion FD. Other steps before the formation of the resist mask 138 are the same as those of the first example. Note that the floating diffusion portion FD, source-drain regions 34, and the like have not yet been formed in this stage. In order to facilitate the understanding of the positional relationship, the floating diffusion portion FD and the source-drain regions 34 are shown in the figures.

Subsequently, the source-drain regions 34 and 35 of transistors in the pixel portion and the peripheral circuit portion are formed. In this step, since the floating diffusion portion FD is covered with the sidewall film 137, ion implantation is preferably performed separately from ion implantation for forming the source-drain regions of the transistors in the pixel portion and the peripheral circuit portion.

Figure 57:
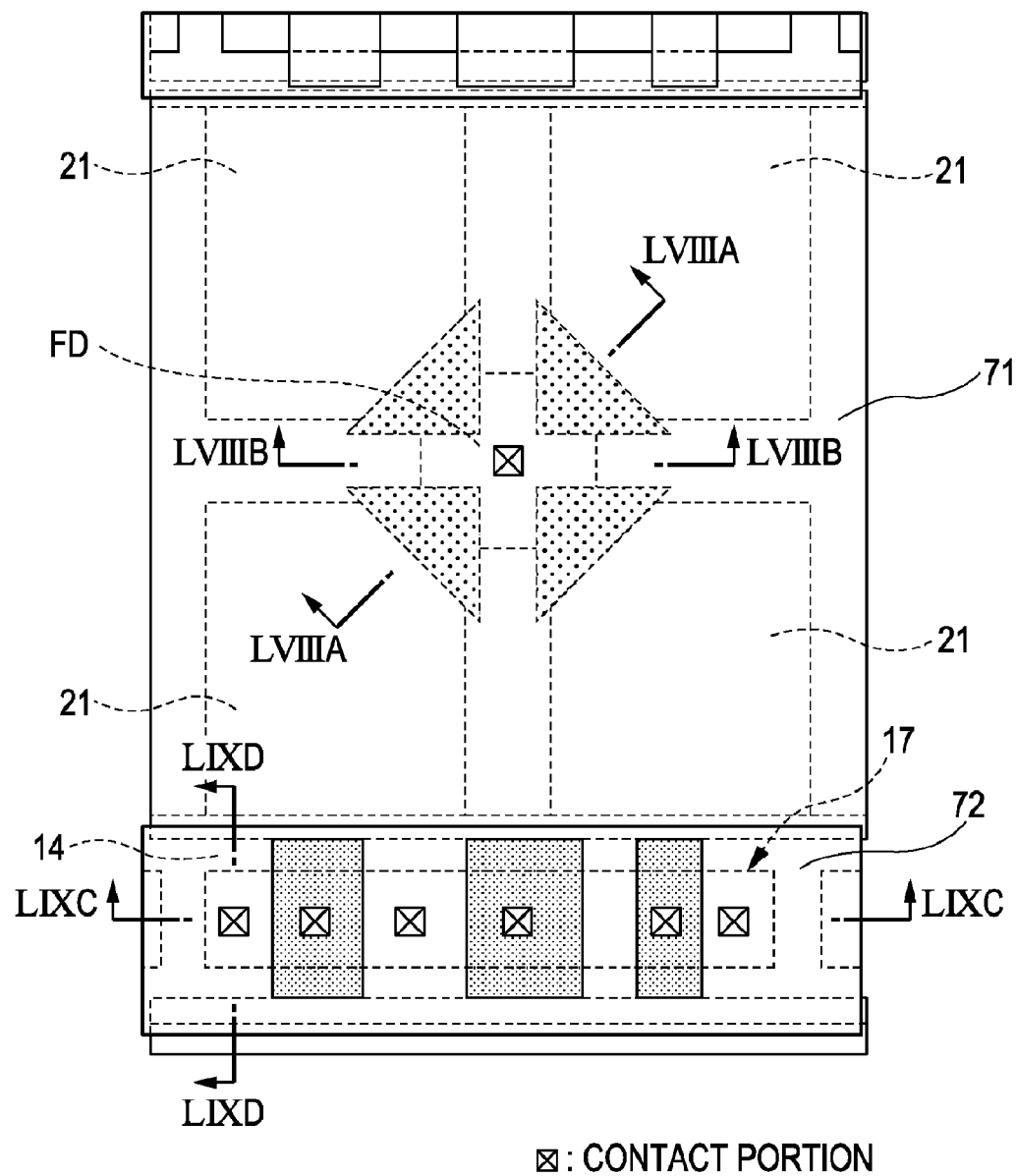
FIG. 57 is a planar layout view showing the third example of the method of producing a solid-state imaging device according to an embodiment of the present invention.
Figure 58A:
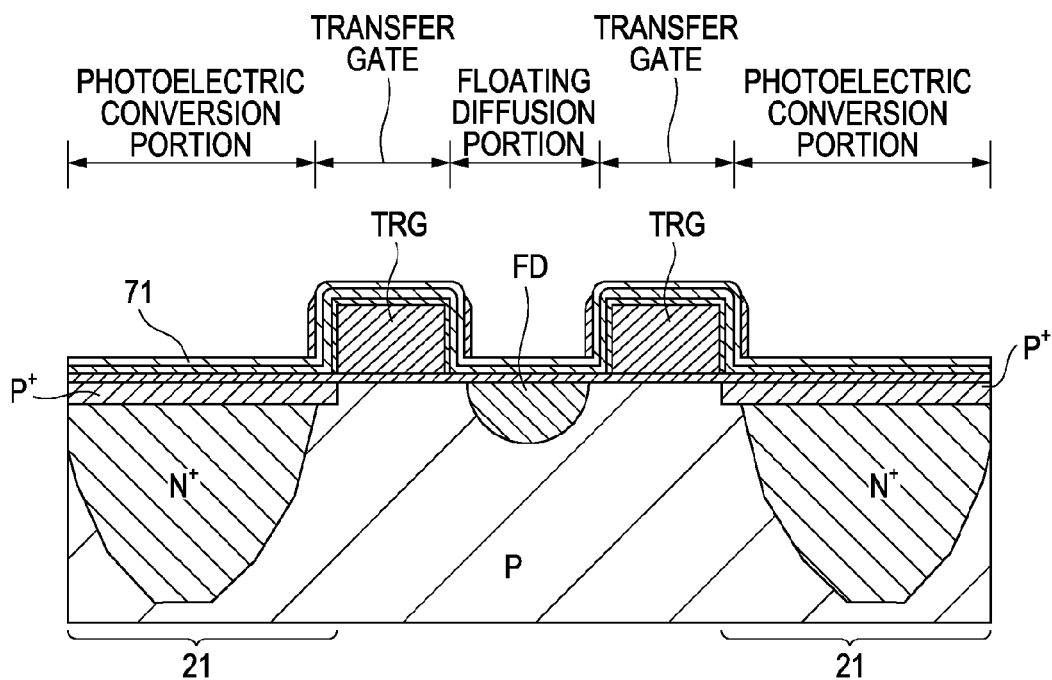
FIGS. 58A and 58B are partial cross-sectional views showing the third example of the method of producing a solid-state imaging device according to an embodiment of the present invention.
Figure 58B:
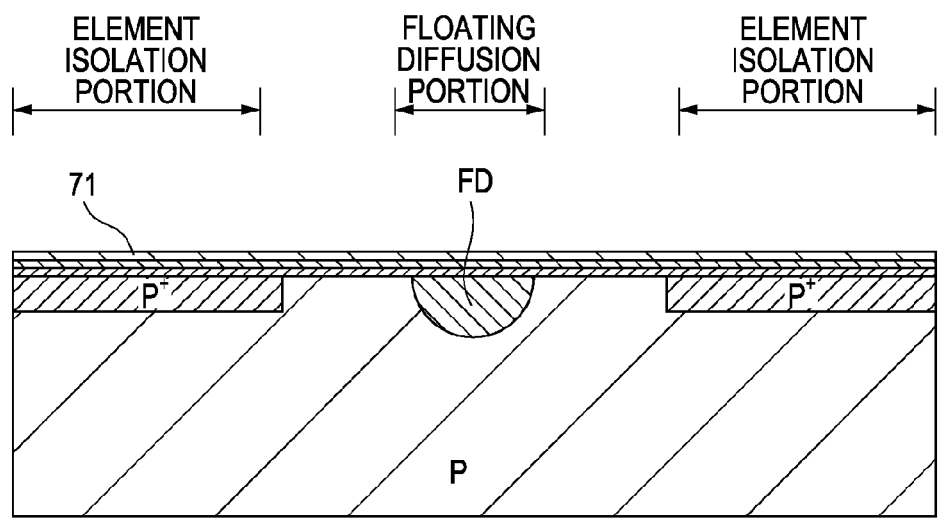
Figure 59C:
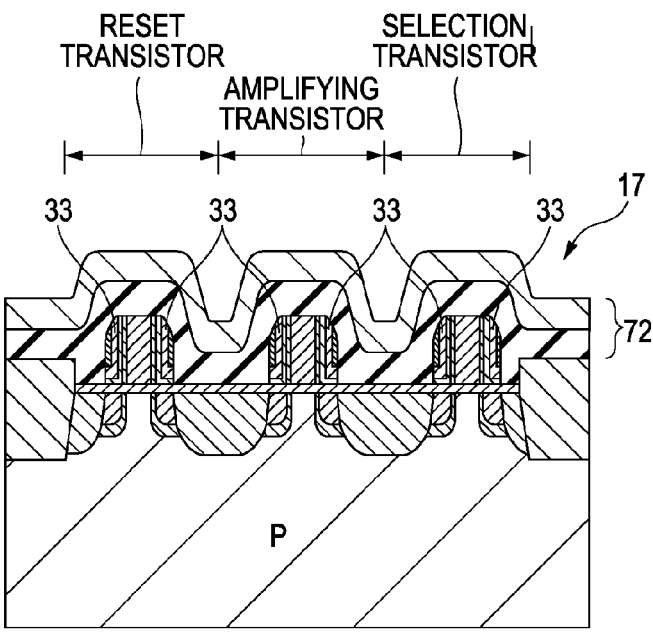
FIGS. 59C and 59D are partial cross-sectional views showing the third example of the method of producing a solid-state imaging device according to an embodiment of the present invention.
Figure 59D:
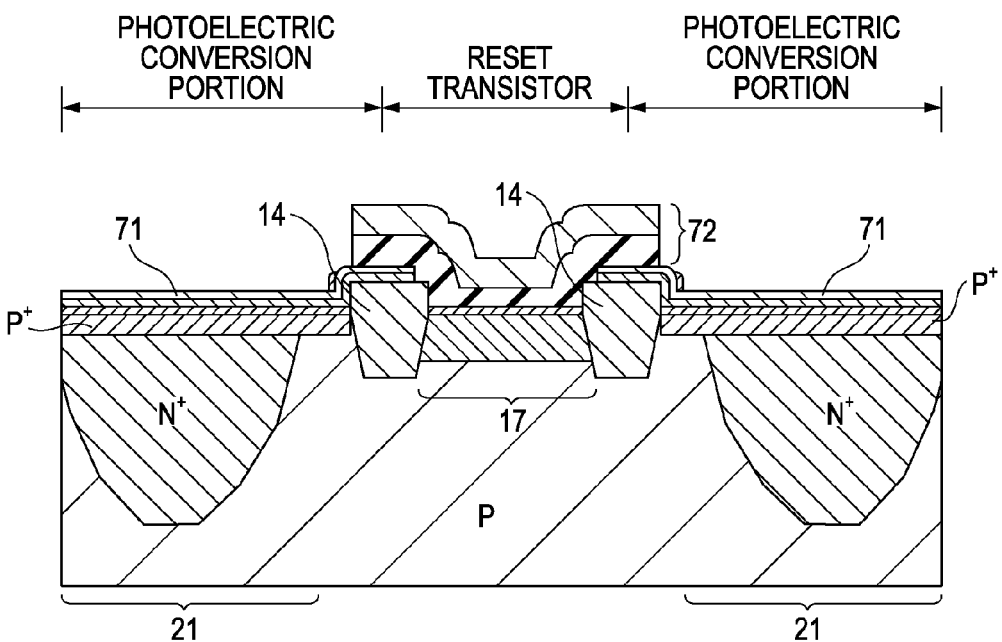

Next, a subsequent step will be described with reference to FIGS. 57, 58A, 58B, 59C, 59D, etc. FIG. 57 is a planar layout view of the pixel portion, FIG. 58A is a cross-sectional view taken along line LVIIIA-LVIIIA in FIG. 57, FIG. 58B is a cross-sectional view taken along line LVIIIB-LVIIIB in FIG. 57, FIG. 59C is a cross-sectional view taken along line LIXC-LIXC in FIG. 57, and FIG. 59D is a cross-sectional view taken along line LIXD-LIXD in FIG. 57. After the source-drain regions of the transistors in the pixel portion 12 and the peripheral circuit portion (not shown) are formed, a silicide layer is formed on the source-drain regions and the like in the peripheral circuit portion. In this step, it is necessary that the silicide layer be not formed on the pixel transistor portion 17, the photoelectric conversion portions 21, etc. For this purpose, prior to the formation of the silicide layer, a second silicide blocking film 72 covering the pixel transistor portion 17 is formed. In this step, the second silicide blocking film 72 is formed so as to overlap with the first silicide blocking film 71. Furthermore, in other portions, the second silicide blocking film 72 is formed so as to overlap with the first silicide blocking film 71 on an isolation region 14. Subsequently, as in the first example, the step of silicidation on the gate electrodes and the source-drain regions of the MOS transistors in the peripheral circuit portion, and the subsequent steps are performed.

Accordingly, when the sidewalls 33 in the pixel transistor portion 17 and the sidewalls (not shown) in the peripheral circuit portion are formed, the floating diffusion portion FD is also covered with the first silicide blocking film 71 which is the sidewall film. This structure can prevent the occurrence of etching damage in the floating diffusion portion FD during the formation of the sidewalls. In addition, this structure can prevent the floating diffusion portion FD from receiving the effect of out-diffusion. Accordingly, the generation of a leak path can be suppressed, thereby suppressing the generation of the FD white flaws. Thus, a solid-state imaging device that can realize imaging with high image quality can be produced. Furthermore, before the formation of the silicide layer, the pixel transistor portion 17 can be covered with the second silicide blocking film 72.

[Fourth Example of Method of Producing Solid-state Imaging Device]

Next, main points of a production method (fourth example) for preventing etching damage of a floating diffusion portion FD will be described using a method of producing a solid-state imaging device having a structure in which a single pixel transistor portion shares four pixels as an example.

When the pixel transistor portion is shared by four pixels, the structure of this solid-state imaging device differs from the solid-state imaging device produced by the above first example of the production method in that a floating diffusion portion is formed at the center of an arrangement of photoelectric conversion portions and a transfer gate is formed between each of the photoelectric conversion portions and the floating diffusion portion. However, operations of the production process of this solid-state imaging device are the same as those of the first example except that the arrangement of the photoelectric conversion portions, the floating diffusion portion, and the transfer gates are different from that in the first example, and pattern shapes of a sidewall film and a second silicide blocking film are different from those in the first example. A part of the method will be described below.

Figure 60:
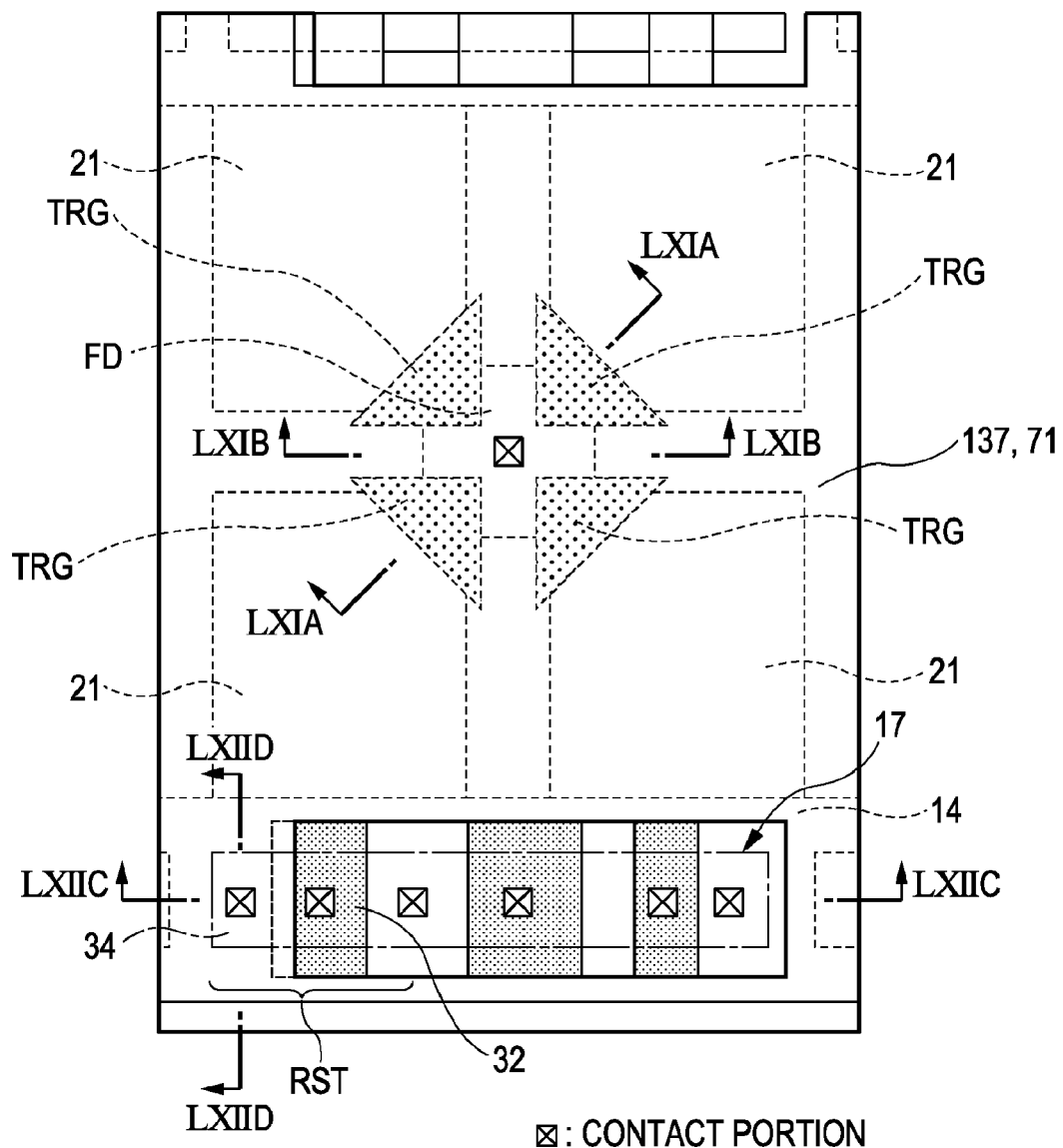
FIG. 60 is a planar layout view showing a fourth example of a method of producing a solid-state imaging device according to an embodiment of the present invention.
Figure 61A:
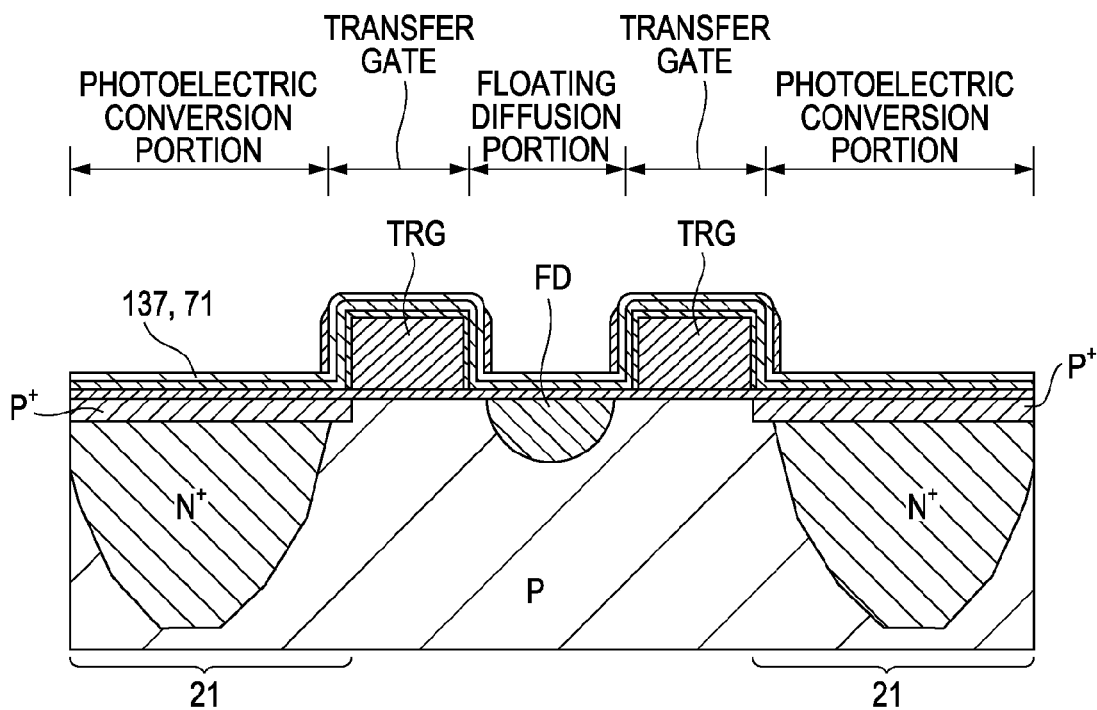
FIGS. 61A and 61B are partial cross-sectional views showing the fourth example of the method of producing a solid-state imaging device according to an embodiment of the present invention.
Figure 61B:
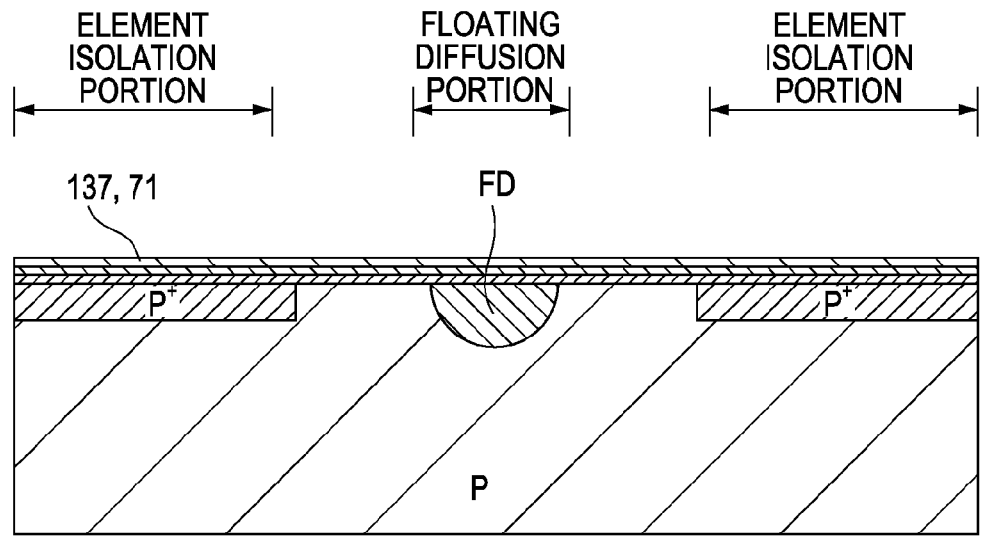
Figure 62C:
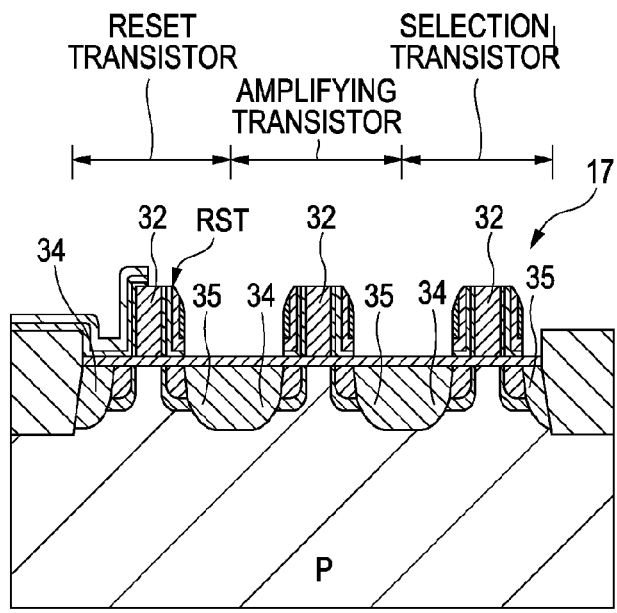
FIGS. 62C and 62D are partial cross-sectional views showing the fourth example of the method of producing a solid-state imaging device according to an embodiment of the present invention.
Figure 62D:
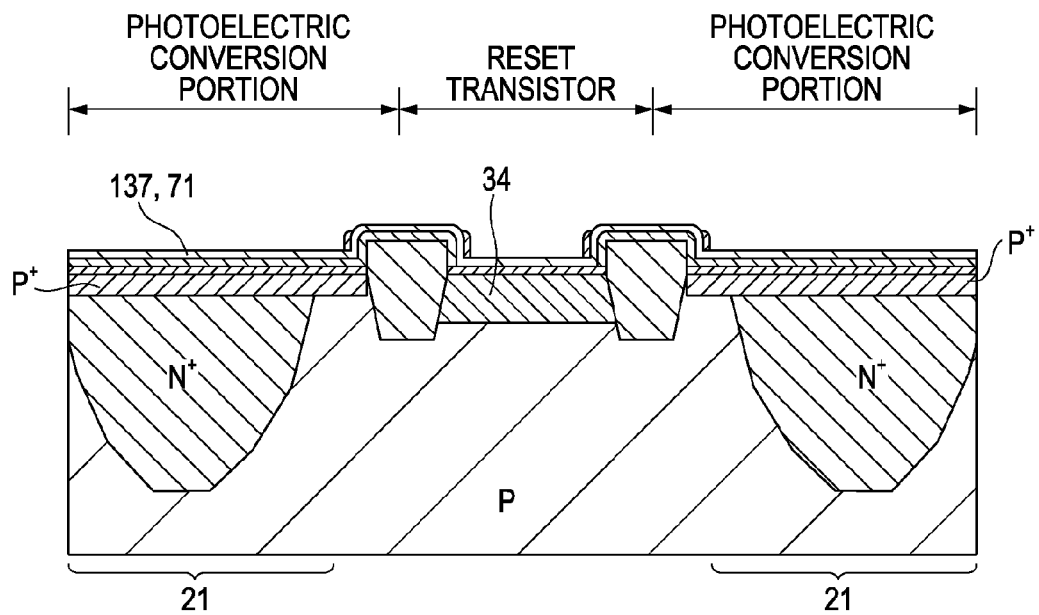

First, a step of forming a sidewall will be described with reference to FIGS. 60, 61A, 61B, 62C, 62D, etc. FIG. 60 is a planar layout view of a pixel portion, FIG. 61A is a cross-sectional view taken along line LXIA-LXIA in FIG. 60, FIG. 61B is a cross-sectional view taken along line LXIB-LXIB in FIG. 60, FIG. 62C is a cross-sectional view taken along line LXIIC-LXIIC in FIG. 60, and FIG. 62D is a cross-sectional view taken along line LXIID-LXIID in FIG. 60. After a sidewall film 137 (first silicide blocking film 71) is formed, etching-back of the sidewall film 137 is performed to form sidewalls (not shown) on sidewalls of each gate electrode 32 of a pixel transistor portion 17 and each gate electrode (not shown) in a peripheral circuit portion. In this case, the sidewall film 137 is left on photoelectric conversion portions 21, a floating diffusion portion FD (and transfer gates TRG), and a source-drain region 34 of a reset transistor RST. This is because the photoelectric conversion portions 21, the floating diffusion portion FD, and the source-drain region 34 of the reset transistor RST are covered with a resist mask (not shown) so that etching damage during the formation of the sidewalls does not enter the photoelectric conversion portions 21, the floating diffusion portion FD (and the transfer gates TRG), and the source-drain region 34 of the reset transistor RST. That is, this method differs from the first example of the production method described above only in that the resist mask 138 (see FIG. 25) is formed so as to extend to the floating diffusion portion FD, the source-drain region 34 of the reset transistor RST, and a part of the gate electrode 32 of the reset transistor RST. Other steps before the formation of the resist mask 138 are the same as those of the first example. Note that the floating diffusion portion FD, the source-drain regions 34, and the like have not yet been formed in this stage. In order to facilitate the understanding of the positional relationship, the floating diffusion portion FD and the source-drain regions 34 are shown in the figures.

Subsequently, the source-drain regions 34 and 35 of transistors in the pixel portion and the peripheral circuit portion are formed. In this step, since the floating diffusion portion FD and the source-drain region 34 of the reset transistor RST are covered with the sidewall film 137, ion implantation is preferably performed separately from ion implantation for forming the source-drain regions of the transistors in the pixel portion and the peripheral circuit portion.

Figure 63:
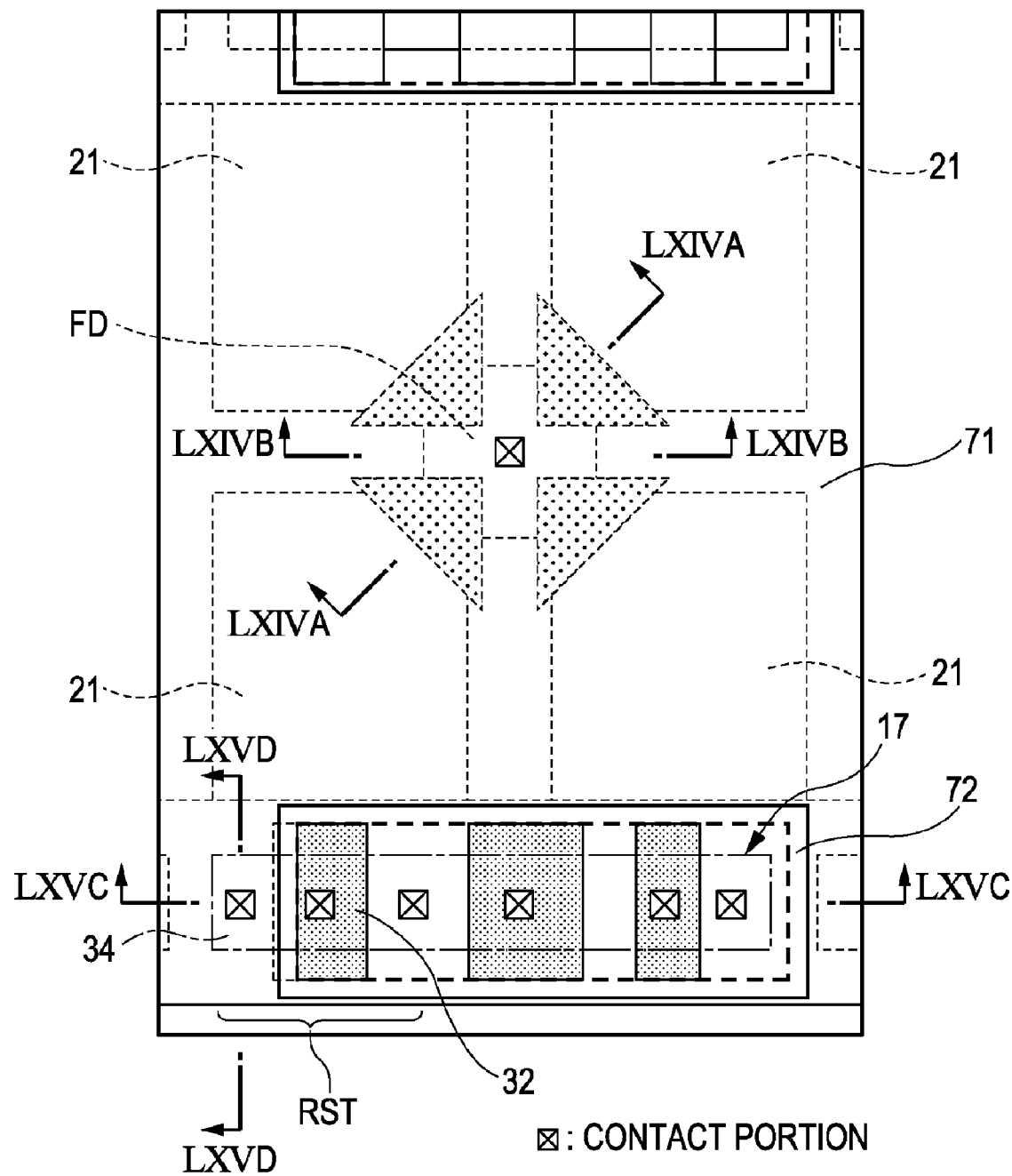
FIG. 63 is a planar layout view showing the fourth example of the method of producing a solid-state imaging device according to an embodiment of the present invention.
Figure 64A:
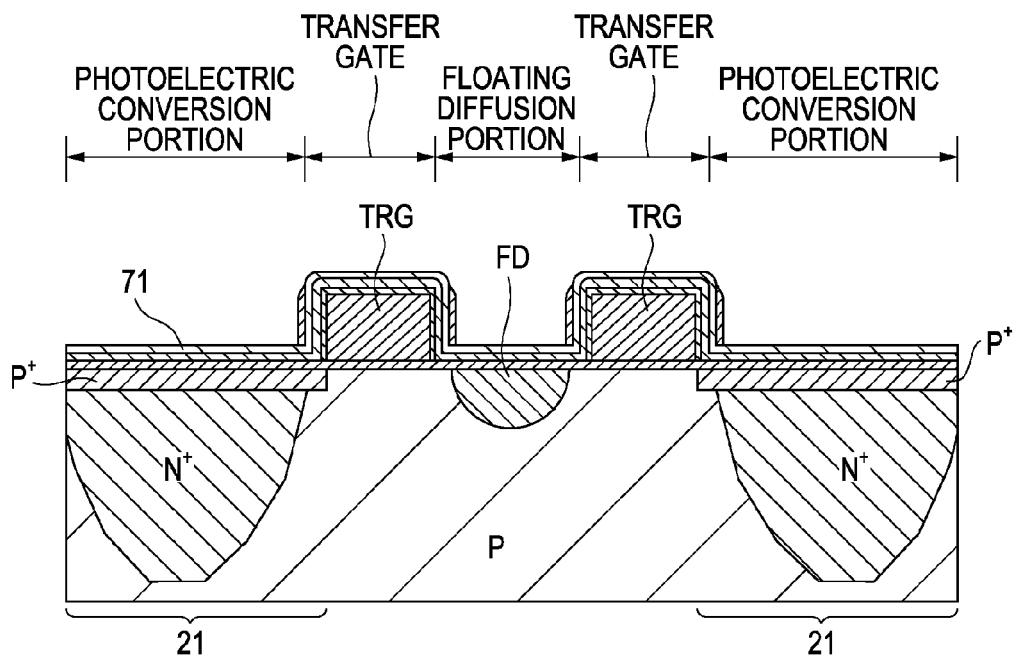
FIGS. 64A and 64B are partial cross-sectional views showing the fourth example of the method of producing a solid-state imaging device according to an embodiment of the present invention.
Figure 64B:
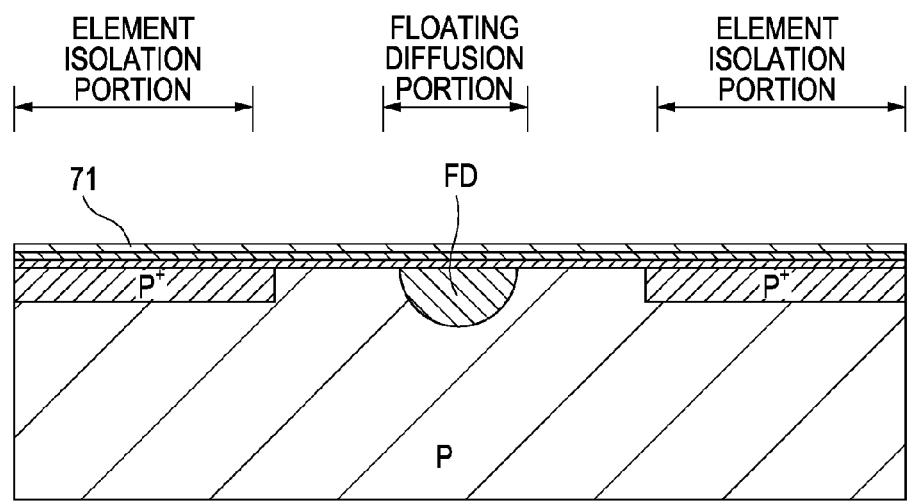
Figure 65C:
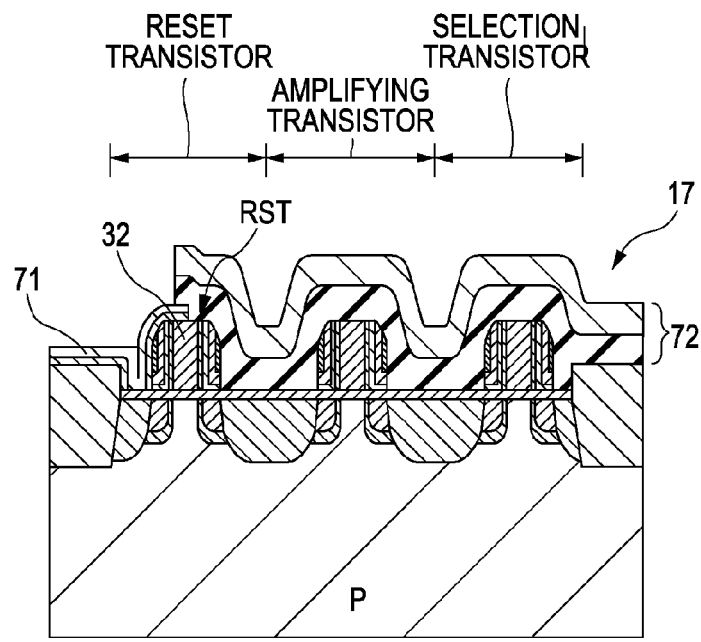
FIGS. 65C and 65D are partial cross-sectional views showing the fourth example of the method of producing a solid-state imaging device according to an embodiment of the present invention.
Figure 65D:
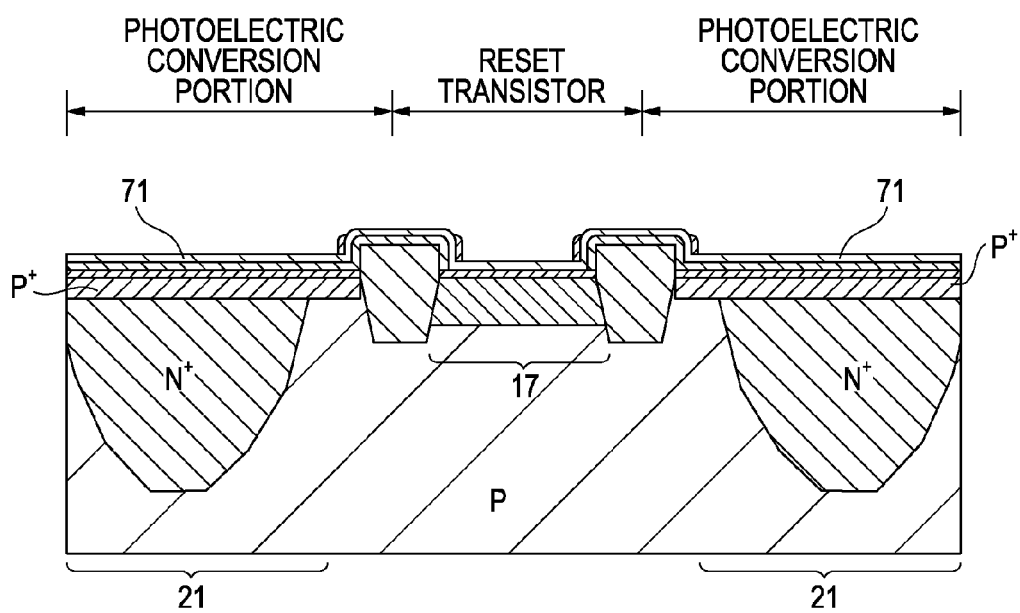

Next, a subsequent step will be described with reference to FIGS. 63, 64A, 64B, 65C, 65D, etc. FIG. 63 is a planar layout view of the pixel portion, FIG. 64A is a cross-sectional view taken along line LXIVA-LXIVA in FIG. 63, FIG. 64B is a cross-sectional view taken along line LXIVB-LXIVB in FIG. 63, FIG. 65C is a cross-sectional view taken along line LXVC-LXVC in FIG. 63, and FIG. 65D is a cross-sectional view taken along line LXVD-LXVD in FIG. 63. After the source-drain regions of the transistors in the pixel portion and the peripheral circuit portion are formed, a silicide layer is formed on the source-drain regions and the like in the peripheral circuit portion. In this step, it is necessary that the silicide layer be not formed on the pixel transistor portion 17, the photoelectric conversion portions 21, etc. For this purpose, prior to the formation of the silicide layer, a second silicide blocking film 72 covering the pixel transistor portion 17 is formed. In this step, the second silicide blocking film 72 is formed so as to overlap with the first silicide blocking film 71. In this case, since the first silicide blocking film 71 is formed so as to extend to the part of the gate electrode 32 of the reset transistor RST, the second silicide blocking film 72 may be formed so as to be overlap with the first silicide blocking film 71 on the gate electrode 32 of the reset transistor RST. Furthermore, in other portions, the second silicide blocking film 72 is formed so as to overlap with the first silicide blocking film 71 on an isolation region 14. Subsequently, as in the first example, the step of silicidation on the gate electrodes and the source-drain regions of the MOS transistors in the peripheral circuit portion, and the subsequent steps are performed.

Accordingly, when the sidewalls 33 in the pixel transistor portion 17 and the sidewalls (not shown) in the peripheral circuit portion are formed, the floating diffusion portion FD is also covered with the first silicide blocking film 71 which is the sidewall film. This structure can prevent the occurrence of etching damage in the floating diffusion portion FD during the formation of the sidewalls. In addition, this structure can prevent the floating diffusion portion FD from receiving an effect of out-diffusion. Accordingly, the generation of a leak path can be suppressed, thereby suppressing the generation of the FD white flaws. Thus, a solid-state imaging device that can realize imaging with high image quality can be produced. Furthermore, before the formation of the silicide layer, the pixel transistor portion 17 can be covered with the second silicide blocking film 72.

[Modification of Third Example and Fourth Example of Solid-state Imaging Device and Method of Producing the Same]

Figure 66:
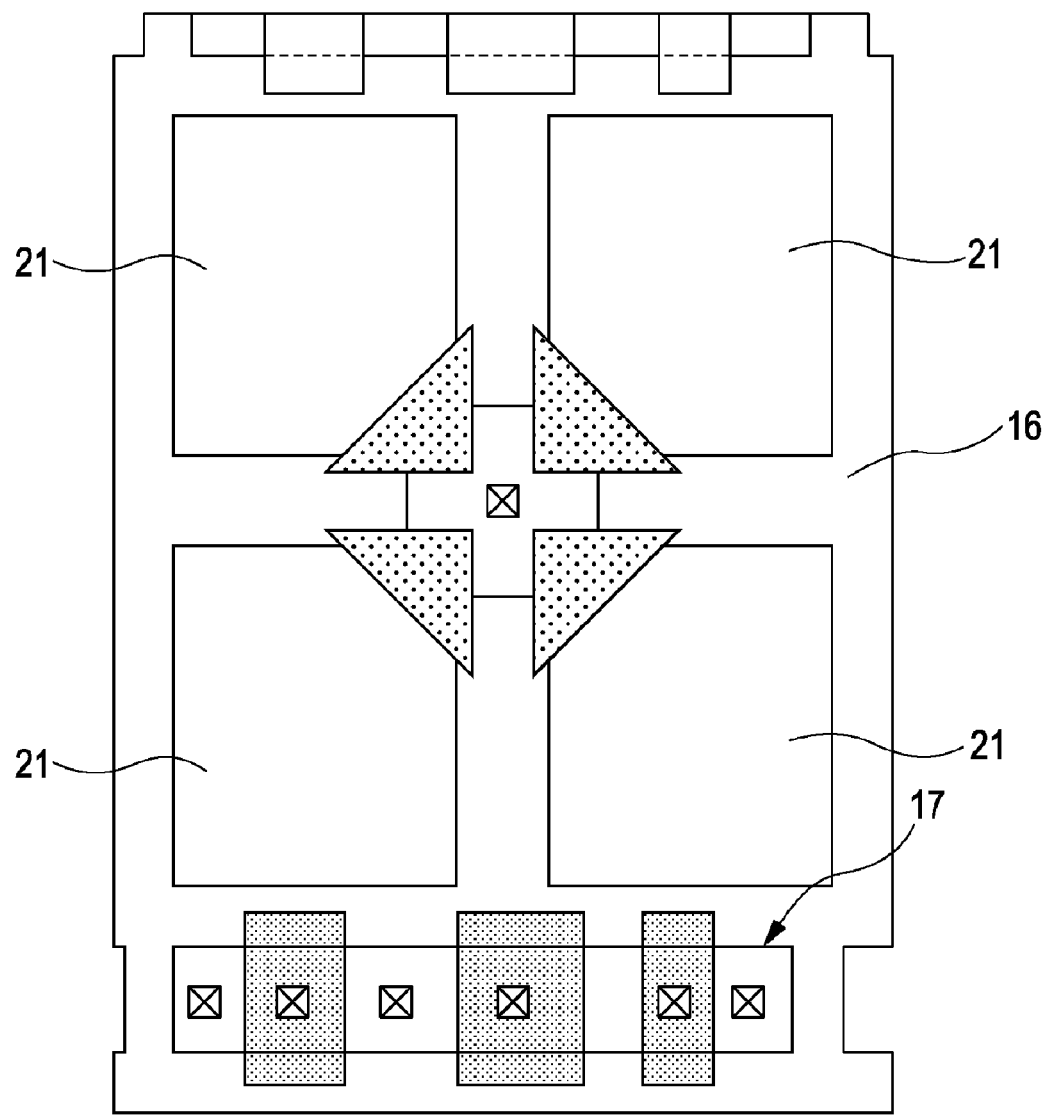
FIG. 66 is a planar layout view showing a modification of the third and fourth examples of the solid-state imaging device and the method of producing the same.

In the structure of the third example and the fourth example in which four pixels are shared by one pixel transistor portion 17, element isolation around the photoelectric conversion portions 21 is achieved using an impurity diffusion layer ($P^+$-type diffusion layer), and element isolation around the pixel transistor portion 17 is achieved by a shallow trench isolation (STI) structure. Alternatively, for example, as shown in FIG. 66, element isolation around the photoelectric conversion portions 21 and element isolation around the pixel transistor portion 17 may be formed by an isolation region 16 composed of an impurity diffusion layer ($P^+$-type diffusion layer). In this case, the first silicide blocking film 71 can be formed as in the third example, the fourth example, and the like. The second silicide blocking film 72 can also be formed as in the third example, the fourth example, and the like.

[Modification of First Example of Solid-state Imaging Device and Method of Producing the Same]

Figure 67:
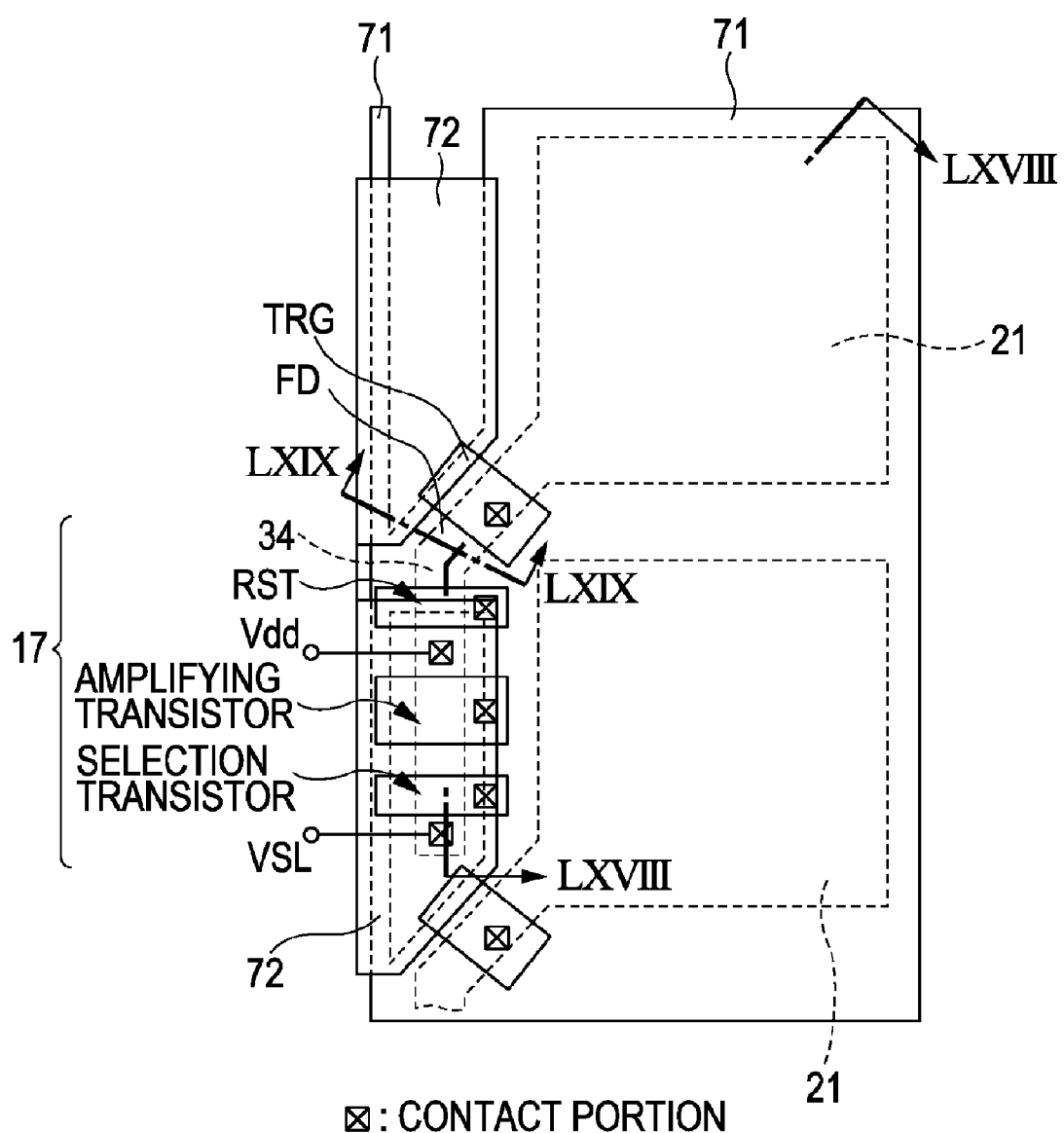
FIG. 67 is a planar layout view showing a modification of the first example of the solid-state imaging device and the method of producing the same.
Figure 68:
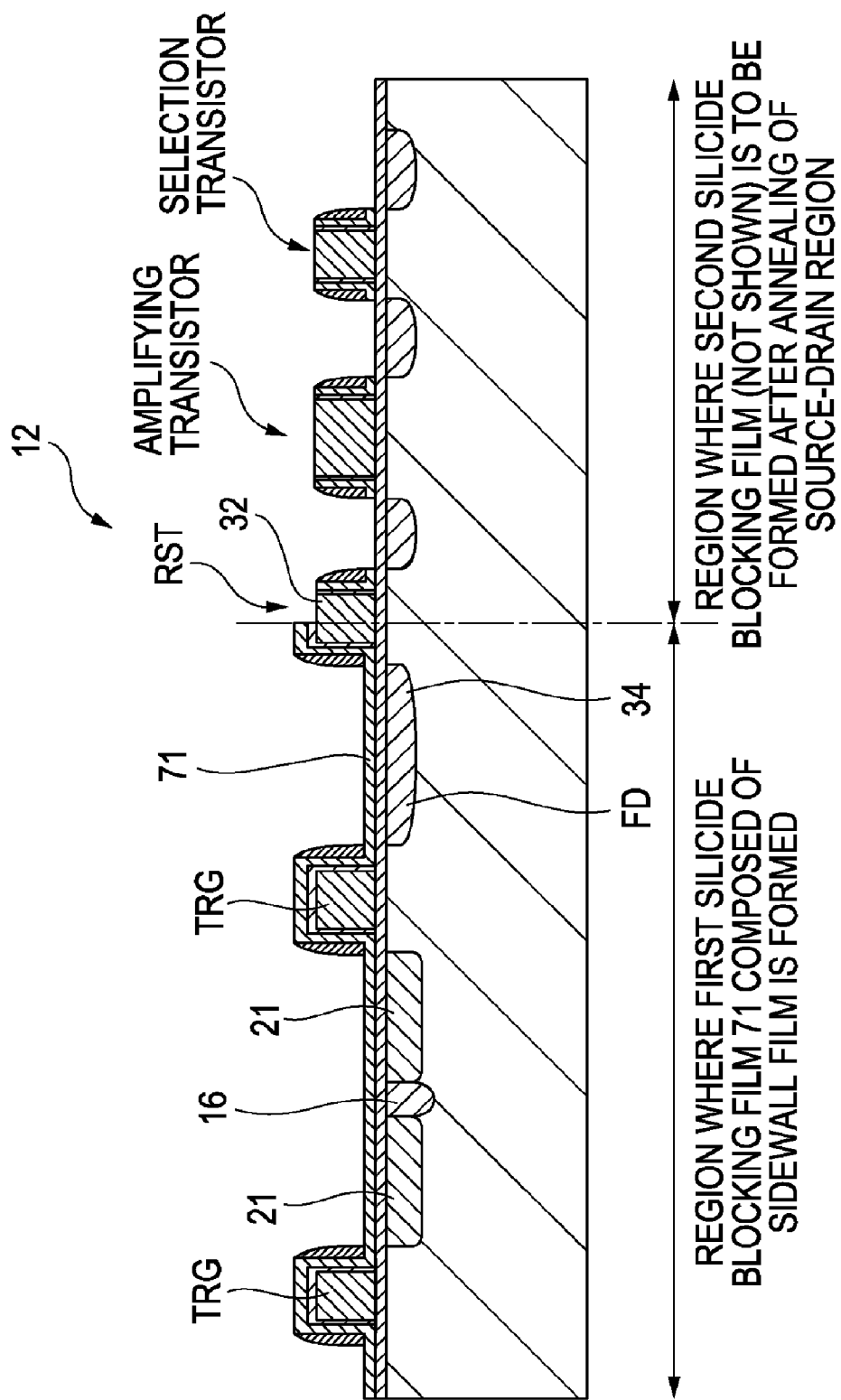
FIG. 68 is a partial cross-sectional view showing the modification of the first example of the solid-state imaging device and the method of producing the same.
Figure 69A:
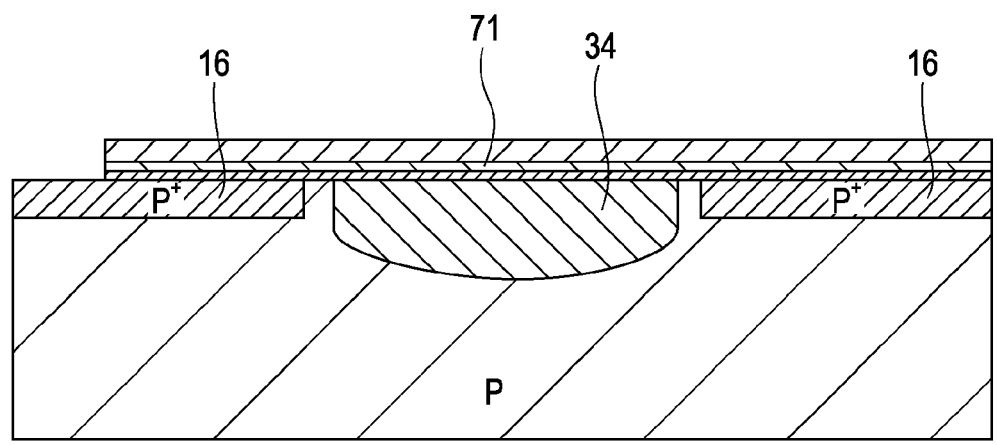
FIGS. 69A and 69B are partial cross-sectional views showing the modification of the first example of the solid-state imaging device and the method of producing the same.
Figure 69B:
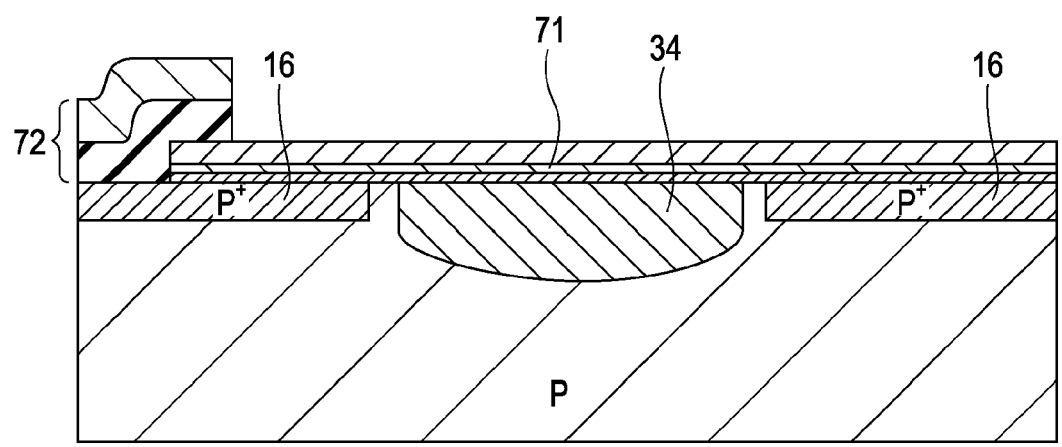

In the structure shown in FIG. 5A, element isolation around the photoelectric conversion portions 21 and element isolation around the pixel transistor portion are achieved by a shallow trench isolation (STI) structure. Alternatively, for example, as shown in FIGS. 67 to 69B, element isolation around the photoelectric conversion portions 21 and element isolation around the pixel transistor portion 17 may be achieved by an isolation region 16 composed of an impurity diffusion layer ($P^+$-type diffusion layer). In this case, the first silicide blocking film 71 is formed on the photoelectric conversion portion 21, the transfer gate TRG, the floating diffusion portion FD, the source-drain region 34 of the reset transistor RST, and a part of the gate electrode 32 of the reset transistor RST. The second silicide blocking film 72 is formed so as to overlap with the first silicide blocking film 71. In this case, since the first silicide blocking film 71 is formed on the part of the gate electrode 32 of the reset transistor RST, the second silicide blocking film 72 may be formed so as to overlap with the first silicide blocking film 71 on the gate electrode 32 of the reset transistor RST. Furthermore, in other portions, the second silicide blocking film 72 is formed so as to overlap with the first silicide blocking film 71 on the isolation region 16. FIG. 68 is a cross-sectional view taken along line LXVIII-LXVIII in FIG. 67, and FIGS. 69A and 69B are cross-sectional views taken along line LXIX-LXIX in FIG. 67.

In each of the third example and the fourth example of the methods of producing a solid-state imaging device, the structure of the peripheral circuit portion is the same as that of the first example of the above production method.

[Detailed Example of Method of Producing Solid-state Imaging Device]

Next, a detailed example of a method of producing a solid-state imaging device having a structure in which a single pixel transistor portion shares four pixels will now be described with reference to cross-sectional views of FIGS. 70A to 93D. This method is a method of producing the structure described with reference to the planar layout view of a pixel portion of FIG. 51. FIGS. 70A, 72A, 74A, 76A, 78A, 80A, 82A, 84A, 86A, 88A, 90A, and 92A are cross-sectional views taken along line LIIA-LIIA in FIG. 51. FIGS. 70B, 72B, 74B, 76B, 78B, 80B, 82B, 84B, 86B, 88B, 90B, and 92B are cross-sectional views taken along line LIIB-LIIB in FIG. 51. FIGS. 71C, 73C, 75C, 77C, 79C, 81C, 83C, 85C, 87C, 89C, 91C, and 93C are cross-sectional views taken along line LIIIC-LIIIC in FIG. 51. FIGS. 71D, 73D, 75D, 77D, 79D, 81D, 83D, 85D, 87D, 89D, 91D, and 93D are cross-sectional views taken along line LIIID-LIIID in FIG. 51.

First, the steps shown in FIGS. 6 to 12 are performed. For example, a silicon substrate is used as a semiconductor substrate 11. First isolation regions 14 are formed at the periphery of a pixel transistor portion, and second isolation regions 15 in a peripheral circuit portion 13 are formed. Next, although not shown in FIGS. 6 to 12, a p-well and an n-well are formed in the semiconductor substrate 11. Channel ion implantation is further performed. Furthermore, ion implantation for forming photodiodes in photoelectric conversion portions is performed to form p-type regions. For example, ion implantation of boron (B) is performed on the surface of the semiconductor substrate on which the photoelectric conversion portions are formed, and ion implantation is performed in deep regions using arsenic (As) or phosphorus (P) to form n-type regions that form a junction with a lower part of the p-type regions. Thus, the photoelectric conversion portions including a p-n junction are formed.

Figure 70A:
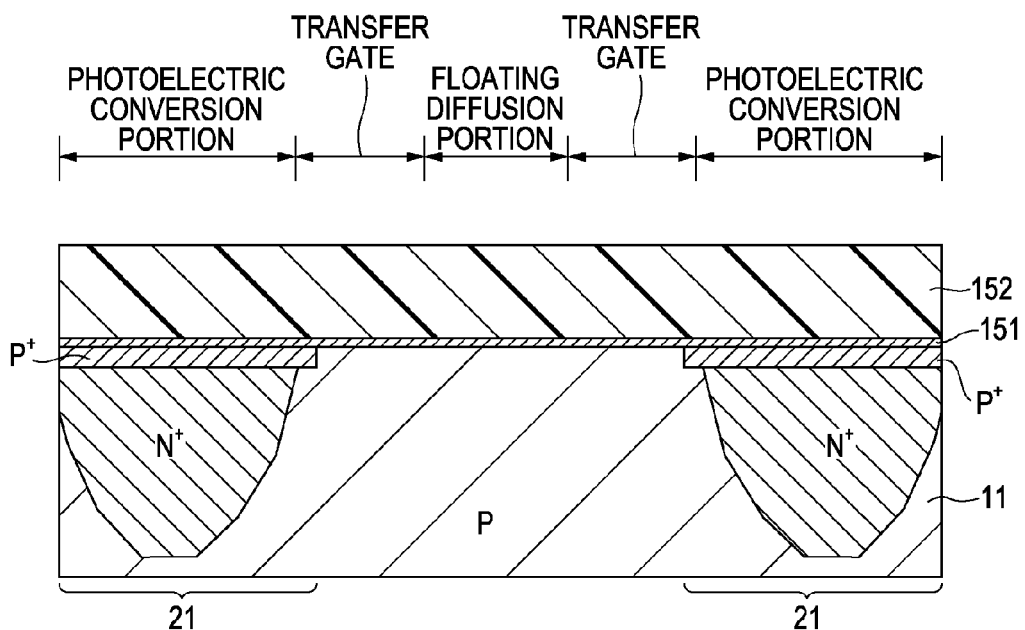
FIGS. 70A and 70B are cross-sectional views showing a detailed example of a method of producing a solid-state imaging device having a structure in which a single pixel transistor portion shares four pixels (four-pixel sharing structure)
Figure 70B:
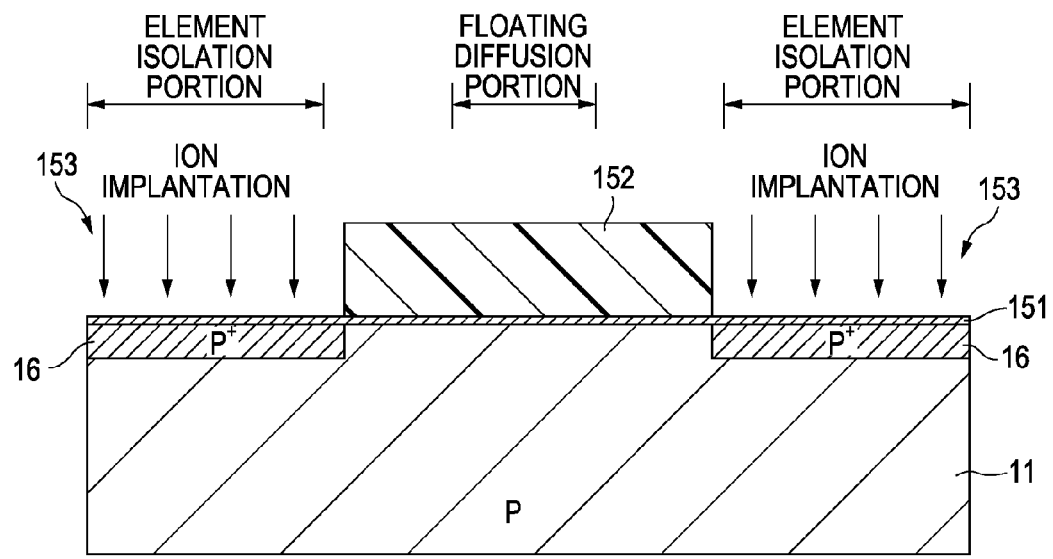
Figure 71C:
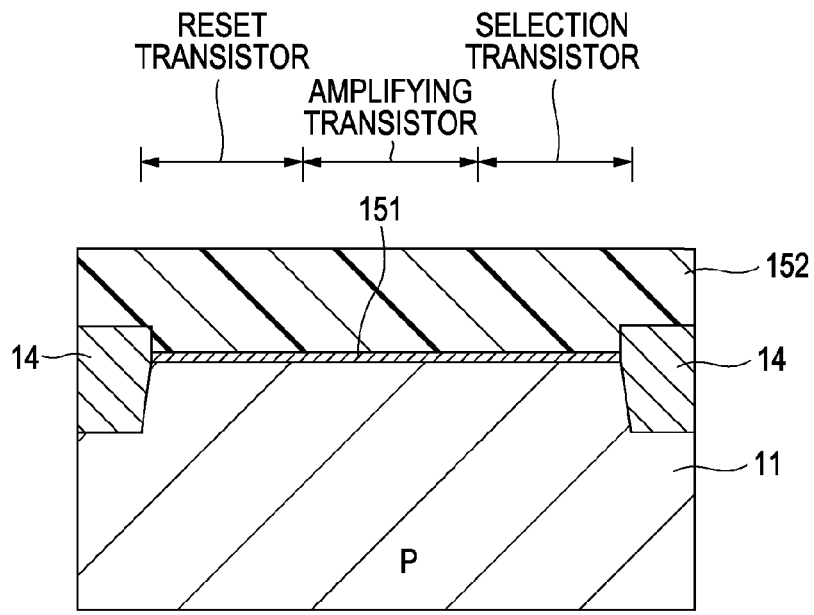
FIGS. 71C and 71D are cross-sectional views showing the detailed example of the method of producing a solid-state imaging device having the four-pixel sharing structure.
Figure 71D:
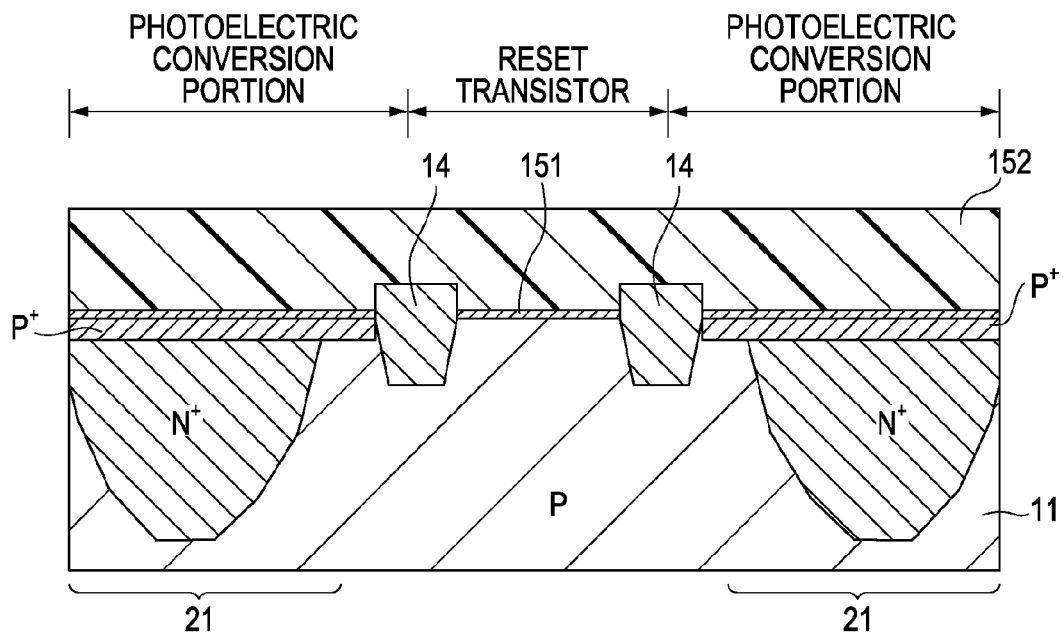

Next, a description will be made with reference to 70A, 70B, 71C, 71D, etc. FIG. 70A is a cross-sectional view taken along line LIIA-LIIA in FIG. 51, FIG. 70B is a cross-sectional view taken along line LIIB-LIIB in FIG. 51, FIG. 71C is a cross-sectional view taken along line LIIIC-LIIIC in FIG. 51, and FIG. 71D is a cross-sectional view taken along line LIIID-LIIID in FIG. 51. A sacrificial oxide layer 151 is formed on the semiconductor substrate 11. Subsequently, a resist mask 152 is formed on the sacrificial oxide layer 151. The resist mask 152 has openings 153 provided on isolation regions formed around photoelectric conversion portions 21. Specifically, the resist mask 152 covers the photoelectric conversion portions 21 and areas where transfer gates, a floating diffusion portion, and the pixel transistor portion are formed. Next, ion implantation is performed in the semiconductor substrate 11 using the resist mask 152 as an ion implantation mask to form $p^+$-type isolation regions 16. In this ion implantation, for example, boron (B) is used as an ion implantation species, and the dosage is set to be in the range of $1 \times 10^{12}$ to $1 \times 10^{13}$ cm$^{-2}$. The implantation energy is set to be in the range of 10 to 30 keV. The ion implantation may be performed at multiple stages in accordance with the depth. Consequently, the photoelectric conversion portions 21 are separated from each other by the isolation regions 16, and separated from a pixel transistor portion-forming region where a reset transistor, an amplifying transistor, a selection transistor, and the like are formed by the isolation regions 14. Although not shown in the figures, the peripheral circuit portion is separated by the second isolation regions 15, as described above.

Subsequently, the resist mask 152 is removed, and the sacrificial oxide layer 151 is further removed. The figure shows a state immediately before the resist mask 152 is removed.

Figure 73C:
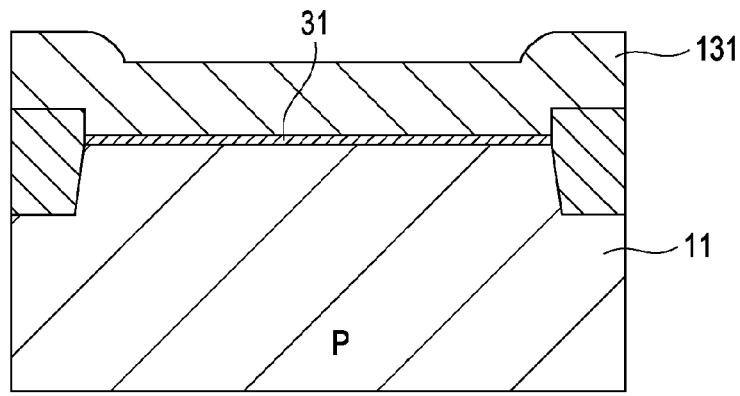
FIGS. 73C and 73D are cross-sectional views showing the detailed example of the method of producing a solid-state imaging device having the four-pixel sharing structure.
Figure 73D:
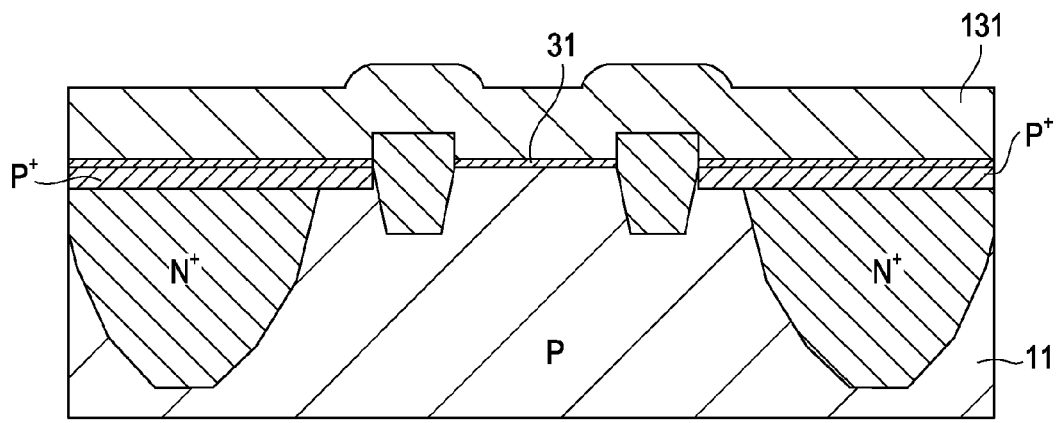

Next, a description will be made with reference to 72A, 72B, 73C, 73D, etc. FIG. 72A is a cross-sectional view taken along line LIIA-LIIA in FIG. 51, FIG. 72B is a cross-sectional view taken along line LIIB-LIIB in FIG. 51, FIG. 73C is a cross-sectional view taken along line LIIIC-LIIIC in FIG. 51, and FIG. 73D is a cross-sectional view taken along line LIIID-LIIID in FIG. 51. As shown in FIGS. 72A to 73D, a gate insulating film 31 is formed on the semiconductor substrate 11, and a gate electrode-forming film 131 is further formed on the gate insulating film 31. In this step, although not shown in the figures, as shown in FIG. 14, a gate insulating film 51 is also formed on the semiconductor substrate 11 in the peripheral circuit portion 13, and the gate electrode-forming film 131 is formed on the gate insulating film 51. The gate electrode-forming film 131 is formed by depositing polysilicon by an LP-CVD method. The deposited film thickness is in the range of 150 to 200 nm in a 90-nm node, though it depends on the technical node. The film thickness tends to decrease for every node because a gate aspect ratio is not generally increased from the standpoint of the controllability of the process. As a measure to counter gate depletion, silicon germanium (SiGe) may be used instead of polysilicon. The gate depletion refers to the following problem: As the thickness of a gate oxide film decreases, not only an effect of the physical thickness of the gate oxide film but also an effect of the thickness of a depletion layer in the gate polysilicon is not negligible, and thus an effective thickness of the gate oxide film is not decreased, thereby degrading the transistor performance.

Figure 74A:
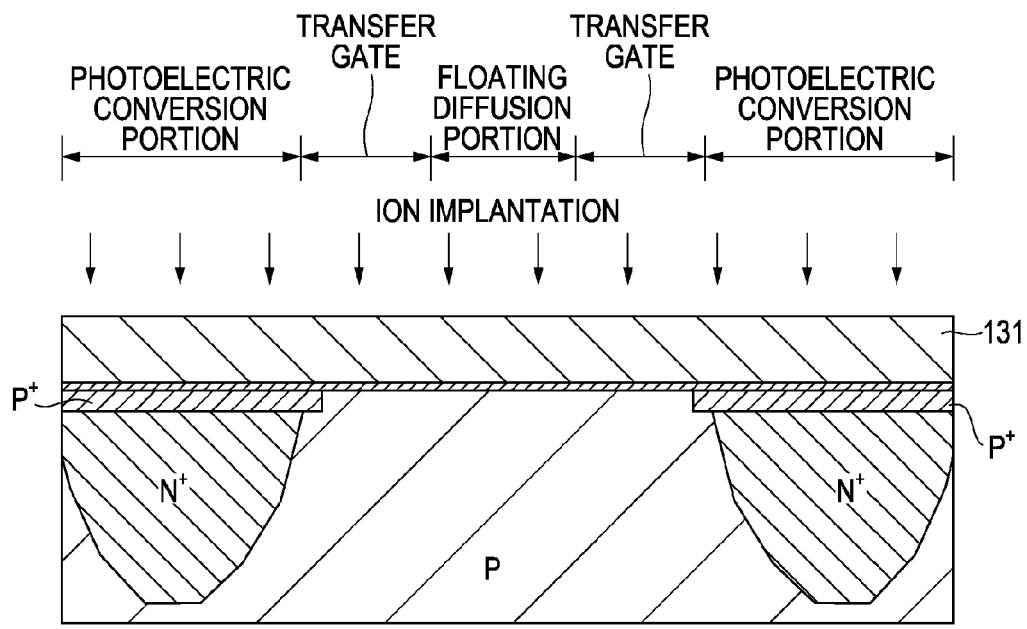
FIGS. 74A and 74B are cross-sectional views showing the detailed example of the method of producing a solid-state imaging device having the four-pixel sharing structure.
Figure 74B:
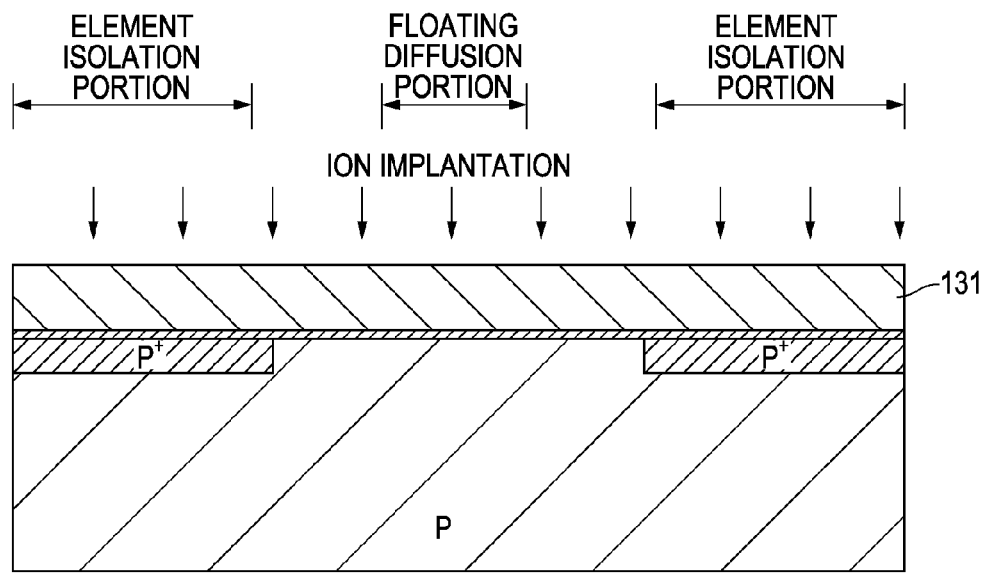
Figure 75C:
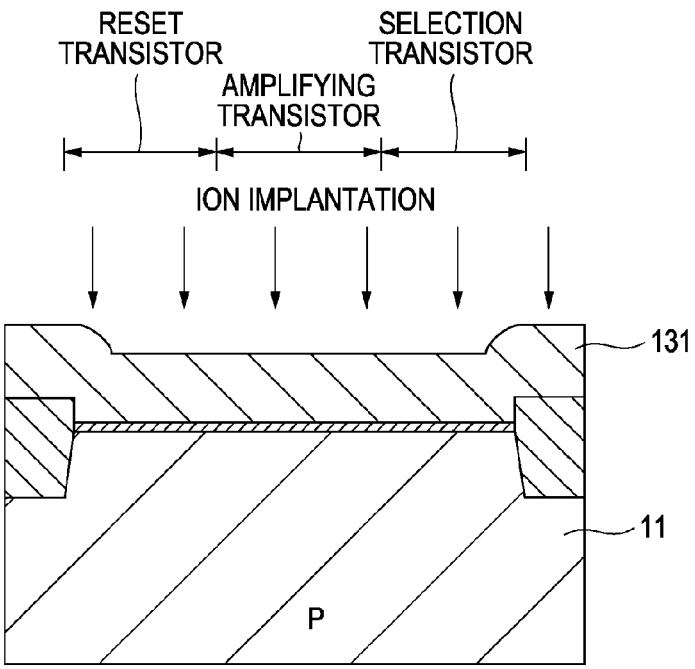
FIGS. 75C and 75D are cross-sectional views showing the detailed example of the method of producing a solid-state imaging device having the four-pixel sharing structure.
Figure 75D:
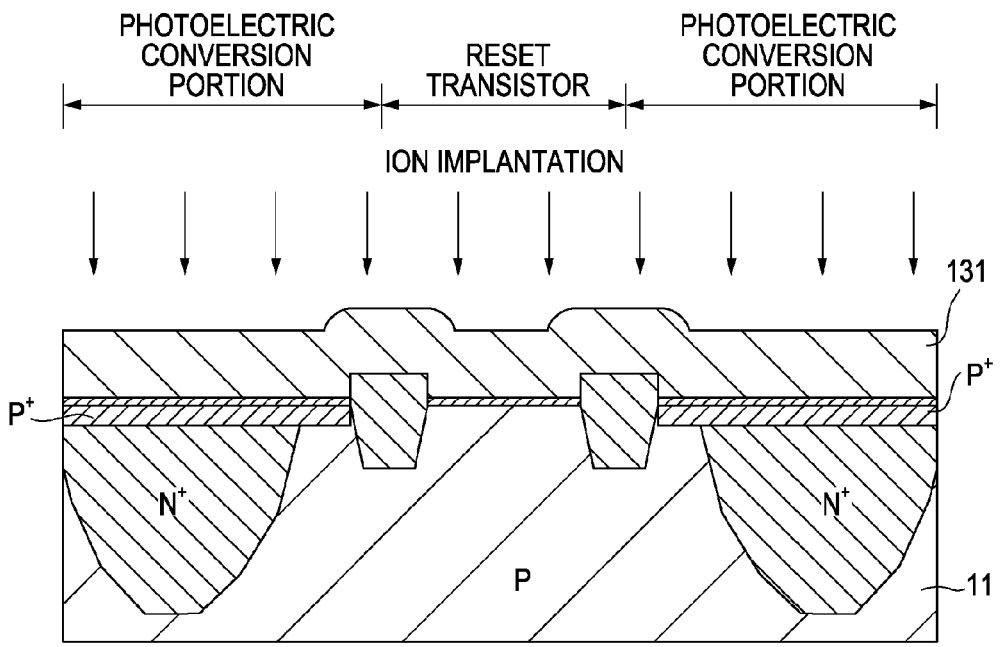

Next, a description will be made with reference to 74A, 74B, 75C, 75D, etc. FIG. 74A is a cross-sectional view taken along line LIIA-LIIA in FIG. 51, FIG. 74B is a cross-sectional view taken along line LIIB-LIIB in FIG. 51, FIG. 75C is a cross-sectional view taken along line LIIIC-LIIIC in FIG. 51, and FIG. 75D is a cross-sectional view taken along line LIIID-LIIID in FIG. 51. As shown in FIGS. 74A to 75D, a measure to counter gate depletion is taken. First, a resist mask 132 (see FIG. 16) is formed on a p-MOS transistor-forming region in the peripheral circuit portion 13, and an n-type impurity is doped into the gate electrode-forming film 131 in the n-MOS transistor-forming region. This doping is performed by ion implantation of, for example, phosphorus (P) or arsenic (As). The amount of ions implanted is in the range of about $1 \times 10^{15}$ to $1 \times 10^{16}$ cm$^{-2}$. The resist mask 132 is then removed. Next, although not shown in the figure, a resist mask (not shown) is formed on the n-MOS transistor-forming region, and a p-type impurity is doped into the gate electrode-forming film 131 in the p-MOS transistor-forming region. This doping is performed by ion implantation of, for example, boron (B), boron difluoride ($BF_2$), or indium (In). The amount of ions implanted is in the range of about $1 \times 10^{15}$ to $1 \times 10^{16}$ cm$^{-2}$. The resist mask is then removed. Either the former implantation or the latter implantation may be performed first. In each of the above ion implantations, in order to prevent impurities introduced by the ion implantation from reaching right under the gate insulating film, ion implantation of nitrogen ($N_2$) may be combined.

Figure 76A:
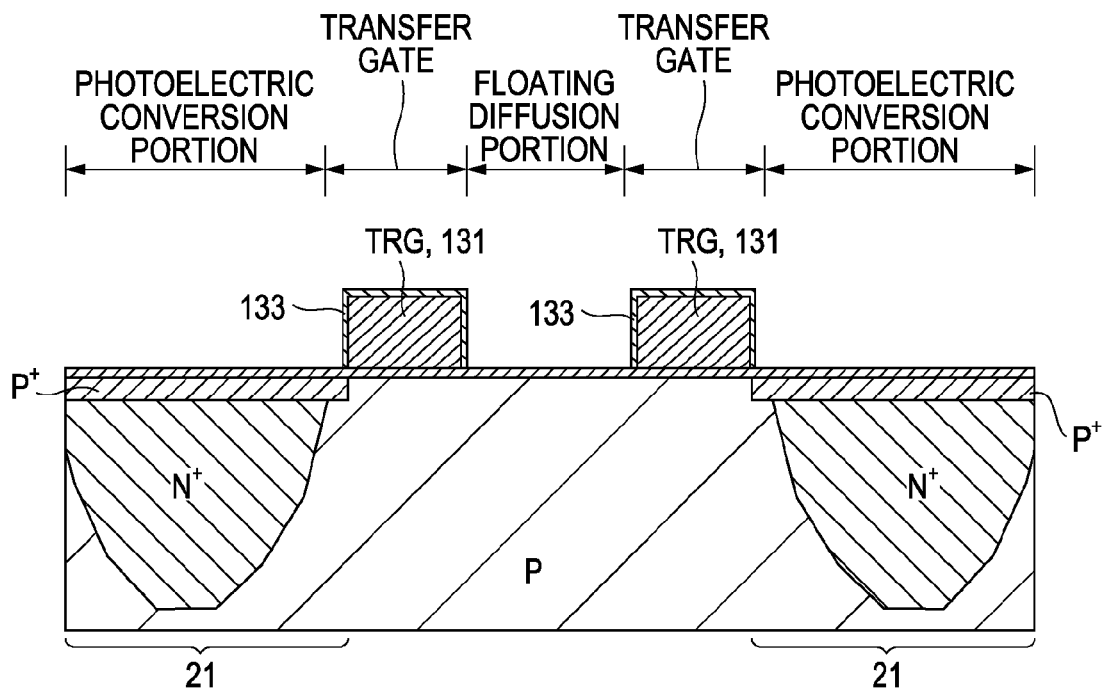
FIGS. 76A and 76B are cross-sectional views showing the detailed example of the method of producing a solid-state imaging device having the four-pixel sharing structure.
Figure 76B:
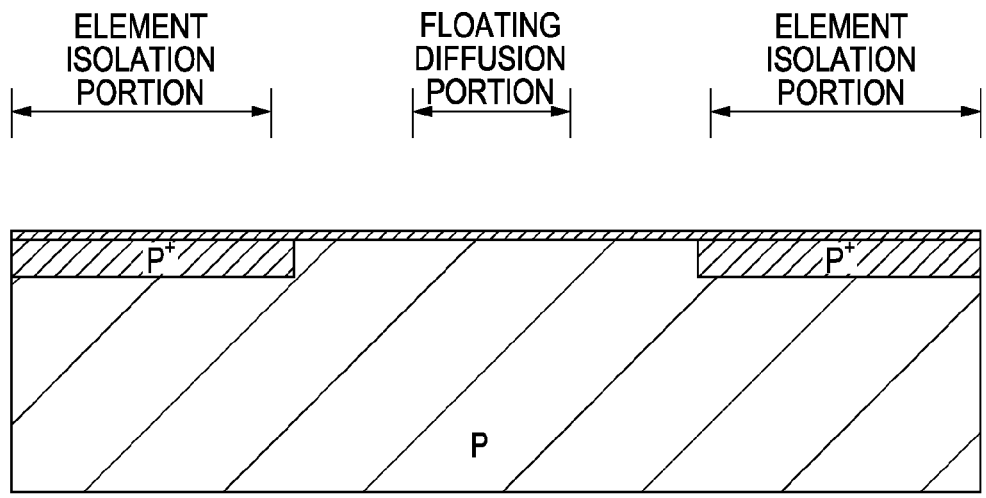

Next, a description will be made with reference to 76A, 76B, 77C, 77D, etc. FIG. 76A is a cross-sectional view taken along line LIIA-LIIA in FIG. 51, FIG. 76B is a cross-sectional view taken along line LIIB-LIIB in FIG. 51, FIG. 77C is a cross-sectional view taken along line LIIIC-LIIIC in FIG. 51, and FIG. 77D is a cross-sectional view taken along line LIIID-LIIID in FIG. 51. As shown in FIGS. 76A to 77D, a resist mask (not shown) for forming gate electrodes is formed on the gate electrode-forming film 131. The gate electrode-forming film 131 is etching-processed by reactive ion etching using this resist mask as an etching mask to form gate electrodes 32 of MOS transistors in the pixel portion 12, the transfer gates TRG, and gate electrodes 52 of MOS transistors in the peripheral circuit portion 13 (see FIG. 18). Subsequently, the surfaces of the gate electrodes 32 and gate electrodes 52 (see FIG. 18) are oxidized to form an oxide film 133. The thickness of the oxide film 133 is, for example, in the range of 1 to 10 nm. The oxide film 133 is formed not only on the sidewalls but also on the top surface of each of the gate electrodes 32 and 52. Furthermore, rounding edge portions of the gate electrodes 32 and 52 in the above oxidization step has an effect of improving the breakdown voltage of the oxide film. In addition, etching damage can be decreased by performing the heat treatment. Furthermore, in the above processing of the gate electrodes, even if the gate insulating film formed on the photoelectric conversion portions 21 is removed, the oxide film 133 is formed also on the photoelectric conversion portions 21. Therefore, when a resist film is formed in the subsequent step of lithography, the resist film is not formed directly on a surface of silicon, thus preventing contamination due to this resist. Accordingly, for the photoelectric conversion portions 21 in the pixel portion 12, this structure serves as a measure to counter white flaws.

Figure 78A:
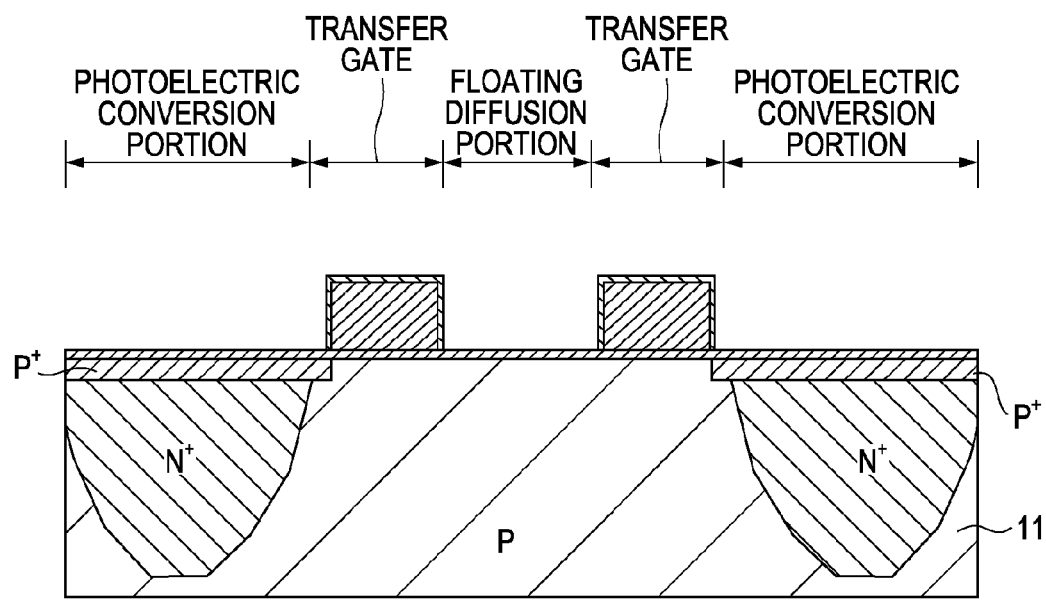
FIGS. 78A and 78B are cross-sectional views showing the detailed example of the method of producing a solid-state imaging device having the four-pixel sharing structure.
Figure 78B:
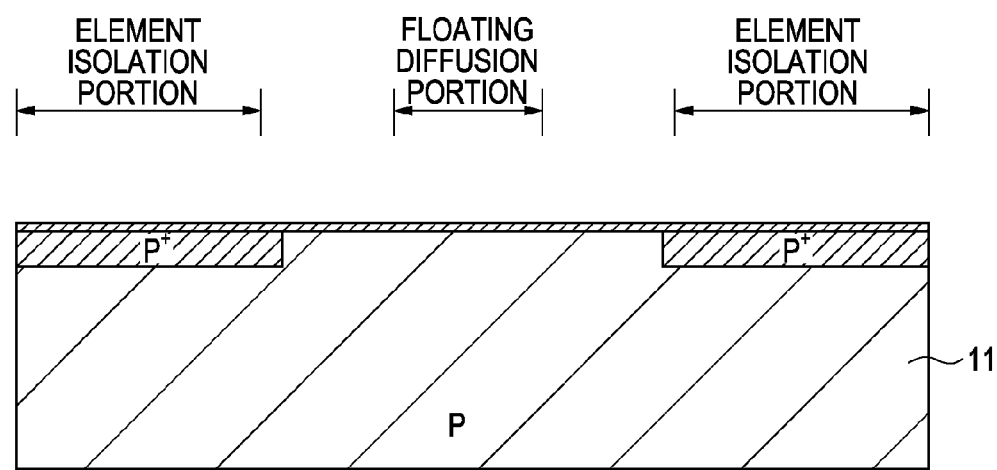
Figure 79C:
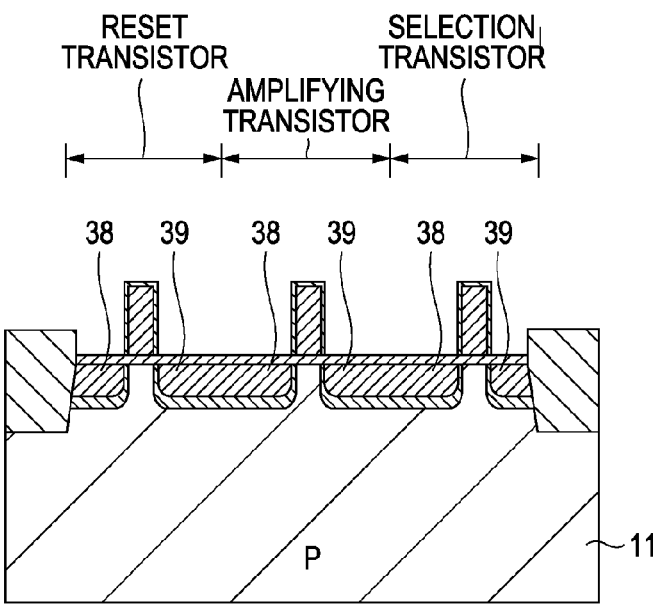
FIGS. 79C and 79D are cross-sectional views showing the detailed example of the method of producing a solid-state imaging device having the four-pixel sharing structure.
Figure 79D:
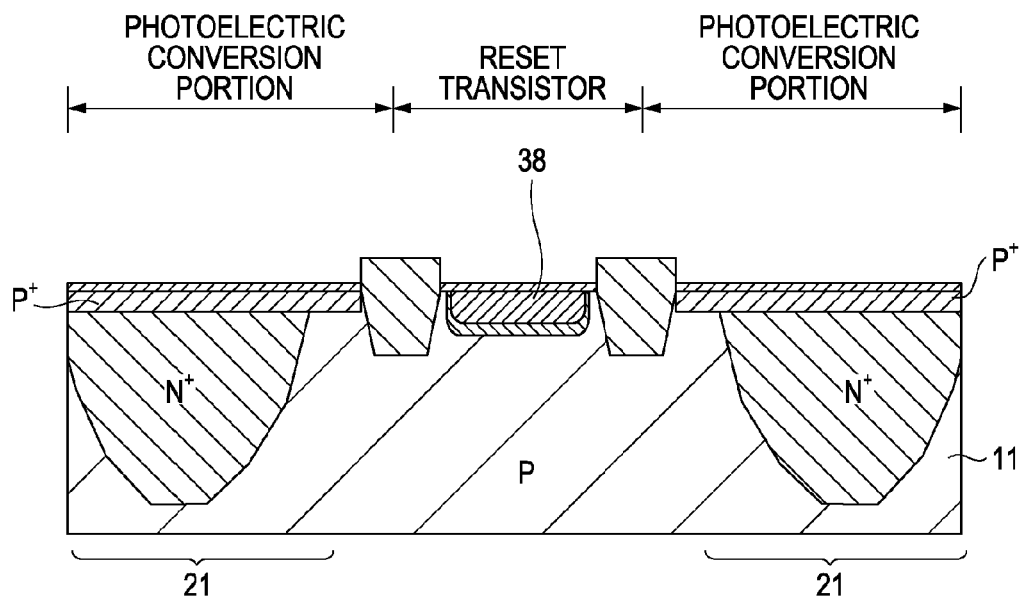

Next, a description will be made with reference to 78A, 78B, 79C, 79D, etc. FIG. 78A is a cross-sectional view taken along line LIIA-LIIA in FIG. 51, FIG. 78B is a cross-sectional view taken along line LIIB-LIIB in FIG. 51, FIG. 79C is a cross-sectional view taken along line LIIIC-LIIIC in FIG. 51, and FIG. 79D is a cross-sectional view taken along line LIIID-LIIID in FIG. 51. As shown in FIG. 78A to 79D, LDD regions 38, 39, etc. of the MOS transistors of the pixel portion 12 and LDD regions 61, 62, 63, 64, etc. of the MOS transistors of the peripheral circuit portion 13 are formed (see FIG. 20).

First, as for NMOS transistors formed in the peripheral circuit portion 13, pocket diffusion layers 65 and 66 are formed at both sides of each of the gate electrodes 52 (52N) in the semiconductor substrate 11 (see FIG. 20). These pocket diffusion layers 65 and 66 are formed by ion implantation using, for example, boron difluoride ($BF_2$), boron (B), or indium (In) as an ion implantation species, and the dosage thereof is set to be, for example, in the range of $1 \times 10^{12}$ to $1 \times 10^{14}$ cm$^{-2}$. Furthermore, the LDD regions 61 and 62 are formed at both sides of each of the gate electrodes 52 (52N) in the semiconductor substrate 11. The LDD regions 61 and 62 are formed by ion implantation using, for example, arsenic (As) or phosphorus (P) as an ion implantation species, and the dosage thereof is set to be, for example, in the range of $1 \times 10^{13}$ to $1 \times 10^{15}$ cm$^{-2}$.

As for MOS transistors formed in the pixel portion 12, the LDD regions 38 and 39 are formed at both sides of each of the gate electrodes 32 in the semiconductor substrate 11. The LDD regions 38 and 39 are formed by ion implantation using, for example, arsenic (As) or phosphorus (P) as an ion implantation species, and the dosage thereof is set to be, for example, in the range of $1 \times 10^{13}$ to $1 \times 10^{15}$ cm$^{-2}$. In addition, pocket diffusion layers may be formed. As for the MOS transistors formed in the pixel portion 12, the LDD regions may not be formed from the standpoint of reducing the number of steps. Alternatively, the ion implantation for forming the LDD regions for the MOS transistors formed in the pixel portion 12 may also function as the LDD ion implantation for the MOS transistors formed in the peripheral circuit portion 13.

As for PMOS transistors formed in the peripheral circuit portion 13, pocket diffusion layers 67 and 68 are formed at both sides of each of the gate electrodes 52 (52P) in the semiconductor substrate 11 (see FIG. 20). These pocket diffusion layers 67 and 68 are formed by ion implantation using, for example, arsenic (As) or phosphorus (P) as an ion implantation species, and the dosage thereof is set to be, for example, in the range of $1 \times 10^{12}$ to $1 \times 10^{14}$ cm$^{-2}$. Furthermore, the LDD regions 63 and 64 are formed at both sides of each of the gate electrodes 52 (52P) in the semiconductor substrate 11. The LDD regions 63 and 64 are formed by ion implantation using, for example, boron difluoride ($BF_2$), boron (B), or indium (In) as an ion implantation species, and the dosage thereof is set to be, for example, in the range of $1 \times 10^{13}$ to $1 \times 10^{15}$ cm$^{-2}$.

Before the pocket ion implantations of the NMOS transistors and PMOS transistors in the peripheral circuit portion, pre-amorphization may be performed by conducting ion implantation of germanium (Ge) as a technique for suppressing channeling in implantation. Furthermore, in order to reduce the number of implantation defects that may cause transient enhanced diffusion (TED) or the like, rapid thermal annealing (RTA) at a temperature in the range of about 800° C. to 900° C. may be added after the formation of the LDD regions.

Figure 80A:
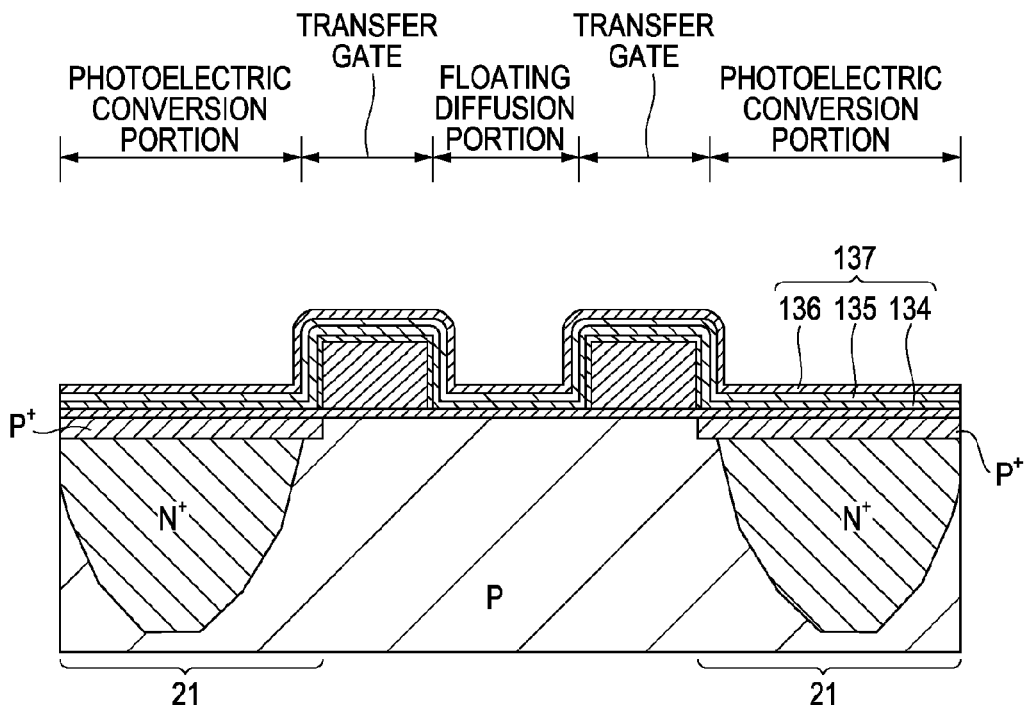
FIGS. 80A and 80B are cross-sectional views showing the detailed example of the method of producing a solid-state imaging device having the four-pixel sharing structure.
Figure 80B:
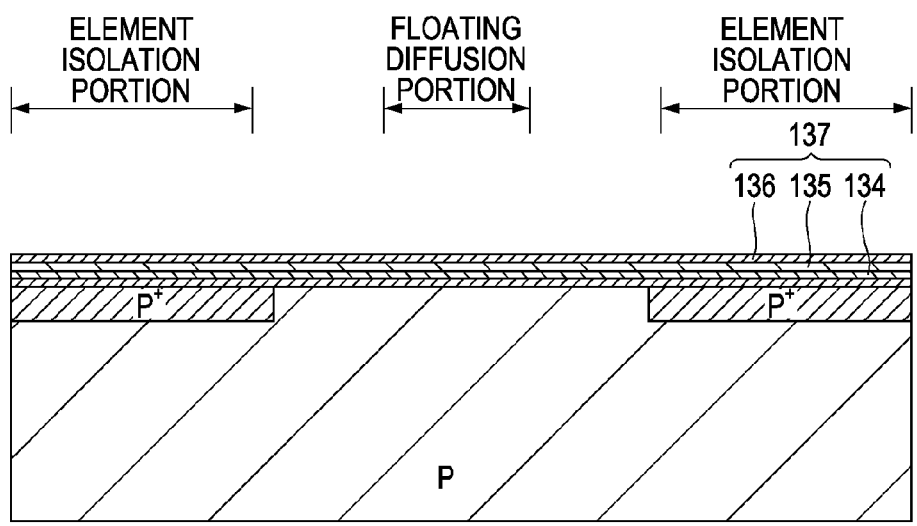
Figure 81C:
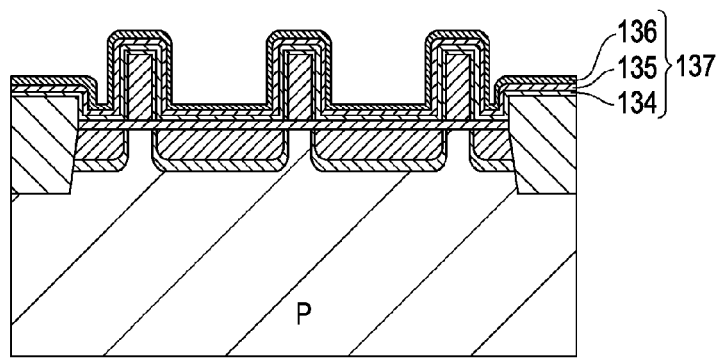
FIGS. 81C and 81D are cross-sectional views showing the detailed example of the method of producing a solid-state imaging device having the four-pixel sharing structure.
Figure 81D:
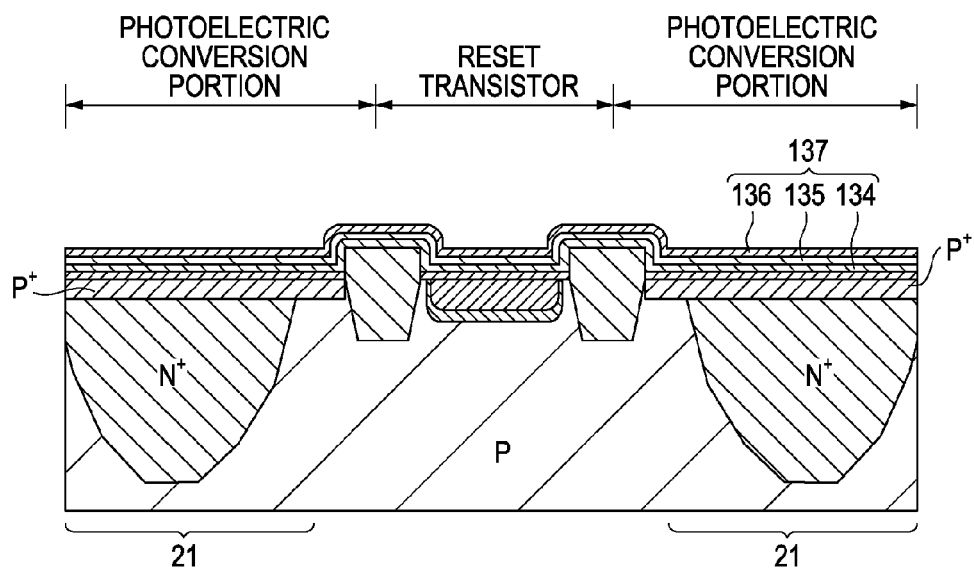

Next, a description will be made with reference to 80A, 80B, 81C, 81D, etc. FIG. 80A is a cross-sectional view taken along line LIIA-LIIA in FIG. 51, FIG. 80B is a cross-sectional view taken along line LIIB-LIIB in FIG. 51, FIG. 81C is a cross-sectional view taken along line LIIIC-LIIIC in FIG. 51, and FIG. 81D is a cross-sectional view taken along line LIIID-LIIID in FIG. 51. As shown in FIG. 80A to 81B, a silicon oxide ($SiO_2$) film 134 is formed on the entire surface of the pixel portion 12 and the peripheral circuit portion 13 (see FIG. 22). This silicon oxide film 134 is formed by depositing a non-doped silicate glass (NSG) film, a low-pressure tetraethyl orthosilicate (LP-TEOS) film, a high-temperature oxide (HTO) film, or the like. The silicon oxide film 134 is formed so as to have a thickness in the range of, for example, 5 to 20 nm. Next, a silicon nitride film 135 is formed on the silicon oxide film 134. This silicon nitride film 135 is composed of, for example, a silicon nitride film formed by LPCVD. The thickness thereof is in the range of, for example, 10 to 100 nm. The silicon nitride film 135 may be an ALD silicon nitride film formed by an atomic layer deposition method by which the film can be formed at a low temperature. On the photoelectric conversion portions 21 in the pixel portion 12, as the thickness of the silicon oxide film 134 disposed right under the silicon nitride film 135 decreases, light reflection is prevented, and thus the sensitivity of the photoelectric conversion portions 21 becomes high. Next, a silicon oxide ($SiO_2$) film 136, which is a third layer, is optionally deposited on the silicon nitride film 135. This silicon oxide film 136 is formed by depositing an NSG film, an LP-TEOS film, an HTO film, or the like. The silicon oxide film 136 is formed so as to have a thickness in the range of, for example, 10 to 100 nm.

Accordingly, a sidewall film 137 is formed as a three-layered film having a structure of silicon oxide film 136/silicon nitride film 135/silicon oxide film 134. Alternatively, the sidewall film 137 may be a two-layered film having a structure of silicon nitride film/silicon oxide film. A case of the sidewall film 137 having the three-layer structure will be described below.

Figure 82A:
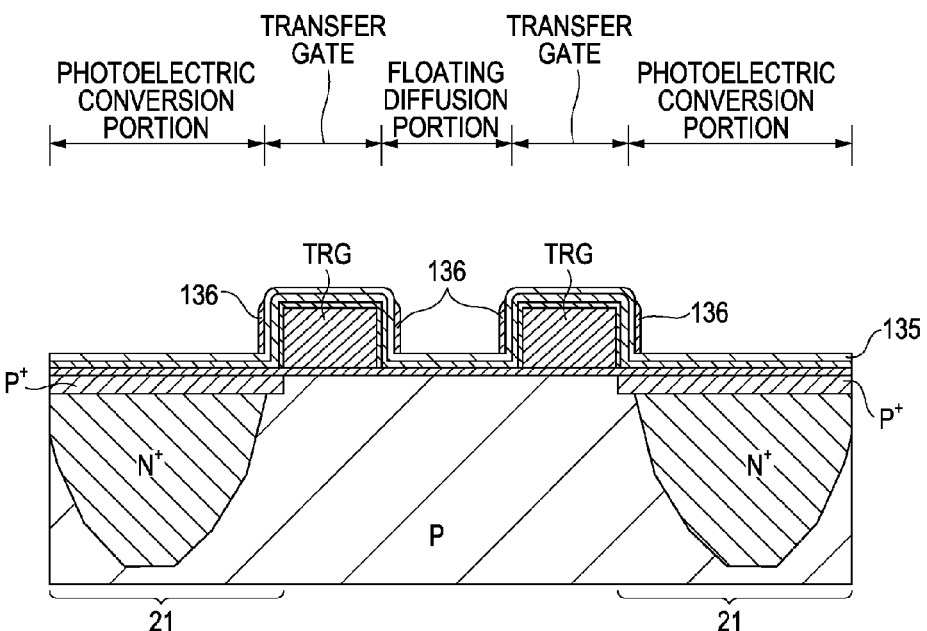
FIGS. 82A and 82B are cross-sectional views showing the detailed example of the method of producing a solid-state imaging device having the four-pixel sharing structure.
Figure 82B:
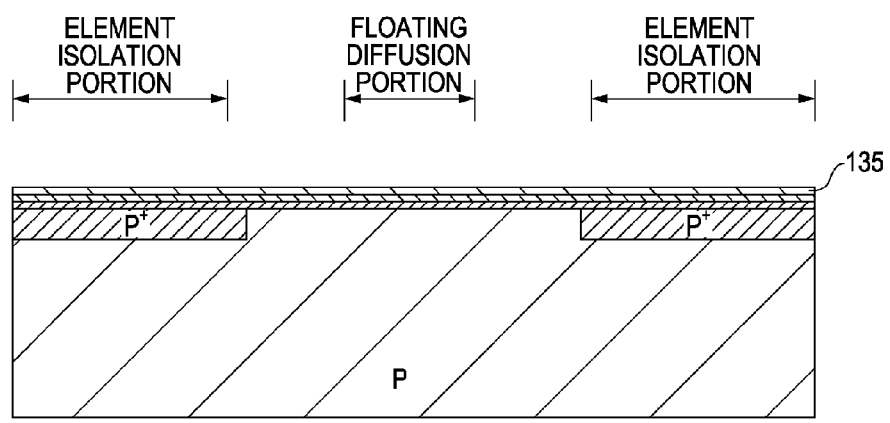

Next, a description will be made with reference to 82A, 82B, 83C, 83D, etc. FIG. 82A is a cross-sectional view taken along line LIIA-LIIA in FIG. 51, FIG. 82B is a cross-sectional view taken along line LIIB-LIIB in FIG. 51, FIG. 83C is a cross-sectional view taken along line LIIIC-LIIIC in FIG. 51, and FIG. 83D is a cross-sectional view taken along line LIIID-LIIID in FIG. 51. As shown in FIG. 82A to 83B, etching-back of the silicon oxide film 136, which is provided as the top layer, is performed so that the silicon oxide film 136 is left only on the side portions of each of the gate electrodes 32 and 52 (see FIG. 24), the transfer gates TRG, and the like. The etching-back is performed by, for example, reactive ion etching (RIE). In this etching-back, etching is stopped using the silicon nitride film 135. Since the etching is stopped by the silicon nitride film 135 in this manner, etching damage on the photoelectric conversion portions 21 in the pixel portion 12 can be reduced, and thus the number of white flaws can be decreased.

Figure 84A:
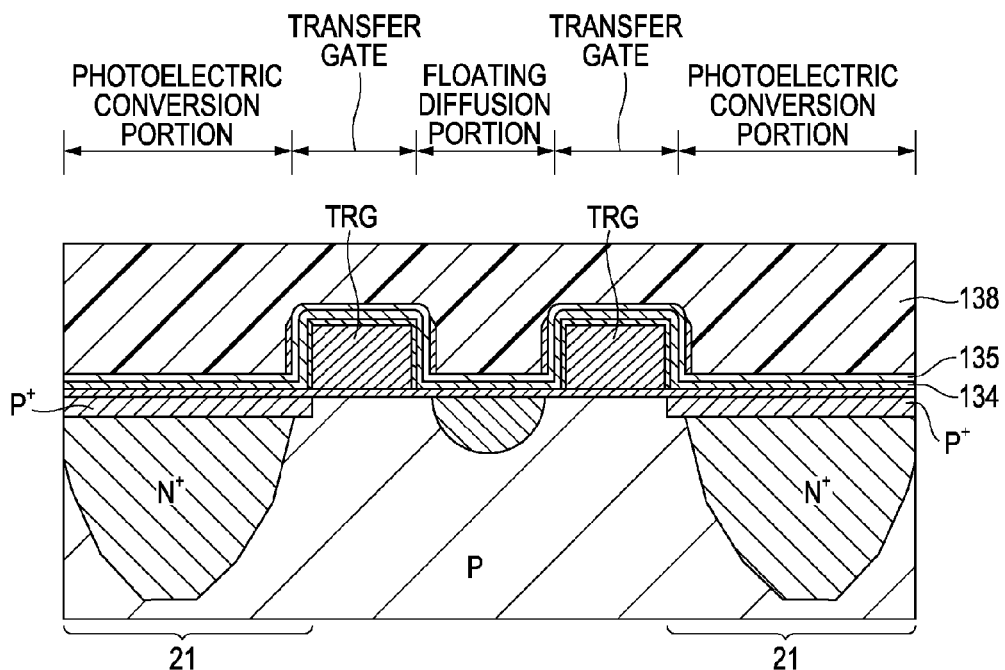
FIGS. 84A and 84B are cross-sectional views showing the detailed example of the method of producing a solid-state imaging device having the four-pixel sharing structure.
Figure 84B:
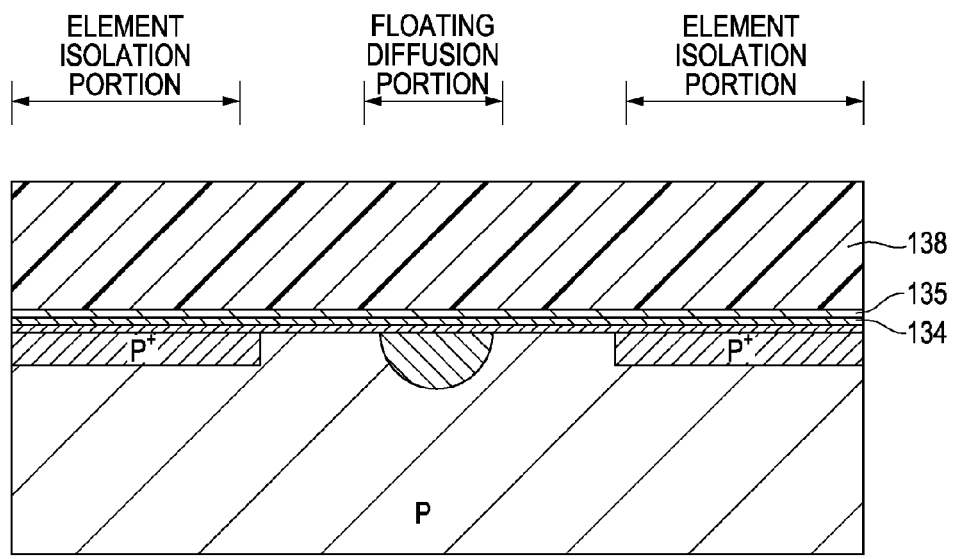
Figure 85C:
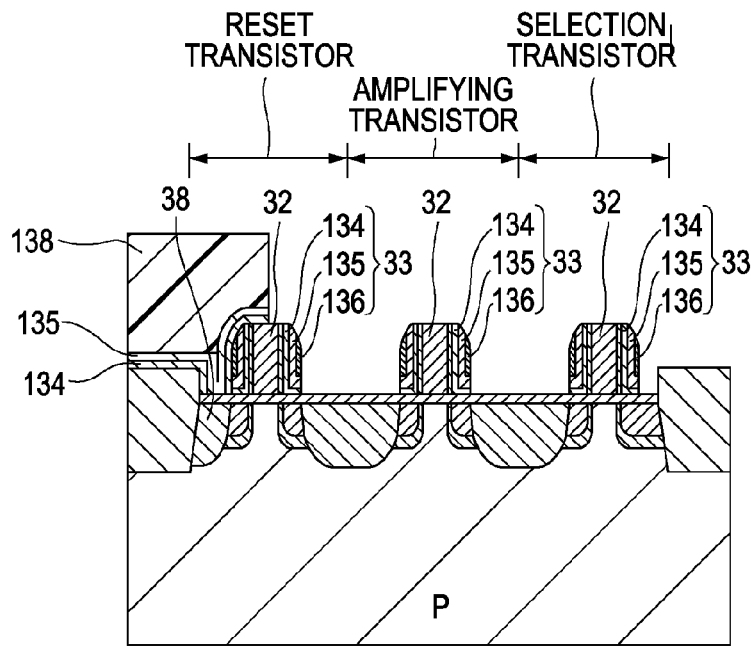
FIGS. 85C and 85D are cross-sectional views showing the detailed example of the method of producing a solid-state imaging device having the four-pixel sharing structure.
Figure 85D:
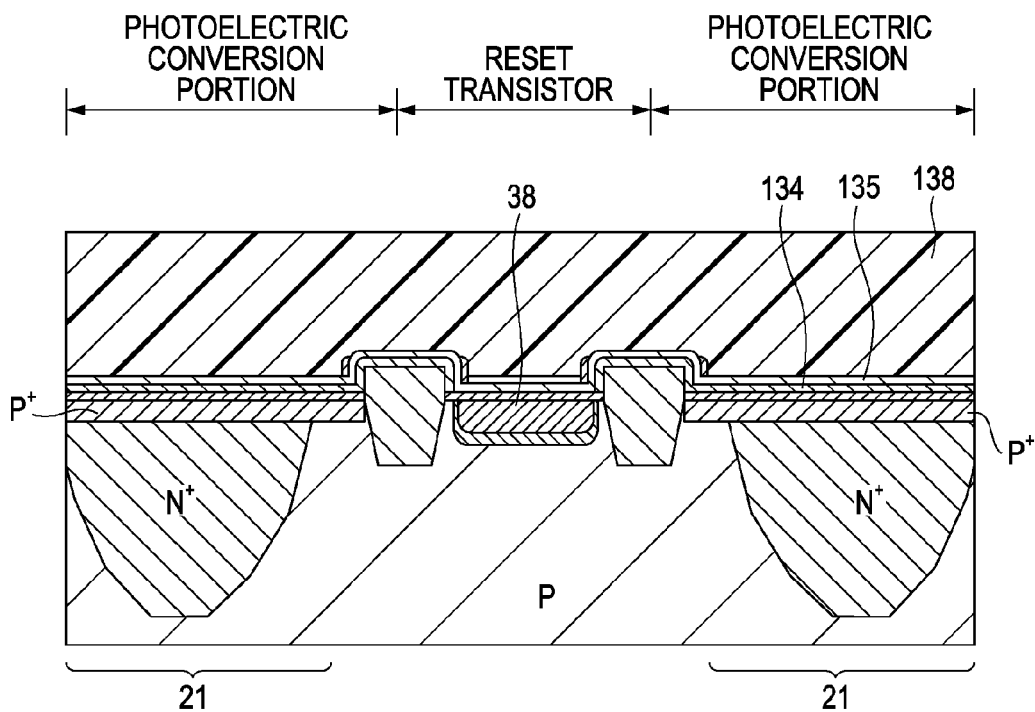

Next, a description will be made with reference to 84A, 84B, 85C, 85D, etc. FIG. 84A is a cross-sectional view taken along line LIIA-LIIA in FIG. 51, FIG. 84B is a cross-sectional view taken along line LIIB-LIIB in FIG. 51, FIG. 85C is a cross-sectional view taken along line LIIIC-LIIIC in FIG. 51, and FIG. 85D is a cross-sectional view taken along line LIIID-LIIID in FIG. 51. As shown in FIG. 84A to 85B, a resist mask 138 is formed on the entire surface of the photoelectric conversion portions 21 in the pixel portion 12 and on the transfer gates TRG, a region where the floating diffusion portion is formed, the LDD region 38 of the reset transistor, and a part of the gate electrode 32 of the reset transistor. Next, etching-back of the silicon nitride film 135 and the silicon oxide film 134 are performed to form a first sidewall 33 on the sidewalls of each of the gate electrodes 32 and a second sidewall 53 (see FIG. 26) on the sidewalls of each of the gate electrodes 52 (see FIG. 26), the first sidewall 33 and the second sidewall 53 being composed of the silicon oxide film 134, the silicon nitride film 135, and the silicon oxide film 136. In this step, the photoelectric conversion portions 21, the region where the floating diffusion portion is formed, and the silicon nitride film 135 and silicon oxide film 134 located on a region where the source-drain region of the reset transistor is formed are not etched because they are covered with the resist mask 138. Accordingly, etching damage does not occur on the photoelectric conversion portions 21, the region where floating diffusion portion is formed, and the region where the source-drain region of the reset transistor is formed.

Figure 86A:
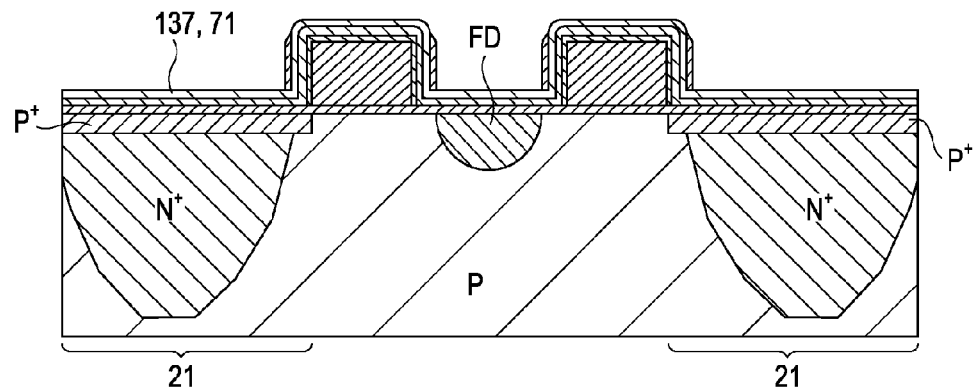
FIGS. 86A and 86B are cross-sectional views showing the detailed example of the method of producing a solid-state imaging device having the four-pixel sharing structure.
Figure 86B:
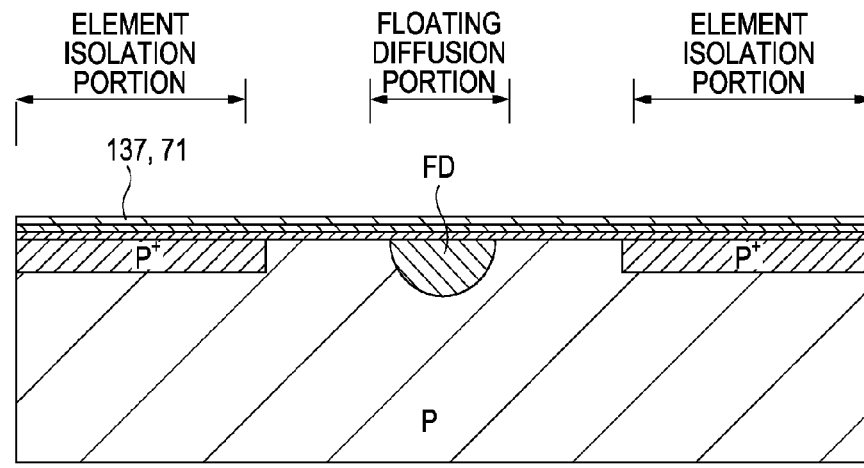
Figure 87C:
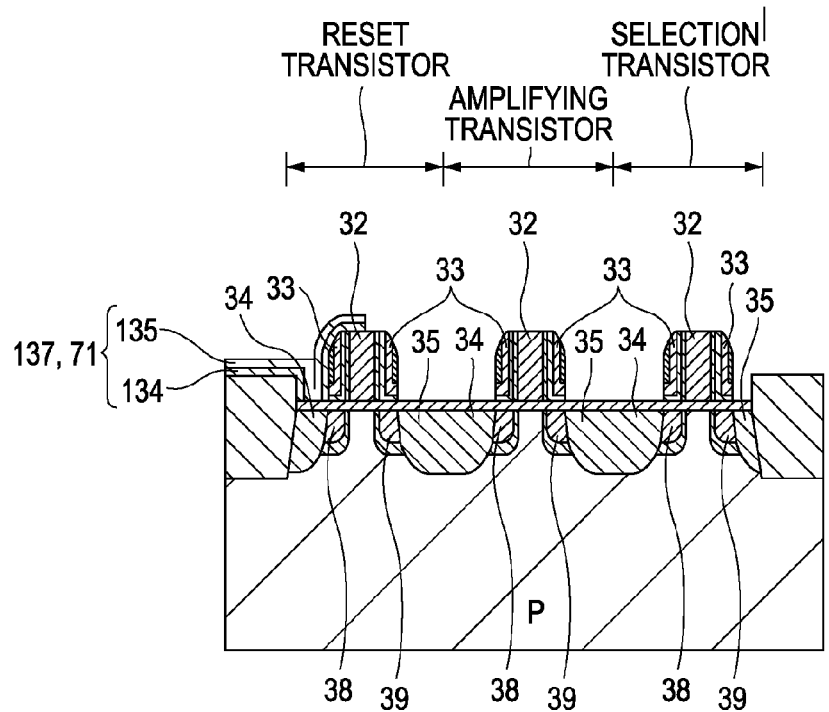
FIGS. 87C and 87D are cross-sectional views showing the detailed example of the method of producing a solid-state imaging device having the four-pixel sharing structure.
Figure 87D:
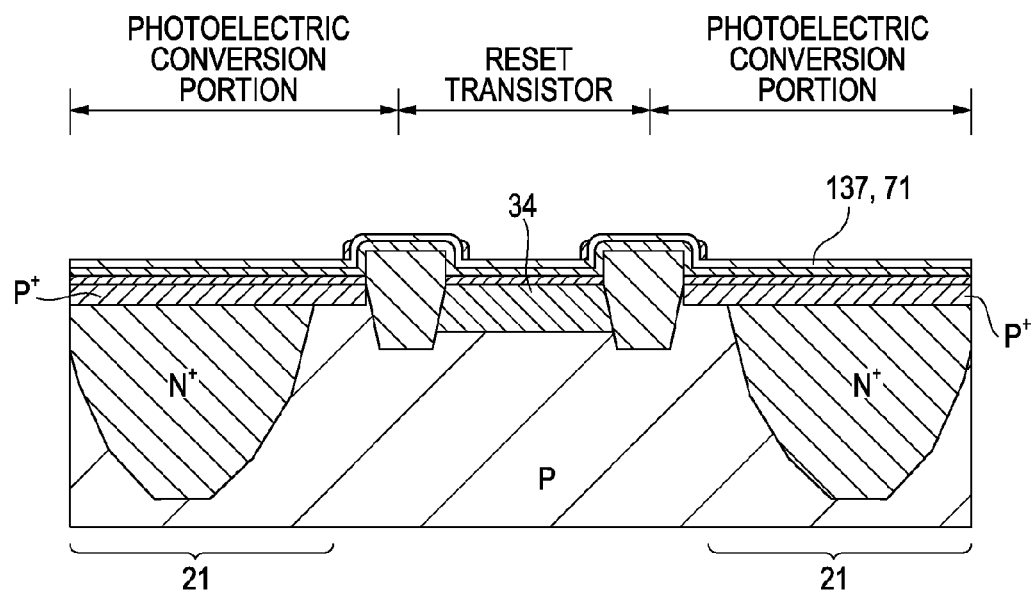

Next, a description will be made with reference to 86A, 86B, 87C, 87D, etc. FIG. 86A is a cross-sectional view taken along line LIIA-LIIA in FIG. 51, FIG. 86B is a cross-sectional view taken along line LIIB-LIIB in FIG. 51, FIG. 87C is a cross-sectional view taken along line LIIIC-LIIIC in FIG. 51, and FIG. 87D is a cross-sectional view taken along line LIIID-LIIID in FIG. 51. First, as shown in FIG. 28, a resist mask (not shown) having openings is formed, the openings being disposed in regions where the NMOS transistors in the peripheral circuit portion 13 are to be formed. Deep source-drain regions 54 (54N) and 55 (55N) are formed in the regions where the NMOS transistors in the peripheral circuit portion 13 are to be formed by ion implantation using the resist mask. Specifically, the source-drain regions 54N and 55N are formed at both sides of each of the gate electrodes 52 in the semiconductor substrate 11, with the LDD regions 61, 62, etc. therebetween. The source-drain regions 54N and 55N are formed by ion implantation using, for example, arsenic (As) or phosphorus (P) as an ion implantation species, and the dosage thereof is set to be, for example, in the range of $1\times10^{15}$ to $1\times10^{16}$ cm$^{-2}$. The resist mask is then removed.

Next, as shown in FIGS. 86A to 87B, a resist mask (not shown) having openings is formed, the openings being disposed in regions where the NMOS transistors in the pixel portion 12 are to be formed. Deep source-drain regions 34 and 35 and a floating diffusion portion FD are formed in the regions where the NMOS transistors in the pixel portion 12 are to be formed by ion implantation using the resist mask. Specifically, the source-drain regions 34 and 35 are formed at both sides of each of the gate electrodes 32 in the semiconductor substrate 11, with the LDD regions 38, 39 etc. therebetween. The source-drain regions 34 and 35 are formed by ion implantation using, for example, arsenic (As) or phosphorus (P) as an ion implantation species, and the dosage thereof is set to be, for example, in the range of $1\times10^{15}$ to $1\times10^{16}$ cm$^{-2}$. The resist mask is then removed. This ion implantation may also function as the ion implantation for forming the source-drain regions 54N and 55N of the NMOS transistors in the peripheral circuit portion 13. The source-drain region 34 of the reset transistor RST is formed by ion implantation performed through the silicon oxide film 134 and the silicon nitride film 135. Therefore, the ion implantation of this portion may be separately performed.

Next, as shown in FIG. 28, a resist mask (not shown) having openings is formed, the openings being disposed in regions where the PMOS transistors in the peripheral circuit portion 13 are to be formed. Deep source-drain regions 54 (54P) and 55 (55P) are formed in the regions where the PMOS transistors in the peripheral circuit portion 13 are to be formed by ion implantation using the resist mask. Specifically, the source-drain regions 54P and 55P are formed at both sides of each of the gate electrodes 52 in the semiconductor substrate 11, with the LDD regions 63, 64, etc. therebetween. The source-drain regions 54P and 55P are formed by ion implantation using, for example, boron (B) or boron difluoride (BF$_2$) as an ion implantation species, and the dosage thereof is set to be, for example, in the range of $1\times10^{15}$ to $1\times10^{16}$ cm$^{-2}$. The resist mask is then removed.

Next, activation annealing of the source-drain regions is performed. This activation annealing is performed at a temperature in the range of, for example, about 800° C. to 1,100° C. For this activation annealing, a rapid thermal annealing (RTA) apparatus, a spike RTA apparatus, or the like can be used.

Before the activation annealing of the source-drain regions, the sidewall film 137 covering the photoelectric conversion portions 21 is separated from the sidewall 33 composed of the sidewall film 137 on the gate electrodes 32 of the MOS transistors in the pixel portion 12. This structure prevents degradation by a stress due to stress memorization technique (SMT) described in the related art. Accordingly, white flaws, random noise, and the like can be suppressed. Furthermore, the photoelectric conversion portions 21 are covered with the sidewall film 137, and the resist mask used in ion implantation for forming the source-drain regions is formed on the photoelectric conversion portions 21, with the sidewall film 137 therebetween. That is, the resist mask is formed not directly on the surface of the photoelectric conversion portions 21. Therefore, the photoelectric conversion portions 21 are not contaminated by contaminants in the resist, thus suppressing an increase in the number of white flaws, dark current, and the like. In addition, the ion implantation for forming the source-drain regions is not an ion implantation through a film, and thus the depth of the source-drain regions can be set while ensuring a high concentration at the surface. Therefore, an increase in the series resistance of the source-drain regions can be suppressed. Furthermore, the sidewall film 137 covering the photoelectric conversion portions 21, the floating diffusion portion FD, and the source-drain region 34 of the reset transistor, the source-drain region 34 being connected to the floating diffusion portion FD via wiring (not shown) or the like, is used as a first silicide blocking film 71 in the subsequent steps.

Figure 88A:
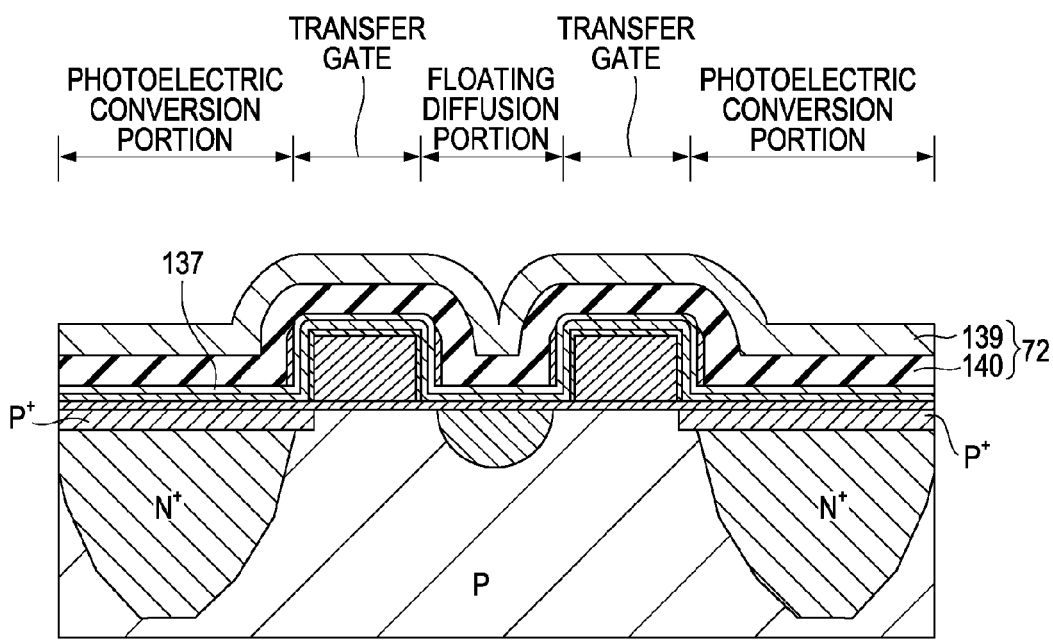
FIGS. 88A and 88B are cross-sectional views showing the detailed example of the method of producing a solid-state imaging device having the four-pixel sharing structure.
Figure 88B:
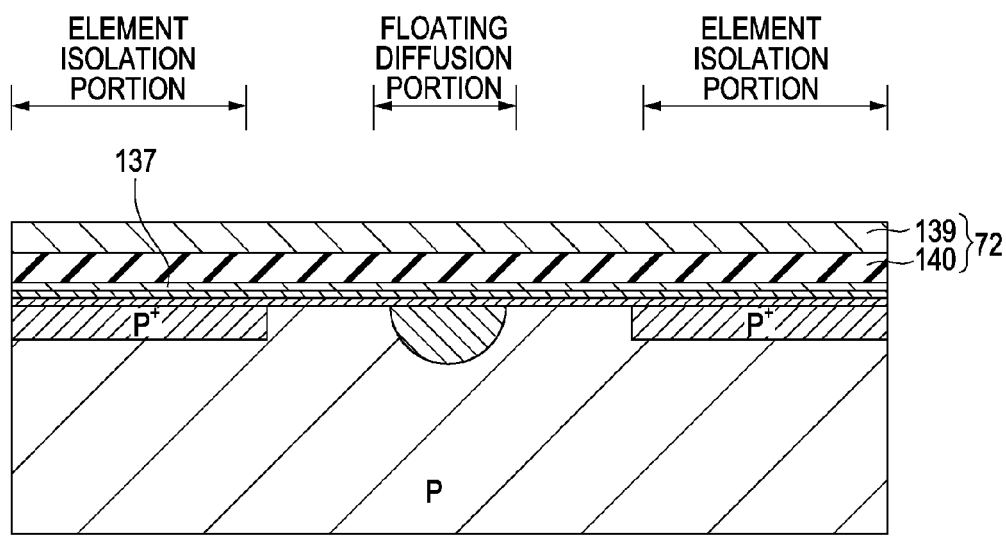
Figure 89C:
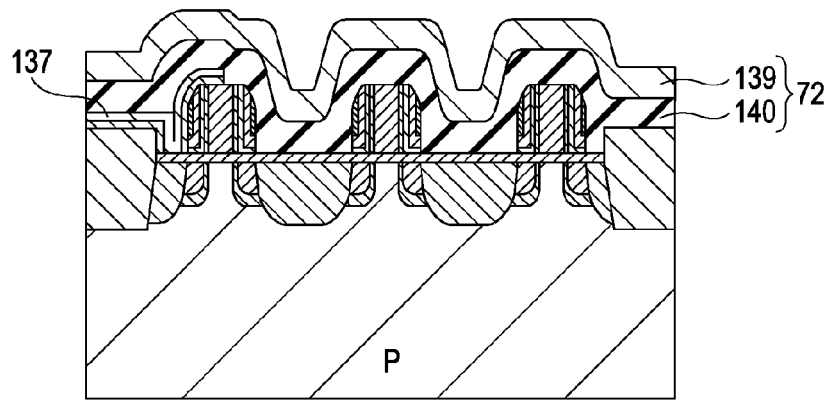
FIGS. 89C and 89D are cross-sectional views showing the detailed example of the method of producing a solid-state imaging device having the four-pixel sharing structure.
Figure 89D:
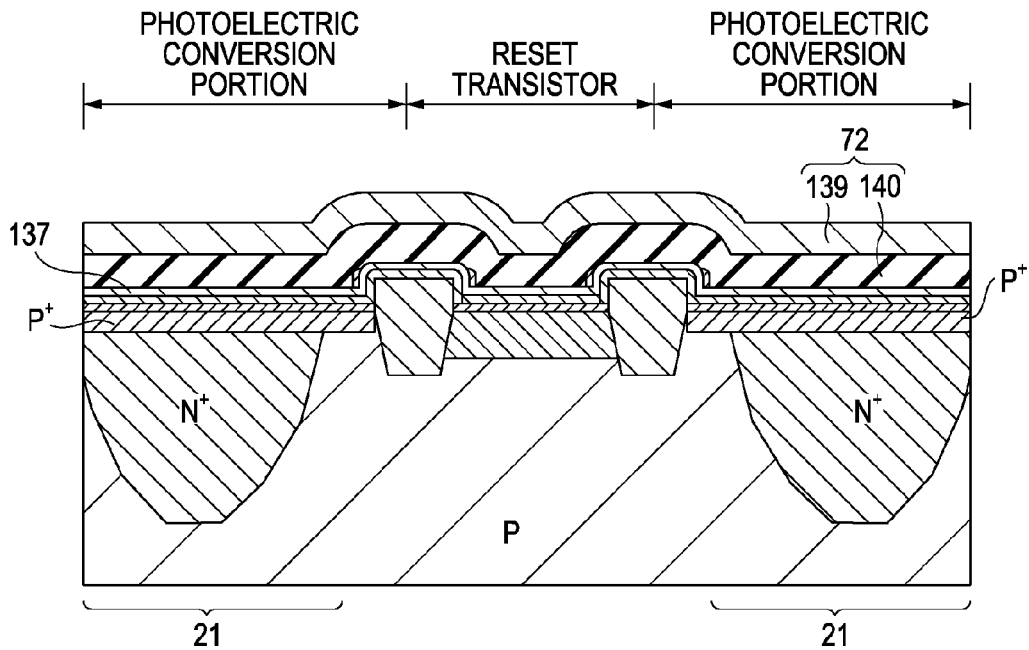

Next, a description will be made with reference to 88A, 88B, 89C, 89D, etc. FIG. 88A is a cross-sectional view taken along line LIIA-LIIA in FIG. 51, FIG. 88B is a cross-sectional view taken along line LIIB-LIIB in FIG. 51, FIG. 89C is a cross-sectional view taken along line LIIIC-LIIIC in FIG. 51, and FIG. 89D is a cross-sectional view taken along line LIIID-LIIID in FIG. 51. First, as shown in FIG. 88A to 89D, a second silicide blocking film 72 is formed on the entire surface of the pixel portion 12 and the peripheral circuit portion 13 (see FIG. 30). The second silicide blocking film 72 is composed of a stacked film including a silicon oxide ($SiO_2$) film 140 and a silicon nitride film 139. For example, the silicon oxide film 140 is formed so as to have a thickness in the range of, for example, 5 to 40 nm, and the silicon nitride film 139 is formed so as to have a thickness in the range of, for example, 5 to 60 nm. The silicon oxide film 140 is composed of an NSG film, an LP-TEOS film, an HTO film, or the like. The silicon nitride film 139 is composed of an ALD-SiN film, a plasma nitride film, an LP-SiN film, or the like. If the deposition temperature of these two films is high, deactivation of boron occurs in gate electrodes of PMOSFETs. Consequently, a current driving capability of the PMOSFETs is decreased by gate depletion. Accordingly, the deposition temperature of the silicon oxide film 140 and the silicon nitride film 139 is preferably lower than the deposition temperature of the sidewall film 137. The deposition temperature is preferably, for example, at 700° C. or lower.

Figure 90A:
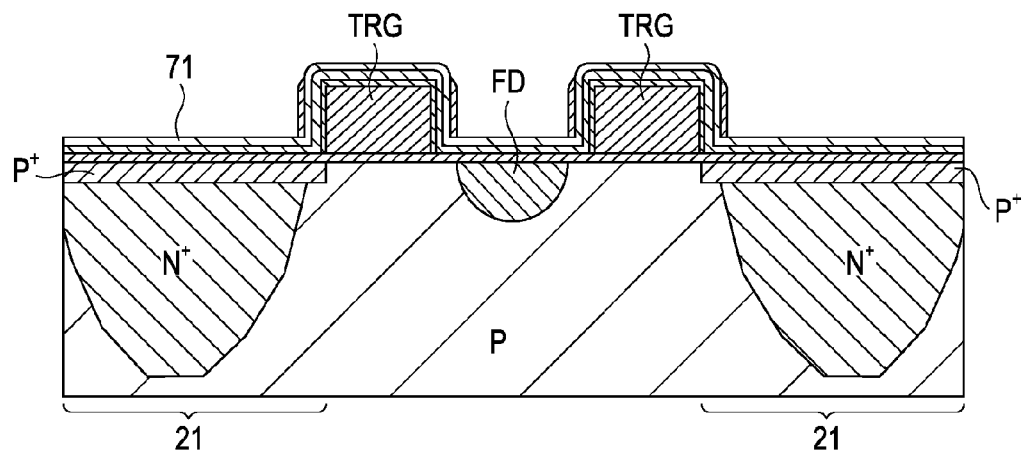
FIGS. 90A and 90B are cross-sectional views showing the detailed example of the method of producing a solid-state imaging device having the four-pixel sharing structure.
Figure 90B:
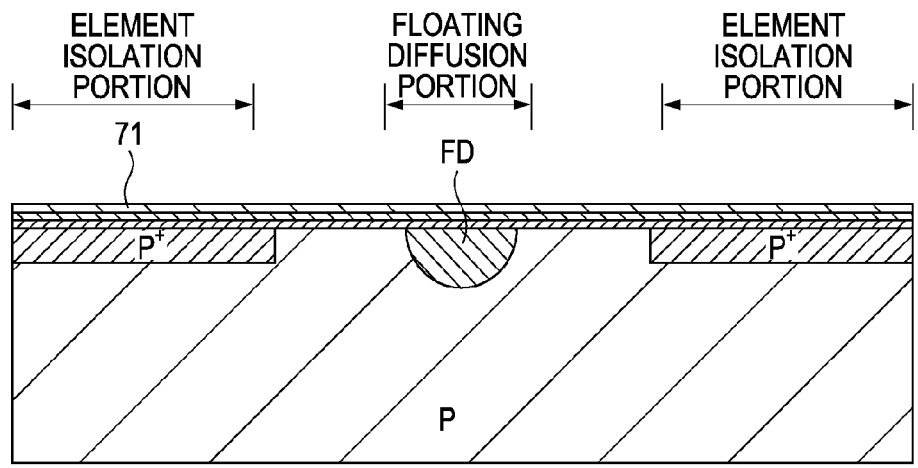
Figure 91C:
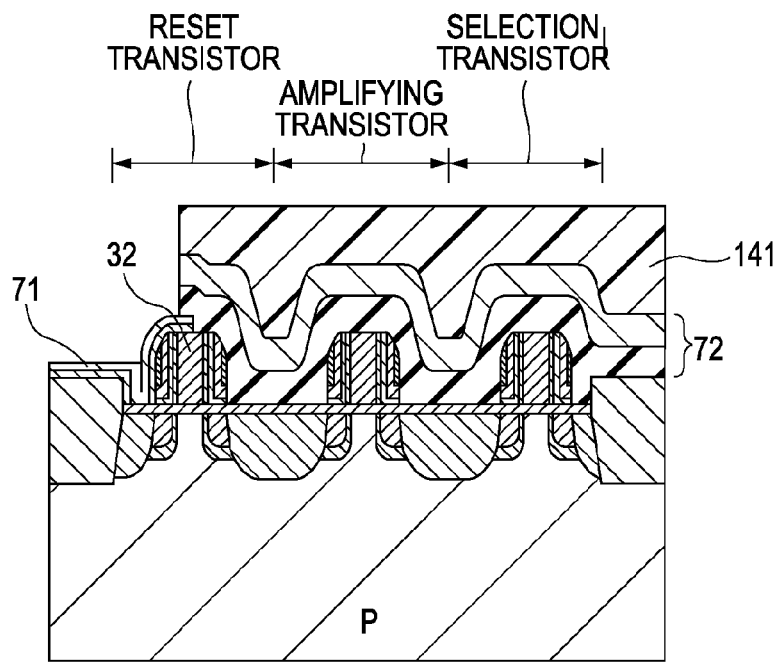
FIGS. 91C and 91D are cross-sectional views showing the detailed example of the method of producing a solid-state imaging device having the four-pixel sharing structure.
Figure 91D:
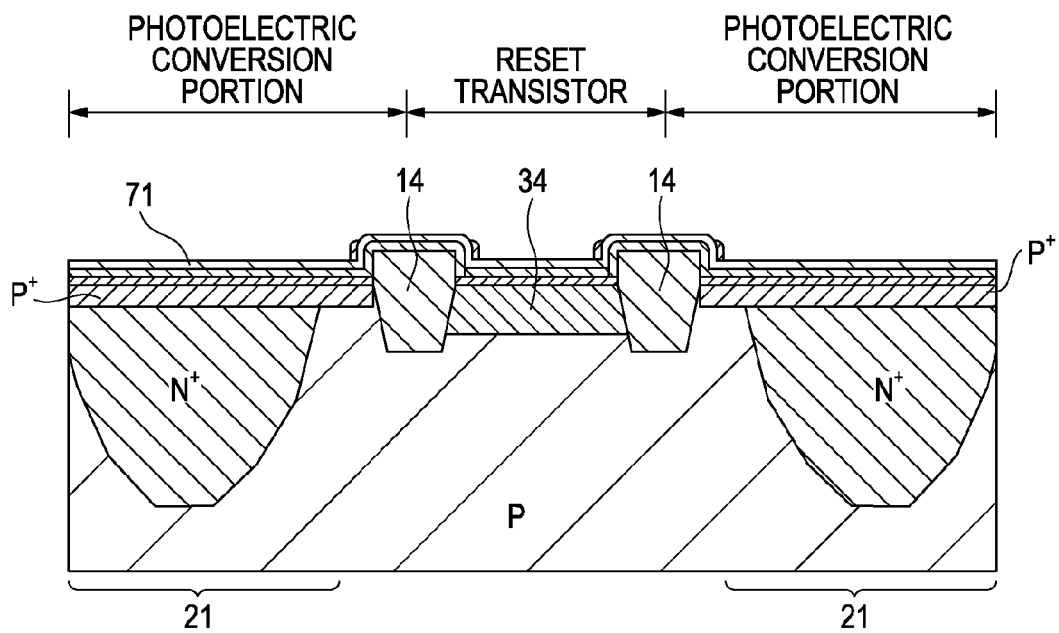

Next, a description will be made with reference to 90A, 90B, 91C, 91D, etc. FIG. 90A is a cross-sectional view taken along line LIIA-LIIA in FIG. 51, FIG. 90B is a cross-sectional view taken along line LIIB-LIIB in FIG. 51, FIG. 91C is a cross-sectional view taken along line LIIIC-LIIIC in FIG. 51, and FIG. 91D is a cross-sectional view taken along line LIIID-LIIID in FIG. 51. First, as shown in FIG. 90A to 91D, a resist mask 141 is formed so as to substantially cover the region where the MOS transistors in the pixel portion 12 are formed. The second silicide blocking film 72 located on the photoelectric conversion portions 21, the floating diffusion portion FD, (and the transfer gates TRG), the source-drain region 34 of the reset transistor, a part of the gate electrode 32 of the reset transistor in the pixel portion 12 and on the peripheral circuit portion 13 (see FIG. 32) is removed by etching using this resist mask 141 as an etching mask. Accordingly, the second silicide blocking film 72 is formed so as to overlap with the first silicide blocking film 71 on the gate electrode 32 of the reset transistor and at the back side of the isolation regions 14 shown in FIG. 91D. As a result, from the top layer, the silicon nitride film 135 and the silicon oxide film 134 are disposed on the photoelectric conversion portions 21 in that order, and thus spectral ripple can be prevented. In contrast, if the above etching is not performed, from the top layer, the silicon nitride film 139, the silicon oxide film 140, the silicon nitride film 135, and the silicon oxide film 134 are disposed on the photoelectric conversion portions 21 in that order. In this case, incident light is subjected to multiple reflections, thereby degrading spectral ripple characteristics. Since the ripple characteristics are degraded, chip-to-chip spectral variations increase. To solve this problem, in this embodiment, the second silicide blocking film 72 on the photoelectric conversion portions 21 is intentionally removed.

Figure 92A:
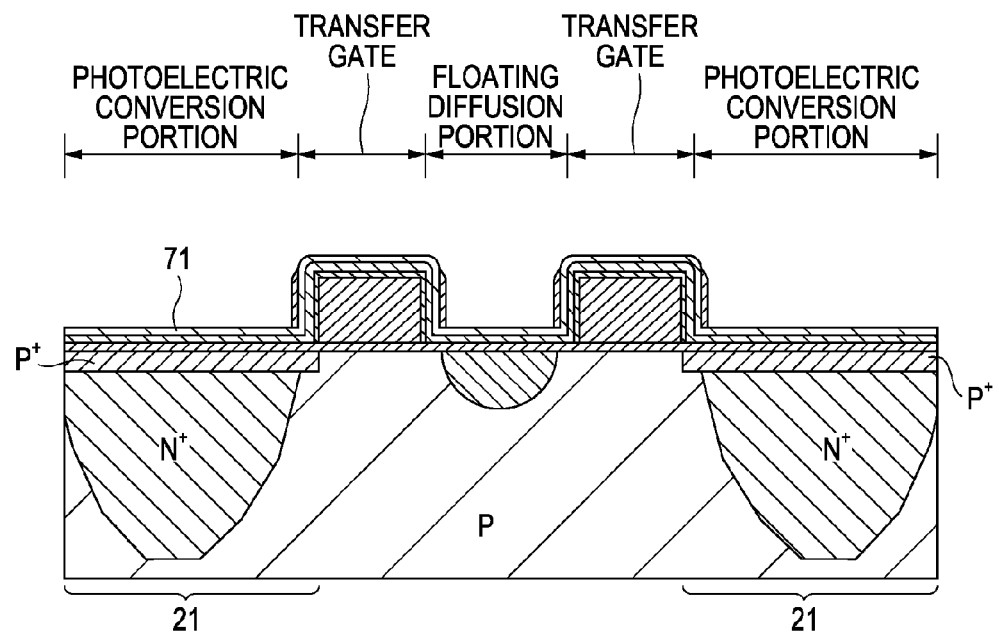
FIGS. 92A and 92B are cross-sectional views showing the detailed example of the method of producing a solid-state imaging device having the four-pixel sharing structure.
Figure 92B:
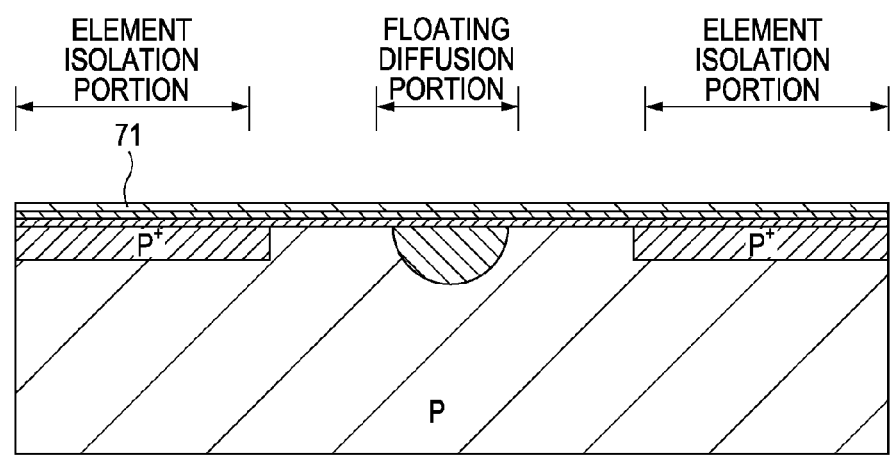
Figure 93C:
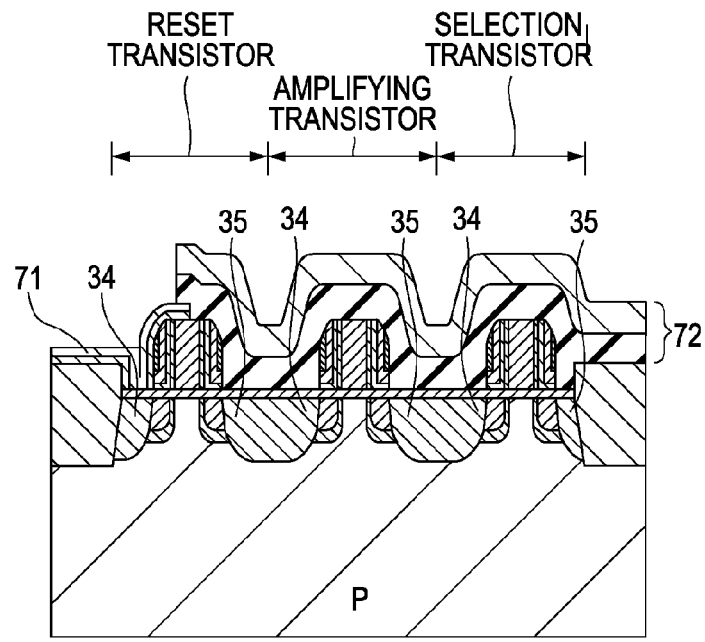
FIGS. 93C and 93D are cross-sectional views showing the detailed example of the method of producing a solid-state imaging device having the four-pixel sharing structure.
Figure 93D:
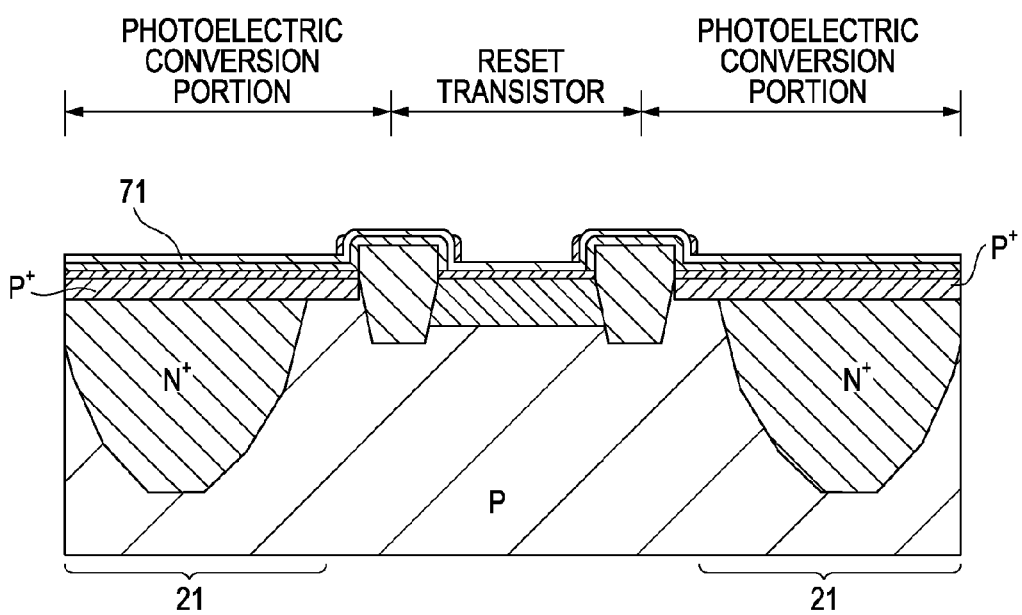

Next, a description will be made with reference to 92A, 92B, 93C, 93D, etc. FIG. 92A is a cross-sectional view taken along line LIIA-LIIA in FIG. 51, FIG. 92B is a cross-sectional view taken along line LIIB-LIIB in FIG. 51, FIG. 93C is a cross-sectional view taken along line LIIIC-LIIIC in FIG. 51, and FIG. 93D is a cross-sectional view taken along line LIIID-LIIID in FIG. 51. First, as shown in FIG. 34, silicide layers 56, 57, and 58 are formed on the source-drain regions 54 and 55, and the gate electrode 52, respectively, of each of the MOS transistors 50 in the peripheral circuit portion 13. The silicide layers 56, 57, and 58 are composed of cobalt silicide ($CoSi_2$), nickel silicide (NiSi), titanium silicide ($TiSi_2$), platinum silicide (PtSi), tungsten silicide ($WSi_2$), or the like. An example of the formation of nickel silicide will be described as an example of the formation of the silicide layers 56, 57, and 58. First, a nickel (Ni) film is formed on the entire surface. This nickel film is formed using a sputtering apparatus or the like so as to have a thickness of, for example, 10 nm. Subsequently, an annealing treatment is performed at a temperature in the range of about 300° C. to 400° C. to react the nickel film with silicon which is the underlying layer, thus forming a nickel silicide layer. Unreacted nickel is then removed by wet etching. By this wet etching, the silicide layers 56, 57, and 58 are formed only on the surfaces of silicon or polysilicon other than the insulating films in a self-alignment manner. Subsequently, an annealing treatment is again performed at a temperature in the range of about 500° C. to 600° C. to stabilize the nickel silicide layer. In the above silicidation step, as shown in FIGS. 92A to 93D, since the pixel portion 12 is covered with the first silicide blocking film 71 and the second silicide blocking film 72, the silicide is not formed on the pixel portion 12. This structure is used in order to prevent an increase in the number of white flaws and dark current caused by diffusion of the metal constituting the silicide on the photoelectric conversion portions 21. Accordingly, unless the surfaces of the source-drain regions 34 and 35 of the MOS transistors in the pixel portion 12 have a high impurity concentration, the contact resistance significantly increases. This embodiment is advantageous in that an increase in the contact resistance can be relatively suppressed because the surfaces of the source-drain regions 34 and 35 can have a high impurity concentration.

Subsequently, as in the description with reference to FIGS. 35 and 36, an etching stopper film 74 is formed on the entire surface of the pixel portion 12 and the peripheral circuit portion 13. The etching stopper film 74 is composed of, for example, a silicon nitride film. This silicon nitride film has an effect of minimizing overetching during etching for forming contact holes. Furthermore, this silicon nitride film has an effect of suppressing an increase in junction leakage due to etching damage.

Subsequently, as in the description with reference to FIGS. 37 and 38, an interlayer insulating film 76 is formed on the etching stopper film 74. The interlayer insulating film 76 is composed of, for example, a silicon oxide film and has a thickness, for example, in the range of 100 to 1,000 nm. Next, the surface of the interlayer insulating film 76 is planarized. This planarization is performed by, for example, chemical mechanical polishing (CMP). Next, a resist mask (not shown) for forming contact holes is formed. Subsequently, contact holes 77, 78, and 79 are formed by, for example, etching the interlayer insulating film 76, the etching stopper film 74, and the second silicide blocking film 72 in the pixel portion 12. Similarly, contact holes 81 and 82 are formed in the peripheral circuit portion 13. In the pixel portion 12, as an example, the contact holes 77, 78, and 79 reaching the transfer gate TRG, the gate electrode 32 of the reset transistor RST, and the gate electrode 32 of the amplifying transistor Amp, respectively, are shown in FIG. 37. In the peripheral circuit portion 13, as an example, the contact holes 81 and 82 reaching the source-drain region 55 of an N channel (Nch) low-breakdown voltage transistor and the source-drain region 55 of a P channel (Pch) low-breakdown voltage transistor, respectively, are shown in FIG. 38. However, contact holes reaching gate electrodes and source-drain regions of other transistors are also formed at the same time, though they are not shown in the figures.

Next, a plug 85 is formed inside each of the contact holes 77 to 79, 81, and 82, with an adhesion layer (not shown) and a barrier metal layer 84 therebetween. As the adhesion layer, for example, a titanium (Ti) film or a tantalum (Ta) film is used. As the barrier metal layer 84, for example, a titanium nitride film or a tantalum nitride film is used. The plug 85 may be composed of, for example, tungsten (W), aluminum (Al), or copper (Cu). For example, when copper (Cu) is used as the plug 85, for example, a tantalum film is used as the adhesion layer and a tantalum nitride film is used as the barrier metal layer 84. Subsequently, although not shown in the figures, multilayer wiring is formed. If necessary, the number of wiring layers may be increased to two layers, three layers, four layers, and the like.

Next, as shown in the cross-sectional view of the pixel portion of FIG. 39, a waveguide 23 may be formed on the photoelectric conversion portion 21. In addition, in order to focus incident light to the photoelectric conversion portion 21, a focusing lens 25 may be formed. A color filter 27 for spectral separation of light may be formed between the waveguide 23 and the focusing lens 25.

In the above-described method (fourth example) of producing a solid-state imaging device, when the sidewall 33 in the pixel transistor portion 17 and the sidewall 53 in the peripheral circuit portion are formed, the floating diffusion portion FD is also covered with the sidewall film 137 (first silicide blocking film 71). Accordingly, etching damage during the formation of the sidewalls does not occur in the floating diffusion portion FD. Furthermore, the effect of out-diffusion on the floating diffusion portion FD can be prevented. Consequently, the generation of a leak path between the isolation region 16 and the floating diffusion portion FD can be suppressed, thus suppressing the generation of FD white flaws. Accordingly, a solid-state imaging device that can realize imaging with high image quality can be produced. In addition, the pixel portion 12 is covered with two layers, namely, the first silicide blocking film 71 composed of the same film as the sidewall film 137 and the second silicide blocking film 72 composed of a film different from the first silicide blocking film 71. Accordingly, MOS transistors in the pixel portion 12 are not completely covered with a single silicide blocking film. Consequently, random noise can be reduced and the number of white flaws and dark current can also be reduced.

In the description of the above embodiments, a p-well is formed in an n-type substrate, and the photodiodes of the photoelectric conversion portions 21 include, from the top layer, a $P^+$ layer and an $N^+$ layer in that order. Alternatively, an n-well may be formed in a p-type substrate, and the photodiodes of the photoelectric conversion portions 21 may include, from the top layer, an $N^+$ layer and a $P^+$ layer in that order.

The reset transistor RST, the amplifying transistor Amp, and the selection transistor SEL in the pixel transistor portion 17 of the solid-state imaging device will now be described.

In the reset transistor RST, a drain electrode (source-drain region 35) is connected to a reset line (not shown), and a source electrode (source-drain region 34) is connected to the floating diffusion portion FD. Prior to transfer of signal charges from the photoelectric conversion portion 21 to the floating diffusion portion FD, a reset pulse is supplied to a gate electrode, and thereby, the reset transistor RST resets the electric potential of the floating diffusion portion FD to a reset voltage.

In the amplifying transistor Amp, a gate electrode 32 is connected to the floating diffusion portion FD, and a drain electrode (source-drain region 34) is connected to a pixel power supply Vdd. The amplifying transistor Amp outputs the electric potential of the floating diffusion portion FD obtained after the reset by the reset transistor RST as a reset level, and further outputs an electric potential of the floating diffusion portion FD obtained after the signal charges are transferred by a transfer transistor TRG as a signal level.

In the selection transistor SEL, for example, a drain electrode (source-drain region 34) is connected to a source electrode (source-drain region 35) of the amplifying transistor Amp, and a source electrode (source-drain region 35) is connected to an output signal line (not shown). When a selection pulse is supplied to a gate electrode 32, the selection transistor SEL turns to an ON state and outputs a signal output from the amplifying transistor Amp to the output signal line (not shown) while a pixel is made to be in a selected state. The selection transistor SEL may be configured to be connected between the pixel power supply Vdd and the drain electrode of the amplifying transistor Amp.

5. Fifth Embodiment

Example of Structure of Imaging Device

Next, an imaging device according to an embodiment of the present invention will be described with reference to a block diagram of FIG. 94. This imaging device includes a solid-state imaging device according to an embodiment of the present invention.

Figure 94:
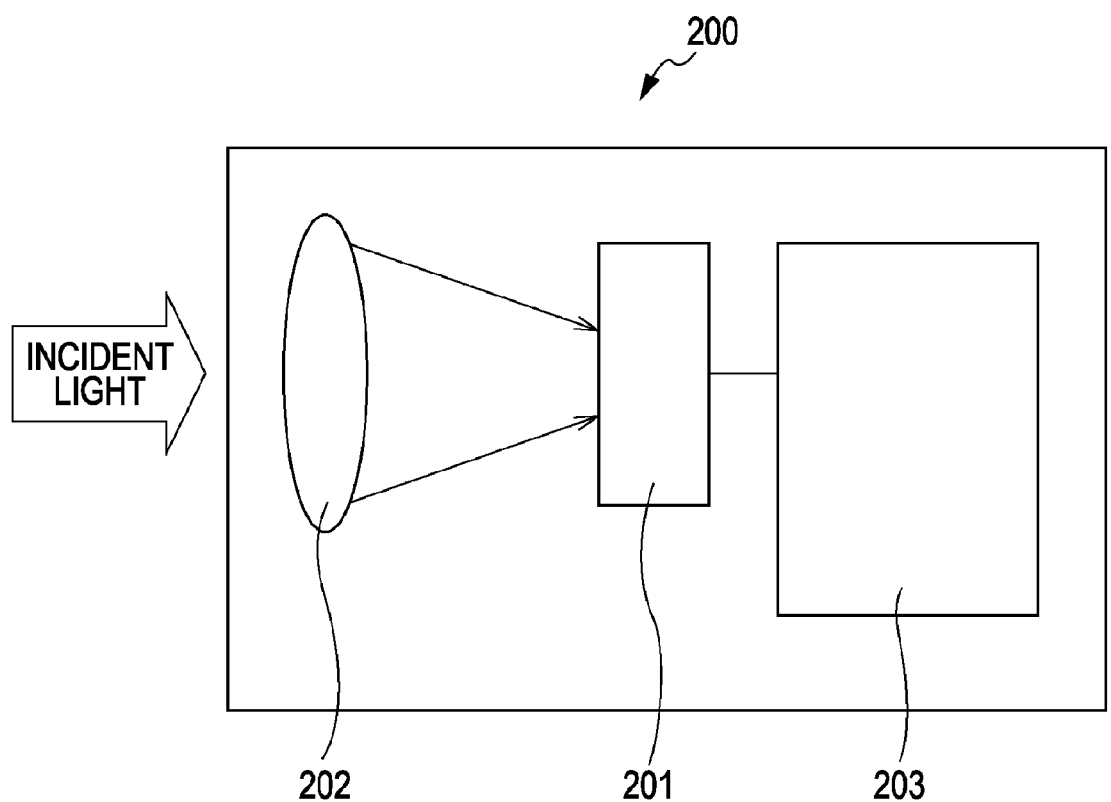
FIG. 94 is a block diagram showing an imaging device according to an embodiment of the present invention.
Figure 95:
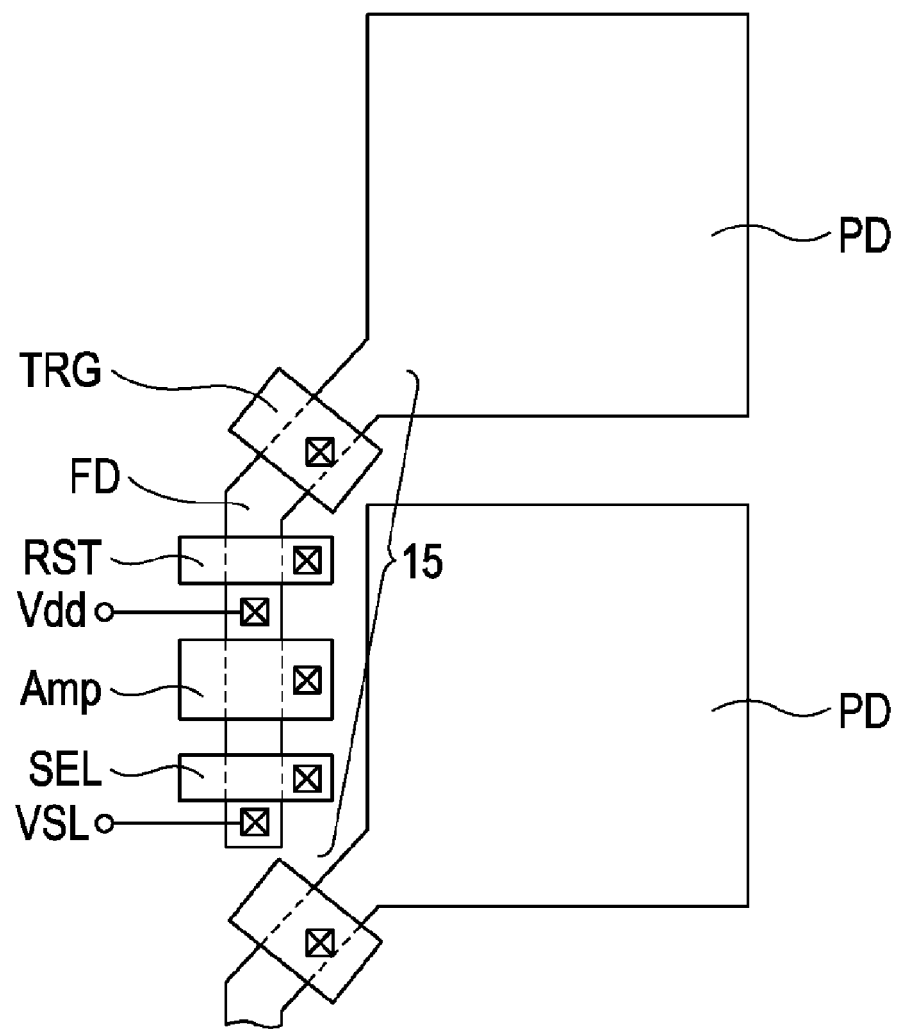
FIG. 95 is a layout view of a CMOS sensor in the related art.
Figure 96:
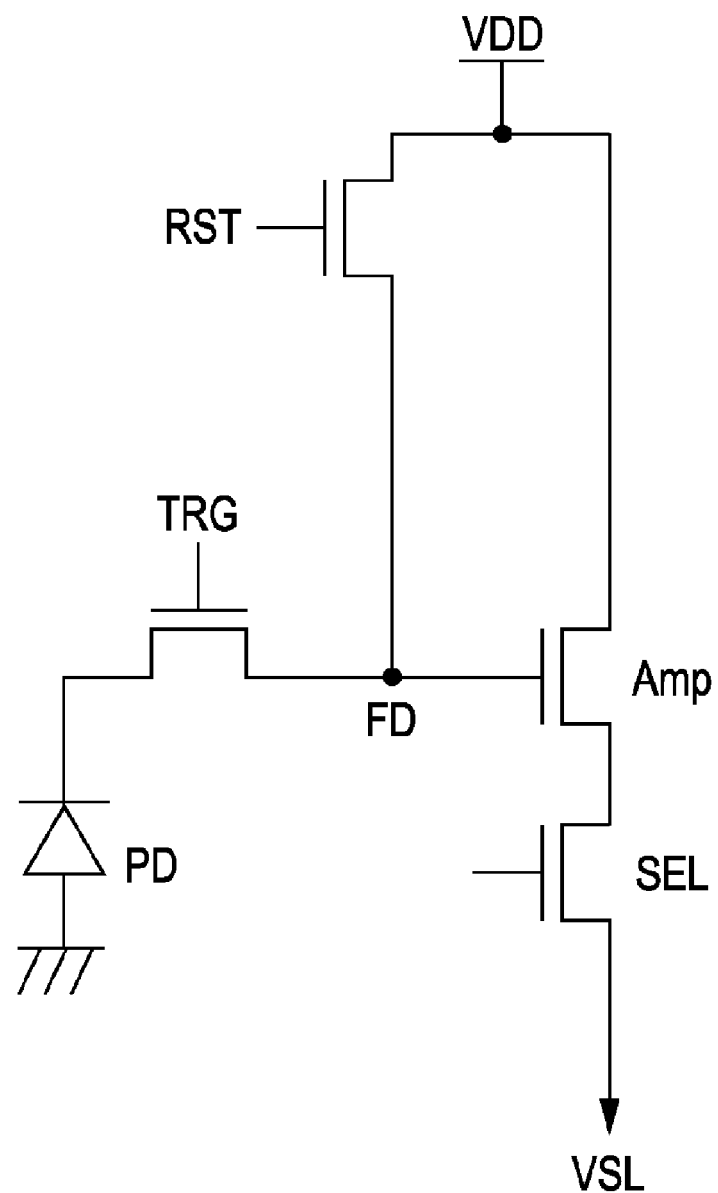
FIG. 96 is an equivalent circuit diagram of a planar layout of the CMOS sensor in the related art.

As shown in FIG. 94, an imaging device 200 includes an imaging unit 201 provided with a solid-state imaging device (not shown). An imaging optical system 202 for forming an image is provided at a light-focusing side of the imaging unit 201. A signal processing unit 203 including a driving circuit for driving the imaging unit 201, a signal processing circuit for processing signals that are photoelectrically converted in the solid-state imaging device to an image, and the like is connected to the imaging unit 201. Image signals processed by the signal processing unit 203 can be stored by an image storage unit (not shown). In this imaging device 200, the solid-state imaging device 1 described in any of the above embodiments can be used as the solid-state imaging device.

Since the imaging device 200 according to an embodiment of the present invention includes the solid-state imaging device 1 according to an embodiment of the present invention, the sensitivity of the photoelectric conversion portion of each pixel is satisfactorily ensured, as described above. Accordingly, the imaging device 200 according to an embodiment of the present invention is advantageous in that pixel characteristics can be improved, for example, random noise, the number of white flaws, and dark current can be reduced.

The structure of the imaging device 200 according to an embodiment of the present invention is not limited to the structure described above. The imaging device 200 according to an embodiment of the present invention can be applied to any imaging device including a solid-state imaging device.

The imaging device 200 may be produced in the form of a single chip or in the form of a module with an imaging function in which an imaging unit and a signal processing unit or an optical system are integrally packaged. The solid-state imaging device according to an embodiment of the present invention can also be applied to such an imaging device. In such a case, a high image quality can be realized in the imaging device. Herein, the term "imaging device" refers to, for example, a camera or a portable device having an imaging function. The term "imaging" means not only normal imaging with a camera but also fingerprint detection etc. in a broad sense.

The present application contains subject matter related to that disclosed in Japanese Priority Patent Applications JP 2008-199518 filed in the Japan Patent Office on Aug. 1, 2008, JP 2008-199519 filed in the Japan Patent Office on Aug. 1, 2008, and JP 2009-037557 filed in the Japan Patent Office on Feb. 20, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor substrate including a pixel portion having a photoelectric conversion portion configured to photoelectrically convert incident light to obtain an electrical signal and a peripheral circuit portion disposed at the periphery of the pixel portion;
a first sidewall composed of a sidewall film and disposed on each sidewall of gate electrodes of MOS transistors in the pixel portion;
a second sidewall composed of the same film as the sidewall film and disposed on each sidewall of gate electrodes of MOS transistors in the peripheral circuit portion;
a first silicide blocking film composed of the same film as the sidewall film and disposed on the photoelectric conversion portion and a part of the MOS transistors in the pixel portion; and
a second silicide blocking film disposed on the MOS transistors in the pixel portion so as to overlap with a part of the first silicide blocking film,
wherein the MOS transistors in the pixel portion are covered with the first silicide blocking film and the second silicide blocking film.

2. The solid-state imaging device according to claim 1, wherein the semiconductor substrate further includes a floating diffusion portion adjacent to the photoelectric conversion portion, and
the floating diffusion portion is covered with the first silicide blocking film.

3. The solid-state imaging device according to claim 1, wherein the semiconductor substrate further includes a floating diffusion portion adjacent to the photoelectric conversion portion,
one of the MOS transistors in the pixel portion is a reset transistor, and
the floating diffusion portion and an impurity diffusion layer of the reset transistor to which the floating diffusion portion is connected are covered with the first silicide blocking film.

4. The solid-state imaging device according to claim 1, wherein the part where the first silicide blocking film overlaps with the second silicide blocking film is disposed in the pixel portion.

5. The solid-state imaging device according to claim 1, further comprising:
a first isolation region in the pixel portion of the semiconductor substrate; and
a second isolation region in the peripheral circuit portion of the semiconductor substrate,
wherein each of the first isolation region and the second isolation region has a shallow trench isolation (STI) structure,
the first isolation region is shallower than the second isolation region, and
a height of a part of the first isolation region projecting from the semiconductor substrate is the same as a height of a part of the second isolation region projecting from the semiconductor substrate.

6. The solid-state imaging device according to claim 1, wherein the first silicide blocking film has a stacked structure including a silicon oxide film and a silicon nitride film, and
the second silicide blocking film has a stacked structure including a silicon oxide film and a silicon nitride film.

7. A method of producing a solid-state imaging device comprising the steps of:
in forming on a semiconductor substrate a pixel portion having a photoelectric conversion portion configured to photoelectrically convert incident light to obtain an electrical signal and a peripheral circuit portion formed at the periphery of the pixel portion,
forming a sidewall film covering the pixel portion and the peripheral circuit portion;
forming a first sidewall composed of the sidewall film on each sidewall of gate electrodes of MOS transistors in the pixel portion, a second sidewall composed of the sidewall film on each sidewall of gate electrodes of MOS transistors in the peripheral circuit portion, and a first silicide blocking film composed of the sidewall film on the photoelectric conversion portion and a part of the MOS transistors in the pixel portion; and
forming a second silicide blocking film on the MOS transistors in the pixel portion so as to overlap with a part of the first silicide blocking film,
wherein the MOS transistors in the pixel portion are covered with the first silicide blocking film and the second silicide blocking film.

8. The method of producing a solid-state imaging device according to claim 7, wherein the first silicide blocking film covers a floating diffusion portion provided adjacent to the photoelectric conversion portion.

9. The method of producing a solid-state imaging device according to claim 8,
wherein the first silicide blocking film covers the floating diffusion portion provided adjacent to the photoelectric conversion portion, and
the part of the MOS transistors covered with the first silicide blocking film is an impurity diffusion layer of a reset transistor.

10. The method of producing a solid-state imaging device according to claim 8, wherein the part where the first silicide blocking film overlaps with the second silicide blocking film is formed in the pixel portion.

11. The method of producing a solid-state imaging device according to claim 7, further comprising a step of:
forming a first isolation region in the pixel portion of the semiconductor substrate and a second isolation region in the peripheral circuit portion of the semiconductor substrate,
wherein each of the first isolation region and the second isolation region has an STI structure,
the first isolation region is shallower than the second isolation region, and a height of a part of the first isolation region projecting from the semiconductor substrate is the same as a height of a part of the second isolation region projecting from the semiconductor substrate.

12. The method of producing a solid-state imaging device according to claim 7, wherein the first silicide blocking film is formed so as to have a stacked structure including a silicon oxide film and a silicon nitride film, and the second silicide blocking film is formed so as to have a stacked structure including a silicon oxide film and a silicon nitride film.

13. An imaging device comprising:

a light-focusing optical unit configured to focus incident light;

an imaging unit including a solid-state imaging device configured to receive light focused in the light-focusing optical unit and to photoelectrically convert the light; and a signal processing unit configured to process an electrical signal output from the solid-state imaging device as a result of photoelectric conversion, wherein the solid-state imaging device includes a semiconductor substrate including a pixel portion having a photoelectric conversion portion configured to photoelectrically convert incident light to obtain an electrical signal and a peripheral circuit portion disposed at the periphery of the pixel portion, a first sidewall composed of a sidewall film and disposed on each sidewall of gate electrodes of MOS transistors in the pixel portion, a second sidewall composed of the same film as the sidewall film and disposed on each sidewall of gate electrodes of MOS transistors in the peripheral circuit portion, a first silicide blocking film composed of the same film as the sidewall film and disposed on the photoelectric conversion portion and a part of the MOS transistors in the pixel portion, and a second silicide blocking film disposed on the MOS transistors in the pixel portion so as to overlap with a part of the first silicide blocking film, wherein the MOS transistors in the pixel portion are covered with the first silicide blocking film and the second silicide blocking film.

* * * * *